United States Patent
Rawlins et al.

(10) Patent No.: US 8,271,223 B2
(45) Date of Patent: Sep. 18, 2012

(54) MULTI-DIMENSIONAL ERROR DEFINITION, ERROR MEASUREMENT, ERROR ANALYSIS, ERROR FUNCTION GENERATION, ERROR INFORMATION OPTIMIZATION, AND ERROR CORRECTION FOR COMMUNICATIONS SYSTEMS

(75) Inventors: Gregory S. Rawlins, Heathrow, FL (US); David F. Sorrells, Middleburg, FL (US)

(73) Assignee: ParkerVision, Inc., Jacksonville, FL (US)

(*) Notice: Subject to any disclaimer, the term of this patent is extended or adjusted under 35 U.S.C. 154(b) by 1336 days.

(21) Appl. No.: 11/984,842

(22) Filed: Nov. 21, 2007

(65) Prior Publication Data

US 2008/0133982 A1    Jun. 5, 2008

Related U.S. Application Data

(60) Provisional application No. 60/860,481, filed on Nov. 22, 2006.

(51) Int. Cl.
*G01D 18/00* (2006.01)
*G01D 21/00* (2006.01)

(52) U.S. Cl. .......................................................... 702/90
(58) Field of Classification Search ................ 702/90
See application file for complete search history.

(56) References Cited

U.S. PATENT DOCUMENTS

| | | | |
|---|---|---|---|
| 6,038,518 A * | 3/2000 | Farwell | 702/89 |
| 6,993,441 B1 * | 1/2006 | Tsyrganovich | 702/69 |
| 7,184,723 B2 * | 2/2007 | Sorrells et al. | 455/127.3 |
| 7,355,470 B2 * | 4/2008 | Sorrells et al. | 330/2 |
| 7,379,831 B1 * | 5/2008 | Tsyrganovich | 702/85 |
| 2002/0044014 A1 * | 4/2002 | Wright et al. | 330/2 |
| 2004/0181738 A1 | 9/2004 | Agazzi et al. | |
| 2005/0083531 A1 * | 4/2005 | Millerd et al. | 356/450 |
| 2005/0273688 A1 | 12/2005 | Argon | |
| 2006/0099919 A1 * | 5/2006 | Sorrells et al. | 455/127.1 |
| 2007/0247217 A1 * | 10/2007 | Sorrells et al. | 330/2 |
| 2008/0122543 A1 * | 5/2008 | Silver et al. | 330/297 |

OTHER PUBLICATIONS

International Search Report for PCT/US2007/024275, dated Apr. 18, 2008, 3 pp.
Velis, Danilo R. et al., "Simulated Annealing Wavelet Estimation Via Fourth-Order Cumulant Matching," In Geophysics, vol. 61, No. 6, pp. 1939-1948, Nov. 1996. [retrieved on Mar. 24, 2008 at http://www/eos.ubc.ca/research/cdsst/Tad__home/GPY001939.pdf.

* cited by examiner

*Primary Examiner* — Michael Nghiem
(74) *Attorney, Agent, or Firm* — Sterne, Kessler, Goldstein & Fox Fox

(57) ABSTRACT

The present invention is related to multi-dimensional error definition, error measurement, error analysis, error function generation, error information optimization, and error correction for communication systems. Novel techniques are provided that can be applied to a myriad of applications for which an input to output transfer characteristic must be corrected or linearized. According to embodiments of the present invention, error can be described, processed, and geometrically interpreted. Compact formulations of error correction and calibration functions can be generated according to the present invention, which reduce memory requirements as well as computational time.

13 Claims, 151 Drawing Sheets

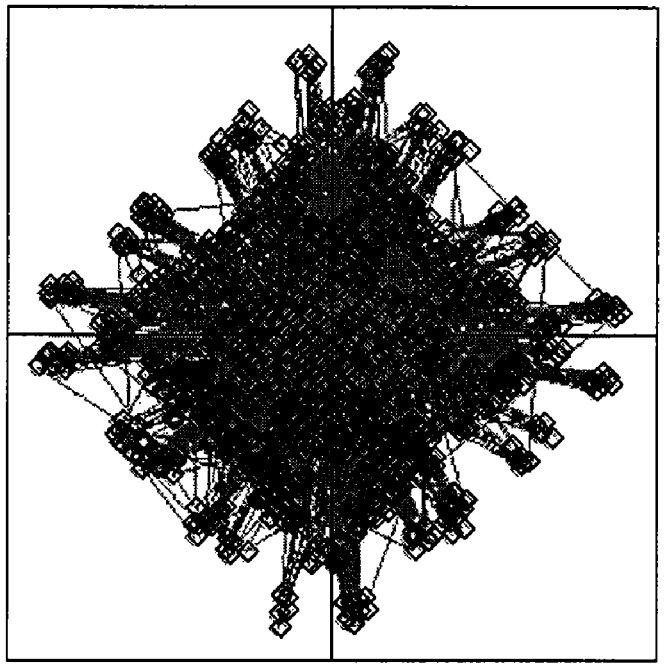
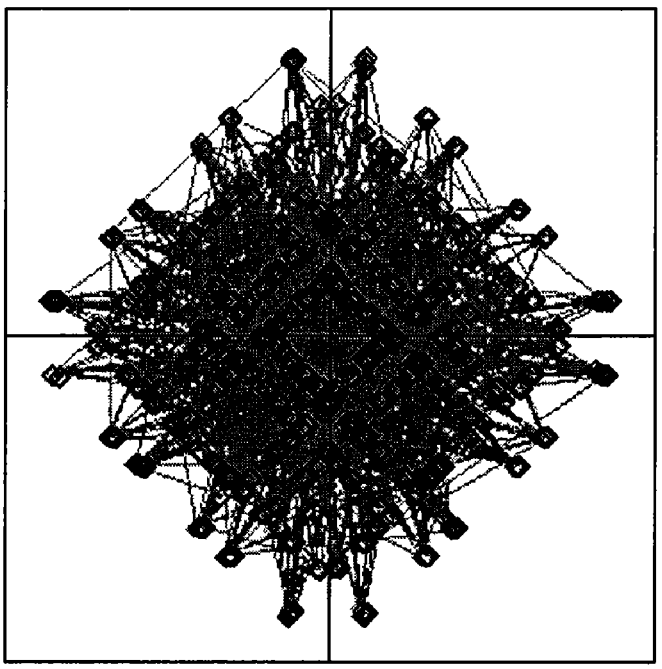
FIG. 6

GradientY OF MAGNITUDE SURFACE

GradientM OF MAGNITUDE SURFACE

PHASE DISTORTION

GradientX OF PHASE DISTORTION SURFACE

GradientY OF PHASE DISTORTION SURFACE

GradientM OF PHASE DISTORTION SURFACE

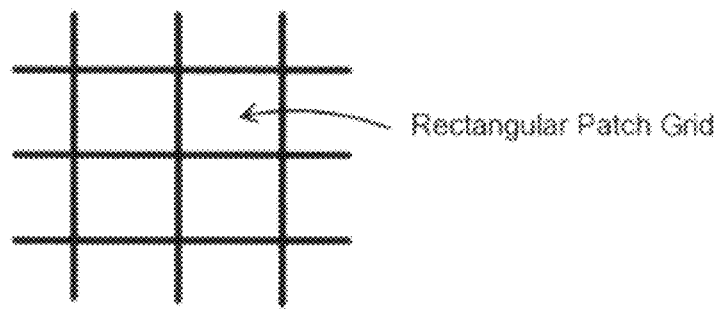
Rectangular Patch Grid
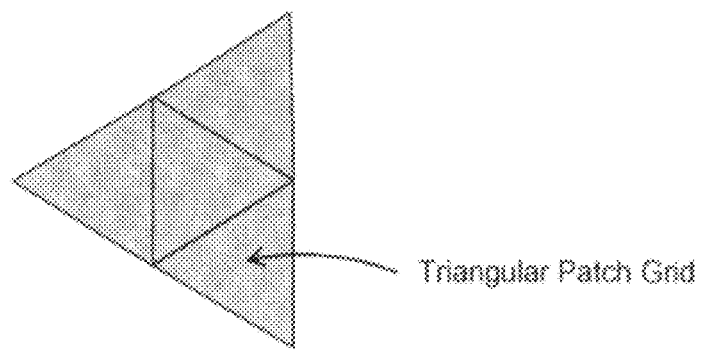
Triangular Patch Grid
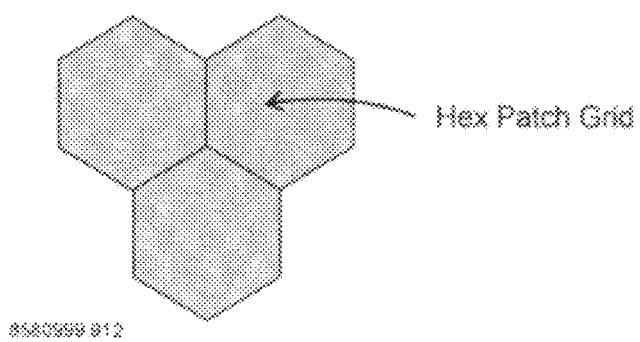
Hex Patch Grid
FIG. 55

MINIMIZATION PHASE

FIG. 82

```
I BOUNDARIES:  63.00000  76.00000  111.00000  117.00000
Q BOUNDARIES:  63.00000  76.00000  111.00000  117.00000

NUMBER OF I COEFFICIENTS:   2  2  3  2  2
NUMBER OF Q COEFFICIENTS:   2  2  3  2  2

RESOLUTION FOR THE I COEFFICIENTS = [24 19]
RESOLUTION FOR THE Q COEFFICIENTS = [24 19]

HIGH RESOLUTION I COEFFICIENTS
  -0.00788890   0.00079507   0.00000000   0.00000000   0.00000000
  -2.58101840   0.04181293   0.00000000   0.00000000   0.00000000
  -7.67304914   0.15742917  -0.00064086   0.00000000   0.00000000
   1.58675979   0.00271054   0.00000000   0.00000000   0.00000000
   2.47754799  -0.00485389   0.00000000   0.00000000   0.00000000

QUANTIZED I COEFFICIENTS
  -0.00788879   0.00079536   0.00000000   0.00000000   0.00000000
  -2.58101845   0.04181290   0.00000000   0.00000000   0.00000000
  -7.67304993   0.15742874  -0.00064087   0.00000000   0.00000000
   1.58675957   0.00271034   0.00000000   0.00000000   0.00000000
   2.47754860  -0.00485420   0.00000000   0.00000000   0.00000000

HIGH RESOLUTION Q COEFFICIENTS
  -0.00251499  -0.00051342   0.00000000   0.00000000   0.00000000
  -0.44162389   0.00612736   0.00000000   0.00000000   0.00000000
  -5.75949240   0.14321182  -0.00087839   0.00000000   0.00000000
   2.37274403  -0.02722631   0.00000000   0.00000000   0.00000000
   0.50418247  -0.01144647   0.00000000   0.00000000   0.00000000

QUANTIZED Q COEFFICIENTS
  -0.00251579  -0.00051308   0.00000000   0.00000000   0.00000000
  -0.44162369   0.00612831   0.00000000   0.00000000   0.00000000
  -5.75949287   0.14321136  -0.00087929   0.00000000   0.00000000
   2.37274361  -0.02722549   0.00000000   0.00000000   0.00000000
   0.50418282  -0.01144600   0.00000000   0.00000000   0.00000000
```

FIG. 84

I BOUNDARIES: 81.00000 96.00000 200.00000 200.00000
Q BOUNDARIES: 81.00000 96.00000 200.00000 200.00000

NUMBER OF I COEFFICIENTS:  2  3  3  3  2
NUMBER OF Q COEFFICIENTS:  2  3  3  3  2

RESOLUTION FOR THE I COEFFICIENTS = [24 19]
RESOLUTION FOR THE Q COEFFICIENTS = [24 19]

HIGH RESOLUTION I COEFFICIENTS
```
 -0.02696733   0.00224743   0.00000000   0.00000000   0.00000000
  9.21729553  -0.21764824   0.00130883   0.00000000   0.00000000
-15.08271206   0.23769067  -0.00081082   0.00000000   0.00000000
  0.00000000   0.00000000   0.00000000   0.00000000   0.00000000
  0.00000000   0.00000000   0.00000000   0.00000000   0.00000000
```

QUANTIZED I COEFFICIENTS
```
 -0.02696800   0.00224686   0.00000000   0.00000000   0.00000000
  9.21729469  -0.21764755   0.00130844   0.00000000   0.00000000
-15.08271217   0.23768997  -0.00081062   0.00000000   0.00000000
  0.00000000   0.00000000   0.00000000   0.00000000   0.00000000
  0.00000000   0.00000000   0.00000000   0.00000000   0.00000000
```

HIGH RESOLUTION Q COEFFICIENTS
```
  0.02391981  -0.00279841   0.00000000   0.00000000   0.00000000
  3.01477496  -0.07360820   0.00041735   0.00000000   0.00000000
 -3.80995549   0.04105463  -0.00004446   0.00000000   0.00000000
  0.00000000   0.00000000   0.00000000   0.00000000   0.00000000
  0.00000000   0.00000000   0.00000000   0.00000000   0.00000000
```

QUANTIZED Q COEFFICIENTS
```
  0.02392006  -0.00279808   0.00000000   0.00000000   0.00000000
  3.01477432  -0.07360840   0.00041771   0.00000000   0.00000000
 -3.80995560   0.04105377  -0.00004387   0.00000000   0.00000000
  0.00000000   0.00000000   0.00000000   0.00000000   0.00000000
  0.00000000   0.00000000   0.00000000   0.00000000   0.00000000
```

FIG. 86

```
I BOUNDARIES: 55.00000 65.00000 100.00000 115.00000
Q BOUNDARIES: 65.00000 85.00000  95.00000 118.00000

NUMBER OF I COEFFICIENTS:   2  2  2  2  2
NUMBER OF Q COEFFICIENTS:   2  2  2  2  2

RESOLUTION FOR THE I COEFFICIENTS = [ 16 11]
RESOLUTION FOR THE Q COEFFICIENTS = [ 16 11]

HIGH RESOLUTION I COEFFICIENTS
    0.00021586    0.00042640    0.00000000    0.00000000    0.00000000
   -0.72356560    0.01316245    0.00000000    0.00000000    0.00000000
   -2.87656886    0.04609625    0.00000000    0.00000000    0.00000000
    0.35749598    0.01365008    0.00000000    0.00000000    0.00000000
    2.39783691   -0.00421361    0.00000000    0.00000000    0.00000000

QUANTIZED I COEFFICIENTS
    0.00000000    0.00048828    0.00000000    0.00000000    0.00000000
   -0.72363281    0.01318359    0.00000000    0.00000000    0.00000000
   -2.87646484    0.04589844    0.00000000    0.00000000    0.00000000
    0.35742188    0.01367188    0.00000000    0.00000000    0.00000000
    2.39794922   -0.00439453    0.00000000    0.00000000    0.00000000

HIGH RESOLUTION Q COEFFICIENTS
   -0.00231702   -0.00052200    0.00000000    0.00000000    0.00000000
   -0.51282789    0.00714384    0.00000000    0.00000000    0.00000000
    1.36368794   -0.01496434    0.00000000    0.00000000    0.00000000
    3.22171630   -0.03466660    0.00000000    0.00000000    0.00000000
    0.38291323   -0.01047632    0.00000000    0.00000000    0.00000000

QUANTIZED Q COEFFICIENTS
   -0.00244141   -0.00048828    0.00000000    0.00000000    0.00000000
   -0.51269531    0.00732422    0.00000000    0.00000000    0.00000000
    1.36376953   -0.01513672    0.00000000    0.00000000    0.00000000
    3.22167969   -0.03466797    0.00000000    0.00000000    0.00000000
    0.38281250   -0.01025391    0.00000000    0.00000000    0.00000000
```

FIG. 88

```
I BOUNDARIES: 85.00000  95.00000  117.00000  130.00000
Q BOUNDARIES: 35.00000  85.00000   98.00000  130.00000

NUMBER OF I COEFFICIENTS:  2  2  2  2  2
NUMBER OF Q COEFFICIENTS:  2  2  2  2  2

RESOLUTION FOR THE I COEFFICIENTS = [ 16 11]
RESOLUTION FOR THE Q COEFFICIENTS = [ 16 11]

HIGH RESOLUTION I COEFFICIENTS
  -0.02795224   0.00228073   0.00000000   0.00000000   0.00000000
  -1.42765621   0.01853772   0.00000000   0.00000000   0.00000000
  -5.76608573   0.06357847   0.00000000   0.00000000   0.00000000
  -1.46288588   0.02721348   0.00000000   0.00000000   0.00000000
   0.00000000   0.00000000   0.00000000   0.00000000   0.00000000

QUANTIZED I COEFFICIENTS
  -0.02783203   0.00244141   0.00000000   0.00000000   0.00000000
  -1.42773438   0.01855469   0.00000000   0.00000000   0.00000000
  -5.76611328   0.06347656   0.00000000   0.00000000   0.00000000
  -1.46289063   0.02734375   0.00000000   0.00000000   0.00000000
   0.00000000   0.00000000   0.00000000   0.00000000   0.00000000

HIGH RESOLUTION Q COEFFICIENTS
  -0.00082012  -0.00154548   0.00000000   0.00000000   0.00000000
   0.05895476  -0.00338247   0.00000000   0.00000000   0.00000000
  -0.56100901   0.00373605   0.00000000   0.00000000   0.00000000
  -3.31709183   0.03160975   0.00000000   0.00000000   0.00000000
   0.00000000   0.00000000   0.00000000   0.00000000   0.00000000

QUANTIZED Q COEFFICIENTS
  -0.00097656  -0.00146484   0.00000000   0.00000000   0.00000000
   0.05908203  -0.00341797   0.00000000   0.00000000   0.00000000
  -0.56103516   0.00390625   0.00000000   0.00000000   0.00000000
  -3.31689453   0.03173828   0.00000000   0.00000000   0.00000000
   0.00000000   0.00000000   0.00000000   0.00000000   0.00000000
```

FIG. 90

```
I BOUNDARIES:  30.00000  60.00000  80.00000  110.00000
Q BOUNDARIES:  30.00000  65.00000  77.00000   90.00000

NUMBER OF I COEFFICIENTS:   2  2  2  2  2
NUMBER OF Q COEFFICIENTS:   2  2  2  2  2

RESOLUTION FOR THE I COEFFICIENTS = [ 16  11 ]
RESOLUTION FOR THE Q COEFFICIENTS = [ 16  11 ]

HIGH RESOLUTION I COEFFICIENTS
   -0.00959792   0.00098373   0.00000000   0.00000000   0.00000000
   -0.11103921   0.00404895   0.00000000   0.00000000   0.00000000
   -1.18653770   0.02150544   0.00000000   0.00000000   0.00000000
   -2.80401281   0.04222831   0.00000000   0.00000000   0.00000000
    0.12745494   0.01566256   0.00000000   0.00000000   0.00000000

QUANTIZED I COEFFICIENTS
   -0.00976563   0.00097656   0.00000000   0.00000000   0.00000000
   -0.11083984   0.00390625   0.00000000   0.00000000   0.00000000
   -1.18652344   0.02148438   0.00000000   0.00000000   0.00000000
   -2.80419922   0.04199219   0.00000000   0.00000000   0.00000000
    0.12744141   0.01562500   0.00000000   0.00000000   0.00000000

HIGH RESOLUTION Q COEFFICIENTS
   -0.03140713  -0.00067091   0.00000000   0.00000000   0.00000000
    0.00993724  -0.00196356   0.00000000   0.00000000   0.00000000
   -0.35043256   0.00349798   0.00000000   0.00000000   0.00000000
   -0.76648230   0.00887881   0.00000000   0.00000000   0.00000000
   -0.25657865   0.00338648   0.00000000   0.00000000   0.00000000

QUANTIZED Q COEFFICIENTS
   -0.03125000  -0.00048828   0.00000000   0.00000000   0.00000000
    0.00976563  -0.00195313   0.00000000   0.00000000   0.00000000
   -0.35058594   0.00341797   0.00000000   0.00000000   0.00000000
   -0.76660156   0.00878906   0.00000000   0.00000000   0.00000000
   -0.25634766   0.00341797   0.00000000   0.00000000   0.00000000
```

FIG. 94

MAGNITUDE BOUNDARIES: 0.40000   0.80000   1.20000   1.60000
PHASE BOUNDARIES:    0.30000   0.60000   1.00000   1.50000

NUMBER OF MAGNITUDE COEFFICIENTS:   3   2   2   2   2
NUMBER OF PHASE COEFFICIENTS:       3   3   3   3   3

RESOLUTION FOR THE MAGNITUDE COEFFICIENTS = [ 12 8]
RESOLUTION FOR THE PHASE COEFFICIENTS = [ 8 2]

HIGH RESOLUTION MAGNITUDE COEFFICIENTS
```
  0.92014995  -0.00923449  -0.00171027   0.00000000   0.00000000
  0.71983580  -0.02352948   0.00000000   0.00000000   0.00000000
  0.48302454  -0.02377794   0.00000000   0.00000000   0.00000000
  0.23661787  -0.02524826   0.00000000   0.00000000   0.00000000
 -0.00231893  -0.02159065   0.00000000   0.00000000   0.00000000
```

QUANTIZED MAGNITUDE COEFFICIENTS
```
  0.92187500  -0.00781250   0.00000000   0.00000000   0.00000000
  0.71875000  -0.02343750   0.00000000   0.00000000   0.00000000
  0.48437500  -0.02343750   0.00000000   0.00000000   0.00000000
  0.23828125  -0.02343750   0.00000000   0.00000000   0.00000000
 -0.00390625  -0.02343750   0.00000000   0.00000000   0.00000000
```

HIGH RESOLUTION PHASE COEFFICIENTS
```
  -0.98472758  -5.52324975   0.41549253   0.00000000   0.00000000
 -24.82801362  -1.19104911   0.15861197   0.00000000   0.00000000
 -29.79812495  -0.32363280   0.02733923   0.00000000   0.00000000
 -27.60230782   0.73449671   0.03550750   0.00000000   0.00000000
 -15.70201905   1.31666279   0.03482753   0.00000000   0.00000000
```

QUANTIZED PHASE COEFFICIENTS
```
  -1.00000000  -5.50000000   0.50000000   0.00000000   0.00000000
 -24.75000000  -1.25000000   0.25000000   0.00000000   0.00000000
 -29.75000000  -0.25000000   0.00000000   0.00000000   0.00000000
 -27.50000000   0.75000000   0.00000000   0.00000000   0.00000000
 -15.75000000   1.25000000   0.00000000   0.00000000   0.00000000
```

FIG. 96

```
MAGNITUDE BOUNDARIES:  0.40000   0.80000   1.20000   1.60000
PHASE BOUNDARIES:      0.30000   0.60000   1.00000   1.50000

NUMBER OF MAGNITUDE COEFFICIENTS:  3  2  2  2  2
NUMBER OF PHASE COEFFICIENTS:      3  3  3  3  3

RESOLUTION FOR THE MAGNITUDE COEFFICIENTS = [12 8]
RESOLUTION FOR THE PHASE COEFFICIENTS = [7 1]

HIGH RESOLUTION MAGNITUDE COEFFICIENTS
   0.92112700   -0.00920495   -0.00183064    0.00000000    0.00000000
   0.72000761   -0.02339917    0.00000000    0.00000000    0.00000000
   0.48321705   -0.02386263    0.00000000    0.00000000    0.00000000
   0.23637269   -0.02524687    0.00000000    0.00000000    0.00000000
  -0.00139552   -0.02146189    0.00000000    0.00000000    0.00000000

QUANTIZED MAGNITUDE COEFFICIENTS
   0.92187500   -0.00781250    0.00000000    0.00000000    0.00000000
   0.71875000   -0.02343750    0.00000000    0.00000000    0.00000000
   0.48437500   -0.02343750    0.00000000    0.00000000    0.00000000
   0.23828125   -0.02343750    0.00000000    0.00000000    0.00000000
   0.00000000   -0.01953125    0.00000000    0.00000000    0.00000000

HIGH RESOLUTION PHASE COEFFICIENTS
  -1.11788759   -5.53670890    0.44881507    0.00000000    0.00000000
 -24.91920214   -1.17866140    0.16961842    0.00000000    0.00000000
 -29.75873248   -0.33205362    0.02323285    0.00000000    0.00000000
 -27.62620109    0.73130601    0.03661580    0.00000000    0.00000000
 -15.71262159    1.32045338    0.03598729    0.00000000    0.00000000

QUANTIZED PHASE COEFFICIENTS
  -1.00000000   -5.50000000    0.50000000    0.00000000    0.00000000
 -25.00000000   -1.00000000    0.00000000    0.00000000    0.00000000
 -30.00000000   -0.50000000    0.00000000    0.00000000    0.00000000
 -27.50000000    0.50000000    0.00000000    0.00000000    0.00000000
 -15.50000000    1.50000000    0.00000000    0.00000000    0.00000000
```

FIG. 98

NUMBER OF MAGNITUDE COEFFICIENTS:  3  2  2  2  2
NUMBER OF PHASE COEFFICIENTS:  3  3  3  3  3

RESOLUTION FOR THE MAGNITUDE COEFFICIENTS = [8 5]
RESOLUTION FOR THE PHASE COEFFICIENTS = [6 0]

HIGH RESOLUTION MAGNITUDE COEFFICIENTS
```
    0.88886474  -0.00191272  -0.03619135   0.00000000   0.00000000
    0.73170191  -0.10630632   0.00000000   0.00000000   0.00000000
    0.49508091  -0.10678085   0.00000000   0.00000000   0.00000000
    0.24904466  -0.11389271   0.00000000   0.00000000   0.00000000
    0.00906191  -0.09760312   0.00000000   0.00000000   0.00000000
```

QUANTIZED MAGNITUDE COEFFICIENTS
```
    0.87500000  -0.00000000  -0.03125000   0.00000000   0.00000000
    0.71875000  -0.09375000   0.00000000   0.00000000   0.00000000
    0.50000000  -0.09375000   0.00000000   0.00000000   0.00000000
    0.25000000  -0.12500000   0.00000000   0.00000000   0.00000000
    0.00000000  -0.09375000   0.00000000   0.00000000   0.00000000
```

HIGH RESOLUTION PHASE COEFFICIENTS
```
    3.71314879 -21.61420349   5.09696602   0.00000000   0.00000000
  -23.22011051  -4.69776412   0.90033911   0.00000000   0.00000000
  -29.36152187  -1.58842299   0.32082683   0.00000000   0.00000000
  -27.42445187   3.83854422   0.52818001   0.00000000   0.00000000
  -15.06366124   7.88428679   0.59611797   0.00000000   0.00000000
```

QUANTIZED PHASE COEFFICIENTS
```
    4.00000000 -22.00000000   5.00000000   0.00000000   0.00000000
  -23.00000000  -5.00000000   1.00000000   0.00000000   0.00000000
  -29.00000000  -2.00000000   0.00000000   0.00000000   0.00000000
  -27.00000000   4.00000000   1.00000000   0.00000000   0.00000000
  -15.00000000   8.00000000   1.00000000   0.00000000   0.00000000
```

FIG. 100

MAGNITUDE BOUNDARIES: 0.40000   0.80000   1.20000   1.60000
PHASE BOUNDARIES:    0.30000   0.60000   1.00000   1.50000

NUMBER OF MAGNITUDE COEFFICIENTS:  3  2  2  2  2
NUMBER OF PHASE COEFFICIENTS:      3  3  3  3  3

RESOLUTION FOR THE MAGNITUDE COEFFICIENTS = [ 12  8]
RESOLUTION FOR THE PHASE COEFFICIENTS = [ 8  1]

HIGH RESOLUTION MAGNITUDE COEFFICIENTS
   1.41459046   -0.01635144   -0.00253307    0.00000000    0.00000000
   1.12860723   -0.03154957    0.00000000    0.00000000    0.00000000
   0.80119699   -0.03329429    0.00000000    0.00000000    0.00000000
   0.46361236   -0.03402636    0.00000000    0.00000000    0.00000000
   0.12096145   -0.03440347    0.00000000    0.00000000    0.00000000

QUANTIZED MAGNITUDE COEFFICIENTS
   1.41406250   -0.01562500   -0.00390625    0.00000000    0.00000000
   1.12890625   -0.03125000    0.00000000    0.00000000    0.00000000
   0.80078125   -0.03515625    0.00000000    0.00000000    0.00000000
   0.46484375   -0.03515625    0.00000000    0.00000000    0.00000000
   0.12109375   -0.03515625    0.00000000    0.00000000    0.00000000

HIGH RESOLUTION PHASE COEFFICIENTS
  36.07609910  -12.41494973    1.69033424    0.00000000    0.00000000
   1.26706055   -1.52956563    0.15335026    0.00000000    0.00000000
  -4.86705851   -0.22511280    0.03641913    0.00000000    0.00000000
  -4.64472766    0.15557619    0.00932669    0.00000000    0.00000000
  -1.86079910    0.24492332   -0.00272823    0.00000000    0.00000000

QUANTIZED PHASE COEFFICIENTS
  36.00000000  -12.50000000    1.50000000    0.00000000    0.00000000
   1.50000000   -1.50000000    0.00000000    0.00000000    0.00000000
  -5.00000000    0.00000000    0.00000000    0.00000000    0.00000000
  -4.50000000    0.00000000    0.00000000    0.00000000    0.00000000
  -2.00000000    0.00000000    0.00000000    0.00000000    0.00000000

FIG. 102

MAGNITUDE BOUNDARIES:  0.40000   0.80000   1.20000   1.60000
PHASE BOUNDARIES:  0.30000   0.60000   1.00000   1.50000

NUMBER OF MAGNITUDE COEFFICIENTS:  3  2  2  2  2
NUMBER OF PHASE COEFFICIENTS:   3  3  3  3  3

RESOLUTION FOR THE MAGNITUDE COEFFICIENTS = [12 8]
RESOLUTION FOR THE PHASE COEFFICIENTS = [3 0]

HIGH RESOLUTION MAGNITUDE COEFFICIENTS
```
    1.41825143   -0.01618393   -0.00295548    0.00000000    0.00000000
    1.12845726   -0.03144841    0.00000000    0.00000000    0.00000000
    0.80208218   -0.03304771    0.00000000    0.00000000    0.00000000
    0.46367830   -0.03402295    0.00000000    0.00000000    0.00000000
    0.12103686   -0.03442805    0.00000000    0.00000000    0.00000000
```

QUANTIZED MAGNITUDE COEFFICIENTS
```
    1.41796875   -0.01562500   -0.00390625    0.00000000    0.00000000
    1.12890625   -0.03125000    0.00000000    0.00000000    0.00000000
    0.80078125   -0.03125000    0.00000000    0.00000000    0.00000000
    0.46484375   -0.03515625    0.00000000    0.00000000    0.00000000
    0.12109375   -0.03515625    0.00000000    0.00000000    0.00000000
```

HIGH RESOLUTION PHASE COEFFICIENTS
```
   35.61589810  -12.48749576    1.81142546    0.00000000    0.00000000
    1.32112629   -1.41294661    0.18038337    0.00000000    0.00000000
   -4.86179825   -0.22206132    0.03680760    0.00000000    0.00000000
   -4.65393056    0.16045741    0.01035811    0.00000000    0.00000000
   -1.86810257    0.24368997   -0.00253146    0.00000000    0.00000000
```

QUANTIZED PHASE COEFFICIENTS
```
    3.00000000   -4.00000000    2.00000000    0.00000000    0.00000000
    1.00000000   -1.00000000    0.00000000    0.00000000    0.00000000
   -4.00000000    0.00000000    0.00000000    0.00000000    0.00000000
   -4.00000000    0.00000000    0.00000000    0.00000000    0.00000000
   -2.00000000    0.00000000    0.00000000    0.00000000    0.00000000
```
NOTE: OVERFLOW OCCURRED WHERE NUMBERS ARE HIGHLIGHTED

FIG. 104

MAGNITUDE BOUNDARIES:  0.40000   0.80000   1.20000   1.60000
PHASE BOUNDARIES:  0.30000   0.60000   1.00000   1.50000

NUMBER OF MAGNITUDE COEFFICIENTS:  3  2  2  2  2
NUMBER OF PHASE COEFFICIENTS:  3  3  3  3  3

RESOLUTION FOR THE MAGNITUDE COEFFICIENTS = [8 5]
RESOLUTION FOR THE PHASE COEFFICIENTS = [2 0]

HIGH RESOLUTION MAGNITUDE COEFFICIENTS
```
   1.34681951    0.02480917   -0.07736581    0.00000000    0.00000000
   1.14391826   -0.14240448    0.00000000    0.00000000    0.00000000
   0.81763561   -0.15000534    0.00000000    0.00000000    0.00000000
   0.48043422   -0.15307823    0.00000000    0.00000000    0.00000000
   0.13806245   -0.15492604    0.00000000    0.00000000    0.00000000
```

QUANTIZED MAGNITUDE COEFFICIENTS
```
   1.34375000    0.03125000   -0.06250000    0.00000000    0.00000000
   1.15625000   -0.15625000    0.00000000    0.00000000    0.00000000
   0.81250000   -0.15625000    0.00000000    0.00000000    0.00000000
   0.46875000   -0.15625000    0.00000000    0.00000000    0.00000000
   0.12500000   -0.15625000    0.00000000    0.00000000    0.00000000
```

HIGH RESOLUTION PHASE COEFFICIENTS
```
  41.40592390  -33.80205631    6.63793609    0.00000000    0.00000000
   2.97165890   -5.85310569    0.96198236    0.00000000    0.00000000
  -4.38761025   -1.16914171    0.36447707    0.00000000    0.00000000
  -4.57293984    0.77345438    0.13390515    0.00000000    0.00000000
  -1.90657290    1.45440461   -0.04802371    0.00000000    0.00000000
```

QUANTIZED PHASE COEFFICIENTS
```
   1.00000000   -2.00000000    1.00000000    0.00000000    0.00000000
   1.00000000   -2.00000000    1.00000000    0.00000000    0.00000000
  -2.00000000   -1.00000000    0.00000000    0.00000000    0.00000000
  -2.00000000    1.00000000    0.00000000    0.00000000    0.00000000
  -2.00000000    1.00000000    0.00000000    0.00000000    0.00000000
```
NOTE: OVERFLOW OCCURRED WHERE NUMBERS ARE HIGHLIGHTED

FIG. 106

```
MAGNITUDE BOUNDARIES:  0.40000   0.80000   1.20000   1.60000
PHASE BOUNDARIES:      0.30000   0.60000   1.10000   1.50000

NUMBER OF MAGNITUDE COEFFICIENTS:   3  2  2  2  2
NUMBER OF PHASE COEFFICIENTS:       3  3  3  3  3

RESOLUTION FOR THE MAGNITUDE COEFFICIENTS = [10  6]
RESOLUTION FOR THE PHASE COEFFICIENTS     = [ 8  1]

HIGH RESOLUTION MAGNITUDE COEFFICIENTS
    0.90451912    0.05533827   -0.01201887    0.00000000    0.00000000
    0.85529308   -0.01881402    0.00000000    0.00000000    0.00000000
    0.62827991   -0.02483923    0.00000000    0.00000000    0.00000000
    0.36475877   -0.02747349    0.00000000    0.00000000    0.00000000
    0.07714968   -0.02951245    0.00000000    0.00000000    0.00000000

QUANTIZED MAGNITUDE COEFFICIENTS
    0.90625000    0.06250000   -0.01562500    0.00000000    0.00000000
    0.85937500   -0.01562500    0.00000000    0.00000000    0.00000000
    0.62500000   -0.03125000    0.00000000    0.00000000    0.00000000
    0.35937500   -0.03125000    0.00000000    0.00000000    0.00000000
    0.07812500   -0.03125000    0.00000000    0.00000000    0.00000000

HIGH RESOLUTION PHASE COEFFICIENTS
   45.59987369   -8.21962841    0.56115125    0.00000000    0.00000000
   11.19634121   -1.81687648    0.20273948    0.00000000    0.00000000
    2.21775407   -0.49795149    0.03187340    0.00000000    0.00000000
   -0.48523153   -0.08305597    0.01243970    0.00000000    0.00000000
   -0.51416691    0.05535186    0.00224611    0.00000000    0.00000000

QUANTIZED PHASE COEFFICIENTS
   45.5000000   -8.00000000    0.50000000    0.00000000    0.00000000
   11.0000000   -2.00000000    0.00000000    0.00000000    0.00000000
    2.0000000   -0.50000000    0.00000000    0.00000000    0.00000000
   -0.5000000    0.00000000    0.00000000    0.00000000    0.00000000
   -0.5000000    0.00000000    0.00000000    0.00000000    0.00000000
```

FIG. 108

```
MAGNITUDE BOUNDARIES:  0.40000   0.80000   1.20000   1.60000
PHASE BOUNDARIES:      0.30000   0.60000   1.10000   1.50000

NUMBER OF MAGNITUDE COEFFICIENTS:  3  2  2  2  2
NUMBER OF PHASE COEFFICIENTS:      3  3  3  3  3

RESOLUTION FOR THE MAGNITUDE COEFFICIENTS = [10 6]
RESOLUTION FOR THE PHASE COEFFICIENTS = [5 0]

HIGH RESOLUTION MAGNITUDE COEFFICIENTS
    0.90572699    0.05501441   -0.01210546    0.00000000    0.00000000
    0.85407485   -0.01862923    0.00000000    0.00000000    0.00000000
    0.62798784   -0.02480019    0.00000000    0.00000000    0.00000000
    0.36467786   -0.02744848    0.00000000    0.00000000    0.00000000
    0.07727800   -0.02954307    0.00000000    0.00000000    0.00000000

QUANTIZED MAGNITUDE COEFFICIENTS
    0.90625000    0.06250000   -0.01562500    0.00000000    0.00000000
    0.85937500   -0.01562500    0.00000000    0.00000000    0.00000000
    0.62500000   -0.03125000    0.00000000    0.00000000    0.00000000
    0.35937500   -0.03125000    0.00000000    0.00000000    0.00000000
    0.07812500   -0.03125000    0.00000000    0.00000000    0.00000000

HIGH RESOLUTION PHASE COEFFICIENTS
   45.70950167   -8.38908602    0.55507828    0.00000000    0.00000000
   11.18133448   -1.78603862    0.21178849    0.00000000    0.00000000
    2.20000004   -0.49019539    0.03246215    0.00000000    0.00000000
   -0.52273977   -0.08117988    0.01634184    0.00000000    0.00000000
   -0.51851993    0.05559208    0.00276230    0.00000000    0.00000000

QUANTIZED PHASE COEFFICIENTS
   15.0000000   -8.00000000    1.00000000    0.00000000    0.00000000
   11.0000000   -2.00000000    0.00000000    0.00000000    0.00000000
    2.0000000    0.00000000    0.00000000    0.00000000    0.00000000
   -1.0000000    0.00000000    0.00000000    0.00000000    0.00000000
   -1.0000000    0.00000000    0.00000000    0.00000000    0.00000000
NOTE: OVERFLOW OCCURRED WHERE NUMBER IS HIGHLIGHTED
```

FIG. 110

MAGNITUDE BOUNDARIES:  0.40000   0.80000   1.20000   1.60000
PHASE BOUNDARIES:      0.30000   0.60000   1.10000   1.50000

NUMBER OF MAGNITUDE COEFFICIENTS:  3  2  2  2  2
NUMBER OF PHASE COEFFICIENTS:      3  3  3  3  3

RESOLUTION FOR THE MAGNITUDE COEFFICIENTS = [8 4]
RESOLUTION FOR THE PHASE COEFFICIENTS = [6 0]

HIGH RESOLUTION MAGNITUDE COEFFICIENTS
```
 0.69557011   0.40713981  -0.19197683   0.00000000   0.00000000
 0.86436963  -0.08562743   0.00000000   0.00000000   0.00000000
 0.64059465  -0.11202000   0.00000000   0.00000000   0.00000000
 0.37863541  -0.12340319   0.00000000   0.00000000   0.00000000
 0.09155265  -0.13296471   0.00000000   0.00000000   0.00000000
```

QUANTIZED MAGNITUDE COEFFICIENTS
```
 0.68750000   0.43750000  -0.18750000   0.00000000   0.00000000
 0.87500000  -0.06250000   0.00000000   0.00000000   0.00000000
 0.62500000  -0.12500000   0.00000000   0.00000000   0.00000000
 0.37500000  -0.12500000   0.00000000   0.00000000   0.00000000
 0.06250000  -0.12500000   0.00000000   0.00000000   0.00000000
```

HIGH RESOLUTION PHASE COEFFICIENTS
```
46.65084465  -21.57873039   0.46607872   0.00000000   0.00000000
13.40947382   -7.04063939   1.09295164   0.00000000   0.00000000
 2.94596091   -2.90331317   0.46794467   0.00000000   0.00000000
-0.30352504   -0.40229341   0.13438928   0.00000000   0.00000000
-0.47285032    0.31594651   0.02097494   0.00000000   0.00000000
```

QUANTIZED PHASE COEFFICIENTS
```
 31.0000000  -22.00000000   0.00000000   0.00000000   0.00000000
 13.0000000   -7.00000000   1.00000000   0.00000000   0.00000000
  3.0000000   -3.00000000   0.00000000   0.00000000   0.00000000
  0.0000000    0.00000000   0.00000000   0.00000000   0.00000000
  0.0000000    0.00000000   0.00000000   0.00000000   0.00000000
```
NOTE: OVERFLOW OCCURRED WHERE NUMBER IS HIGHLIGHTED

FIG. 112
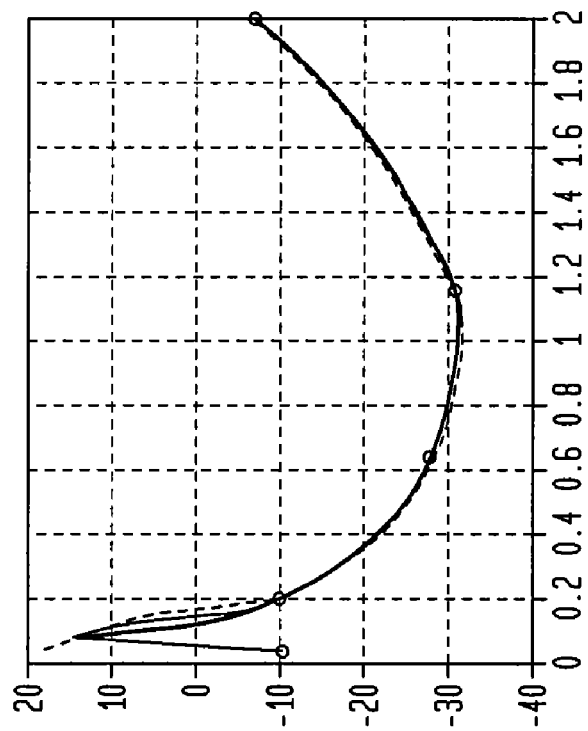
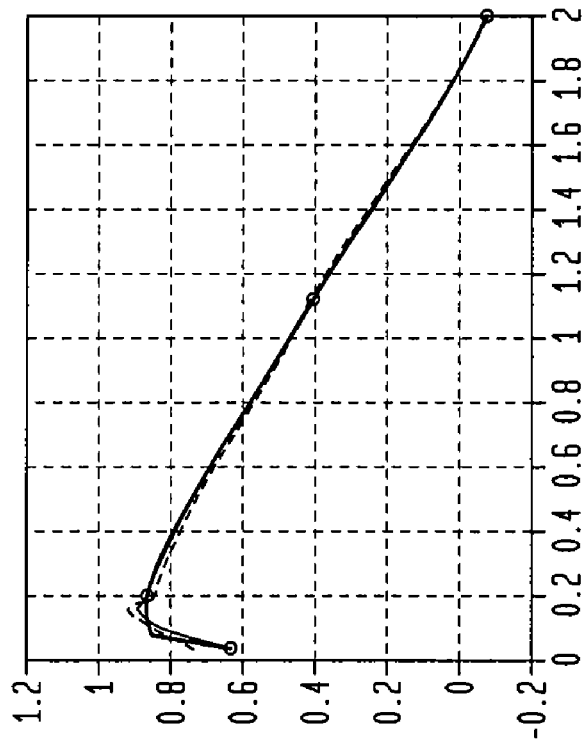

Magnitude Boundaries: 0.20000 1.10000 3.00000 3.00000
Phase Boundaries:    0.20000 0.65000 1.15000 3.00000

Number of Magnitude Coefficients: 3 4 4 4 4
Number of Phase Coefficients:     4 4 4 4 4

Resolution for the Magnitude Coefficients = [8 5]
Resolution for the Phase Coefficients     = [8 0]

High Resolution Magnitude Coefficients
  0.86620113  1.39103998 -17.66485340  0.00000000  0.00000000
  0.66445920 -0.56543029  -0.13899211  0.25721245  0.00000000
  0.13699755 -0.56597827   0.08923004  0.16233581  0.00000000
  0.00000000  0.00000000   0.00000000  0.00000000  0.00000000
  0.00000000  0.00000000   0.00000000  0.00000000  0.00000000

Quantized Magnitude Coefficients
  0.87500000  1.40625000 -4.00000000  0.00000000  0.00000000
  0.65625000 -0.56250000 -0.12500000  0.25000000  0.00000000
  0.12500000 -0.56250000  0.09375000  0.15625000  0.00000000
  0.00000000  0.00000000  0.00000000  0.00000000  0.00000000
  0.00000000  0.00000000  0.00000000  0.00000000  0.00000000

High Resolution Phase Coefficients
   7.92314183 -326.68756800 -3072.00649677 53133.89550753  0.00000000
 -23.54073364  -47.85180483    84.86785083    11.56150683  0.00000000
 -32.47467511   -3.54915643    20.58842067   -33.27779370  0.00000000
 -24.58050411   25.16484092    15.57528129     6.72539668  0.00000000
   0.00000000    0.00000000     0.00000000     0.00000000  0.00000000

Quantized Phase Coefficients
   8.00000000 -128.00000000 -128.00000000  127.00000000  0.00000000
 -24.00000000  -48.00000000   85.00000000   12.00000000  0.00000000
 -32.00000000   -4.00000000   21.00000000  -33.00000000  0.00000000
 -25.00000000   25.00000000   16.00000000    7.00000000  0.00000000
   0.00000000    0.00000000    0.00000000    0.00000000  0.00000000

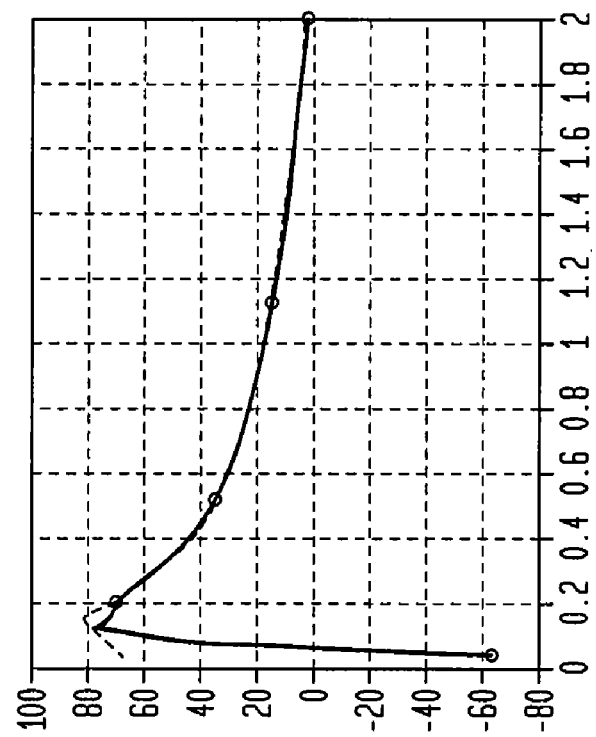
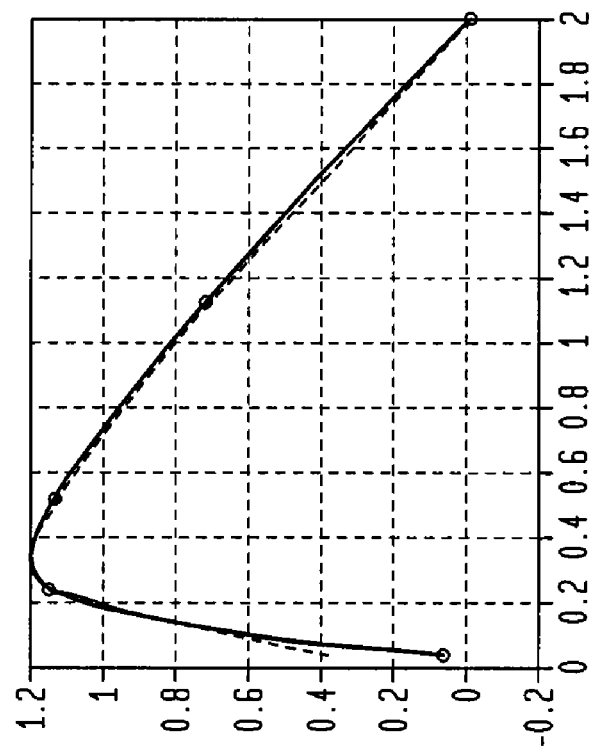
FIG. 116

Magnitude Boundaries:  0.25000  0.50000  1.10000  3.00000
Phase Boundaries:      0.20000  0.50000  1.10000  3.00000

Number of Magnitude Coefficients:  4  4  3  3  4
Number of Phase Coefficients:      4  4  4  4  4

Resolution for the Magnitude Coefficients = [8 5]
Resolution for the Phase Coefficients     = [8 0]

High Resolution Magnitude Coefficients
  0.72170805   5.01457953 -29.97123925  143.59746546   0.00000000
  1.19024109  -0.14111120  -3.38827448   10.63374608   0.00000000
  0.94959423  -0.67969513  -0.19680573    0.00000000   0.00000000
  0.35767975  -0.82451376  -0.04404400    0.00000000   0.00000000
  0.00000000   0.00000000   0.00000000    0.00000000   0.00000000

Quantized Magnitude Coefficients
  0.71875000   3.96875000  -4.00000000   3.96875000   0.00000000
  1.18750000  -0.15625000  -3.37500000   3.96875000   0.00000000
  0.93750000  -0.68750000  -0.18750000   0.00000000   0.00000000
  0.34375000  -0.81250000  -0.03125000   0.00000000   0.00000000
  0.00000000   0.00000000   0.00000000   0.00000000   0.00000000

High.Resolution Phase Coefficients
 77.05324787  118.75876713 -11642.47770405  110864.65345782   0.00000000
 47.24337496 -116.53995485   161.59689816    298.30415561   0.00000000
 21.83196064  -30.85813369    32.40377070    -42.95840447   0.00000000
  6.82335392  -13.37526810     4.00716801     -4.50299796   0.00000000
  0.00000000    0.00000000     0.00000000      0.00000000   0.00000000

Quantized Phase Coefficients
 77.00000000  119.00000000 -128.00000000  127.00000000   0.00000000
 47.00000000 -117.00000000  127.00000000  127.00000000   0.00000000
 22.00000000  -31.00000000   32.00000000  -43.00000000   0.00000000
  7.00000000  -13.00000000    4.00000000   -5.00000000   0.00000000
  0.00000000    0.00000000    0.00000000    0.00000000   0.00000000

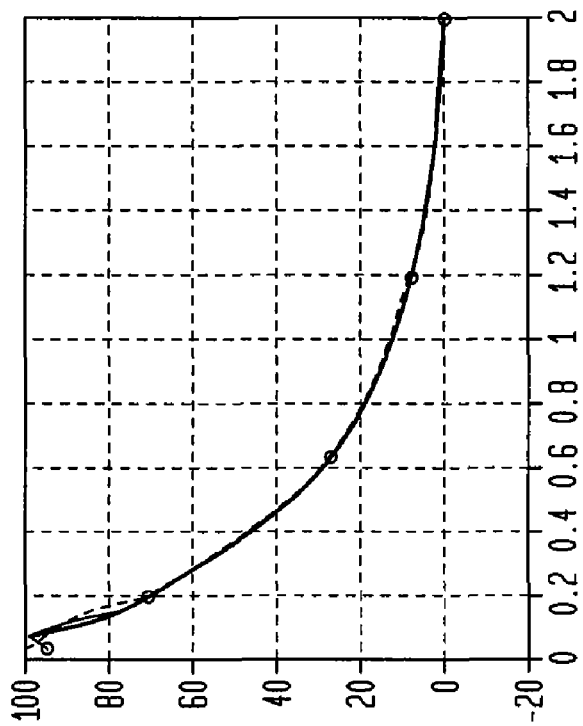
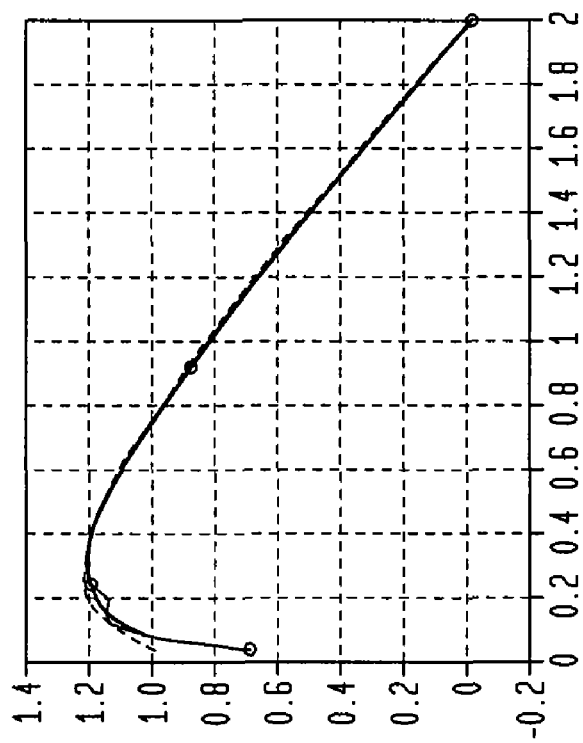
FIG. 120

Magnitude Boundaries:  0.25000  0.90000  3.00000  3.00000
Phase Boundaries:      0.20000  0.65000  1.20000  3.00000

Number of Magnitude Coefficients:  4  4  4  4  4
Number of Phase Coefficients:      4  4  4  4  4

Resolution for the Magnitude Coefficients = [8 5]
Resolution for the Phase Coefficients     = [8 0]

High Resolution Magnitude Coefficients
  1.12933538   1.35359378 -33.91379136 226.09217687  0.00000000
  1.11984904  -0.56054572  -0.69828599   1.02611897  0.00000000
  0.46122562  -0.83559638  -0.05612967   0.03647694  0.00000000
  0.00000000   0.00000000   0.00000000   0.00000000  0.00000000
  0.00000000   0.00000000   0.00000000   0.00000000  0.00000000

Quantized Magnitude Coefficients
  1.12500000   1.34375000  -4.00000000   3.96875000  0.00000000
  1.12500000  -0.56250000  -0.68750000   1.03125000  0.00000000
  0.46875000  -0.84375000  -0.06250000   0.03125000  0.00000000
  0.00000000   0.00000000   0.00000000   0.00000000  0.00000000
  0.00000000   0.00000000   0.00000000   0.00000000  0.00000000

High Resolution Phase Coefficients
 89.76867658 -319.41269310 -1141.44300578 26504.78009295  0.00000000
 46.57637049 -106.65610593    80.63032654    81.49142815  0.00000000
 14.56466718  -31.23221125    33.64164186   -36.55969035  0.00000000
  2.27597797   -8.97620969     9.12447105    -5.12839400  0.00000000
  0.00000000    0.00000000     0.00000000     0.00000000  0.00000000

Quantized Phase Coefficients
 90.00000000 -128.00000000 -128.00000000  127.00000000  0.00000000
 47.00000000 -107.00000000   81.00000000   81.00000000  0.00000000
 15.00000000  -31.00000000   34.00000000  -37.00000000  0.00000000
  2.00000000   -9.00000000    9.00000000   -5.00000000  0.00000000
  0.00000000    0.00000000    0.00000000    0.00000000  0.00000000

| SIGNAL | CONDITIONS | | Starburst96 WCDMA 1-1 | Starburst96 WCDMA 1-1 | Starburst96 WCDMA 1-1 | Required |
|---|---|---|---|---|---|---|
| | PERFORMANCE | ATTEN | 0.00 | 20.86 | 28.79 | |
| Pout (dBm) | | | 25.34 | 2.99 | -4.94 | |
| IccD (A) | | | 0.096 | 0.023 | 0.011 | |
| IccM (A) | | | 0.034 | 0.033 | 0.033 | |
| IccPA (A) | | | 0.217 | 0.013 | 0.005 | |
| PA Eff (%) | | | 43.8 | 9.2 | 3.8 | |
| Chip Eff (%) | | | 28.258 | 1.401 | 0.261 | |
| ACPR (dBc) | IS95 | WCDMA | L/U | L/U | L/U | |
| | 0.885 | 5.000 | (-35.3,-35.7) | (-36.0,-35.8) | (-35.2,-33.1) | -33 |
| | 1.980 | 10.000 | (-46.0,-46.0) | (-45.2,-43.1) | (-49.2,-46.5) | -43 |
| | EDGE | 0.200 | | | | |
| | | 0.250 | | | | |
| | | 0.400 | | | | |
| | | 0.600 | | | | |
| | | 1.200 | | | | |
| | | 1.800 | | | | |
| EVM (%rms) | | | 3.53 | 2.85 | 3.89 | 17.50 |
| Mag Error (%rms) | | | 2.47 | 2.12 | 3.16 | |
| Phase Error (%rms) | | | 1.45 | 1.09 | 1.30 | |
| Rho | | | 0.99875 | 0.99919 | 0.99849 | 0.94400 |
| Peak CDE (dB) | | | -37.2 | -39.3 | -36.0 | |
| IQ Offset (dB) | | | -35.6 | -41.3 | -45.2 | |

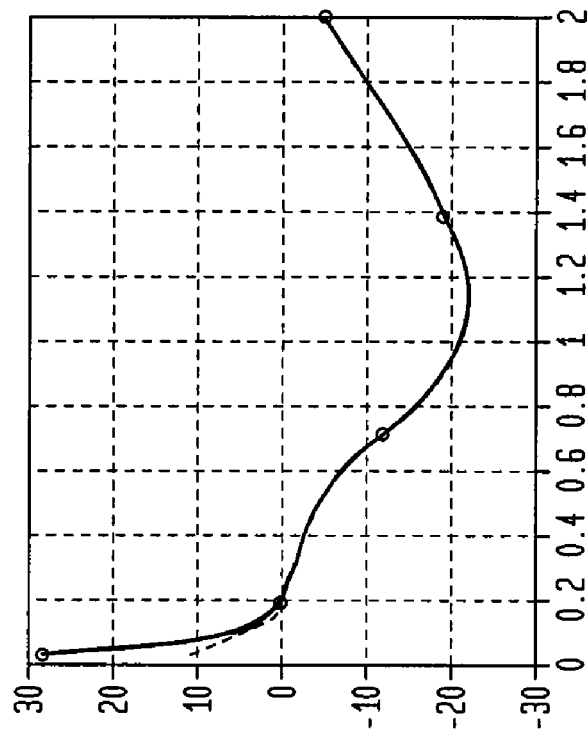
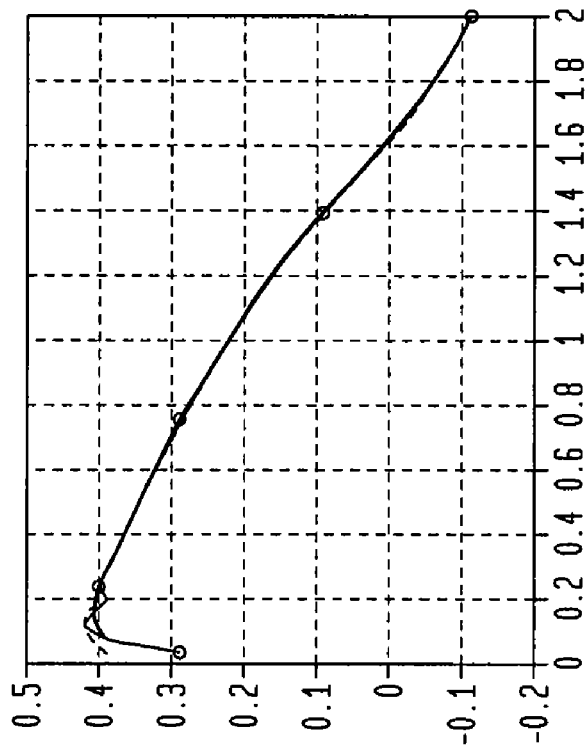
FIG. 125

Magnitude Boundaries:  0.25000  0.75000  1.40000  3.00000
Phase Boundaries:     0.20000  0.70000  1.40000  3.00000

Number of Magnitude Coefficients:  4  4  4  4  4
Number of Phase Coefficients:      4  4  4  4  4

Resolution for the Magnitude Coefficients = [11 8]
Resolution for the Phase Coefficients    = [11 3]

High Resolution Magnitude Coefficients
  0.41846583   0.01869306 -12.71866263  92.76107021  0.00000000
  0.34786545  -0.20651393  -0.00834021  -0.06532033  0.00000000
  0.19884415  -0.28114290  -0.08823326  -0.24960216  0.00000000
 -0.01887366  -0.35339569   0.17112233   0.08330667  0.00000000
  0.00000000   0.00000000   0.00000000   0.00000000  0.00000000

Quantized Magnitude Coefficients
  0.41796875   0.01953125  -4.00000000   3.99609375  0.00000000
  0.34765625  -0.20703125  -0.00781250  -0.06640625  0.00000000
  0.19921875  -0.28125000  -0.08984375  -0.25000000  0.00000000
 -0.01953125  -0.35156250   0.17187500   0.08203125  0.00000000
  0.00000000   0.00000000   0.00000000   0.00000000  0.00000000

High Resolution Phase Coefficients
   3.37011640  -80.40418197  1689.63408495 -14861.98609938  0.00000000
  -3.11781355  -14.96364900   -29.59966118    -99.36207851  0.00000000
 -21.20033185  -11.88151885    52.79644279     -5.56778021  0.00000000
 -13.33591037   24.41823198    11.06276571    -18.70738396  0.00000000
   0.00000000    0.00000000     0.00000000      0.00000000  0.00000000

Quantized Phase Coefficients
   3.37500000  -80.37500000  127.87500000  -128.00000000  0.00000000
  -3.12500000  -15.00000000  -29.62500000   -99.37500000  0.00000000
 -21.25000000  -11.87500000   52.75000000    -5.62500000  0.00000000
 -13.37500000   24.37500000   11.12500000   -18.75000000  0.00000000
   0.00000000    0.00000000    0.00000000     0.00000000  0.00000000

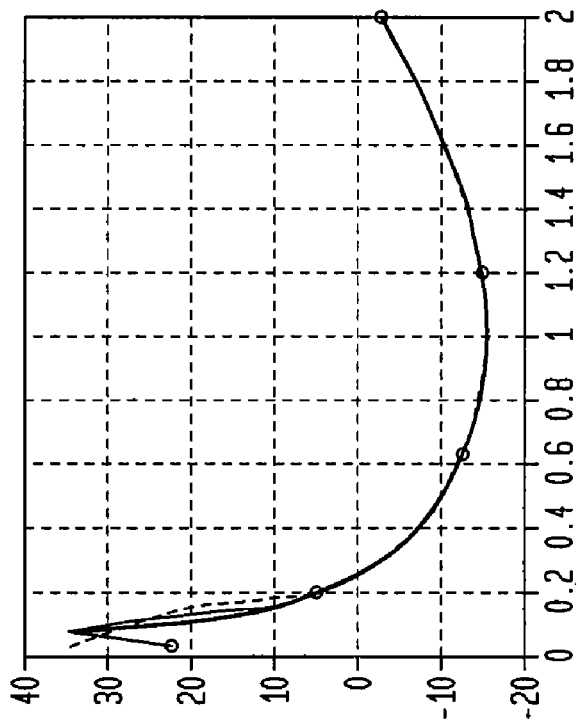
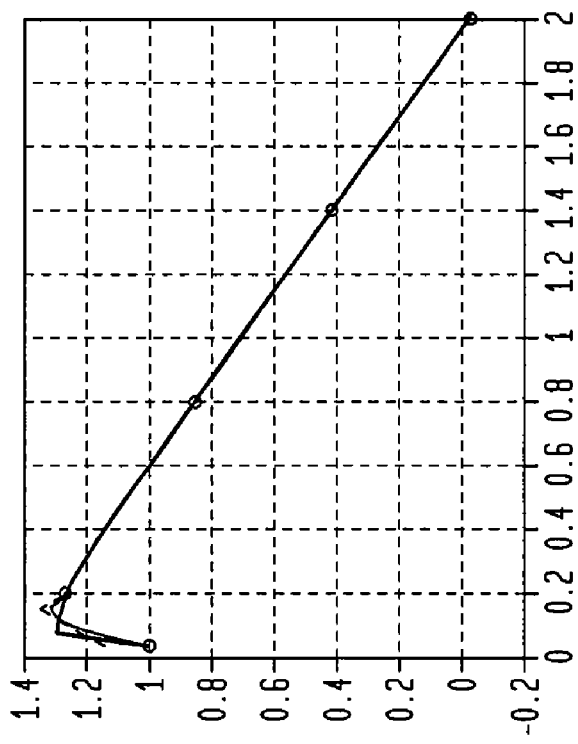
FIG. 129

Magnitude Boundaries: 0.20000 0.80000 1.40000 3.00000
Phase Boundaries:    0.20000 0.65000 1.20000 3.00000

Number of Magnitude Coefficients: 3 4 4 4 4
Number of Phase Coefficients:     4 4 4 4 4

Resolution for the Magnitude Coefficients = [11 8]
Resolution for the Phase Coefficients     = [11 3]

High Resolution Magnitude Coefficients
  1.29045431  1.61736562 -24.85066651  0.00000000  0.00000000
  1.08402863 -0.71355414  -0.18284246  0.39584769  0.00000000
  0.64680084 -0.72189295   0.00287598 -0.03567003  0.00000000
  0.20941695 -0.74037724  -0.00986042  0.04686393  0.00000000
  0.00000000  0.00000000   0.00000000  0.00000000  0.00000000

Quantized Magnitude Coefficients
  1.28906250  1.61718750 -4.00000000  0.00000000  0.00000000
  1.08593750 -0.71484375 -0.18359375  0.39453125  0.00000000
  0.64843750 -0.72265625  0.00390625 -0.03515625  0.00000000
  0.21093750 -0.74218750 -0.01171875  0.04687500  0.00000000
  0.00000000  0.00000000  0.00000000  0.00000000  0.00000000

High Resolution Phase Coefficients
  24.89565933 -380.13836032 -1777.91502434 42315.62000432  0.00000000
  -7.33586354  -35.19216936    92.61687434  -170.53580996  0.00000000
 -15.40562837   -4.11198975    19.28124644     2.82970754  0.00000000
 -10.56846997   15.83180299    10.10002566    -4.71826602  0.00000000
   0.00000000    0.00000000     0.00000000     0.00000000  0.00000000

Quantized Phase Coefficients
  24.87500000 -128.00000000 -128.00000000  127.87500000  0.00000000
  -7.37500000  -35.25000000   92.62500000 -128.00000000  0.00000000
 -15.37500000   -4.12500000   19.25000000    2.87500000  0.00000000
 -10.62500000   15.87500000   10.12500000   -4.75000000  0.00000000
   0.00000000    0.00000000    0.00000000    0.00000000  0.00000000

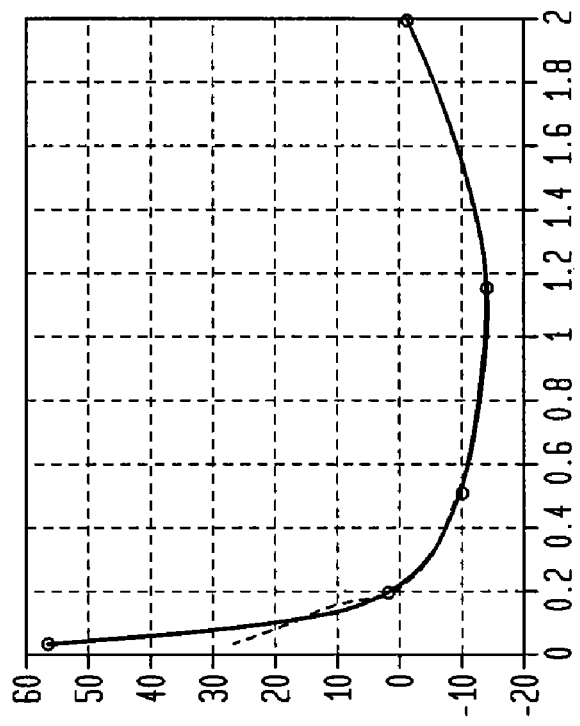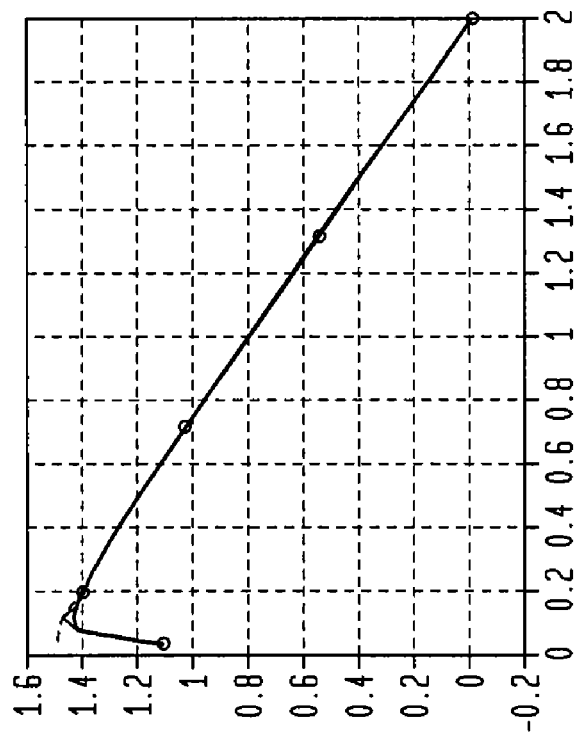
FIG. 133

Magnitude Boundaries: 0.20000 0.70000 1.30000 3.00000
Phase Boundaries:     0.20000 0.50000 1.15000 3.00000

Number of Magnitude Coefficients:  4 4 4 4 4
Number of Phase Coefficients:      4 4 4 4 4

Resolution for the Magnitude Coefficients = [11 8]
Resolution for the Phase Coefficients     = [11 3]

High Resolution Magnitude Coefficients
  1.46570099  -0.57764314  -34.02521727  374.85722776   0.00000000
  1.23749766  -0.73081653   -0.24854548    0.35607342   0.00000000
  0.79653748  -0.80507428   -0.00158399    0.02890374   0.00000000
  0.28226668  -0.81190638   -0.02194126    0.00400750   0.00000000
  0.00000000   0.00000000    0.00000000    0.00000000   0.00000000

Quantized Magnitude Coefficients
  1.46484375  -0.57812500  -4.00000000  3.99609375   0.00000000
  1.23828125  -0.73046875  -0.25000000  0.35546875   0.00000000
  0.79687500  -0.80468750   0.00000000  0.02734375   0.00000000
  0.28125000  -0.81250000  -0.02343750  0.00390625   0.00000000
  0.00000000   0.00000000   0.00000000  0.00000000   0.00000000

High Resolution Phase Coefficients
  15.29942467  -280.07140214  2161.20942325  -9319.92072291   0.00000000
  -6.50174584   -27.30764246    97.80615426   -386.31320573   0.00000000
 -13.06636930    -6.15032130     9.93598282     -4.00854108   0.00000000
 -10.01704860    15.75366643    11.01760572     -6.36435780   0.00000000
   0.00000000     0.00000000     0.00000000      0.00000000   0.00000000

Quantized Phase Coefficients
  15.25000000  -128.00000000  127.87500000  -128.00000000   0.00000000
  -6.50000000   -27.25000000   97.75000000  -128.00000000   0.00000000
 -13.12500000    -6.12500000    9.87500000    -4.00000000   0.00000000
 -10.00000000    15.75000000   11.00000000    -6.37500000   0.00000000
   0.00000000     0.00000000    0.00000000     0.00000000   0.00000000

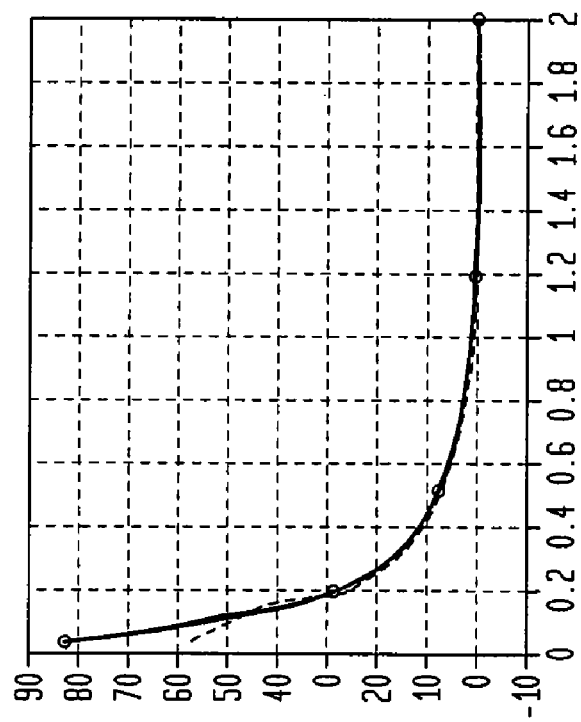
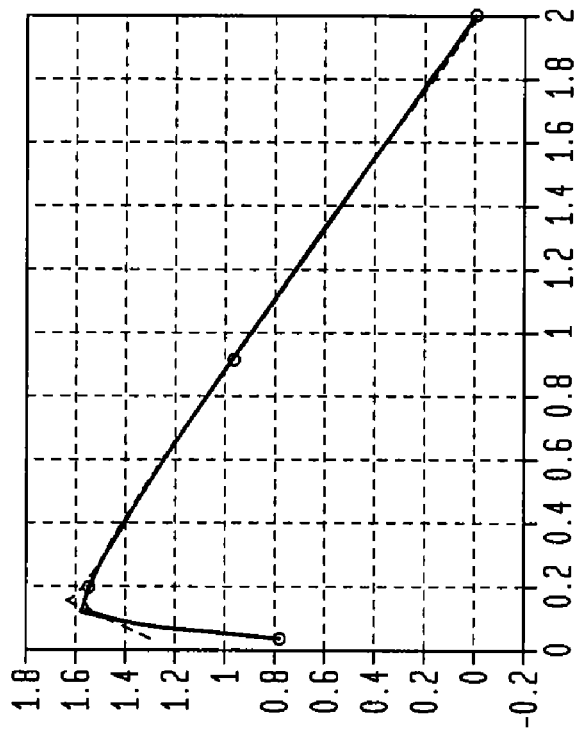
FIG. 137

Magnitude Boundaries: 0.20000 0.90000 3.00000 3.00000
Phase Boundaries:    0.20000 0.50000 1.20000 3.00000

Number of Magnitude Coefficients: 4 4 4 4 4
Number of Phase Coefficients:     4 4 4 4 4

Resolution for the Magnitude Coefficients = [8 5]
Resolution for the Phase Coefficients     = [8 0]

High Resolution Magnitude Coefficients
  1.53332427  2.55819898 -57.64390269 347.04098934  0.00000000
  1.27844696 -0.83469115  -0.16417423   0.23393771  0.00000000
  0.50335680 -0.90296221  -0.01694081   0.00512478  0.00000000
  0.00000000  0.00000000   0.00000000   0.00000000  0.00000000
  0.00000000  0.00000000   0.00000000   0.00000000  0.00000000

Quantized Magnitude Coefficients
  1.53125000  2.56250000 -4.00000000  3.96875000  0.00000000
  1.28125000 -0.84375000 -0.15625000  0.21875000  0.00000000
  0.50000000 -0.90625000 -0.03125000  0.00000000  0.00000000
  0.00000000  0.00000000  0.00000000  0.00000000  0.00000000
  0.00000000  0.00000000  0.00000000  0.00000000  0.00000000

High Resolution Phase Coefficients
 47.49905195 -325.01833983 1267.69894632 -2376.65790546  0.00000000
 13.42428130  -52.38563507  179.77202735  -484.82967787  0.00000000
  2.31219684   -9.22555313   18.12543080   -16.43259483  0.00000000
 -0.21233530    0.26604091    3.29774165    -5.69511563  0.00000000
  0.00000000    0.00000000    0.00000000     0.00000000  0.00000000

Quantized Phase Coefficients
 47.00000000 -128.00000000 127.00000000 -128.00000000  0.00000000
 13.00000000  -52.00000000 127.00000000 -128.00000000  0.00000000
  2.00000000   -9.00000000  18.00000000  -16.00000000  0.00000000
  0.00000000    0.00000000   3.00000000   -6.00000000  0.00000000
  0.00000000    0.00000000   0.00000000    0.00000000  0.00000000

$\Im_{CP_F} \triangle \Im \{$ MISO POWER SUPPLY, DRIVER POWER SUPPLY, MISO BIAS 1 AND 2, DRIVER BIAS 1 AND 2, VGA 1 AND 2, WAVEFORM STATE, OUT PHASING OFFSET, FILTER STATE, SAMPLE RATE, INTERPOLATION TIME DELAY, AUTO BIAS FUNCTION $\}$

↑ FUNCTIONAL CALIBRATION PARAMETERS

↑ OPERATIONAL CALIBRATION PARAMETERS

THIS EQUATION REPRESENTS "ERROR FUNCTION"

$$D_{\varepsilon_{RN}} \triangle \Im \{ \Im_{CP_F} \{ \Im_{CP_O} + \Im_{CP_M} \} \}$$

↑ MODULATION PARAMETERS

↑ OPERATIONAL CALIBRATION PARAMETERS

FUNCTIONAL CALIBRATION PARAMETERS
▲ GAIN
▲ FREQUENCY
▲ TEMPERATURE
▲ BATTERY VOLTAGE
▲ LOAD CONDITIONS

Calibration Memory Estimate for $D\varepsilon_R$

| | No. of Radials | | No. of Segments | | Resolution | | No. Coefficients | | Domain | | Sub Total |
|---|---|---|---|---|---|---|---|---|---|---|---|
| WCDMA | 1 | x | 10 | x | 8 | x | 4 | + | 80 | = | 400 bits (50 bytes) |
| EDGE | 32 | x | 8 | x | 11 | x | 4 | + | (10 x 11) | = | 11,374 bits (1421.75 bytes) |

FIG. 142

Operational Calibration Parameters $\widetilde{\mathfrak{I}}_{CP_o}$

- MISO Supply — 4 bytes
- Driver Supply — 4 bytes
- MISO Bias 1 & 2 — 8 bytes
- Driver Bias 1 & 2 — 8 bytes
- VGA 1 & 2 — 8 bytes
- Waveform State — 5 bytes
- Out Phasing Offset — 4 bytes
- Filter State — TBD
- Sample Rate — 4 bytes
- Interpolation Time Delay — 4 bytes
- Auto Bias Functions — 48 bytes
- TOTAL — 97 bytes

FIG. 143

Modulation Calibration Parameters $\widetilde{\Im}_{CP_M}$

- Upper I/Q Amplitude Balance      5 bits
- Lower I/Q Amplitude Balance      5 bytes
- Upper I/Q Phase Balance      5 bytes
- Lower I/Q Phase Balance      5 bytes
- $Bu_x$ Offset      6 bytes
- $Bu_y$ Offset      6 bytes
- $B\ell_x$ Offset      6 bytes
- $B\ell_y$ Offset      6 types
- TOTAL      50 bits $\approx$ 7 bytes

FIG. 144

Calibration Memory Totals (Estimate) in Bytes

| | $D_{\varepsilon_R}$ | | $\tilde{\mathfrak{J}}_{CP_O}$ | | $\tilde{\mathfrak{J}}_{CP_M}$ | | $\tilde{\mathfrak{J}}_{CP_F}$ (1000 states) | | |
|---|---|---|---|---|---|---|---|---|---|
| WCDMA | 50 | + | 97 | + | 7 | x | 1000 | = | 154,000 bytes |
| EDGE | 1422 | + | 97 | + | 7 | x | 1000 | = | 1.526 Mbytes |

FIG. 145

MULTI-DIMENSIONAL ERROR DEFINITION, ERROR MEASUREMENT, ERROR ANALYSIS, ERROR FUNCTION GENERATION, ERROR INFORMATION OPTIMIZATION, AND ERROR CORRECTION FOR COMMUNICATIONS SYSTEMS

CROSS-REFERENCE TO RELATED APPLICATIONS

The present application claims the benefit of U.S. Provisional Patent Application No. 60/860,481, filed Nov. 22, 2006, which is incorporated herein by reference in its entirety.

The present application is related to U.S. patent application Ser. No. 11/256,172, filed Oct. 24, 2005, now U.S. Pat. No. 7,184,723 and U.S. patent application Ser. No. 11/508,989, filed Aug. 24, 2006, now U.S. Pat. No. 7,355,470, both of which are incorporated herein by reference in their entireties.

BACKGROUND OF THE INVENTION

1. Field of the Invention

The present invention is related to multi-dimensional error definition, error measurement, error analysis, error function generation, error information optimization, and error correction for communication systems.

2. Background Art

System non-linearities may be compensated in real time if the non-linearities are known and fully characterized apriori or if they can be approximated "on the fly."

"On the fly" calculations are power consuming and require large silicon real estate. Compensation techniques based on apriori knowledge, on the other hand, typically rely heavily on memory and DSP (Digital Signal Processing) algorithms.

Feedback techniques compensate for long term effects such as process drift, temperature change, aging, etc. However, having a finite feedback loop, practical considerations of sample rate and stability limit feedback techniques in terms of correction of real time signal anomalies.

Feed forward techniques may, in theory, correct for virtually every non-linearity in a system. However, feed forward techniques come at a significant price in complexity as well as efficiency.

There is a need therefore for efficient error definition, error measurement, error analysis, error function generation, error information optimization, and error correction techniques.

BRIEF SUMMARY OF THE INVENTION

The present invention is related to multi-dimensional error definition, error measurement, error analysis, error function generation, error information optimization, and error correction for communication systems.

Novel techniques are provided herein. These techniques can be applied to a myriad of applications for which an input to output transfer characteristic must be corrected or linearized. This disclosure will show that systems that process signals or inputs, which can be described by complex math in 2 dimensions, can also possess a corresponding complex output signal description that may be compared to some ideal desired output signal. The difference between the measured and ideal is associated with an error function or error data, $D_{\epsilon_R}$, and can be exploited to compensate the system.

$D_{\epsilon_R}$ begins as a raw data set from the above described comparison and morphs into a compact mathematical description which eliminates the requirement to store all compared data points of the original difference measurements. This compact mathematical description may further be optimized in 2, 3, or higher order dimensions to minimize the amount of data stored using a variety of techniques and principles associated with approximation theory, data fitting, interpolation theory, information theory, tensor analysis, spline theory, as well as a plethora of disciplines related to geometric modeling.

This approach permits a convenient partition of resources in the VPA (Vector Power Amplification) application. Some extensive data processing can be accomplished off line in 'non real time', which characterizes the compact mathematical descriptions. Once the 'off line' number calculation is complete, the compact formulation is stored in the form of coefficients in a memory. The memory possesses a description of $D_{\epsilon_R}$ that hardware can utilize to provide corrective compensation in a 'real time' application very efficiently.

VPA based designs utilizing these techniques maintain excellent performance metrics while maintaining high power efficiency for many types of waveform standards in a unified design, with only a modest amount of memory and associated correction hardware. This blend of attributes is exceedingly desirable and can be flexibly tailored using the principles provided herein.

According to embodiments of the present invention, error can be described $D_{\epsilon_R}$, processed, and geometrically interpreted. Raw error data is assigned to coordinates of a 2, 3, or higher order dimensional space. Then contours, surfaces, and manifolds can be constructed within the space to fit the raw data in an optimal sense subject to some important criteria. These contours, surfaces, and manifolds can be described in terms of convenient functions with a minimum amount of memory over specified domains, and may be used to reconstruct interpolated data over a continuum of points, reconstructing new data sets many orders of magnitude larger than the original memory used to describe the various original geometrical structures and their domains. Furthermore, the memory based algorithm can execute in 'real time' hardware very efficiently, thereby rendering practical designs.

All manners of compensation requirements are contemplated by the techniques provided herein. Temperature effects, power supply drift, power gain variations, process variation and many other imperfections can be addressed as parameters of the compensation space or dimensions of the compensation space. In this manner, a high order geometrical interpretation of $D_{\epsilon_R}$ can characterize system errors for virtually all imperfections, including the non-linearities of the input/output transfer characteristic. This does not preclude the simultaneous use of slow feedback adjustments to assist the open loop algorithm to enhance yield or increase performance.

Embodiments of the present invention provided herein advocate the compact formulation of correction and calibration functions which reduces memory requirements as well as computational time and associated math operations related to VPA operation. Embodiments are addressed to VPA applications. However, they can be applied to any linear or non-linear system which can be represented in an N order geometrical description.

Embodiments of the present invention introduce methods for characterizing a distorted space by mathematical functions or describing non-linearities of trajectories through the space by functions, apply these descriptions to some definition of an error function $D_{\epsilon_R}$, then use $D_{\epsilon_R}$ to either linearize the space or correct non-linearities within the functional trajectories. The proposed techniques are specifically applied to D2P VPA compensation and correction. Typically, RF power amplifiers are compensated with real time feed forward or feed back loops which seek to reduce intermod products by 'on the fly analog circuits' or DSP algorithms. Such approaches do not reconstruct general mathematical functional descriptions of errors prior to execution. Rather, errors are manipulated point by point in virtual real time on the fly with algorithmic convergence determined by control loops. In contrast, the algorithms provided herein fully describe an N-dimensional space by mathematical functions such that the distortion of the space is completely known apriori without storing raw data from the space. Only the data required to describe spatial distortion is stored. This provides a significant advantage in data storage requirements to achieve a specified performance for the VPA.

According to embodiments of the present invention, error information is related to a geometric shape, or contour of the space, and significantly related to the 'tension' or 'latent energy' of the space, not directly to point wise errors encountered in time as the application runs. This approach permits much more efficient calculations which transform scalars, vectors, tensors, and indeed the space itself, and can be accommodated by linear algebra.

BRIEF DESCRIPTION OF THE FIGURES

Embodiments of the present invention will be described with reference to the accompanying drawings, wherein generally like reference numbers indicate identical or functionally similar elements. Also, generally, the leftmost digit(s) of the reference numbers identify the drawings in which the associated elements are first introduced.

FIG. 6 illustrates example WCDMA constellations with and without distortion.

FIG. 55 illustrates example patch grids.

FIGS. 80-84 illustrate example results using an extended polynomial fitting technique.

FIGS. 85-90 illustrate example results using an I and Q explicit polynomial fitting technique.

FIGS. 93-94 illustrate example results using the Least Squares Fit algorithm for a 0 db attenuation case.

FIGS. 95-96 illustrate example results using the Minimax Fit algorithm for a 0 dB attenuation case.

FIGS. 97-98 illustrate example results using the Chebyshev Fit algorithm for a 0 dB attenuation case.

FIGS. 99-100 illustrate example results using the Least Squares Fit algorithm for a 22 dB attenuation case.

FIGS. 101-102 illustrate example results using the Minimax algorithm for a 22 dB attenuation case.

FIGS. 103-104 illustrate example results using the Chebyshev Fit algorithm for a 22 dB attenuation case.

FIGS. 105-106 illustrate example results using the Least Squares Fit algorithm for a 40 dB attenuation case.

FIGS. 107-108 illustrate example results using the Minimax Fit algorithm for a 40 dB attenuation case.

FIGS. 109-110 illustrate example results using the Chebyshev Fit algorithm for a 40 dB attenuation case.

FIGS. 111-114 illustrate example results using an upgraded multi radial algorithm for a 0 dB attenuation case.

FIGS. 115-118 illustrate example results using an upgraded multi radial algorithm for a 22 dB attenuation case.

FIGS. 119-122 illustrate example results using an upgraded multi radial algorithm for a 31 dB attenuation case.

FIG. 123 provides a performance summary of the multi radial algorithm for a WCDMA1-1 waveform.

FIGS. 124-139 illustrate example performance results using a radial starburst technique.

FIG. 140 provides a performance summary of the radial starburst technique for an EDGE waveform.

FIG. 141 illustrates functional relationships of calibration parameters.

FIG. 142 illustrates example calibration memory estimates for $D_{\epsilon_R}$ for WCDMA and EDGE.

FIG. 143 illustrates example memory requirements for operational calibration parameters.

FIG. 144 illustrates example memory requirements for modulation calibration parameters.

FIG. 145 illustrates example total memory requirements for WCDMA and EDGE.

DETAILED DESCRIPTION OF THE INVENTION

Figure 1:
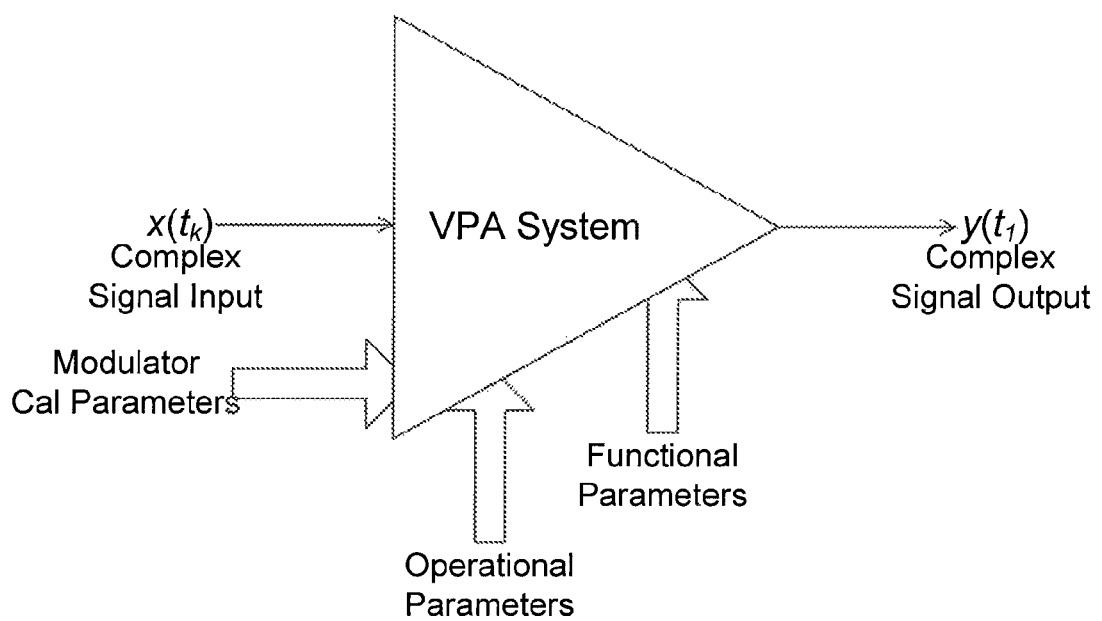
FIG. 1 illustrates an example VPA system.

1. INTRODUCTION . . . 11
 (A) SYSTEM PARADIGM . . . 13
2. VOLTERRA BASED MODELS . . . 15
3. REAL TIME COMPENSATION . . . 17
4. OTHER APPROACHES . . . 18
5. VPA CALIBRATION THEORY . . . 19
 (A) CALIBRATION WAVEFORMS . . . 19
  (i) Star Burst . . . 22
  (ii) Signaling Memory . . . 27
  (iii) Comments on PAPR, Heating, Sweep Rate . . . 29
  (iv) Error Mapping . . . 29
  (v) Real Time Feed Forward Algorithm Interaction with VPA Signal Processing Flow . . . 33
6. BUILDING ERROR FUNCTIONS . . . 34
 (A) $D\epsilon_R$ DATA AND FUNCTION . . . 34
 (B) EXAMPLE VPA ERROR PLOT FOR $D\epsilon_{ER}$ . . . 35
 (C) EFFICIENT ERROR GRADIENTS . . . 37
  (i) Error in the Complex Plane . . . 39
 (D) EXAMPLE OF RADIAL SAMPLING CONTOUR IN COMPLEX PLANE . . . 41
  (i) Averaged Weighting . . . 42
 (E) MULTIPLE RADIAL SAMPLING ARMS . . . 43
 (F) COMPARISON OF CIRCULAR SAMPLING AND RADIAL . . . 45
 (G) JOINT SAMPLING APPROACH . . . 46
  (i) Cross Correlation . . . 46
  (ii) Radial to Radial Correlation . . . 48
  (iii) Circle to Circle Correlation . . . 49
 (H) SAMPLING DENSITY AND SAMPLE RATE . . . 49
  (i) Sampling Density . . . 52
 (I) INTERMEDIATE SUMMARY . . . 52
7. APPROXIMATION THEORY . . . 53
 (A) FITTING . . . 54
  (i) Polynomial Fitting . . . 55
 (B) INTERPOLATION . . . 57
  (i) Newton's Formula . . . 59
  (ii) Lagrange Interpolation . . . 60
  (iii) Hermitian (Oscullatory) Interpolation . . . 61
 (C) APPROXIMATION BY ORTHOGONAL FUNCTIONS . . . 62
 (D) LEAST SQUARES REVISITED . . . 64
8. PIECEWISE POLYNOMIALS AND SPLINES . . . 66
 (A) CUBIC B SPLINE . . . 67
 (B) SMOOTHING . . . 69
 (C) POLAR SPLINES . . . 71
 (D) RELEVANCE OF THE SAMPLING THEOREM . . . 72
 (E) B SPLINE TRANSFORM . . . 74
9. SURFACE FITTING . . . 76
 (A) BI-CUBIC SURFACE B-SPLINES . . . 76
10. PATCHES AND SPLOTCHES . . . 78
 (A) POLYNOMIAL BASED PATCH INTERPOLATION . . . 79
11. TENSOR APPLICATIONS . . . 80
 (A) BASIC TENSOR OPERATOR APPLICATION . . . 82
12. MISCELLANEOUS RELATED TOPICS . . . 83
 (A) INFORMATION CONTENT . . . 83
13. EXAMPLES FOR CONSTRUCTION OF $D\epsilon_R$ . . . 87
 (A) 2D EXAMPLE USING STARBURST . . . 87
 (B) 3D $D\epsilon_R$ EXAMPLE . . . 89
 (C) IMPROVEMENTS IN 3-D POLYNOMIAL FIT . . . 90
 (D) EXPANDED 2_D TOOL PERFORMANCE . . . 93

(E) EXTENSION OF 2-D TECHNIQUE WITH EXPLICIT I, Q COMPONENT POLYNOMIAL FIT... 94
(F) HEAD TO HEAD COMPARISON FOR THREE GENERATION I ALGORITHMS... 94
(G) UPGRADED MULTI RADIAL ALGORITHMS FOR WCDMA1_1... 95
(H) EDGE APPLICATIONS... 96
(I) INTERIM SUMMARY... 97
14. HARDWARE FOR 'REAL TIME OPERATION'... 98
(A) POLYNOMIAL INTERPOLATOR... 98
(B) SPLINE INTERPOLATOR... 100
   (i) Filter Based Spline Interpolator... 101
15. SUMMARY... 101
16. APPENDIX A—BIBLIOGRAPHY... 105
17. APPENDIX B... 109
(A) EQUATION OF A RADIAL LINE IN RECTANGULAR AND POLAR COORDINATES... 109
(B) EQUATION OF CIRCLE IN CARTESIAN AND POLAR COORDINATES... 110
(C) CUBIC B SPLINE IN POLAR COORDINATES... 110
(D) GRADIENTS IN CARTESIAN AND CYLINDRICAL COORDINATES... 110
18. APPENDIX C... 111
(A) METHODS... 111
   (i) Input Signals... 111
   (ii) Analysis and Weighting Functions... 112
   (iii) Minimize... 112
   (iv) Output Measurement... 112
   (v) Formulated 2-D $D\epsilon_R$ Description... 112
   (vi) Create Efficient Multi-Dimensional Descriptions of $D\epsilon_R$... 113
   (vii) Store Coefficients and Domains... 113
   (viii) Real Time Application... 113
   (ix) Features and Advantages of the Invention... 114
   (x) Measurement Claims... 116
   (xi) 2-D Fundamental Kernel Claims... 116
   (xii) Create 2-D and 3-D Description Claims... 116
   (xiii) N-Dimensional Processing Claims... 117
(B) PRE DISTORTION CASE COMPARISON... 118
(C) SUMMARY... 119

1. INTRODUCTION

The following sections provide an overview of Vector Power Amplification (VPA) compensation with a theoretical basis and a presentation of various solutions at a high level. Some of these solutions are described in relative detail. Primarily, techniques of approximating hyper geometric manifolds in multi dimensional space and subset solutions are provided. These techniques can be used to generate an efficient functional description of the VPA transfer characteristic that is being corrected or compensated. Systems and methods of RF power transmission, modulation, and amplification also referred to herein as Vector Power Amplification (VPA) are described in related U.S. patent application Ser. No. 11/256,172, filed Oct. 24, 2005, now U.S. Pat. No. 7,184,723 and U.S. patent application Ser. No. 11/508,989, filed Aug. 24, 2006, now U.S. Pat. No. 7,355,470, both of which are incorporated herein by reference in their entireties.

Solutions in 2 or 3 dimensions are discussed and the higher order spatial solutions are extrapolated inductively from the easier to assimilate lower order cases. The low order N=2, 3 solutions are minimal spatial geometries and are considered fundamental spatial kernels for higher order geometries consisting of many dimensions or parameters.

Sections 1 to 4 set the stage for understanding the basic need for compensation. Section 5 provides some background theoretical insights. Section 6 provides some detail of error gradients related to the transfer characteristic of the VPA. Section 7 provides a survey of basic approximation theory, which is relevant to estimating error gradients while minimizing data requirements. Section 8 covers spline concepts. Section 9 addresses surface fitting using splines and other techniques.

Section 14 provides some detailed examples which apply various theoretical aspects to solving VPA compensation problems. These examples incorporate ideas of approximation, interpolation, fitting, smoothing as well as correction functions, which are applied to enhance the VPA performance.

Embodiments provided herein permit the compact formulation of correction and calibration functions that reduce memory requirements as well as computational time and associated math operations related to VPA operation. Although embodiments are described with respect to VPA applications, they can also be readily applied to any non-linear system that can be represented using an N order geometrical description. Embodiments herein illustrate this general idea and support it with an appropriate mathematical basis. The applications of the theories disclosed herein for compensating non-linear electronic systems described in N order geometrical terms, are believed to be new and unique.

Embodiments of the present invention enable the characterization of distorted space or non-linearities of trajectories through space using mathematical functions. Further, embodiments permit the application of these characterizations to a given error function $D_{\epsilon_R}$ and the use of $D_{\epsilon_R}$ to either linearize the distorted space or correct non-linearities within the functional trajectories. Proposed techniques are particularly applicable to Direct2Power (D2P) VPA compensation and correction.

Typically, radio frequency (RF) power amplifiers are compensated with real time feedforward or feedback loops, which seek to reduce intermodulation products using 'on the fly analog circuits' or digital signal processing (DSP) algorithms. Such approaches do not reconstruct general mathematical functional descriptions of errors prior to execution. Rather, errors are manipulated point by point in virtual real time. In contrast, embodiments of the present invention generate an N dimensional space using mathematical functions such that the distortion of the space is completely known apriori without storing raw data from the space. Only the data required to describe spatial distortion is stored. This provides a significant advantage in data storage requirements to achieve a specified performance of the VPA.

(a) System Paradigm

A portion of this disclosure focuses on obtaining descriptions for $D_{\epsilon_R}$. Such descriptions are required to obtain memory efficient implementations in practice.

Among the factors that influence $D_{\epsilon_R}$ are the following:
Architecture
Process
Operational Calibration Parameters
Modulation Calibration Parameters
Functional Parameters Consider the following system paradigm, which is illustrated in FIG. 1. This paradigm is useful for interpreting the interaction of the VPA and the compensation or calibration process. The following basic definition applies:
A VPA Calibration State consists of all variables, functions, configurations, and operations which can affect the system in such a manner to impact the initial state of the VPA and ongoing calibration status. This definition includes consideration of hardware, software, firmware, and support equipment.

The VPA Calibration State is defined by its mathematical and configuration status, which is generally related to:

Calibration Parameters
  Operational
  Functional
Modulation Calibration Parameter
System Error Function ($D_{\epsilon_R}$)
Stimulus Profile
Response Profile The Calibration Parameters and Modulation Parameters interact with $D_{\epsilon_R}$. This interaction is important and affects various significant attributes of the VPA. Functional and Operational Parameters include several parameters as shown below.

Figure 2:
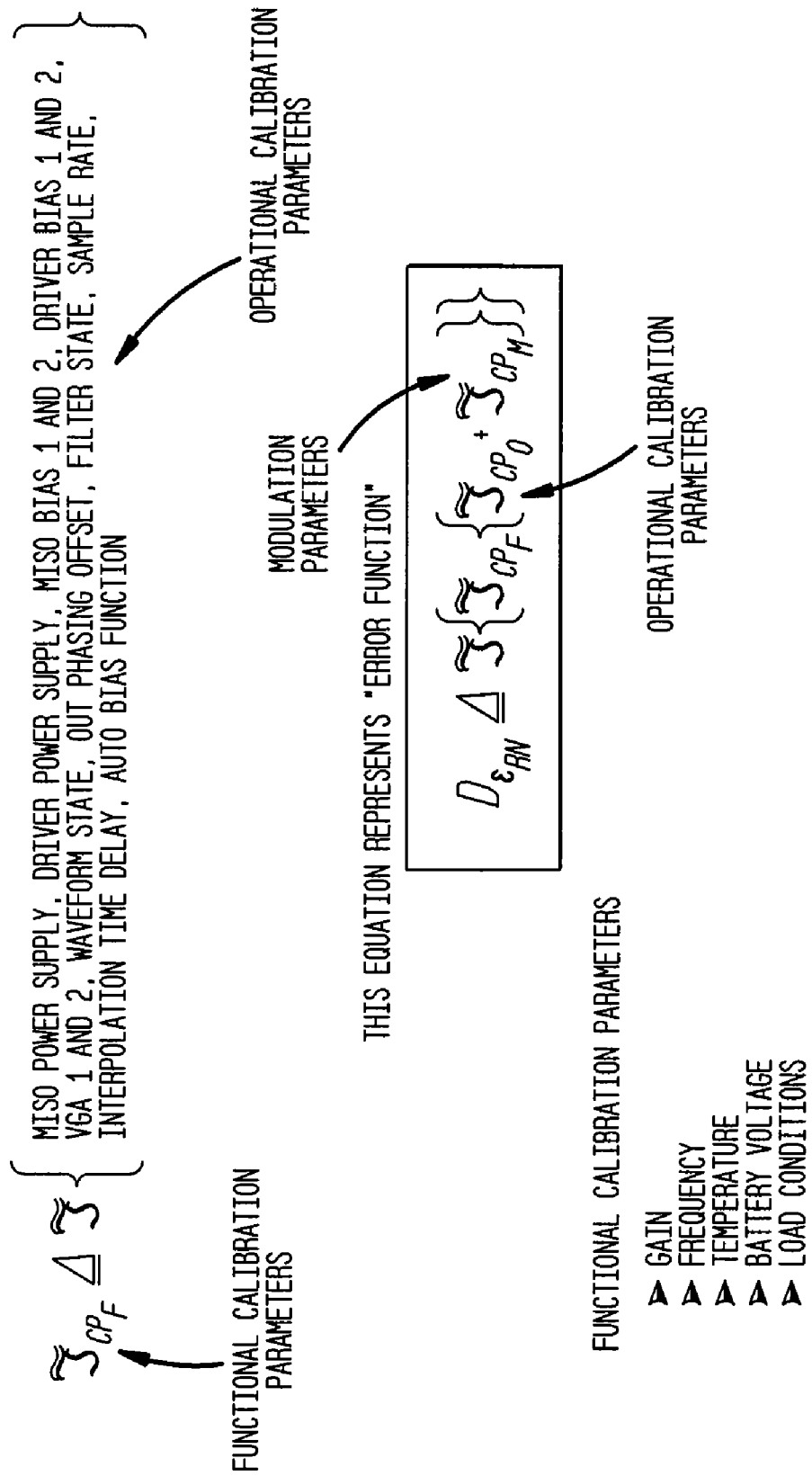
FIG. 2 illustrates functional interrelationships between parameters that affect a VPA system.

Operational Calibration Parameters
  MISO Power Supply
  Driver Supply
  MISO Bias 1 and 2
  Driver Bias 1 and 2
  VGA 1 and 2
  Waveform State
  Out Phasing Offset
  Filter State
  Sample Rate
  Interpolation Time Delays
  Auto Bias Function
Functional Calibration Parameters
  Gain
  Frequency
  Temperature
  Battery Voltage
  Load Conditions Modulation calibration parameters include, among others, factors within the system which are required to align modulation domain functions such as:

Gain Balance (for all system symmetric functions)
  Phase Balance (for all system symmetric functions)
  Orthogonality
  DC Offset The functional interrelationships between Functional Calibration Parameters, Operational Calibration Parameters, and Modulation Parameters are illustrated in FIG. 2.

The techniques provided herein which apply to descriptions of $D_{\epsilon_R}$ can also be applied to Operational, Functional, and Modulation parameters. In fact, some of the parameters are explicitly inducted to augment the spatial geometric description of $D_{\epsilon_R}$. In particular, functional parameters are always implicitly assumed to be a part of the $D_{\epsilon_R}$ space for $R^N$ where N>3. Such partitioning is not entirely arbitrary since it can affect the solution for efficient implementation in hardware, software, and firmware. However, such partitions are not essential for the theoretical disclosures which follow.

$\tilde{S}_{CP_F}$, $\tilde{S}_{CP_O}$, $\tilde{S}_{CP_M}$, illustrated in FIG. 2, are known to be quantities which relate to physical parametrics, adjustments, process variations, etc. Therefore, they are random variables. In their treatment below, it can be assumed that each is parameter an average or mean value.

2. VOLTERRA BASED MODELS

An ideal VPA would reproduce a complex passband waveform, at power, given its baseband complex description. That is, the VPA possesses a complex baseband input waveform description and renders an output RF waveform, on frequency, at power. The complex envelope of desired, processed waveforms should not be distorted in the process of frequency translation and power amplification. However, practical solutions do create distortions in the complex signal envelope which must be corrected to some prerequisite standard.

The input waveform is a composite of in phase (I) and quadrature phase (Q) components which can be represented as an ordering of complex values in time;

$$x(t) = I(t) + jQ(t)$$

The magnitude of x(t) can be calculated from $$|x(t)| = \sqrt{(I(t))^2 + (Q(t))^2} = r(t)$$

The phase of the signal is found from $$\Theta(t) = \arctan\left(\frac{Q(t)}{I(t)}\right)$$

$\Theta(t)$ requires additional processing to resolve the angular quadrant due to ambiguities of the arctan( ) function. This is accomplished by tracking the signs of I(t) and Q(t). The complex envelope signal representation after amplification and frequency translation of x(t) can be written as;

$$y_P(t) = a_0 r(t) e^{j(\Theta(t) + \omega_c(t))}$$

A complex phasor notation is adopted for convenience.

$y_P(t)$ is never achieved in practice as given by the simple formula. The reason is that the VPA is a non-linear device. These non-linearities are manifested in the magnitude and phase domains. That is, r(t) and $\Theta(t)$ are both typically distorted and cannot be represented purely as previously described.

A model of particular theoretical interest and historical significance provides insight into the distortion mechanisms. This model, the Volterra model, is presented graphically in FIG. 3. $y_P(t)$ in the non-linear system model of FIG. 3 can be written as:

$$y(t)_p = a_0 x(t) + a_1 \int_0^\infty h(\tau_1) x(t - \tau_1) d\tau_1 + a_2 \int_0^\infty \int_0^\infty h_2(\tau_1, \tau_2) x(t - \tau_1) x(t - \tau_2) d\tau_1 d\tau_2 \ldots$$

Figure 3:
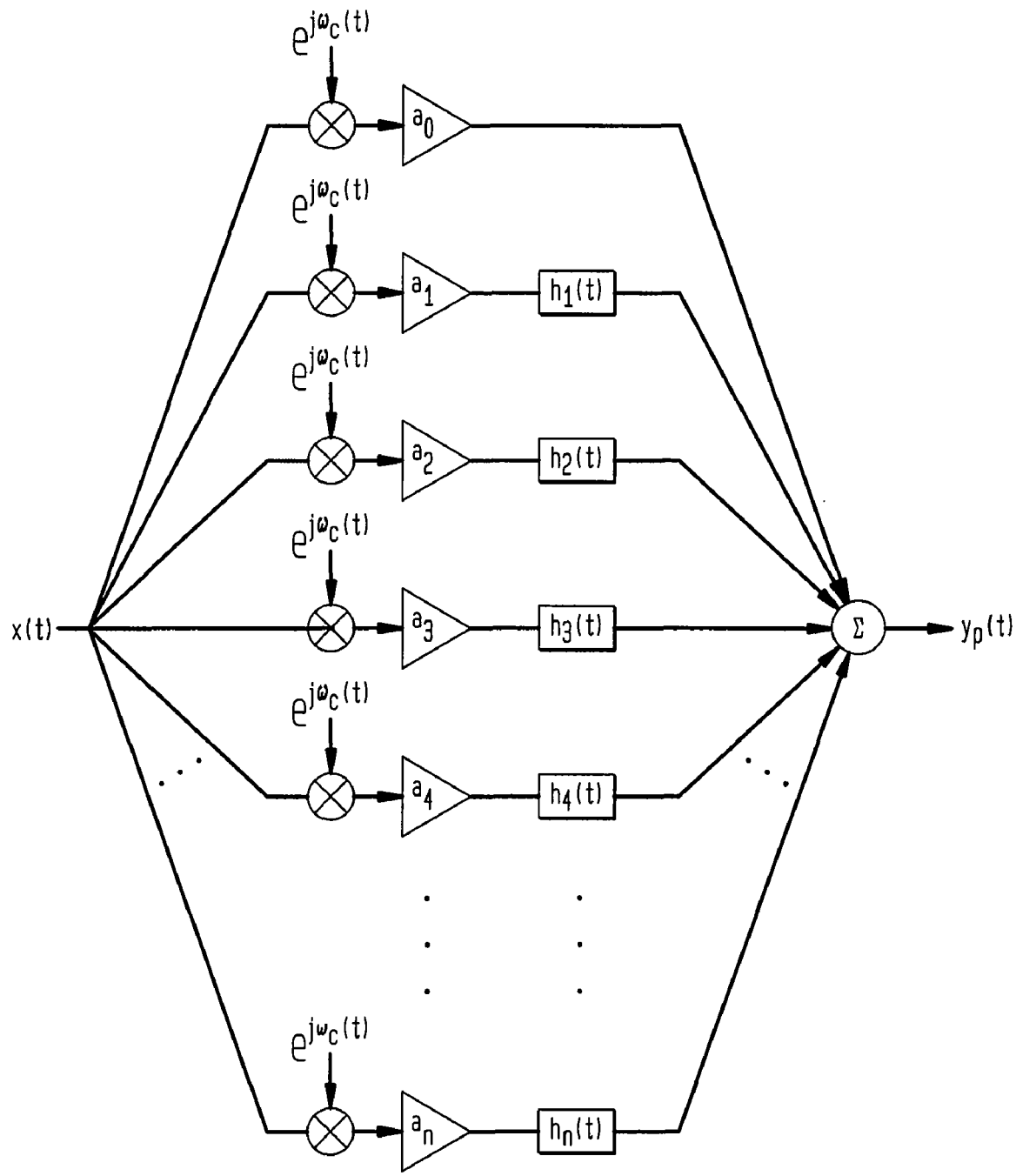
FIG. 3 illustrates an example Volterra model.

Notice that the first branch, with gain $a_0$, produces the exact desired result, $y_P(t)$, if frequency translation is assumed (note that frequency translation is not explicitly described in the convolution kernels provided in FIG. 3 for simplification). Harmonics of the bandpass do arise from the non-linearities and are manifest at bandpass center frequencies of $m \cdot \omega_c$ where $m = 2 \ldots \infty$. Nevertheless, these channel harmonics are implicitly assumed and not explicitly illustrated by the block diagram. $h_1(t) \ldots h_n(t)$ are impulse responses which are typically fixed but may or may not be known. They vary as a function of temperature, power level, and other parameters.

The block diagram of FIG. 3 illustrates some important aspects of the model:

Multi convolution kernels in the parallel branches give rise to components in the output signal related to x(t), $x^2(t)$, $x^3(t) \ldots x^n(t)$;
  The branches may possess memory;
  Each branch can operate independently; and
  All branches operate in parallel and obtain a result using superposition at the output.

It is readily apparent by inspection that r(t) and $\Theta(t)$ cannot be easily preserved unless the branches in parallel with the first branch are null, or unless the parallel impulse responses are constants. Neglecting these two degenerate cases, significant distortion of the complex envelope is likely due to the impulse responses $h_1(t), h_2(t) \ldots$.

The remainder of this disclosure focuses on the effect of the parallel branches on the envelope and on compensation techniques according to the present invention which can reduce the relative impact of the parallel branches on performance. Certain approaches attempt to directly measure all the elements in each branch of the model of FIG. 3 and generate the Volterra model explicitly. Once the model is generated, suitable compensation may be designed to counter the effects of each branch. The approach provided herein acknowledges the mathematical constructs and properties of the model, along with the associated performance impacts. However, compensation techniques presented herein shall not require generation of the Volterra model explicitly. Rather, embodiments of the present invention focus on partitioning of algorithms, which can be implemented in hardware and software, to obtain a profile of VPA non-linearities and thereby also provide for appropriate compensation. An important aspect is to provide such profile efficiently with minimum data requirement.

3. REAL TIME COMPENSATION

Amplifier and other system non-linearities may be compensated in real time if the non-linearities are known and fully characterized apriori or if they can be approximated 'on the fly'. 'On the fly' calculations may be power consuming and require large silicon real estate, while compensation techniques based on apriori knowledge typically rely on memory and DSP algorithms.

Feedback techniques compensate for long term effects such as process drift, temperature change, aging, etc. However, a feedback loop's bandwidth is finite and therefore practical considerations of sample rate and stability limit these techniques in terms of correction of real time signal anomalies. Essentially, the non-linear signal will be transmitted into the medium before a loop can compensate or correct.

On the other hand, feed forward techniques are causal and may correct for virtually every non-linearity. However, this comes at a significant price in complexity as well as efficiency.

Figure 4:
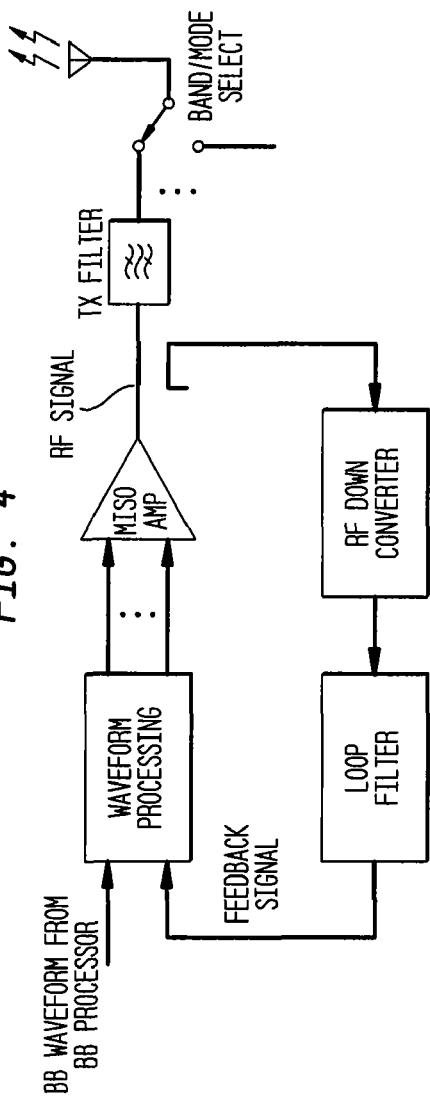
FIG. 4 illustrates an example feedback system.
Figure 5:
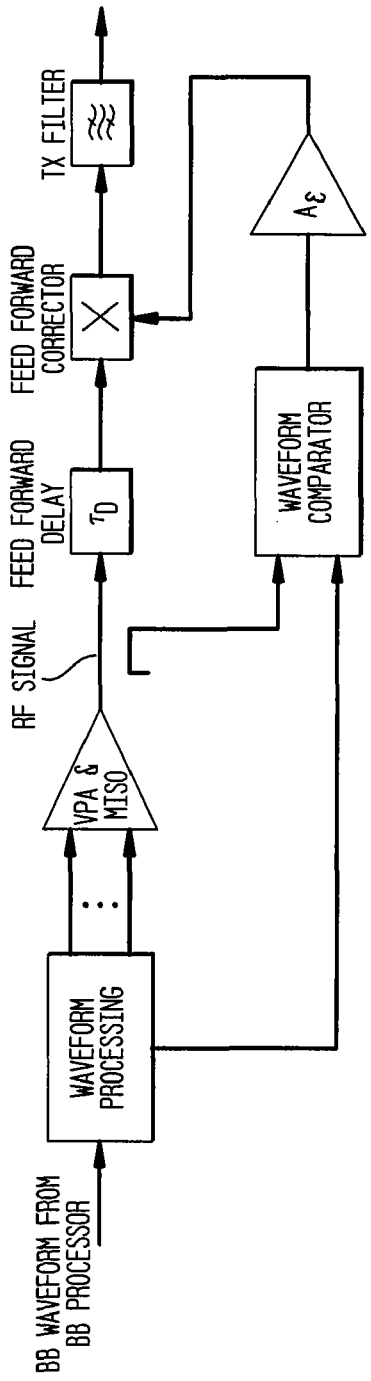
FIG. 5 illustrates an example feedforward system.

FIGS. 4 and 5 illustrate the two approaches at a high level. FIG. 4 illustrates a feedback approach. FIG. 5 illustrates a feedforward approach. As would be understood by a person skilled in the art, many variations exist between digital, analog, and hybrid implementations. Some associated and relevant features of the two approaches are listed below.

Feedback Processing
  Requires a feedback monitoring point which is sensitive to VSWR effects.
  Complex implementation to correct VSWR effects.
  Typically requires down-conversion technology in the loop with polar or rectangular processing.
  Down-converter requires calibration.
  Cannot typically correct wide band signals (i.e., ACPR side bands) without unreasonable sample rates and complexity and significant power consumption.
  Suitable for long term slowly varying average effects like temperature, process, aging, etc.
Feed Forward Processing
  Excellent correction capability.
  Relatively Complex to implement.
  Inefficient feed forward delay element required ($\tau_D$).
  Inefficient corrector block or coupler required.
  Feed forward amplifier is typically power consumptive to create $A_\epsilon$.

As noted, both approaches have merits and drawbacks. At the same time, both approaches are at odds with small, low cost, efficient handheld mobile phone applications.

4. OTHER APPROACHES

Other potential VPA approaches, not specifically addressed above, can be partitioned into the following categories:
  Process based compensation.
  Calibration using non real time processing techniques.
  Hybrid approaches.

Process based approaches eliminate non-linearities by virtue of the circuit design via good design practice and topological compensation.

Calibration techniques fully characterize all anomalies of the VPA in all potential system states. Then, the waveform processor uses the characterization to compensate waveform parameters precisely to produce compliant signals at power.

Hybrid approaches use multiple compensation approaches to affect compensation.

5. VPA CALIBRATION THEORY

As presented in Section 2, a VPA is inherently non-linear. This presents a formidable challenge to create linear amplification from non-linear technology. Hence, other schemes, topologies, and compensation approaches must be employed along with good circuit design to deliver a competitive solution.

Calibration, as referred to herein, relates to measurement of VPA non-linearity and anomalies, characterization of these imperfections for each potential state of operation, and compensation of all waveform parameters. The process can be generally described by the following steps:
  1. Stimulate the VPA with a pre-designed waveform file, for each applicable calibration system state;
  2. Measure the response of the VPA to the pre-designed waveform for each system state;
  3. Characterize the response;
  4. Generate a correction file;
  5. Minimize the correction file; and
  6. Apply the correction and test standards based waveforms.

(a) Calibration Waveforms

It is desirable to produce compliant standards based waveforms consistent with Market Requirements Document (MRD) goals. The MRD goals include the following waveforms:
  WCDMA
  GSM
  EDGE
  HSUPA These standard waveforms each possesses an associated constellation within the complex signaling plane. A constellation is a two dimensional space which geometrically represents the signal, its signaling states, and state transitions. The properties of a constellation provide insight to the signaling attributes of the waveform which may relate to non-linear amplifier behavior in an adverse manner. As such, the accuracy of the signaling states and the character of transitions between signaling states are things of concern. Non-linearities can distort the constellation in a manner to modify the average metric of the space, diminishing the signaling state distance, creating metric asymmetries, and modifying transitional trajectories through the signaling space. These distortions generally result in the following:

Increased $P_e$ due to signaling state metric reduction.

Increased $P_e$ due to metric asymmetries.

Increased timing jitter in synchronization processes, which in turn produces a greater probability of bit error or symbol error.

Spectral domain anomalies such as increased ACPR, spurs, etc., which reduce channel capacity.

Calibration waveforms are required which exercise the complex signal plane to create stimulus constellations such that each possible point within the constellation space can be fully characterized, through the VPA.

Figure 7:
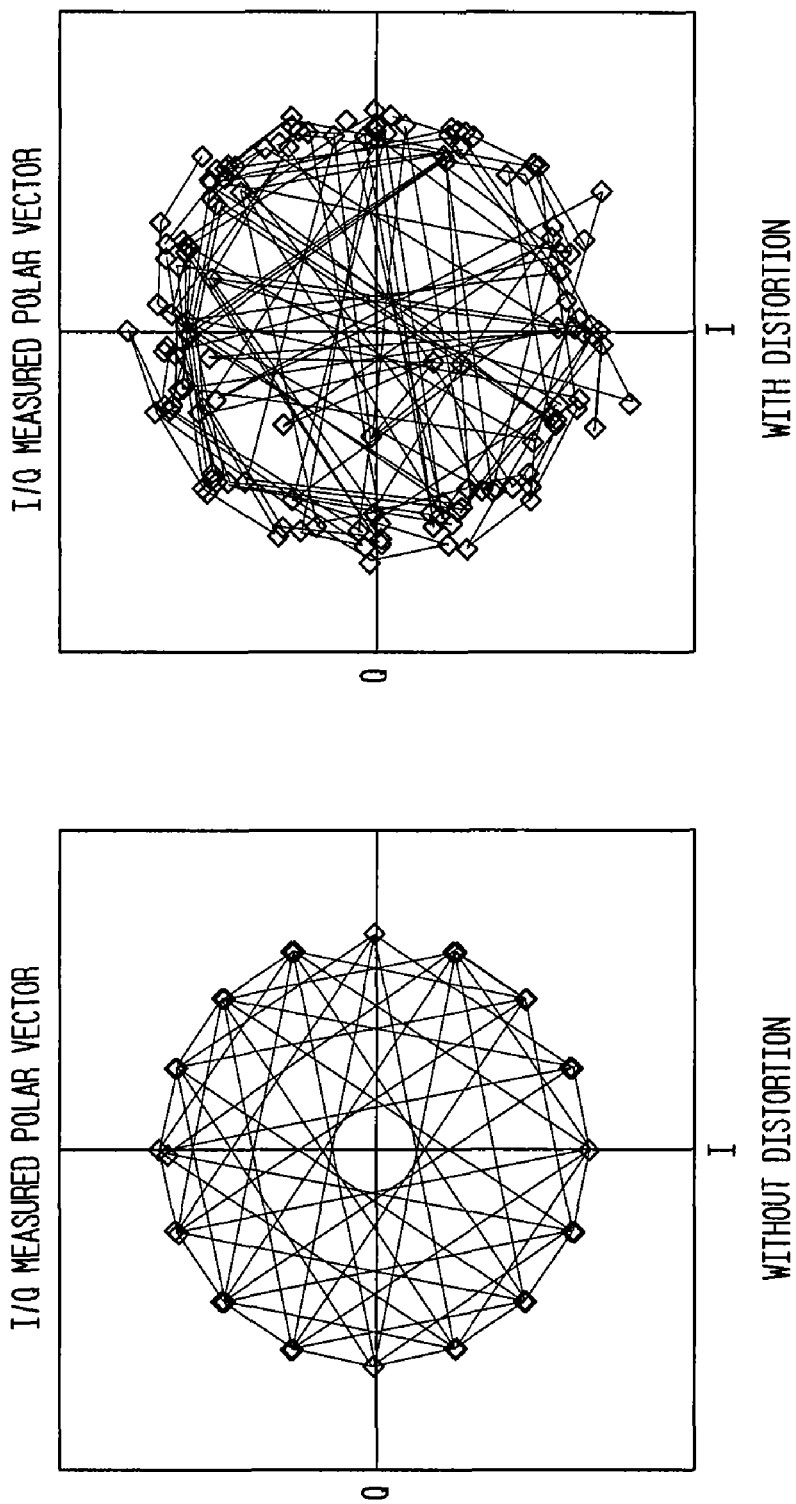
FIG. 7 illustrates example EDGE constellations with and without distortion.

FIGS. 6 and 7 illustrate example constellations of WCDMA and EDGE, respectively, with and without distortion. It is noted that WCDMA possesses greater amplitude domain variation (radial distance of the signal from the origin) while EDGE possesses greater numbers of required phase states (angular perturbations about the origin). Generally, these two waveforms represent the extremums of requirements. The wideband CDMA waveform possesses a large peak to average power ratio (PAPR), particularly when fully loaded with the maximum number of available channels. The EDGE waveform possesses a modest PAPR but requires excellent phase resolution and definition of each separate phase state within the complex signaling plane. Hence, calibration stimulus waveforms should account for these amplitude domain and phase domain fluctuations.

Both constellation types have been accompanied by undistorted and distorted examples to illustrate comparative very linear and very non-linear behavior. Of course, the distorted constellation arises due to system non-linearities which must be corrected.

Figure 8:
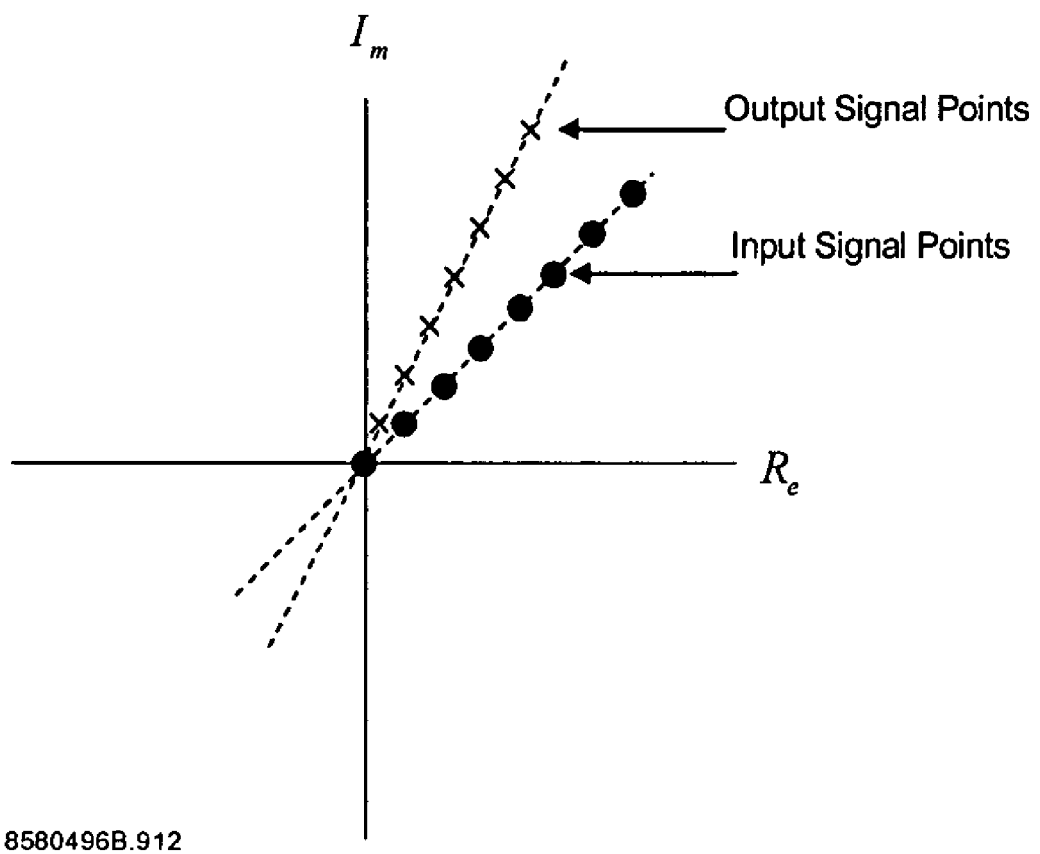
FIG. 8 illustrates a linear stimulus-linear response within a complex signaling plane.

FIG. 8 illustrates a linear stimulus-linear response within a complex signaling plane. Notice that the input points lie along a straight line within the plane. If these signal states were utilized as inputs for a perfectly linear device then observation of the output would yield a similar constellation, a perfectly straight line, with some relative phase shift (angular rotation with respect to the input due to time delay within the device) and perhaps a stretching or compression of the line due to gain of the device. However, what is more likely to occur can be illustrated by FIG. 9, which illustrates a linear stimulus—non-linear response within a complex signaling space.

Figure 9:
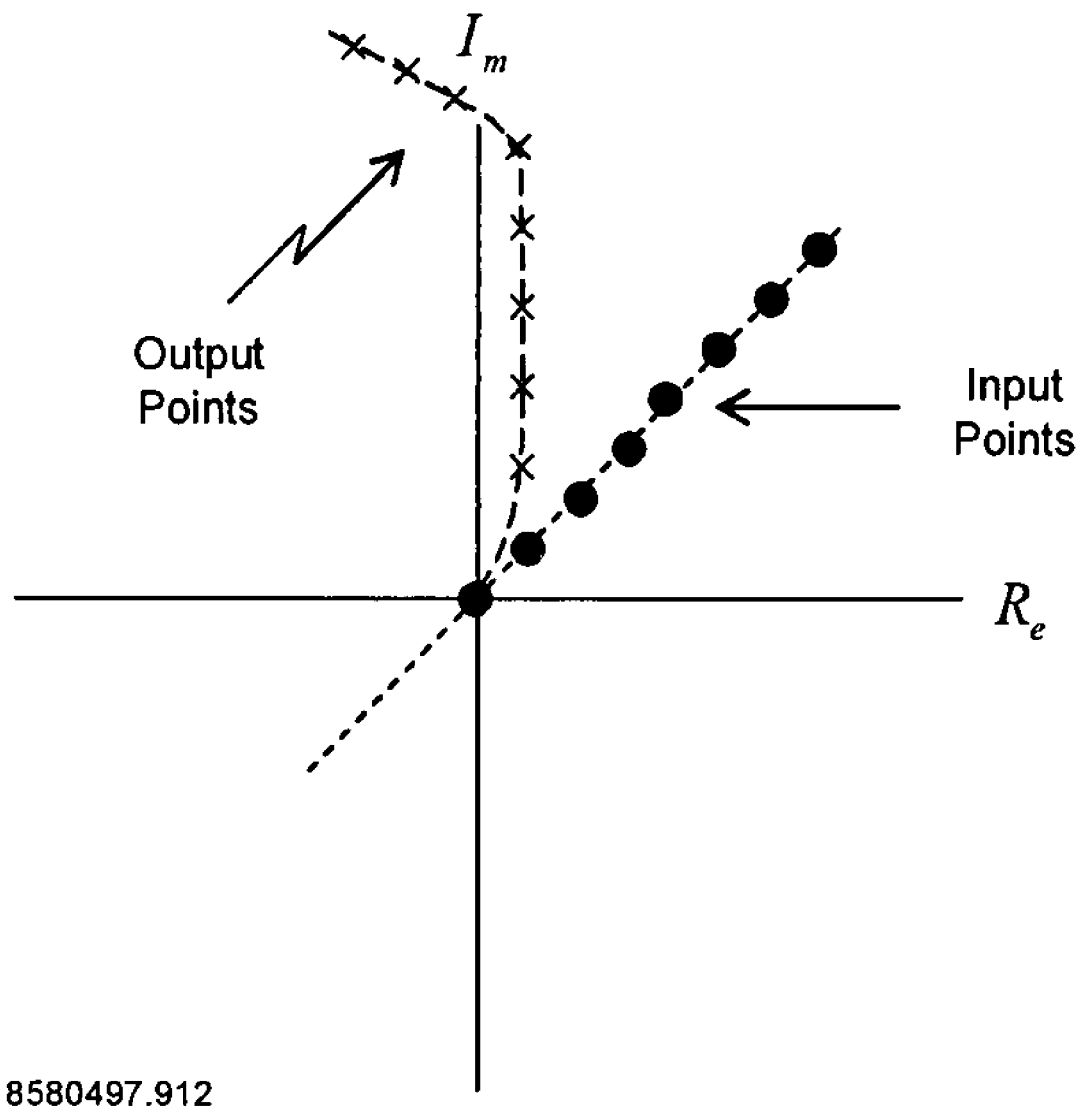
FIG. 9 illustrates a linear stimulus-non linear response within a complex signaling space.

Note in FIG. 9 that the input points lie along a straight line by design and that the output points lie along a distorted line, which indicates gross non-linearity for this example. Amplitude domain non-linearities as well as phase domain non-linearities can be observed in FIG. 9. However, distortions which are manifest as equal transport delays for the I and Q portions of a signal and which can change over the short term (within a symbol or a few symbols) cannot be detected. However, these distortions are rare and compensation of the dominant amplitude and phase distortions will suffice for all applications related to the MRD.

Accordingly, a known input may be compared to the output to determine the nature of the non-linearity. Other input trajectories can also be utilized provided they permit comparison with the output. For instance, a circular input can be used as the stimulus, which would have the advantage of exercising all phases within the complex plane, while a radial line exercises all amplitudes. Generally, a blend of both attributes is ultimately required. Actual WCDMA or EDGE waveforms can also be used to accomplish the calibration.

In making stimulus selection, practical considerations of detection, synchronization, statistical coverage, and overall demodulation complexity should be considered. Furthermore, it is preferable to stimulate the system in such a manner to facilitate easy input-output comparison and subsequent data processing. Systematic patterns solve a myriad of concerns, including:

Input-Output Comparison;

Data Sample Description;

Complex Plane Coverage (for universal modulation support);

Synchronization and Detection; and

Data Reduction.

Hence, it is desirable to use such patterns as lines, circles, spirals, pseudo random patterns, etc. One consideration though is that of sweep rate and pattern discontinuities. The pattern should be swept at a rate commensurate with normal operation. This permits stimulus of all dominant frequencies contemplated by the models described in Section 2. That is, it is important to exercise the appropriate bandwidth of the VPA relating to intended applications. Any stimulus should contemplate this requirement. When such stimulus signals are swept however, discontinuities may present special problems unless accommodated. For instance, straight lines do possess discontinuities at end points. This can be generally overcome by a number of techniques such as blanking, sample time expansion, shaping the transitions (bowtie) rather than permitting discontinuities, retracing, variable sweep rate setup, so on and so forth. Similarly, concentric circles possess discontinuities when the sweep jumps from the circle with radius $r_b$ to a circle with radius $r_a$. One technique is to use continuous 'spiral graph' like functions to sweep out the entire complex plane and minimize discontinuities. This technique is effective but may be less efficient or less systematic from a coverage point of view and does not necessarily reveal circuit memory anomalies. Nevertheless, many approaches will work with some possessing better coverage or mathematical description, while some may provide a more rapid sweep capability. The 'ideal' waveform is a function of many multi discipline concerns and such optimizations are often complex.

The sweep speed at the input must also consider the instrumentation available. That is, the frequency response of the test set up can become a factor.

(i) Star Burst

Figure 10:
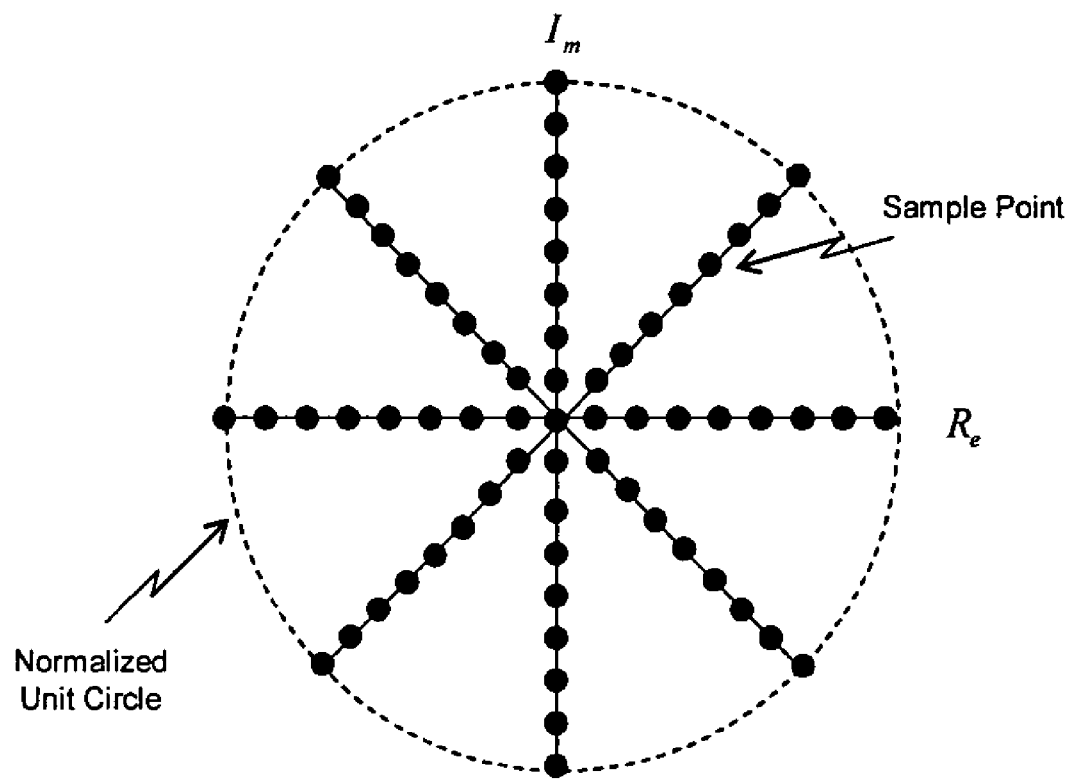
FIG. 10 illustrates an example Star Burst input.

A simple pattern used to stimulate the complex plane is the Star Burst approach. The star burst is a collection of radial lines which form bisecting segments of the 'normalized' unit circle in the complex plane. FIG. 10 illustrates an example Star Burst input. As shown, 8 radial lines are illustrated with angular resolution of 45° for this example. The number of radial sample points and the angular separations are generally selected based on the coverage required. Notice that the samples can be arranged into circles as well as lines. Generally, WCDMA requires less angular resolution than EDGE. However, WCDMA does require a modest resolution for the radial sample points. For a multi-mode application, the 'worst case' dominates the calibration routine waveform consideration. Ultimately, however, the stimulus must possess some minimum coverage so that subsequent analysis can extract all of the necessary information. The essential required information is the deviation from linear behavior throughout the complex signaling plane.

(1) Sample Distribution

Each waveform possesses a required sample distribution for coverage considerations. In addition, VPA non-linearities may strongly suggest sample spacing distribution based on location of the errors contemplated above. The 'essential' information exists only at points in the complex plane (normalized) where the output does not match the input. That is, points where non-linearities are significant possess the greatest information content. Hence, these places within the complex plane can and should possess greater densities of samples. In a scenario where samples are evenly distributed within the complex plane, the regions of greatest non-linearity will drive the minimum sample spacing consideration. One measure or metric for sample density adjustment is to adjust sample density based on input versus output data differences. This differentiation technique will automatically establish the regions of greatest error to be compensated.

The method of establishing input-output error metrics as a reference for sample distribution is a first order technique whenever the error file is generated from the difference signal. A difference of zero requires minimal sampling while a large difference may require greater sampling density.

In addition to input-output difference metric, the rate of change of the difference is also important. That is, the error surface generated by input-output comparison can be characterized by peaks, valleys, transitions, erratic contours, etc. Non-linearities will manifest as contours which are ill behaved and not always smooth. An n-fold directional derivative or gradient can characterize a differential portion of the error space in such a manner to relate the non-linearity of the space to a sample requirement. As a gradient changes from one point in the space to another, information is imparted concerning the number of samples required to define the error. Suppose that the error (perhaps an n-fold error surface) is a function of several variables, then the following definitions are created:

$D_{\epsilon_R} \triangleq$ Error in region R $$\frac{\partial D_{\epsilon_R}}{\partial R} \triangleq$$

Gradient of the error with respect to parameters of the region R, also represented as $\nabla D_{\epsilon_R}$ $D_{\epsilon_R}$ is a function which characterizes the error surface of interest. The samples required for characterizing the space defined by $D_{\epsilon_R}$ are related to two basic principles.

Principle 1: The number of samples required to characterize $D_{\epsilon_R}$, to some desired accuracy, is proportional to the regional gradients and the rate of change of gradients over the region $R^N$, where N is the dimension of the space of interest. In addition, regional cross correlation characterizes the uniqueness properties of the $D_{\epsilon_R}$ space.

Principle 2: The number of samples required to characterize $D_{\epsilon_R}$ is inversely proportional to its probability or predictability. The more systematic $D_{\epsilon_R}$ is, the lower its information content.

Principle 1 can best relate to the realms of approximation theory, geometry, tensor calculus, etc., where characterization of the multi dimensional function is the prime concern.

Principle 2 is a loose statement of Shannon's original information theorem. That is, the greater the likelihood of predicting one point of the sub space defined by $D_{\epsilon_R}$ by knowing or observing another point in that sub space, then the lower the information content is for the region near those points and in between. When the information content is low, fewer samples are required. On the other hand, if $D_{\epsilon_R}$ is non determinant and almost random then the largest information content is stored in the space and a significant number of reconstruction samples may be required. The application of the notion of information here is similar to Shannon's context but not identical. First, Shannon's Theorem anticipates 'white or random noise', although this is not a strict requirement. Secondly, Shannon's Theorem contemplates an information source characterized by a probability density function (pdf) which is indeterminate from one instant to another. In this application the interference is not white, the channel possesses memory, and there is complete knowledge of the system input, although the non-linearity of devices (VPA) is typically unknown. A lesser concern is that some measurements may not be precise. Nevertheless, any apriori knowledge is very important.

It should be noted that the sample rate versus the number of samples is not the focus of this present discussion. Naturally, Nyquist's sampling theorem does apply for any waveform reconstruction. That consideration is one of bandwidth and sampling rate, not information density. Reconstruction theory shall be revisited in a manner consistent with function interpolation, and proper sampling principles in later sections.

The immediate primary focus is to relate the concept that the error space characterized by a function $D_{\epsilon_R}$ or data set $D_{\epsilon_R}$ can be described using some minimal amount of information or some minimal number of samples. If the behavior of $D_{\epsilon_R}$ can be described by a polynomial or some collection of functions, then information content can be minimized. This idea can be exploited in a manner to minimize the storage of calibration coefficients. Rather than storing all measured (observed) points within the space, a description is stored which characterizes the space. Once the function is known the continuum may be generated from it, provided the calculations and cost of calculation are reasonable.

According to embodiments of the present invention, higher order complex spaces may be assigned tensor descriptions. Accordingly, the VPA compensation technique according to the present invention characterizes the signaling space, and any signal in the space may be predicted and therefore compensated, based on the knowledge of the regional non-linearities of the characterized space.

(2) Entropy

Suppose that the points stored in memory from the calibration operation are stored without any additional consideration or description. Each point then possesses some amount of information. If the points are completely unique and statistically independent of one another, then they would possess the following entropy as an ensemble:

$H = \log_2 m$ bits/point $m \triangleq$ resolution of acquisition data point in discrete levels If the digitization process is a 1024 discrete level process then H=10 bits/point. The total required memory then is $N_p \cdot H = m_B$, where $N_p$ is the number of points required.

Now suppose that each point is related in some way to adjacent points. As an example, for instance, let the previous two points relate to or be statistically dependent on the current point. Then, for this third order entropy model, the entropy is calculated from:

$$H = \sum_{i=1}^{m} p_i \sum_{j=1}^{m} P_{j/i} \sum_{k=1}^{m} P_{k/j,i} \log_2 P_{k/j,i}$$

$p_i \triangleq$ probability of a level i occurring $P_{j/i} \triangleq$ probability of level j given i occurred previously $P_{k/i,j} \triangleq$ probability of level k given i and j occurred For the general case given n adjacent related points, the entropy can be written as:

$$H = \ell_{im} \frac{1}{n} \sum^{m^n} p(\beta_n) \log_2 p(\beta_n)$$

$p(\beta_n) \triangleq$ occurrence of first n levels

Although extremely difficult to calculate, the equation illustrates that statistical dependence on the points can drastically reduce the values of H and $N_p$, and ultimately the required memory.

The VPA calibration case is a case which in fact possesses interrelated probabilities. In the limit, the functional description exists and is completely deterministic. That is, each point in the space cannot be treated as an independent random variable from a random process. The points should be considered as points in a space which under ideal conditions could be completely characterized, and under perfect conditions, completely determined. Under such conditions, H is minimized and the joint probabilities indicated above are large. Also $N_p$ can be significantly reduced. Therefore, from an information theory perspective it is desirable to solve the following:

$$\min\{m_B\} = \min\{H \cdot N_p\}, \text{ subject to } Q$$

H can be minimized provided that appropriate sampling techniques are employed within the space (i.e., space is not under sampled). This leaves consideration of $\min\{N_p\}$.

The non-linearity of the space defined by $D_{\epsilon_R}$ may not be known apriori. However, it is stable, once characterized, with modest to low variance. Hence, $D_{\epsilon_R}$ can be described by deterministic means rather than by pdf. The pdf description may be valuable however for certain production considerations and fine tuning associated yields.

A. Data Redundancy

Some potential for data compression exists due to certain symmetries within the sub space defined by $D_{\epsilon_R}$. Although this is contemplated by the calculation of H in the previous section, for the most general conditions, the notion of data redundancy is described here for clarity. The type of data compression possible for $D_{\epsilon_R}$ characterization should not be confused with other classical problems associated with redundant data sources, i.e., media which possess memory. The information processing formulation in the VPA context is different for reasons already mentioned. Compression is best accomplished by appropriate sampling of the sub space and description of the sub space.

(ii) Signaling Memory

As illustrated in Section 2, there are signal constellation memory effects within the non-linear VPA which should be recognized. Although not dominant, these local memory phenomena affect calibration accuracy, as well as performance in an application. In general, the current state of a waveform at the output of the VPA is a function of previous waveform values. If the input and output waveforms are sampled appropriately the memory effect can be described by:

$$y(t_j) = \sum_{i=0}^{n} a_i \sum_{k_i=-\infty}^{j} h_i(t_{j-k}) x(t_k)$$

where;

$y(t_j) \triangleq j^{th}$ Time Sample VPA Output
$x(t_k) \triangleq k^{th}$ Input Time Sample of the Convolution Sum
$h_i(t_{j-k}) \triangleq$ The Volterra based Impulse Response over Time in the $i^{th}$ Branch Convolution Sum
$a_i \triangleq$ Branch Weights Each branch impulse response convolves with x(t) to produce a slightly prolonged time domain response according to the filtering characteristics of $h_i(t)$. Also, non-linearities can arise in the amplitude domain for the most general case of each branch, due to the multiple convolution kernel $k_i(t)$.

Figure 11:
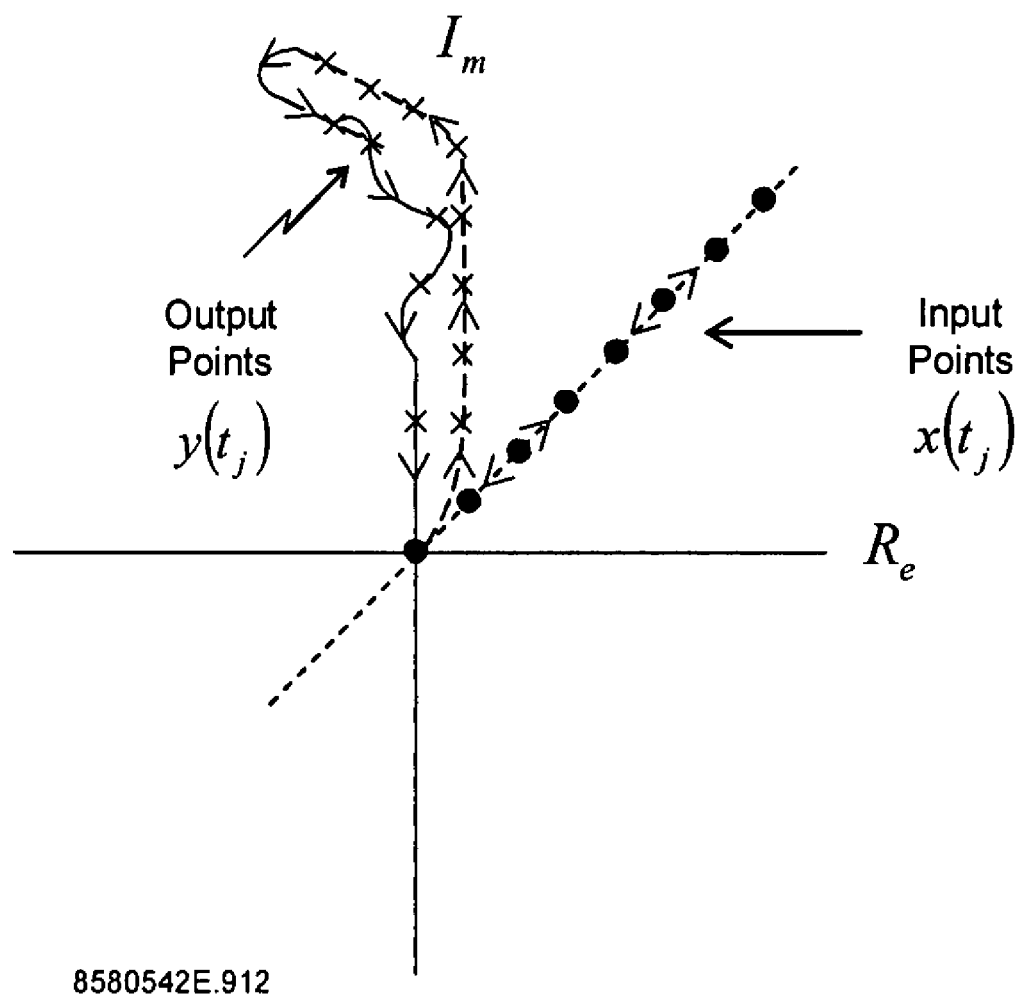
FIG. 11 illustrates an example response for an input stimulus that is reversed in the complex plane after sweeping outward to the unit circle.

It is helpful to consider how this could affect the complex signal plane response for the following simple case of linear radial stimulus. Consider the case for a linear radial excitation where the input stimulus is reversed in the complex plane after sweeping outward to the unit circle. The reverse sweep covers the reverse complex plane 'real estate' in exactly the same input trajectory provided that the time delay is very small. This is illustrated in FIG. 11. The arrows along the dotted trajectory illustrate the outward bound radial (outward from the origin) and the inward bound radial.

Now consider the system output. Notice the distinct difference of the two output trajectories for outward and inward bound responses. As shown, the inward bound trajectory at the output is a function of the current input signal trajectory as well as the previous input signal trajectory. This phenomena relates to energy transport through the VPA. The VPA translates real world signals which involve voltages and hence energies. Therefore, parasitic energy storage components such as capacitance, inductance, etc., redistribute the input energy to the VPA in time. It takes time to move charge through a system with such parasitics. Hence, the output energy transport is affected by broader swaths of time than a specific instant. In addition, heating effects within the VPA can produce temporal fluctuations in the parasitics. Also, the return path does not (in general) possess the same shape as the outward trajectory which implies a separate requirement for characterization.

Figure 12:
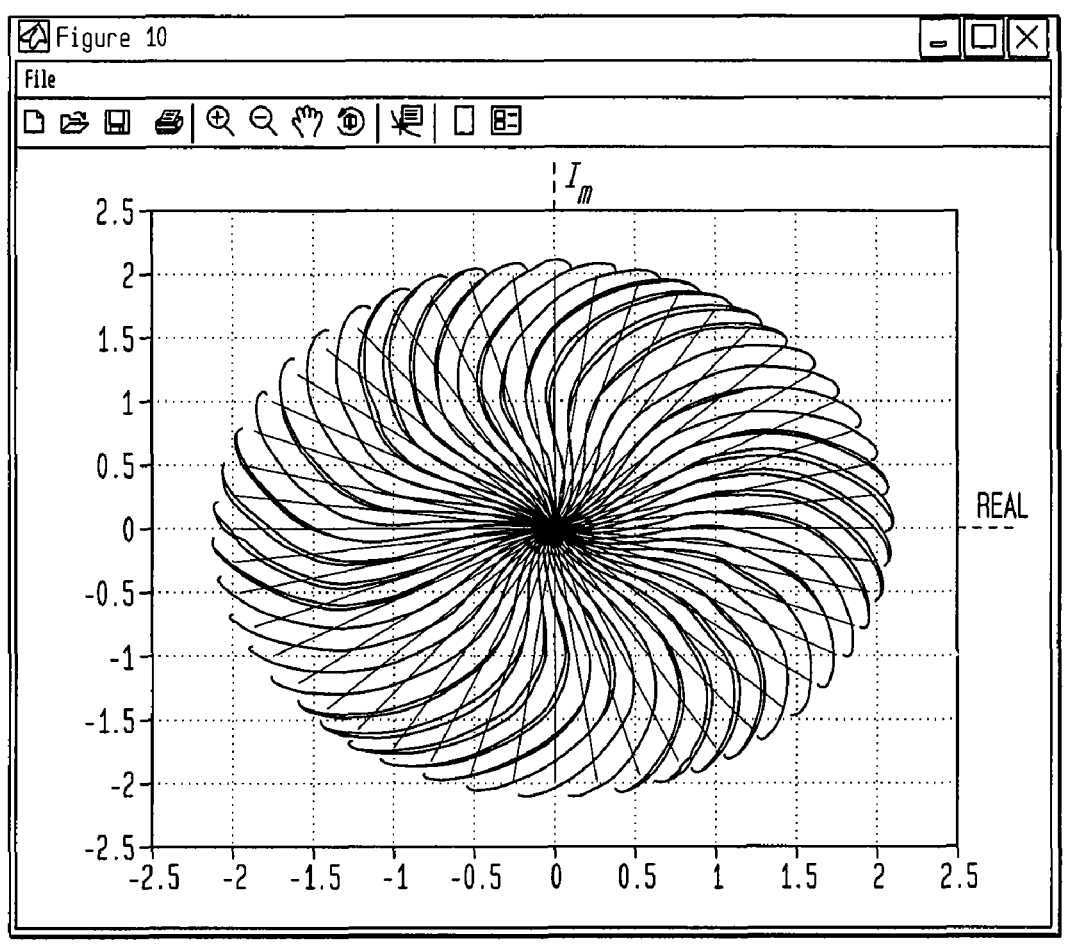
FIG. 12 illustrates an example 2 dimensional complex signal constellation.

FIG. 12 illustrates a 2 dimensional complex signal constellation (order 2 spatial kernel) with inputs illustrated by the linear radial traces and outputs illustrated by the curved traces. The input traces of this starburst pattern stimulate the VPA input, while the output traces illustrate the response at the VPA output.

Notice that the memory effect is clearly present at the output, as indicated from the bifurcation of the output traces.

If this memory effect is too significant then the calibration or compensation becomes complicated and requires the extraction of a model at an intricate level. In addition, it is not unusual to find that capacitance and inductance in such non-linear devices must be modeled as functionally related to the radial position of samples within the complex signaling plane, which further complicates the characterization. Again, the VPA heating anomalies play a role as well. For small perturbations of the radial sweeps a single directional sweep may suffice rather than the attempted retrace. Also, averaging the two sweeps outward-inward, may provide some benefit. This smoothing or interpolating theme will be explored repeatedly in subsequent sections according to embodiments of the present invention.

(iii) Comments on PAPR, Heating, Sweep Rate

Embodiments of the VPA typically comprises a power MISO (Multiple Input Single Output) amplifier. Since the amplifier is not perfectly efficient, some energy is dissipated in the form of heat. This heat in turn modifies the Volterra model description slightly. Thus, it is desirable to consider the heating effect in the context of calibration. In an embodiment, it is possible to create a calibration waveform with a specific peak to average power (PAPR) to reproduce the heating phenomena. In some cases this may improve the calibration process.

Generally, the calibration waveform could be pseudo-random by nature with a mean and a variance designed to deliver a particular PAPR. It may also be systematic and still approximate the heating caused by a WCDMA stimulus.

According to embodiments of the present invention, it is also possible to utilize a variable sweep rate which slows down the samples in the portion of the complex plane for a duration to create the heating affect. For instance, a starburst could possess a variable sweep rate along the linear radial stimulus. In fact, the waveform could even stall at a particular point. In addition, the stimulus could retrace specific small segments of the radial line over and over at fixed or variable sweep rates.

As would be understood by a person skilled in the art based on the teachings herein, any swept stimulus could incorporate these variations, whether the stimulus employs circles, radial lines, spirals, etc.

If variable sweeps or even fixed rate sweeps with retracing are employed, care must be exercised to maintain some reasonable power spectral density (psd) for the stimulus if possible. It is desirable to not only exercise the complex plane appropriately, but also the frequency domain performance of the device should be tested by the calibration waveform.

(iv) Error Mapping

An error mapping of the VPA relates the input to output response of the VPA D2P technology. An ideal response is a one-to-one correspondence within the complex signaling plane for input versus output given normalized scaling and time shifting between x(t) and y(t). That is, given normalized plots of input and output responses within the complex signaling plane, the two trajectories would overlay exactly. This in turn would imply a perfectly linear system. Since this is never the case in practice, except for a perfect wire, some technique is required to provide the measure for the error.

One proposed measure, disclosed above, can be described as:

$$\vec{D}_{\epsilon_{R_j}} = \vec{y}_j - \vec{x}_j \quad \text{(Vector Representation)}$$

Since the space is in general, multidimensional, a vector representation can be useful. Notice that the proposed error is on a sample by sample basis, comparing the $j^{th}$ input ($x_j$) and output ($y_j$) samples. It is also easy to calculate the magnitude and the phase of the error as well based on the proposed measure. However, there is some inaccuracy in the metric as proposed. This is because the error $\vec{D}_{\epsilon_{R_j}}$ is a vector which moves through a region of the distorted space that must be corrected. Therefore a simple comparison of input and output samples may not be accurate enough.

The prior statement involves the notion that $\vec{D}_{\epsilon_R}$ must also be utilized to facilitate the necessary correction operation. However, if $\vec{D}_{\epsilon_R}$ is applied in front of a non-linearity then $\vec{D}_{\epsilon_R}$ is also distorted. Thus, the metric $\vec{D}_{\epsilon_R}$, measured at the VPA output, is an important metric but does require additional consideration if it is subtracted prior to the VPA input.

Figure 13:
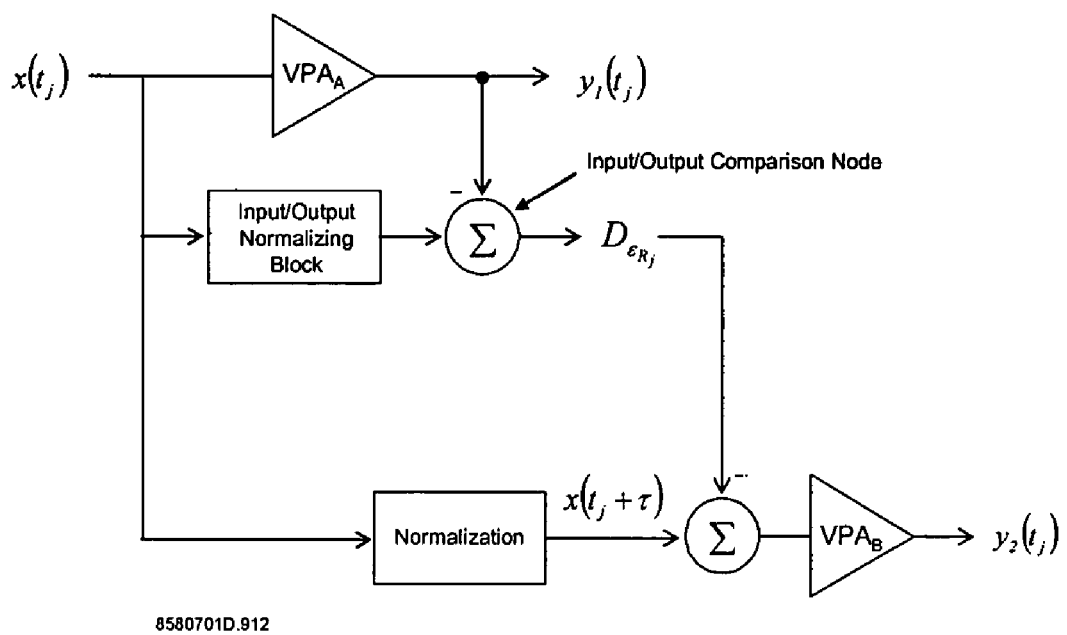
FIG. 13 illustrates an example sample-by-sample error correction system.

To illustrate further consider the scenario illustrated in FIG. 13, which attempts to make use of $\vec{D}_{\epsilon_{R_j}}$ from a sample to sample basis. $VPA_A$ and $VPA_B$ are identical. All signaling time axes are ideally aligned to facilitate proper cancellation of distortions in $VPA_B$ based on measurement of $\vec{D}_{\epsilon_{R_j}}$ in $VPA_A$.

By inspection, the perfectly corrected signal is:

$$y_0(t_j) = y_1(t_j) - D_{\epsilon_{R_j}} \quad \text{(Error @ Output)}$$

Also, by inspection:

$$y_2(t_j) = (kx(t_j+\tau) - D)_{\epsilon_{R_j}} * \{V\} \quad \text{(Correction @ Input)}$$

(k an arbitrary scaling constant)
$\{V\} \triangleq$ Volterra kernel describing the VPA transfer characteristic Also, $$y_0(t_j) \neq y_2(t_j)$$

in general, due to $\{V\}$ unless $\{V\}$ is a constant. This of course is a contradictory or degenerate case and cannot occur. The result of the above comparison may be in the 'ball park' but in general is not sufficiently accurate and must converge by trial and error, modifying $D_{\epsilon_R}$ as required to account for $\{V\}$.

Notice that this is equivalent to a feed back correction in many respects and that is why it is mathematically inferior, unless a control loop is present. If $D_{\epsilon_R}$ were simply carried forward (feed forward compensation) and subtracted from $y_1(t_j)$ then a perfect result is possible. Generally, there are reasons why such an architecture is not acceptable (See Section 3). Therefore, only predistortion is contemplated in the current discussion and is considered as a constraint, for VPA applications, and subsequent arguments.

Figure 14:
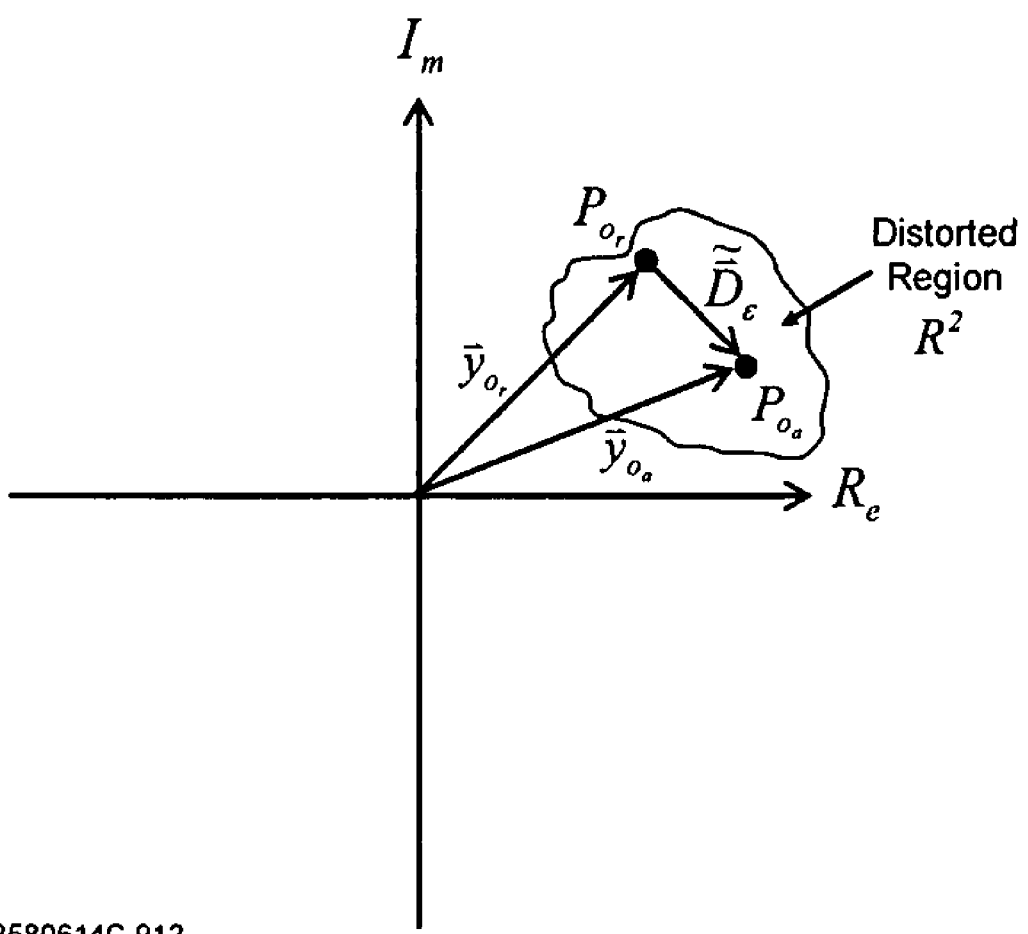
FIG. 14 is an example that illustrates error distortion.

A graphical based commentary provides some other key insights and illustrated in FIG. 14, where:

$\vec{y}_{o_r} \triangleq$ Required output vector from origin to desired output point $P_{o_r}$ $\vec{y}_{o_a} \triangleq$ Actual output vector, warped by VPA non-linearities, extending from origin to point $P_{o_a}$ (actual point achieved)

$\vec{D}_\epsilon \triangleq$ Approximate Error Vector, measured in a warped space $\vec{y}_{o_a} - \vec{D}_\epsilon = \vec{y}_{o_R}$ As shown in FIG. 14, the actual output is compared to the desired output, resulting in an error vector $\vec{D}_\epsilon$. $\vec{y}_{o_r}$ would be equal to $k \cdot x_i$ in a linear system, where k accounts for gain of the VPA. Given that equivalence, consider the input correction vector diagram illustrated in FIG. 15.

Figure 15:
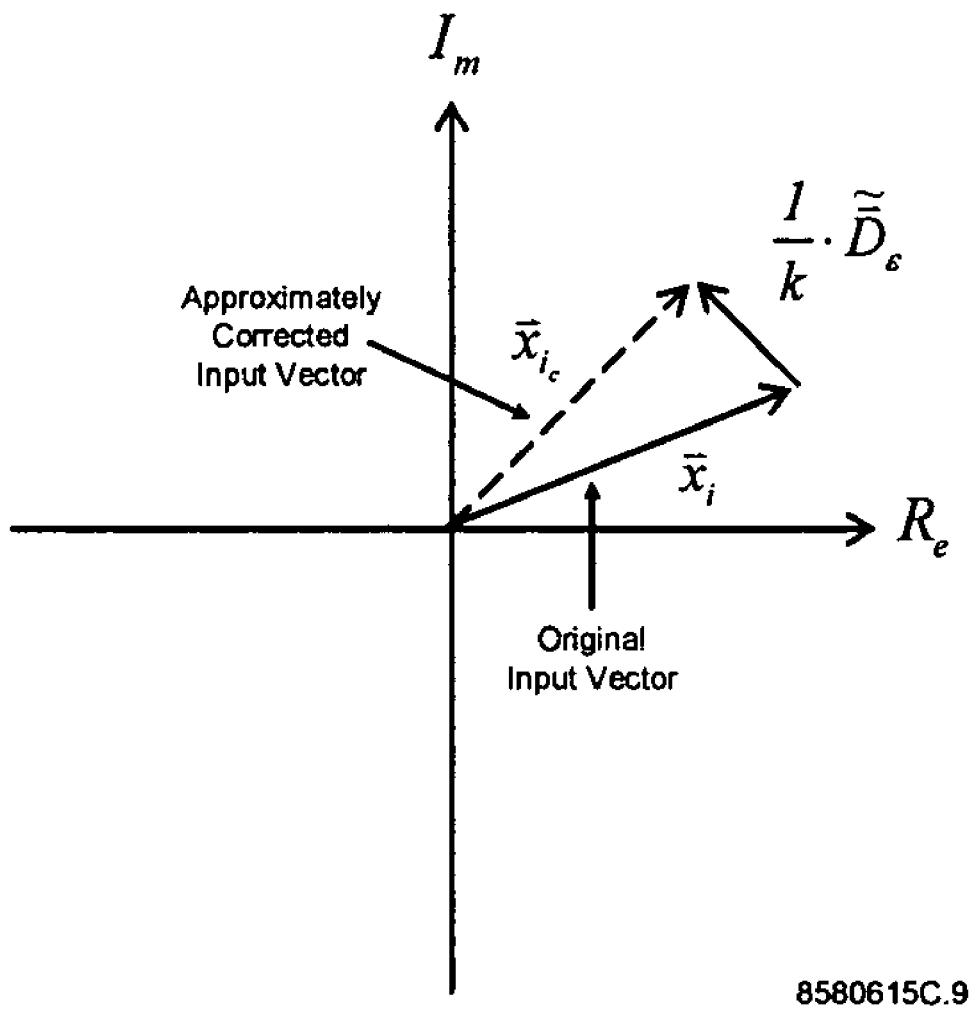
FIG. 15 is an example that illustrates input pre-correction.

FIG. 15 illustrates an attempt to apply a scaled version of $\vec{D}_\epsilon$ to the input vector $\vec{x}_i$ to obtain $\vec{x}_{i_c}$. $x_{i_c}$ is the intended input with pre correction or predistortion to correct in such a manner to achieve $y_{o_r}$ shown in FIG. 14. If this space ($R^2$) were linear (undistorted) then in fact the method of correction illustrated in FIG. 15 would work in the event of an error. However, the space $R^2$ is not linear and is in fact distorted. Thus, the error $\vec{D}_\epsilon$ is measured in a distorted or warped space and is reapplied in a linear manner to the input of the warped space, which warps it ($\vec{D}_\epsilon$) yet again. Furthermore, the distortion is non-homogeneous throughout the region ($R^2$) The distortion is introduced by the VPA. Pre-Correction in FIG. 15 can be described as:

$$\vec{x}_i - \tilde{\vec{D}}_\epsilon = \vec{x}_{i_c} \quad \text{(Approximation to required Predistorted Input)}$$

If the vector is introduced into the VPA at the input, then $\vec{D}_\epsilon$ does not possess the desired effect because it is distorted as it progresses through the region. If that distortion is known apriori, in the region where $-\vec{D}_\epsilon$ must be applied, then a corrective calculation can be accomplished to augment $\vec{D}_\epsilon$ to achieve the desired result. Pre-correction can then be written as:

$$\vec{x}_i - (\tilde{\vec{D}}_\epsilon + \vec{\epsilon})$$

where $\vec{\epsilon}$ is a correction term, which is a function of the local distortion within the complex plane.

Figure 16:
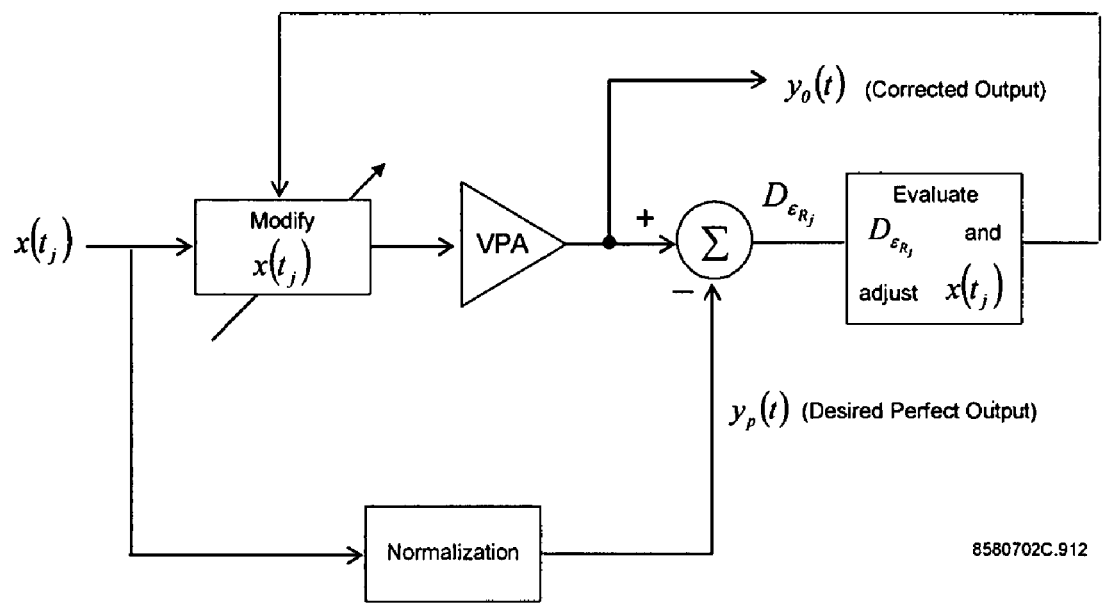
FIG. 16 illustrates an example feedback approach.

FIG. 16 provides insight into an example feedback approach according to an embodiment of the present invention. In this example, $D_{\epsilon_R}$ may be driven to zero by adjusting or modifying the VPA input until the desired output is achieved, and $D_{\epsilon_R}$ or a related metric is minimized.

Modifying x(t) can be done by choosing a new input value known apriori to produce a desired correspondence to the perfect result at the output. That is, the entire complex plane may be mapped apriori with a correspondence between input and output VPA samples. In this scenario, the correct numbers from the appropriate memory locations are summoned for $x(t_j)$ to produce the intended and desired output point $y(t_j)$, effectively building in $\vec{\epsilon}$. This is a memory mapped form of pre-distortion. Since values may not lay on perfect sample grids, some interpolation of values may be required. Other forms of adaptation may also be possible. The important distinction is that pre-distortion is applied, not post distortion.

This feedback system is handled 'off line' in the proposed calibration process. Therefore, unlike the feedback illustrated in Section 3, this feedback is stable, causal, and bandwidth sufficient.

Figure 17:
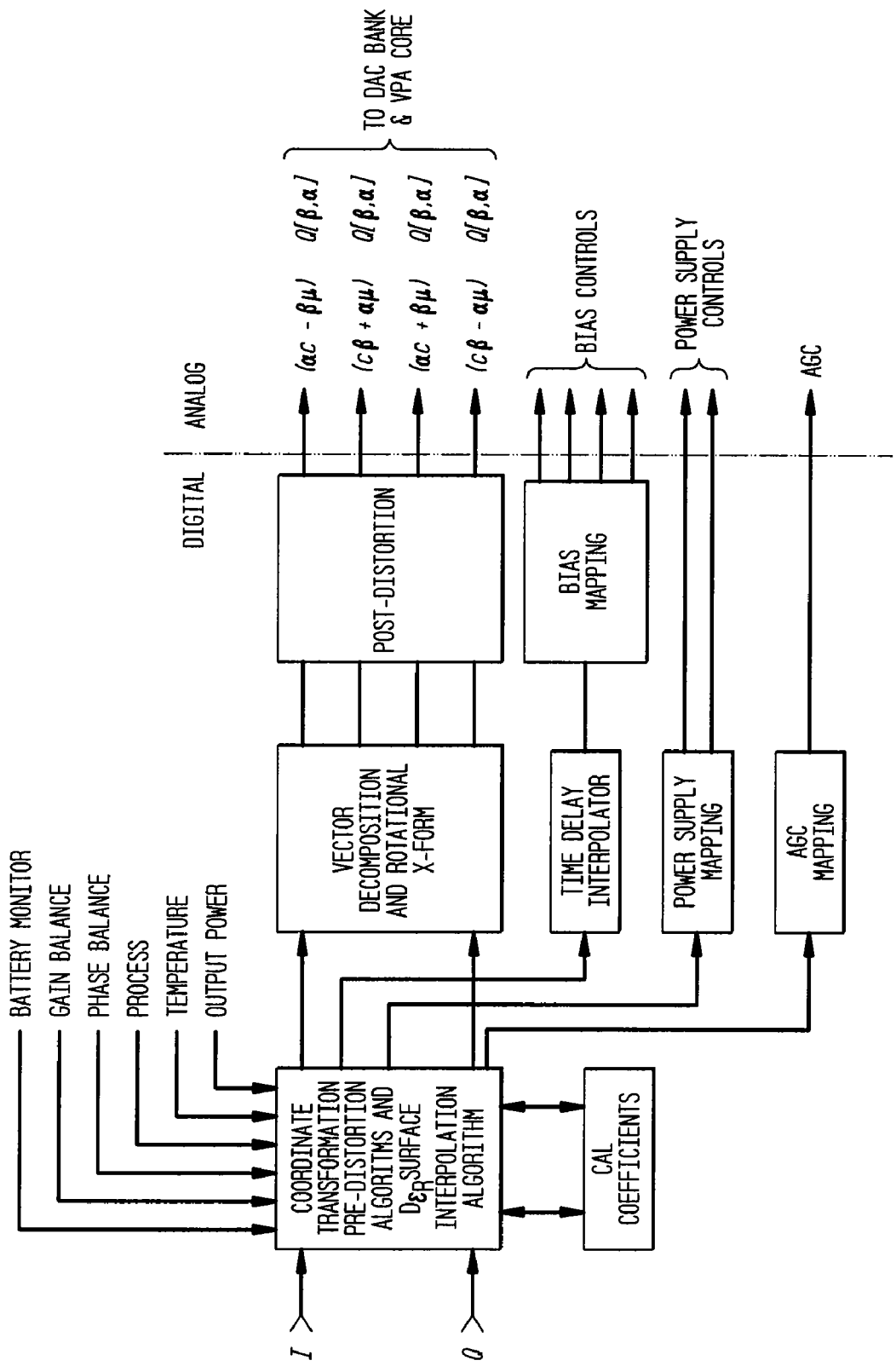
FIG. 17 is a block diagram that illustrates an example system according to an embodiment of the present invention.

(v) Real Time Feed Forward Algorithm Interaction with VPA Signal Processing Flow It is helpful to gain some insight into the relationship between the D2P VPA baseband (BB) algorithms and the processing of $D_{\epsilon_R}$ error surface information. The two work together to define and correct the distortions inflicted by non-linearities of analog and RF circuitry. FIG. 17 is a block diagram that illustrates an example solution according to an embodiment of the present invention. As shown, mathematical descriptions of the error space (direct or indirect) are stored in a cal coefficient memory. $D_{\epsilon_R}$ is re-generated by an interpolation algorithm which manipulates complex information at baseband in Cartesian and/or polar format. The interpolated N-dimensional error functions are then used to minimize the end-to-end error through the VPA circuits all the way to the RF passband signals.

In addition to cal coefficients, the algorithm can be affected, as illustrated in FIG. 17, by quasi-real time/feedback variables such as:

Temperature
Battery Voltage
Gain Balance
Phase Balance
Process Variation
Output Power These real time variables are filtered and sampled at a rate which is insignificant compared to the signal rate of interest. This ensures stability and causality over reasonable epochs yet does influence the N-dimensional manifold description of the error surface $D_{\epsilon_R}$.

Also, as shown in FIG. 17, four feed-forward signaling paths drive the VPA while additional signal space shaping can be accommodated via:

2 Independent Programmable Power Supplies;
4 BIAS Controls; and
1 AGC Control.

The entire feed-forward transfer function compensation is implemented by these 11 signals. It is possible to reduce the number of feedback and feed forward controls, trading off power consumption, silicon area, and performance, in the process.

Figure 18:
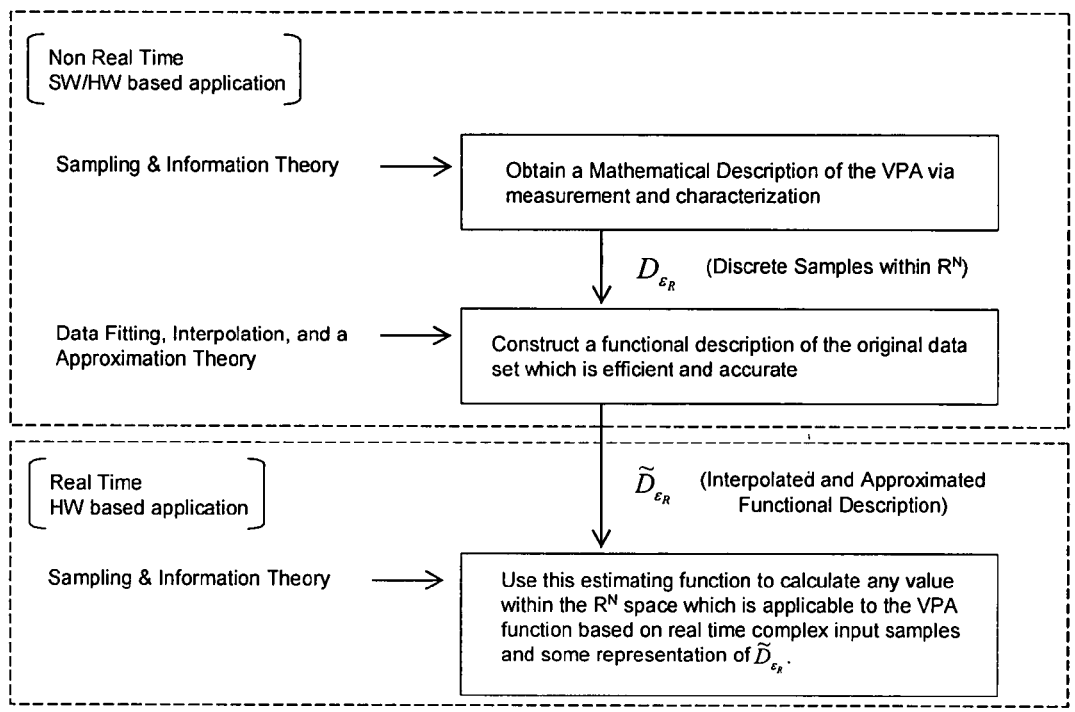
FIG. 18 illustrates an example partitioning of real time and non-real time portions of error correction algorithms to support the implementation of the system of FIG. 17.

FIG. 17, as described above, provides a snapshot of feed-forward algorithm interaction with VPA implementations. FIG. 18 illustrates the partitioning of real time and non-real time portions of the algorithms to support the implementation of FIG. 17.

6. BUILDING ERROR FUNCTIONS

As indicated previously, it is assumed that the VPA can be (in part) characterized via a function called $D_{\epsilon_R}$. $D_{\epsilon_R}$ is some error measure (with respect to ideal) whose effect is to be minimized. Although $D_{\epsilon_R}$ is described as a function above, it is originally available as a raw data set, available in an N dimensional space $R^N$. In addition to characterizing $D_{\epsilon_R}$ according to some robust metric, $D_{\epsilon_R}$ should be described in such a manner to drastically reduce or minimize the amount of data required and permit accurate and effective calculation of any value within the applicable portion of $R^N$ which best reflects or estimates $D_{\epsilon_R}$, even for values not originally available in the initial raw data set.

FIG. 18 is a process flowchart that illustrates the process of building an error function. As shown, the process flowchart is partitioned into real time and non real time applications.

(a) $D_{\epsilon_R}$ Data and Function

It is assumed that error data can be obtained by a measurement process. If the data set for $D_{\epsilon_R}$ is adequately sampled then a function can be defined which interpolates or approximates the original data set and which also interpolates for points which were not captured in the original data set.

Figure 19:
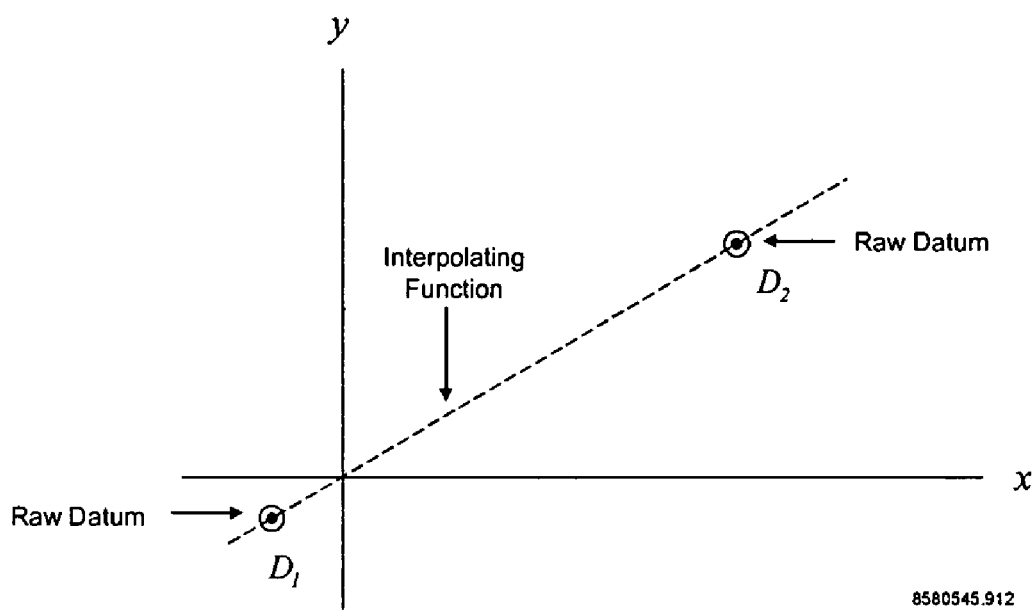
FIG. 19 illustrates an example in Cartesian space.

Consider the 2D ($R^2$) example illustrated in FIG. 19, which illustrates two points in a Cartesian space. In this example, the points $D_1$ and $D_2$ can be defined as:

$$D_1=(x_1,y_1), D_2=(x_2,y_2)$$

and lie on the line given by $$y=mx+b$$

where, $$m = \left(\frac{y_2 - y_1}{x_2 - x_1}\right)$$

Slope of line
b=Intercept evaluated @ x=0

The dotted line in FIG. 19 illustrates an interpolation function based on a simple linear polynomial. Non-linear polynomials could also be used and might provide acceptable results, depending on additional data or constraining information which might be available. What can be observed from the example of FIG. 19 is that:

1) Only two data points were required to define the linear polynomial with order n=1.
2) An infinite number of points on the line can be derived from the equation for the line, while storing only the coefficients m, b.

This implies that significant savings in data storage can be realized if the appropriate function can be constructed. Similarly, the goal is to replace the data input for $D_{\epsilon_R}$ with functions approximating $D_{\epsilon_R}$. This will permit all the calculations required to correct VPA transfer characteristics while simultaneously conserving memory in the process.

(b) Example VPA Error Plot for $D_{\epsilon_R}$

As previously described, errors are defined as differences between the input and output of the VPA as measured in some space whose basis is a signaling constellation. Also, extensions of the space must be contemplated to encompass all potential operational states. Power control, time, temperature, waveform type, etc., are but a few of potential dimensional extensions.

Figure 20:
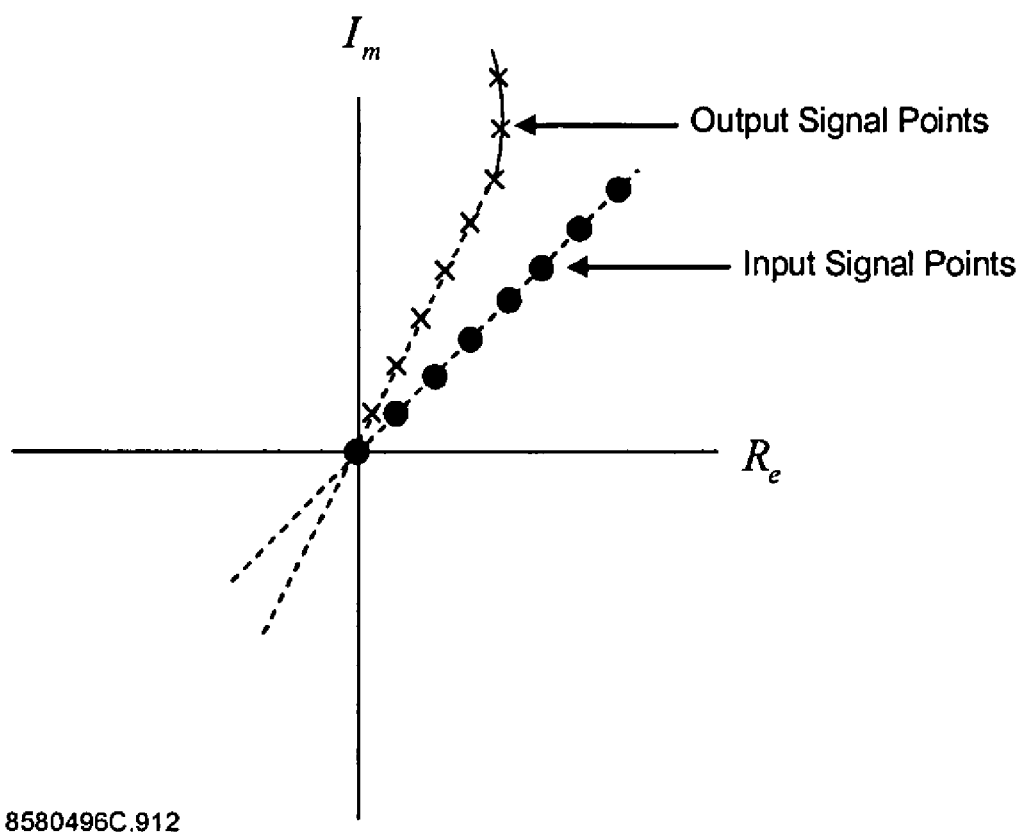
FIG. 20 illustrates an example linear sweep of a constellation.

Consider the linear sweep of a constellation illustrated in FIG. 20. The input to output relationship can be described by the equation below.

$$I_{D_{\epsilon_R}}=a_0+a_1R_e+a_2R_e^2+a_3R_e^3+a_4R_e^4\ldots; \epsilon R^2$$

The equation above indicates that the output functional, given a linear stimulus at the input, is a non-linear function which relates the Imaginary and Real components of the signal constellation space and is described by some number of terms, weighted by coefficients $a_0, a_1, a_2, a_3 \ldots$ etc., over some region R. However, if $a_0, a_1, a_2 \ldots a_n$ can be determined, then only those coefficients are required to be maintained. It is not necessary to store all the points or even many points along the non-linear function.

Figure 21:
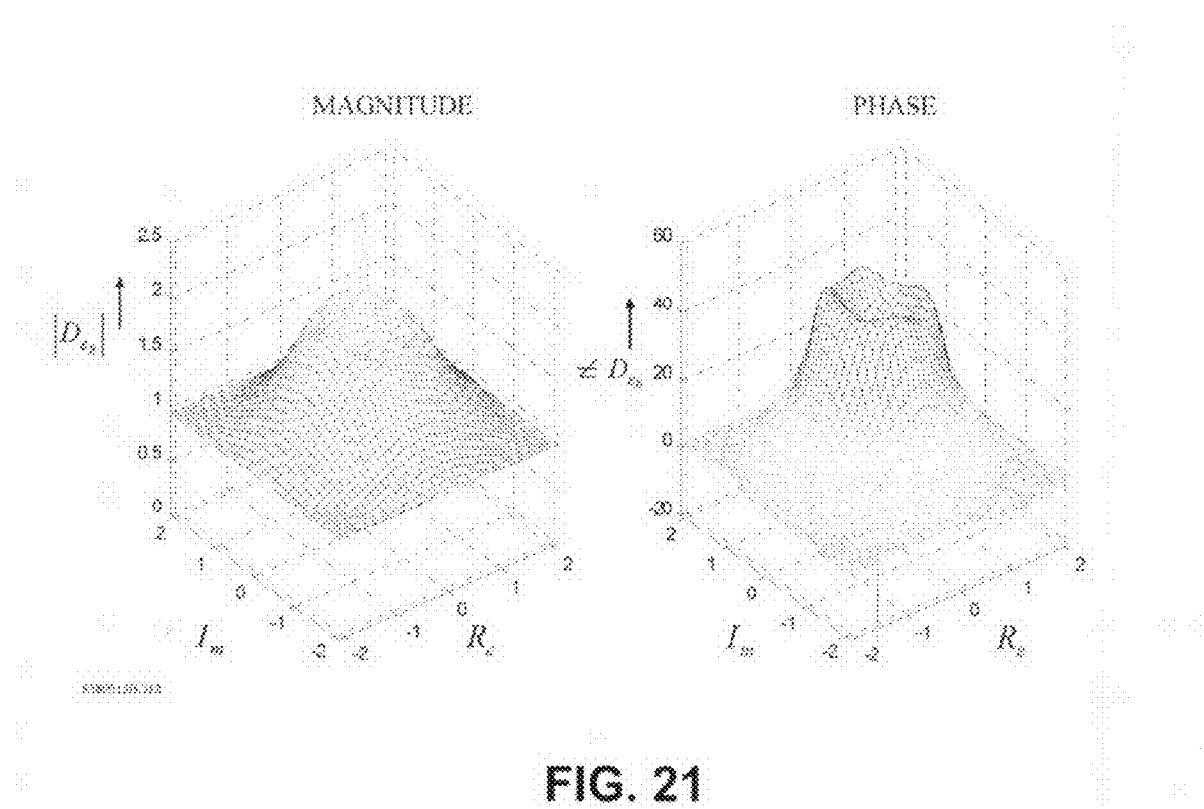
FIG. 21 illustrates an example three-dimensional graphical error description.

The description above with respect to FIG. 20 involves a single thread through a two dimensional space. A three dimensional graphical error description for $D_{\epsilon_R}$, where the third axis represents the magnitude/phase of the error within the complex signal space is illustrated in FIG. 21. Error in this example is measured as a difference between the input and the normalized output of the system.

In this representation, the third axis is $D_{\epsilon_R}$, and the two dimensional foundation plane is the real-imaginary complex signal plane. This permits a compact formulation of the error as:

$$|D_{\epsilon_R}| = f\{D_{\epsilon_R}(R_e, I_m)\}, \epsilon R^3$$

$$\angle D_{\epsilon_R} = f\{D_{\epsilon_R}(R_e, I_m)\}, \epsilon R^3$$

Figure 22:
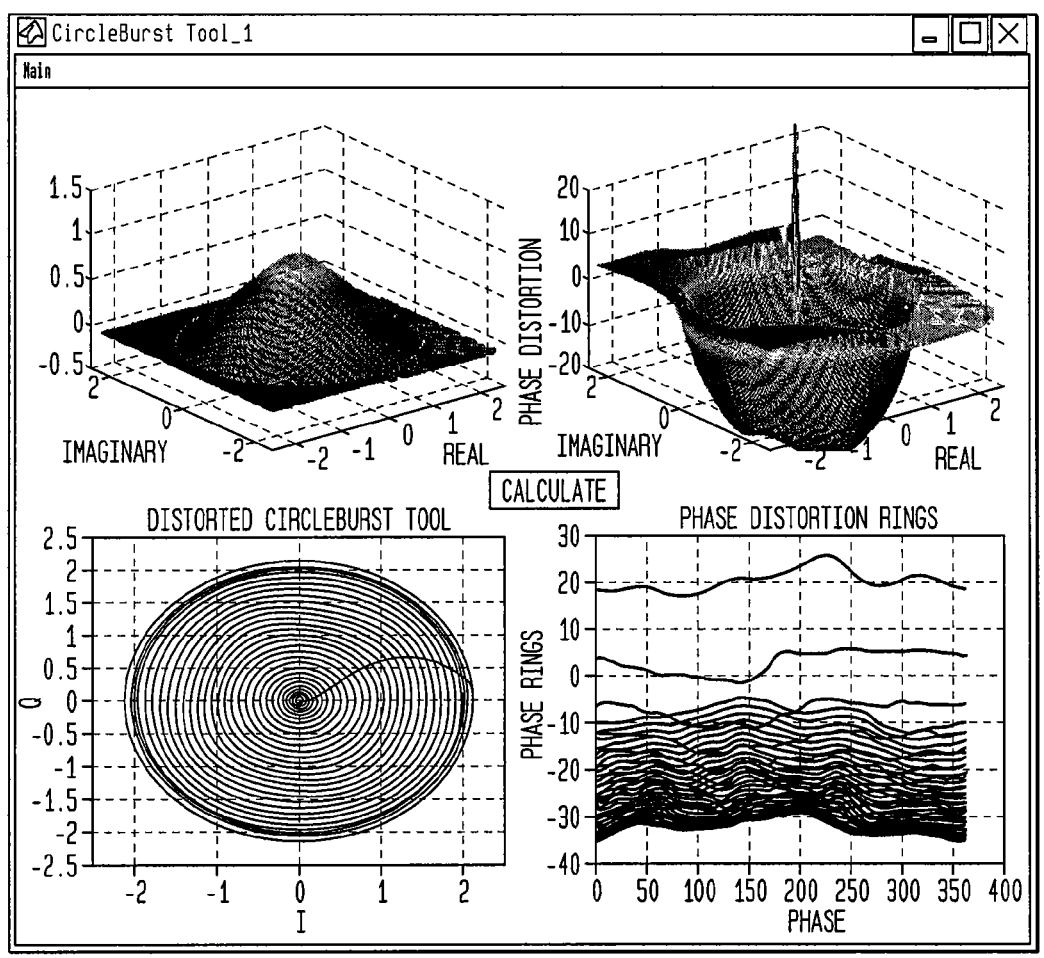
FIG. 22 illustrates example error for an input circle constellation stimulus.
Figure 23:
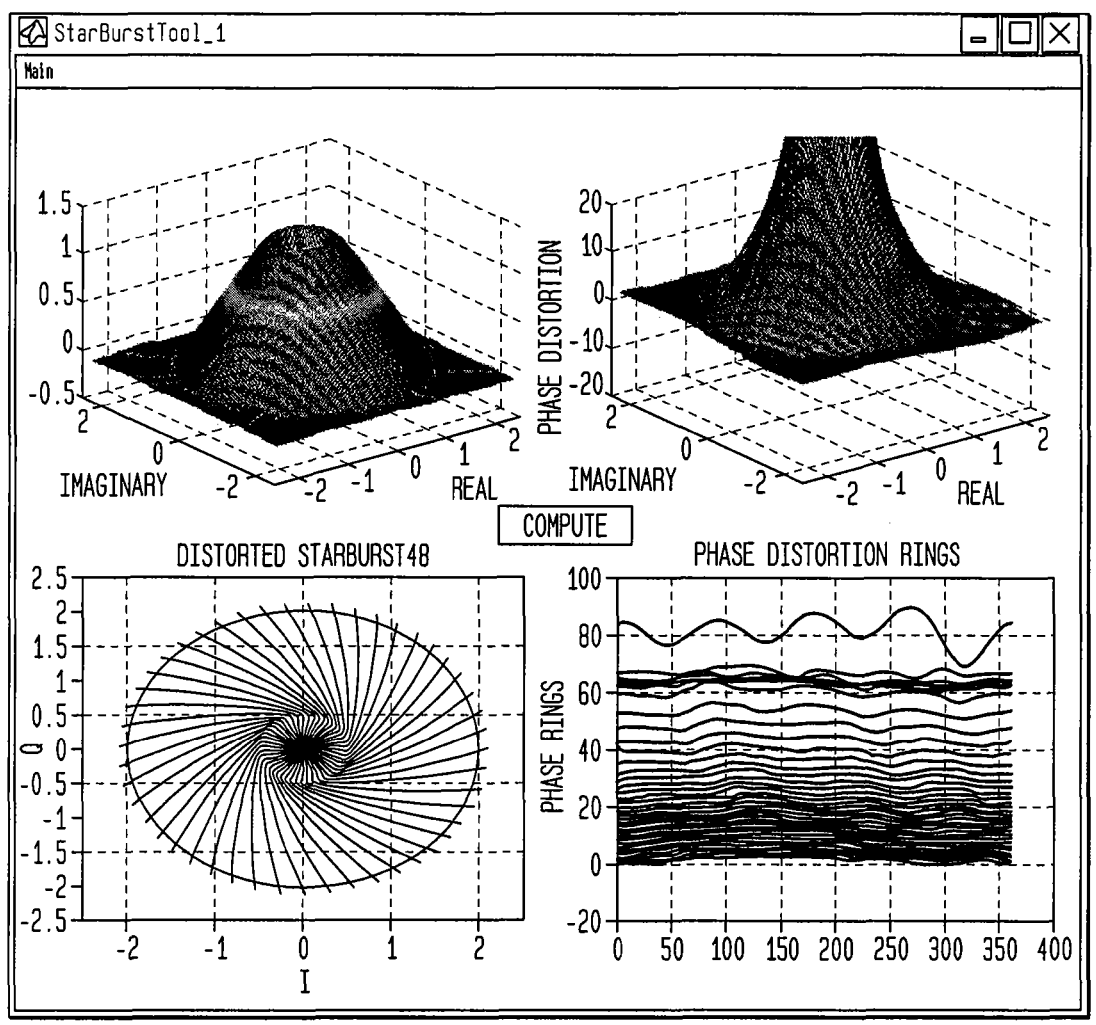
FIG. 23 illustrates example error for a radial constellation stimulus.

FIGS. 22 and 23 illustrate the behavior of the two dimensional complex plane error in the cases of an input circle constellation stimulus and a radial stimulus, respectively. In FIGS. 22 and 23, the top left and top rights plot illustrate the magnitude and phase of the error, respectively. The bottom left and the bottom right plots illustrate the input stimulus and phase distortion rings, respectively.

An extension of the error formulation above can also be generated for an N-dimensional complex plane as follows:

$$\|D_{\epsilon_R}\| = f\{D_{\epsilon_R}[(R_e, I_m), PS, WF, T, f, G \ldots]\}, \epsilon R^N$$

$$\angle\angle D_{\epsilon_R} = \theta\{D_{\epsilon_R}[(R_e, I_m), PS, WF, T, f, G \ldots]\}, \epsilon R^N$$

This illustrates that the error can relate to a large number of parameters as well as the complex signal state. Parameters illustrated in the formulation above include:

| | |
|---|---|
| $(R_e, I_m)$; | Coordinates of the Complex Signal Plane |
| PS; | Power Supply State |
| WF; | Waveform State |
| T; | Temperature |
| f; | Frequency of Operation |
| G; | Gain of VPA |

Figure 24:
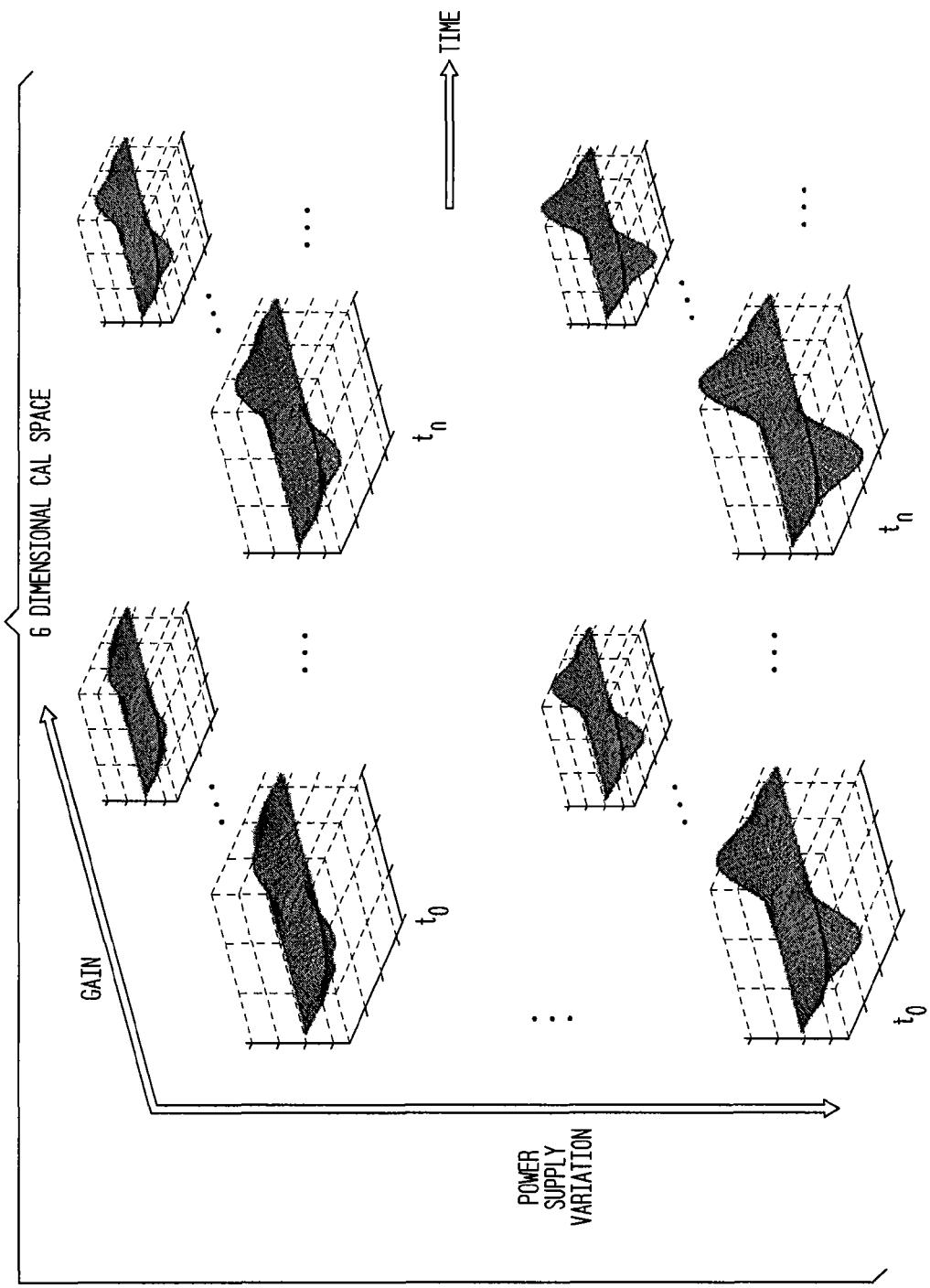
FIG. 24 is an example graphical illustration of a 6-dimensional calibration space.

This is a hyper geometric space and the resultant error surface $D_{\epsilon_{R^N}}$ is a hyper geometric manifold. Calculations involving such surfaces typically involve tensor calculus. However, it is also possible to present the formulation as multiple parametric states of a third order geometry. This approach is often not as efficient but is easier to understand, and visualize. One such graphical illustration of a third order geometry as a subset of $R^6$ is illustrated in FIG. 24. Notice that time was inserted as a horizontal dimension in the graphical example of FIG. 24. Other parameters could have been selected as well.

$D_{\epsilon_R}$ in the complex plane is a fundamental 2-D spatial kernel which is transformed via geometric translation to other higher order coordinate systems of up to N dimensions or the higher order systems consisting of expanded dimensions as well as parametric space. The next fundamental kernel is a 3-D spatial kernel which is derived from the complex information contained in the 2-D kernel. Hence, the two are equivalent in that respect. These kernels are universal to all analysis that follows and all higher order spaces and representations can be reduced to these lower order kernels.

(c) Efficient Error Gradients

Stimulus functions which probe the distorted signal space of interest have been described above. Higher order multi dimensional error surfaces can also be helpful, but even simple error surfaces (3 dimensional representation) can possess substantial numbers of samples to describe (on the order of 13K complex samples) the error.

An theorem is disclosed as follows, with detailed proof provided in the Appendix:

Theorem for Efficient Error Gradient Calculation

The most efficient error gradient is obtained by maximizing $\nabla D_{\epsilon_{R^N}}$ for all samples within the region $R^N$, and is proportional to maximization of the joint directional derivative $$\frac{\partial D_{\epsilon_R N}}{\partial(\zeta_N)}$$

where $\zeta_1 \ldots \zeta_N$ are orthogonal dimensional parameters of the space.

Although $D_{\epsilon_{R^N}}$ can be represented in many ways, which include vector representation, scalar fields with parameters, etc., the visual aspect presented as a surface manifold is particularly useful. The illustrations of FIGS. 20 and 24, for example, should be considered as scalar fields. Hence, the theorem given above is related to the directional derivative applied along the error surface. The goal then is to maximize the directional derivative. By constraining the derivatives to orthogonal dimensions, independence is assured such that unique information is imparted along the directions of the dimensional unit vectors. In the case of a 3 dimensional Cartesian system, the unit vectors would be $\vec{i}_x, \vec{j}_y, \vec{k}$. In a cylindrical coordinate system, the unit vectors would be $\vec{a}_r, \vec{a}_\phi, \vec{a}$. Both coordinate systems possess application for the problem at hand.

Figure 25:
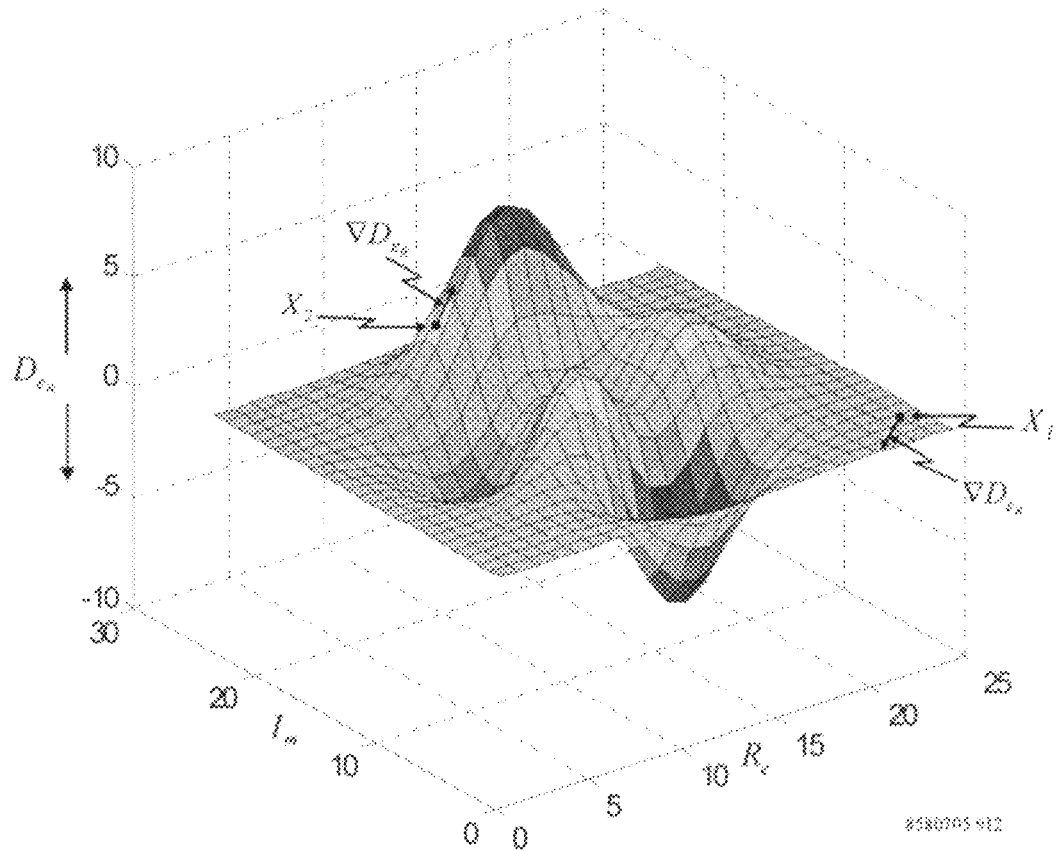
FIG. 25 illustrates an example error surface representation.

Consider the example error surface representation illustrated in FIG. 25. Notice that there are peaks, valleys, varying contours, etc. in the representation. Consider the point $X_1$, which is located on a relatively flat portion of the three dimensional rendering. No matter the direction selected within the immediate vicinity of $X_1$, the directional derivative or gradient is roughly zero. Therefore, deploying a lot of samples in this region is costly in that very little information is imparted per sample. Nonetheless, some minimal data is required to characterize even the flat area.

Now consider $X_2$, which is located on a portion of the surface which is highly irregular. In this volatile region, the directional derivative yields significant information. Visual inspection would indicate that the greatest rate of change is in the vertical direction. It follows that sampling in that direction near the locality of $X_2$ provides the maximum benefit for characterizing $D_{\epsilon_R}$, with the fewest required samples.

Since the directional slope at various points along the surface changes, the optimal sample distribution should be biased as well. An optimal solution from this point of view consistent with the theorem requires:

$$\max\{\nabla D_{\epsilon_R}\}$$

Another method of illustrating the point is obtained by projecting a vector along the error surface denoting the sampling direction, then maximizing the gradient according to the sampling vector orientation in the region. This would be represented by:

$$\left.\frac{\partial D_{\epsilon_R}}{\partial s}\right|_{opt} = \max\{|\vec{b}_s||\nabla D_{\epsilon_R}|\cos\gamma\}$$

where $\gamma$ is the angle between the sampling vector ($\vec{b}_s$) direction and the gradient, along the surface, s.

(i) Error in the Complex Plane

The view presented in Section (c) above relates to a surface error formed from the magnitude and phase error of $\vec{D}_{\epsilon_R}$ within the complex plane. It is important to note the impact of sampling and the theorem presented in Section (c) when the space is constrained by the 2 dimensional complex signal plane rather than the 3 dimensional scalar cloud.

Figure 26:
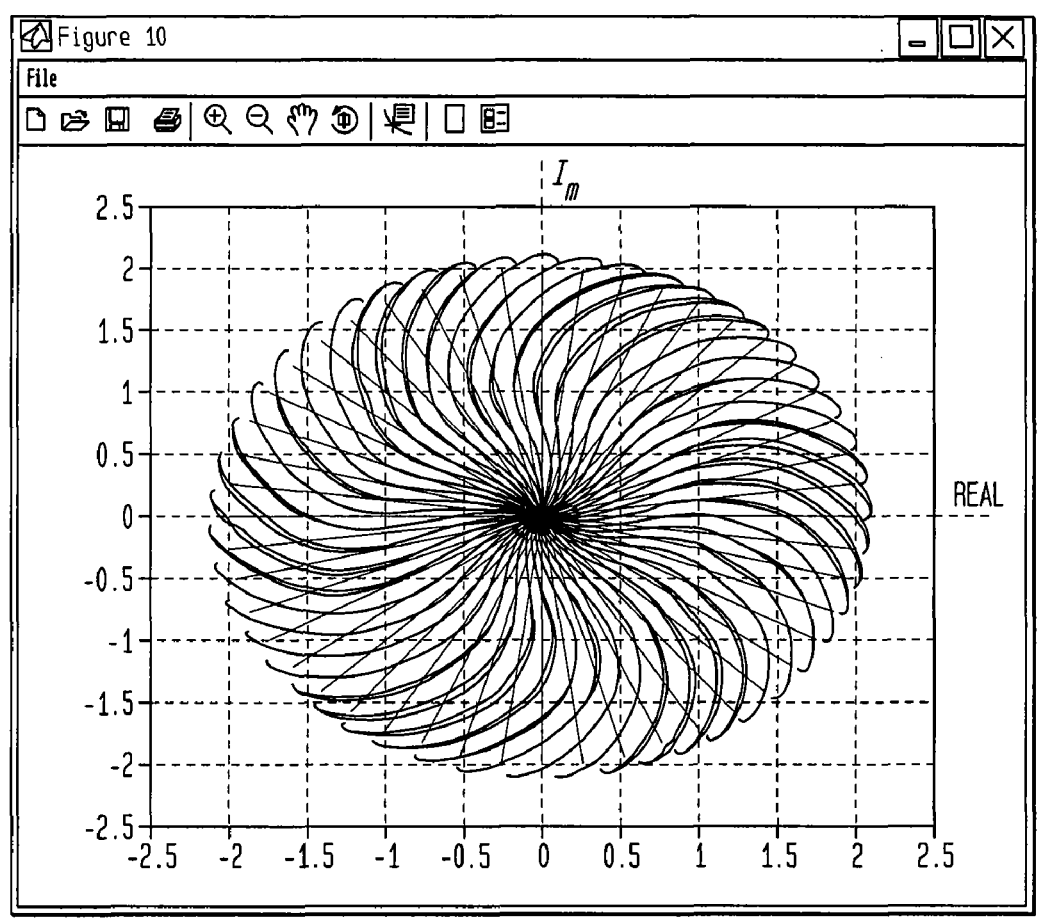
FIG. 26 is an example 2-dimensional view of a starburst calibration pattern.
Figure 27:
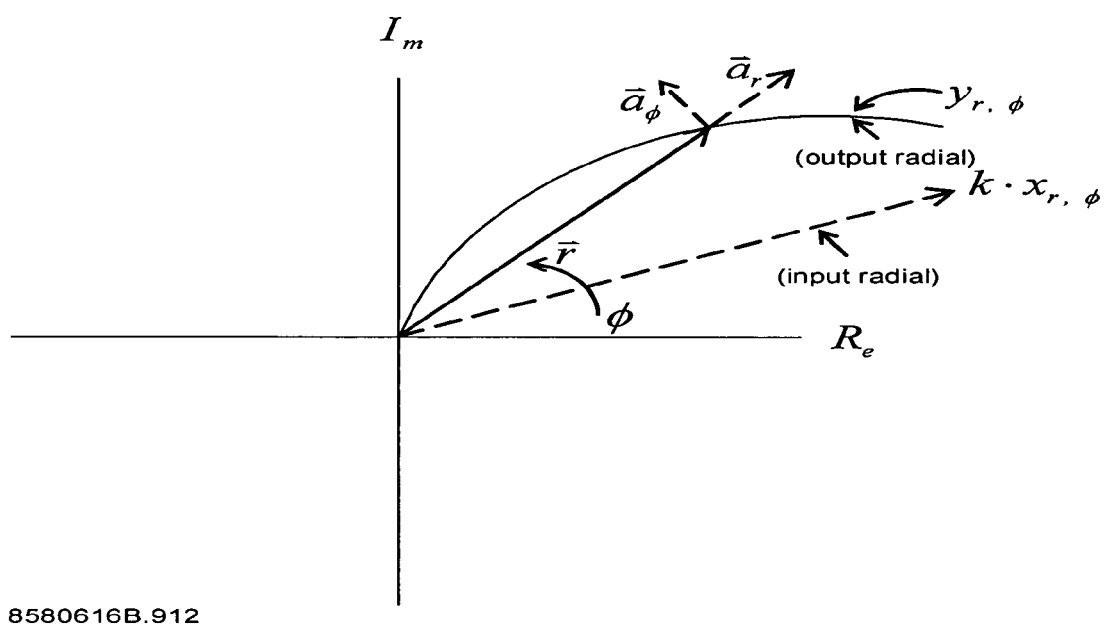
FIG. 27 illustrates a single radial arm of the starburst calibration pattern of FIG. 26.
Figure 28:
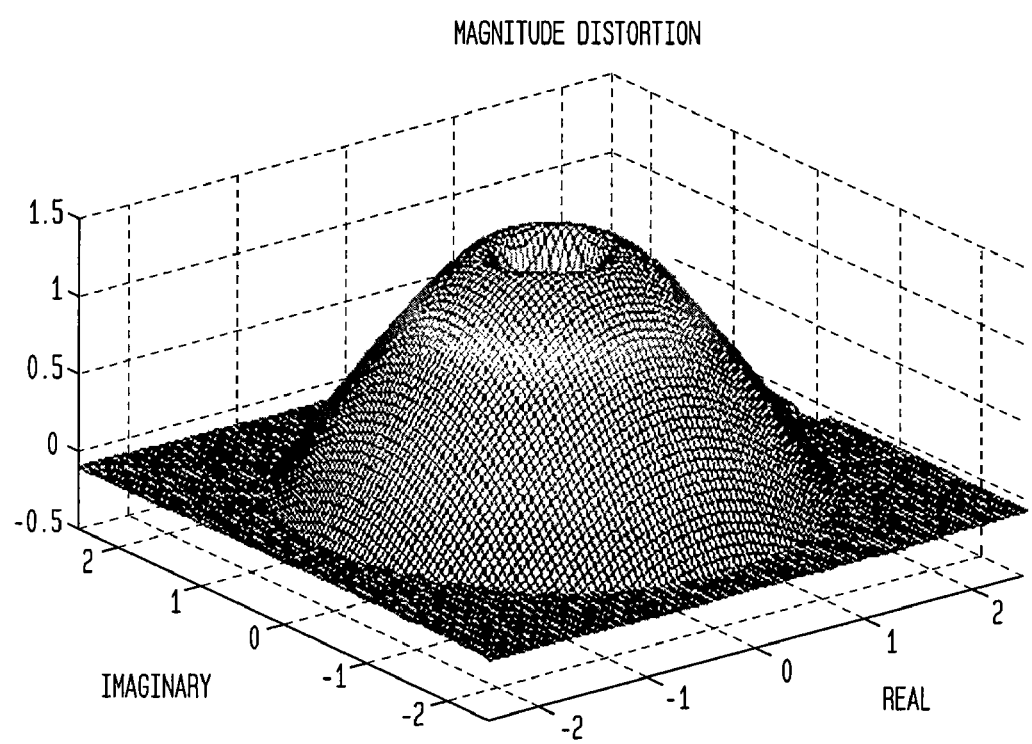
FIGS. 28-35 illustrate example magnitude and phase error gradients.
Figure 29:
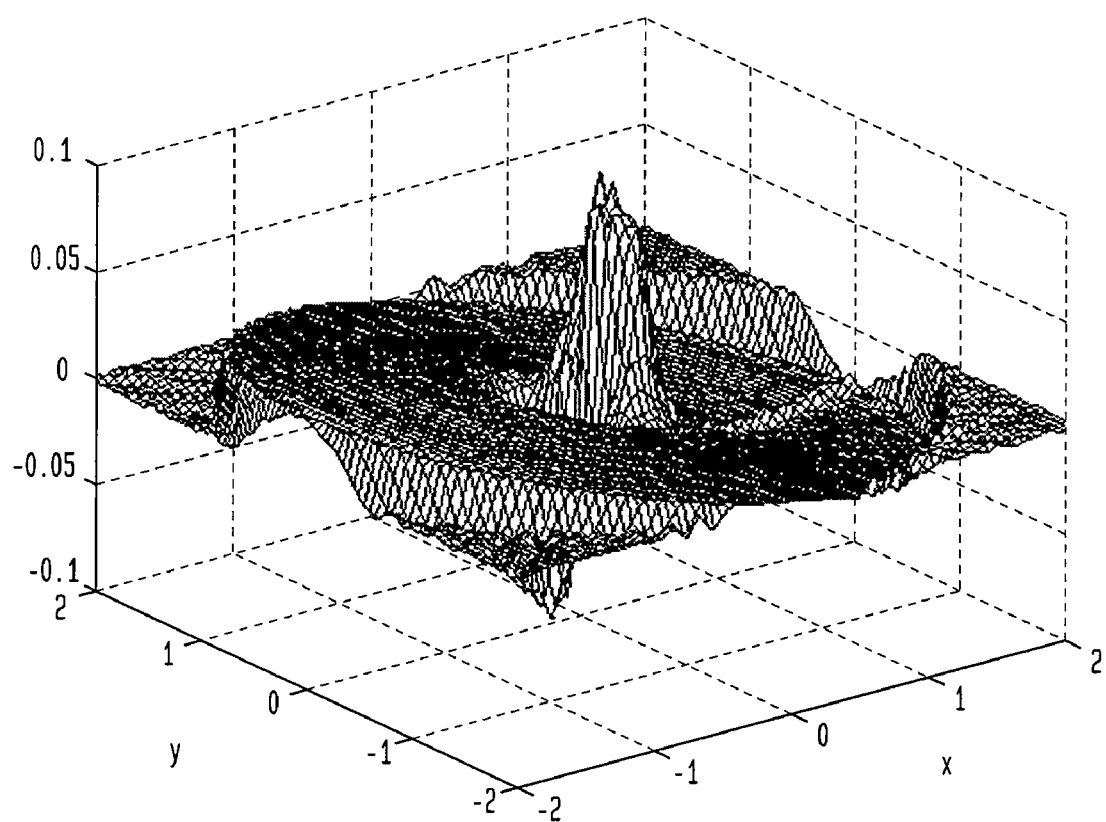
Figure 30:
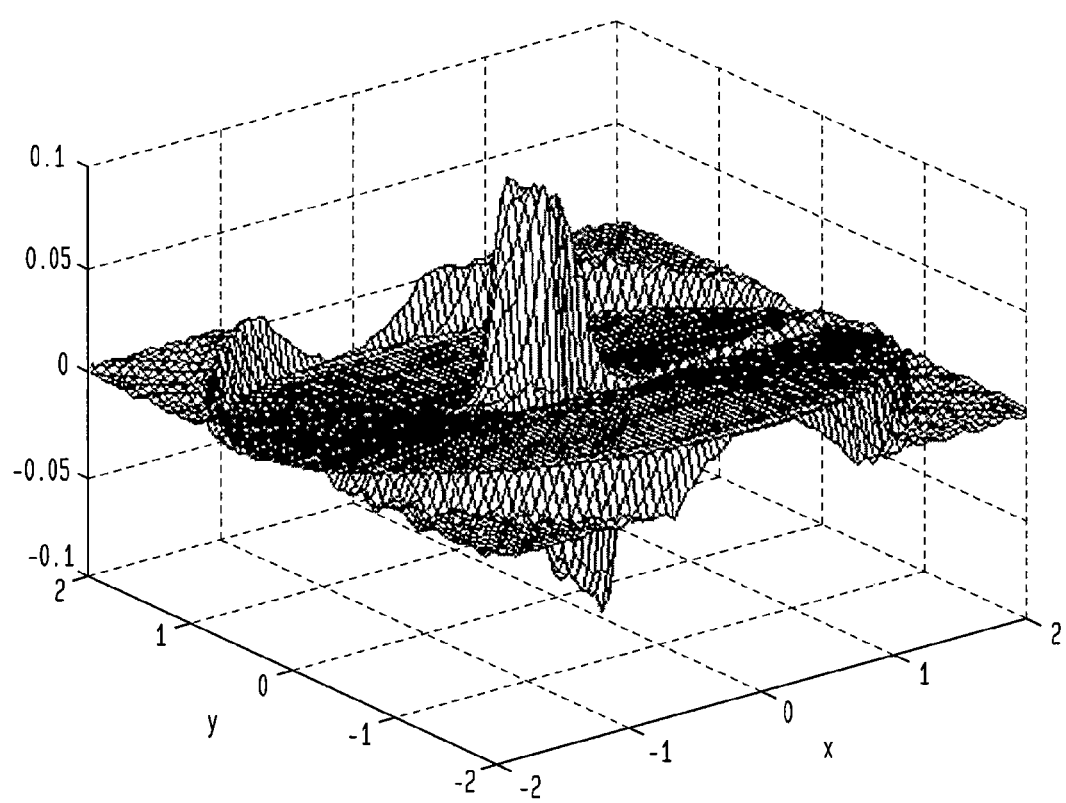
Figure 31:
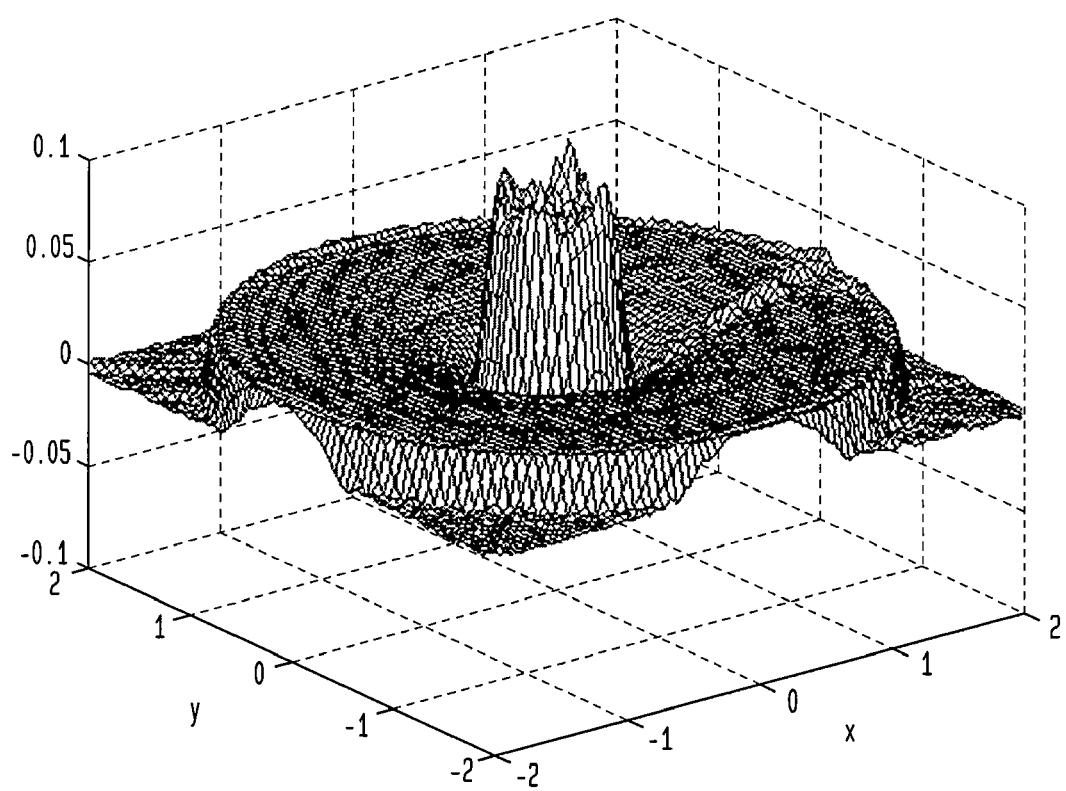
Figure 32:
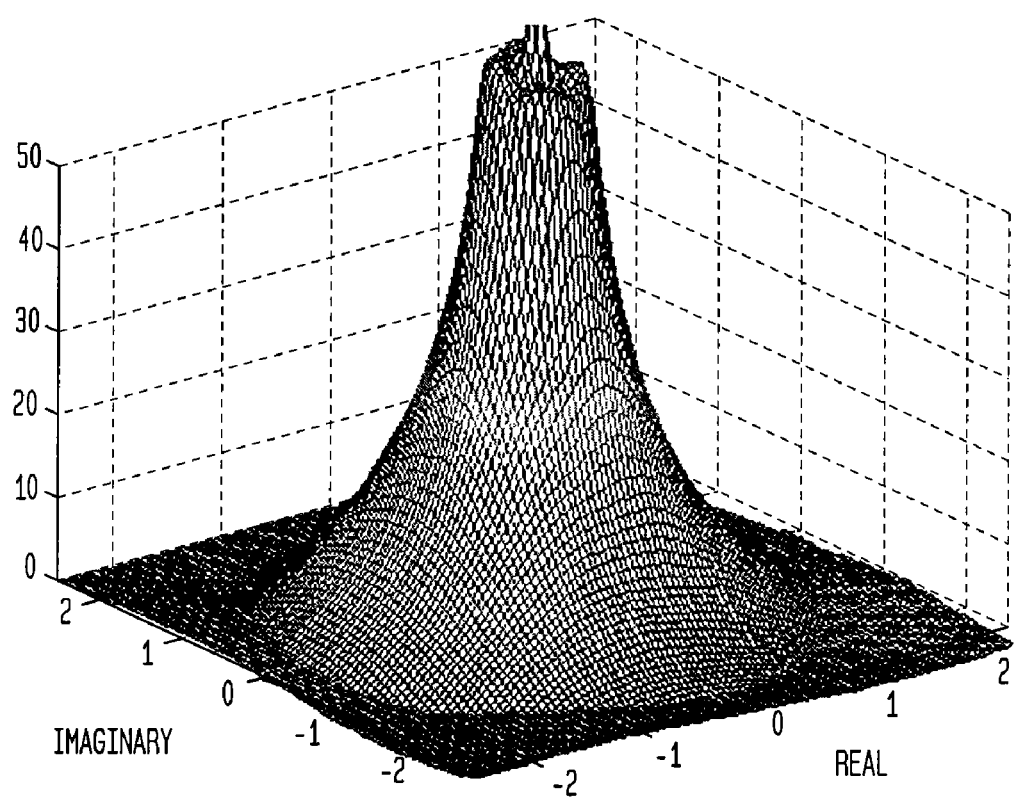
Figure 33:
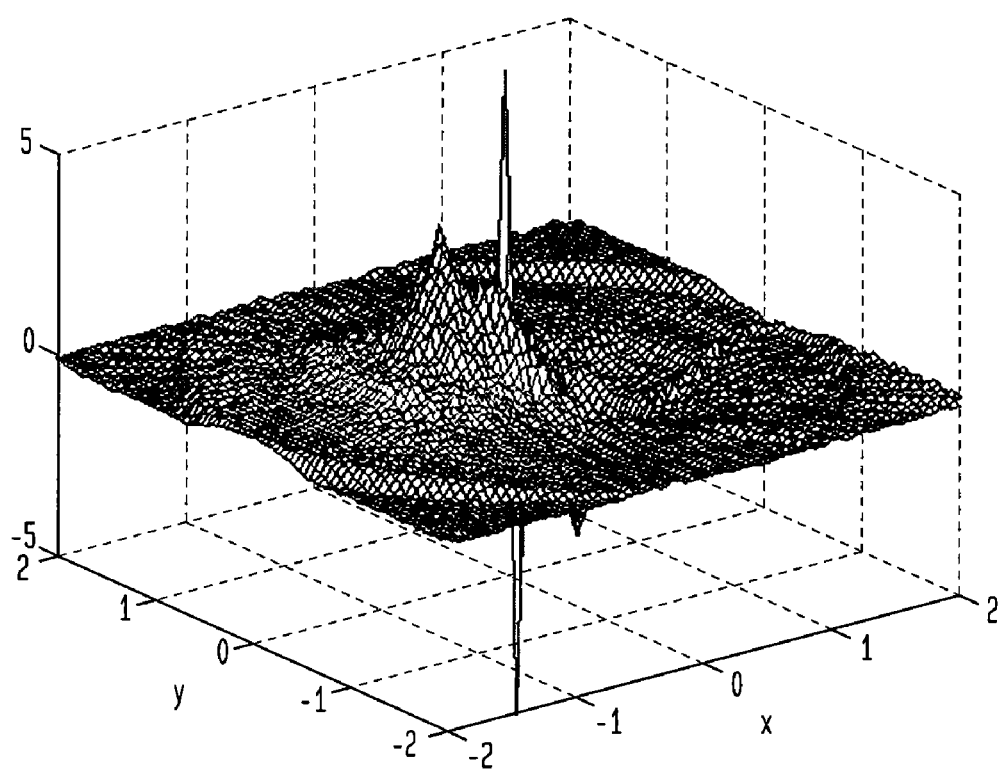
Figure 34:
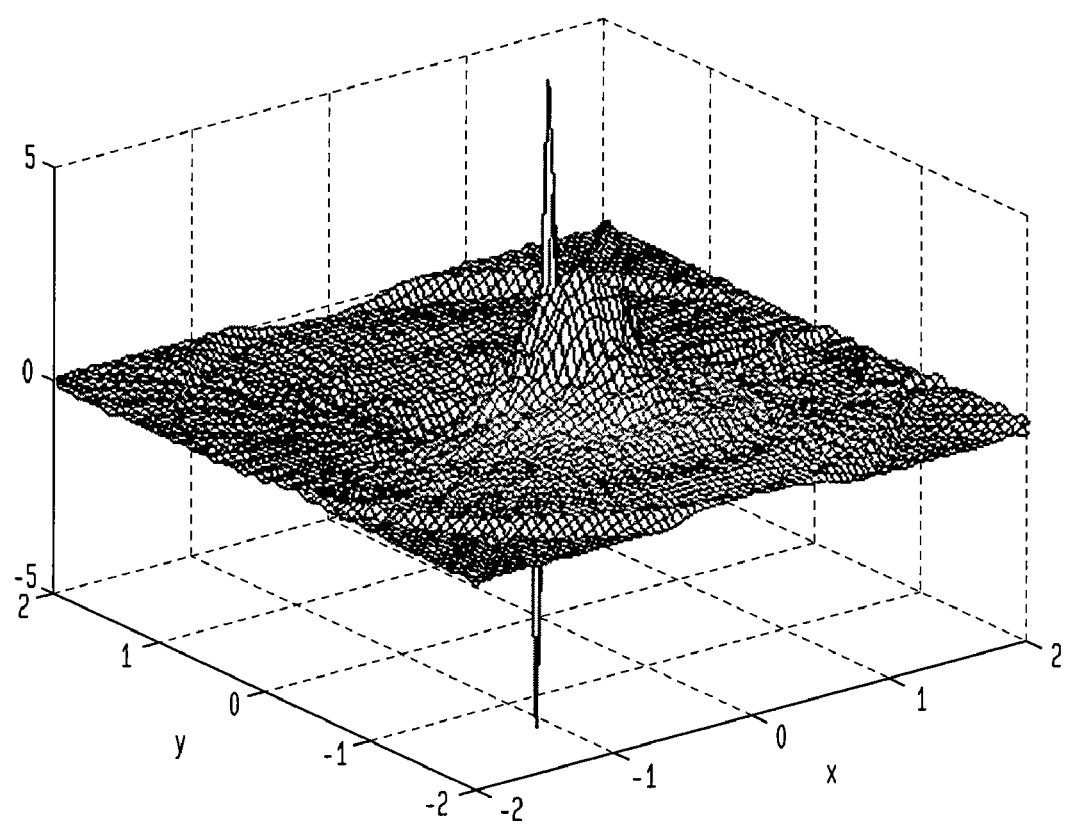
Figure 35:
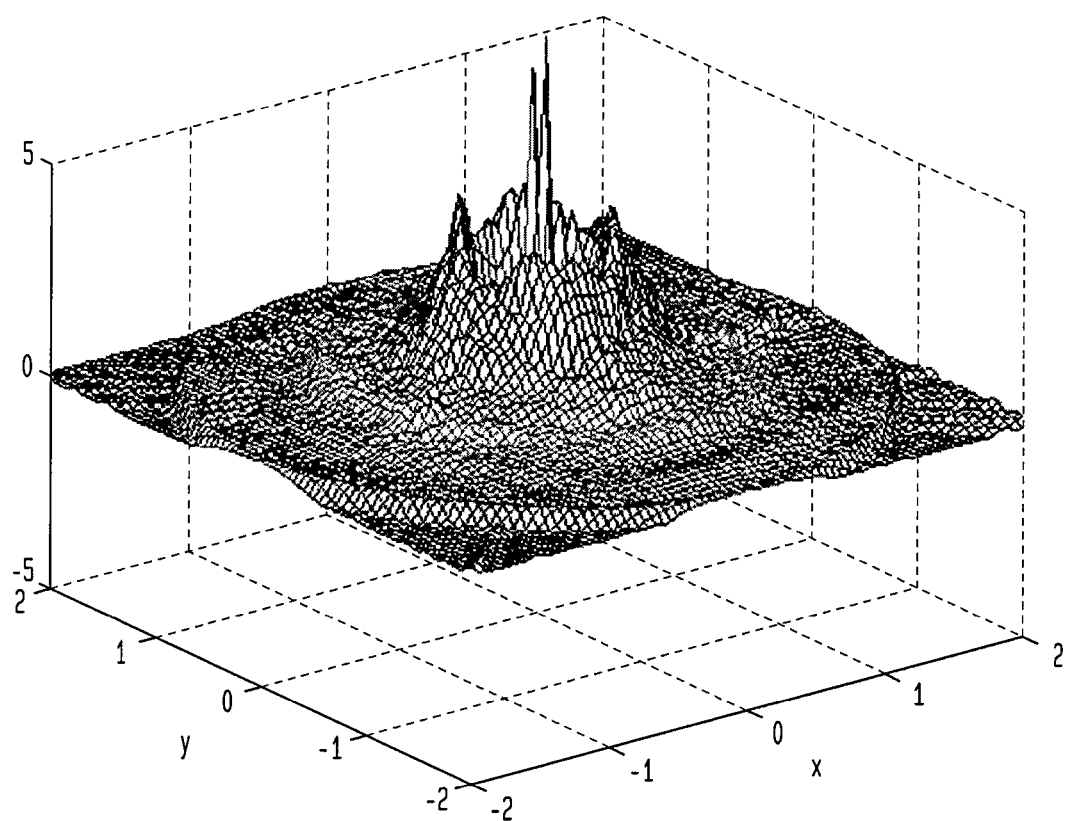

A polar representation is very convenient and will be used, occasionally. FIG. 26 is a 2-D view that illustrates a starburst calibration pattern in the complex plane with distortion. Notice the curvature in the radial arms. A single radial arm is illustrated in FIG. 27 and is examined below:

$\vec{r}$ is a radial vector which intercepts the radial arm at some desired sample location. $\phi$ is the angle to that vector. $\vec{a}_r$ and $\vec{a}_\phi$ are unit vectors for the polar representation and are an orthogonal basis. The test input to the VPA is $x_{r_i,\phi_i}$ and the output, the spiral arm, is $y_{r_i,\phi_i}$.

The following equations relate to this discussion:

$$\tilde{D}_{\epsilon_{r,\phi}} = \vec{y}_{r,\phi} - k\vec{x}_{r,\phi} \quad (k=\text{desired VPA gain})$$

Where;

$$\vec{y}_{r,\phi} = f_y(r) \cdot \vec{a}_r + f_y(\phi) \vec{a}_\phi$$

Since the unit vectors $\vec{a}_r$ and $\vec{a}_\phi$ are orthogonal $$\frac{\partial}{\partial r}\tilde{D}_{\epsilon_r} = \frac{\partial}{\partial r}(f_y(r) - kf_x(r))\vec{a}_r$$

$$\frac{\partial}{\partial \phi}\tilde{D}_{\epsilon_r} = \left(\frac{1}{r}\right)\frac{\partial}{\partial \phi}(f_y(\phi) - kf_x(\phi))\vec{a}_\phi$$

Notice that if the errors are constant in the radial direction then that partial derivative is zero. Similarly, the same is true for the $\vec{a}_\phi$ direction. Furthermore, it is possible to maximize these derivatives independently. If the radial derivative dominates the error gradient then it is better to sample in the radial direction. If the angular derivative dominates the error gradient then angular sampling may prove effective. However, as illustrated in FIG. 26, a blend of distortions is likely. In the case where distortion is distributed between the orthogonal dimensions, cross dimensional sampling may be optimized through proportional weighting. That is, some blend of sampling between the $\vec{a}_r$ and $\vec{a}_\phi$ directions is warranted, when star burst sampling is desired.

FIGS. 28-35 illustrate gradients generated for magnitude and phase of $D_{\epsilon_R}$. The gradients are directionally calculated for the scalar fields and a magnitude of the gradient is also included for both $|D_{\epsilon_R}|$ as well as $\angle D_{\epsilon_R}$.

(1) Higher Order Derivatives

Suppose that the error gradient is non-zero yet is constant. Accordingly, the directional derivative with the greatest first derivative would determine the sampling bias, i.e., the direction through the complex plane for which sampling should be applied, for most efficient characterization.

However, it should be noted that higher order derivatives are an important indicator as well. The rate of change of the error gradient is important because of considerations of entropy. Sections 5(a)(i)(1) and 5(a)(i)(2) described that the more erratic the behavior for $D_{\epsilon_R}$, the greater the entropy for its description (i.e., the greater the information content). Thus, the second order (or higher) gradient can also be maximized to obtain the path (sampling path) through the space which produces the greatest information acquisition per sample. Also, the regions with such erratic gradient behavior warrant greater density of samples as well.

(2) Power Weighting Considerations

The efficiency theorem as stated relates to variations in the error surface because variations retain more information content which must be processed in some manner for effective correction algorithms. Additional considerations which weigh the value of the information content include:

1) Significance of higher order gradients; and
2) Position of the gradients within the complex $R^2$ base.

Consideration 2) implies that corrections for linearization near the origin in a polar or cylindrical coordinate system are not typically as critical as corrections applied at larger radial distances. Larger radials correspond to larger signal distances and energies. Corrections must ultimately minimize misplaced signal metrics such as energies and distances. Therefore, small signals with large errors are not always the dominant concern. A small error in a large signal (larger distance for origin) may be more significant.

In addition, if errors are large in the vicinity of constellation decision points, then the EVM is more important in that vicinity and should be weighted accordingly. Some regions of the complex plane may experience signaling transitions rather than fixed constellation points or decision states. Transition regions should be weighted according to their effect on spectral domain compliance, spurious, ACPR, etc.

(d) Example of Radial Sampling Contour in Complex Plane

In this section, a solution to radial sampling in the complex plane is provided. To illustrate, consider the example radial sampling path of FIG. 36.

Figure 36:
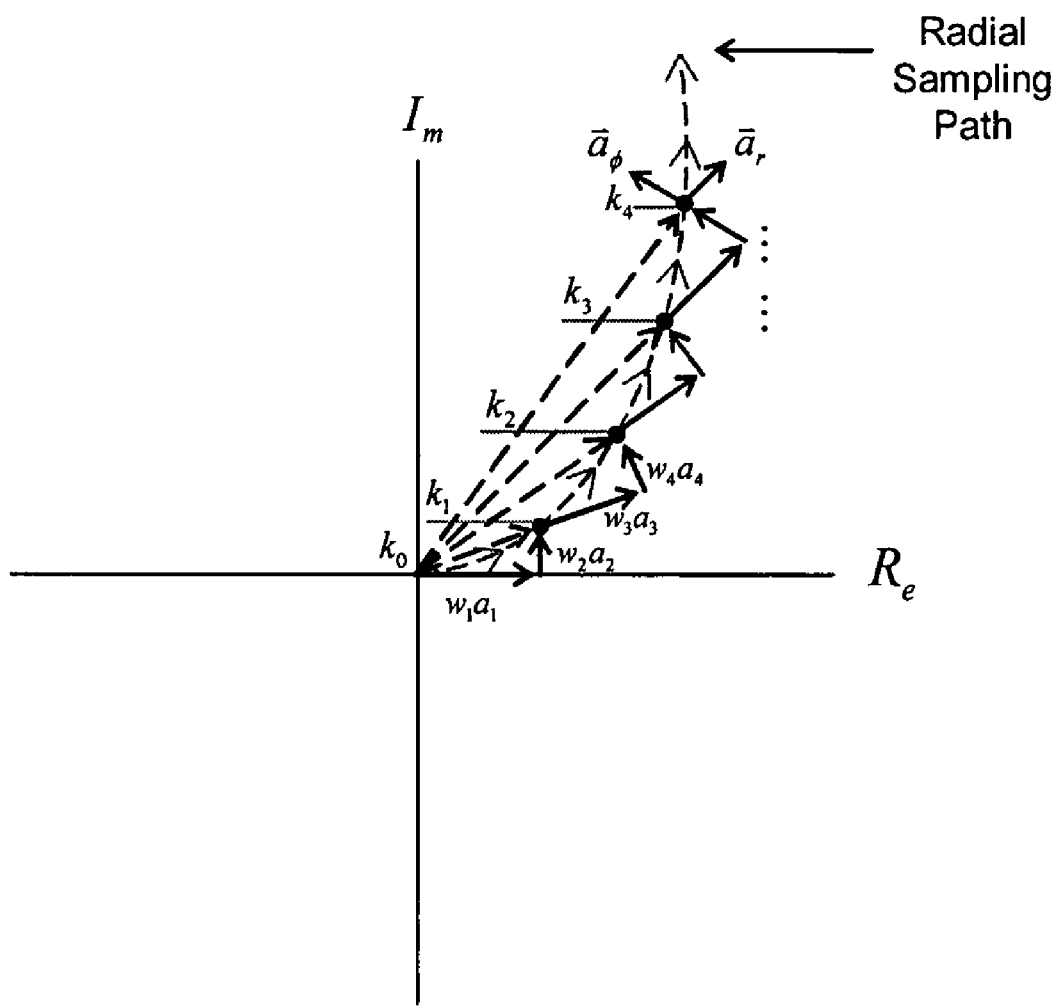
FIG. 36 illustrates an example radial sampling path.

The following definitions relate to parameters illustrated in FIG. 36:

$k_0, k_1 \ldots k_m \triangleq$ sampling points within the complex plane $w_1, w_2, w_e \ldots w_n \triangleq$ weighting values determined from the grad $\{D_{\epsilon_R}\}$ and other considerations $a_1, a_2, \ldots a_n \triangleq$ differential orthogonal components of the samples. Even order terms are in the $\vec{a}_\phi$ direction, odd order terms are in the $\vec{a}_r$ direction $\vec{r}_0, \vec{r}_1, \ldots \vec{r}_m \triangleq$ vectors from origin to the sampling points or knots $k_0, k_1 \ldots$ in the direction of $\vec{a}_{R_n}$ $\phi_m \triangleq$ sample angle, angle between $R_e$ axis and sample radial vector $\vec{r}_m$.

Based on the above, the following equations can be written:

$$r_m^2 = (r_{m-1} + w_{2m-1})^2 + (w_{2m}z_{2m})^2$$

$$m = 0, 1, 2, \ldots n/2$$

$$\phi_m = \begin{cases} \phi_{m-1} + \mu_m \sum_{v=0}^{\infty}(-1)^v \frac{\mu_m^{2v}}{2v+1}, & |\mu_m| < 1 \\ \phi_{m-1} + \left(\frac{\pi}{2} - \frac{1}{\mu_m}\sum_{v=0}^{\infty}\frac{(-1)^v}{(2v+1)\mu_m^{2v}}\right), & |\mu_m| \geq 1 \end{cases}$$

where $\mu_m$ is defined as:

$$\mu_m = \frac{w_{2m}a_{2m}}{w_{2m-1}a_{2m-1}}$$

$\phi_m$ must be calculated based on the quadrant of the complex plane by tracking the signs of the even and odd portions of the quotient for $\mu_m$.

Note that the function traced out by the example plot is monotonic and smooth. However, the differential components, $a_n$, can take on +/− values so that the sampling function can meander anywhere within the plane. If gradients of $D_{\epsilon_R}$ are large and negative in the radial direction, then the weights in the radial direction (odd weights) will be large and the $a_{odd}$ will be negative. The same reasoning applies for the $\vec{a}_\phi$ direction as well.

The sample point locations within the output complex plane are $r_m$, $\phi_m$. In order to ascertain the inputs, the distortion is reversed and the sample is mapped to the input since the input stimulus is known to be perfectly linear along $\vec{a}_r$. Therefore the cross coupling of components in the output (AM-PM conversion) can be easily detected by the gradient calculation.

This analysis reveals the following principles:
1) The analysis of the output samples for radial input sampling should occur on the natural trajectories or contours of the warped output radials;
2) Sampling radially can detect the distortions giving rise to $D_{\epsilon_R}$ only in the following manner, if a single radial thread is analyzed:
   a) Local AM-AM distortions such as amplitude compression and expansion can be detected; and
   b) Local AM-PM distortions can be detected i.e., cross coupling from the radial $\vec{a}_r$ direction to the $\vec{a}_\phi$ direction.
3) Excitation of the $\vec{a}_r$ at the input is an efficient detector of radial distortion at the output; and
4) The density of samples along the output radial threads (Euclidian distance between $k_m$) is different than the assigned distance at the input as a function of $a_n$ an $w_n$.

(i) Averaged Weighting

The equations provided above with respect to FIG. 36 can provide fine structure tracking of the sampling gradient if $a_n$ is a small increment. In the limit $a_n$ may be a differential component. It is possible under certain conditions to average the weights $w_n$. The even weights could be averaged separately from the odd weights, for example.

If the radial gradients are averaged then each of the $a_n$ for n even would be weighted by $\tilde{W}_{AV_E}$. The odd $a_n$ could be weighted by the odd average, $W_{AV_O}$. As such:

$$W_{AV_E} = \left\{\frac{1}{2n}\right\}_{Int} \sum^{n=even} W_n$$

$$W_{AV_O} = \left\{\frac{1}{2n}\right\}_{Int} \sum^{n=odd} W_n$$

where $\{\ \}_{Int}$ denotes the integer value of the number in brackets. This approach may prove very practical under a number of circumstances, especially if multiple radial arms are averaged and calculated or if many devices are to be characterized. Then it is desirable to provide a universal weighting value, where possible, to reduce the number of calculations. It may be possible to use the same even and odd averaged weighting to characterize entire lots of components. Similarly, the angles may be indirectly characterized by using:

$$\tilde{\mu}_m = \frac{\overline{W}_{av_E} a_{2m}}{\overline{W}_{av_O} a_{2m-1}}$$

In later sections it is suggested that the errors between the raw data and a polynomial fit to the radial sample arm may be utilized to form a MMSE (Minimum Mean Square Error). This type of smoothing fit or averaging fit is often preferred.

(e) Multiple Radial Sampling Arms

The previous section described that when the radial sampling approach is used in a single thread manner:
1. PM to PM and PM to AM distortion cannot be easily detected; and
2. Non homogeneous distortions in $R^2$ cannot be characterized.

Both a) and b) represent conditions of under sampling. $D_{\epsilon_R}$ is a two dimensional function when restricted to the complex plane and a single contour cannot characterize the 2 dimensional topology, unless the topology is trivial. A single thread could characterize the topology if it is a spiral which swirls from the origin outward toward the unit circle. However, for reasons stated earlier this violates the maximum gradient theorem, and would typically be inefficient in terms of sample deployment.

Figure 37:
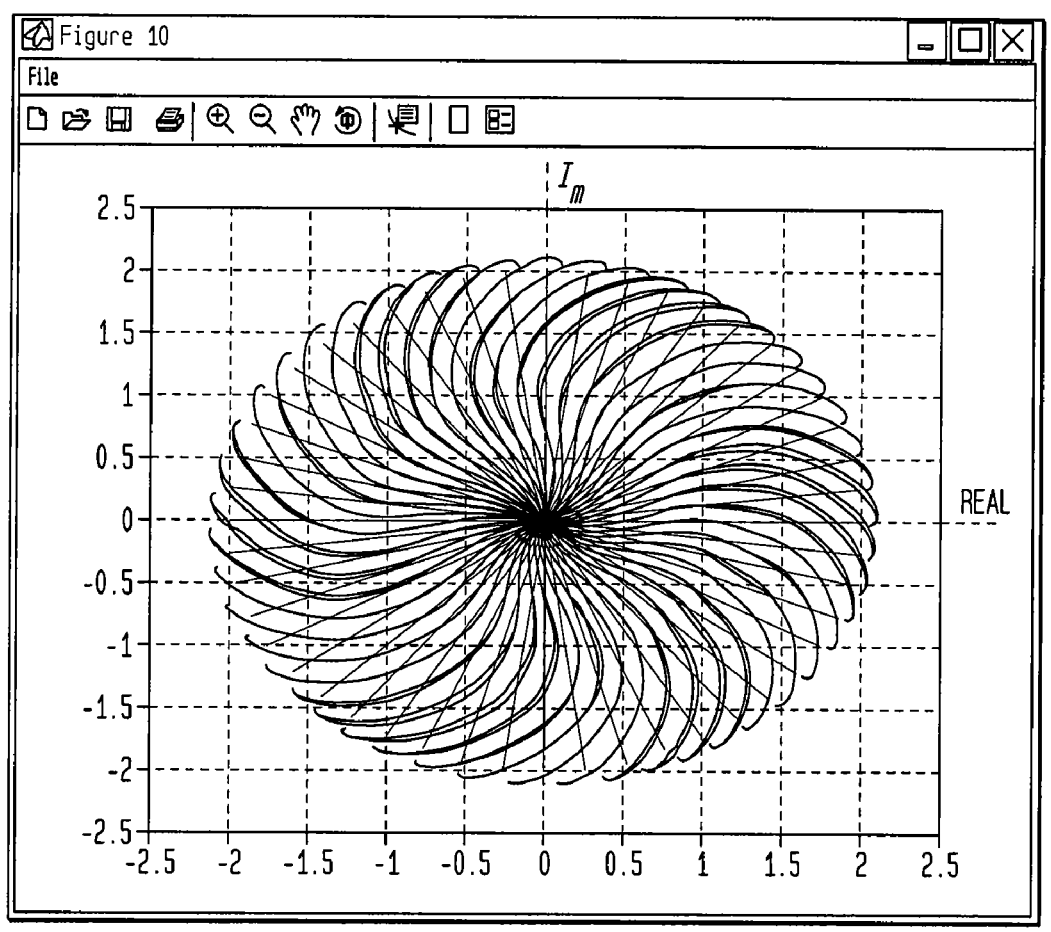
FIG. 37 illustrates an example multi-radial sweep technique.

A multi radial sweep technique, as illustrated in FIG. 37, could potentially characterize the entire complex plane, when taken as an ensemble. As shown in FIG. 37, the entire plane is covered by 48 radial sweep arms in this example star burst. Although swept in radial bursts, the adjacent radial arm samples can be arranged or organized to present a circle like contour at an approximate radial offset $r_0$ and analyzed along the $\vec{a}_\phi$ direction.

There is however another concern of practical importance. As described in Section 2, there are multiple parallel impulse responses that make up the VPA transfer characteristic. Hence, bandwith (BW) is a concern. That is, AM-PM, AM-AM, PM-PM, and PM-AM are potentially bandwidth dependent to some degree. It is widely known that the first two (i.e., AM-PM and AM-AM) can be bandwidth dependent. The second two (PM-PM and PM-AM) are often overlooked. The radial arm technique permits efficient means of exciting the VPA for detection of AM-AM and AM-PM. However, the bandwidth of sampling the sweeps successively to reveal PM-PM and PM-AM is roughly reduced by the number of samples along a radial arm. In the nominal multiple radial arm scheme, a single radial arm would complete prior to sweeping another radial arm somewhere in the complex plane. Therefore a newly excited $\phi_i$ at the input is deferred, radial by radial, at a much slower pace than the amplitude sweep of a particular.

Whether or not this is a draw back should be determined prior to selecting a sweep technique. For instance, if PM-PM and PM-AM possesses a low sensitivity to bandwidth then perhaps a radial sweep is sufficient. More importantly, if the rate of change of phase within the targeted application (WCDMA, EDGE, GSM, etc) can be emulated by the calibration signal then the BW is sufficient by definition.

Techniques may be employed which order the radial arms to be sampled in such a manner as to increase bandwidth of the phasor through phase modulation, by various means such as alternating quadrants of the complex plane, jumping from one radial arm to another, eventually completing all sample locations required for coverage. These techniques will tradeoff bandwidth expansion due to radial domain (amplitude) fluctuation for angular fluctuation of the complex signal.

(f) Comparison of Circular Sampling and Radial

Figure 38:
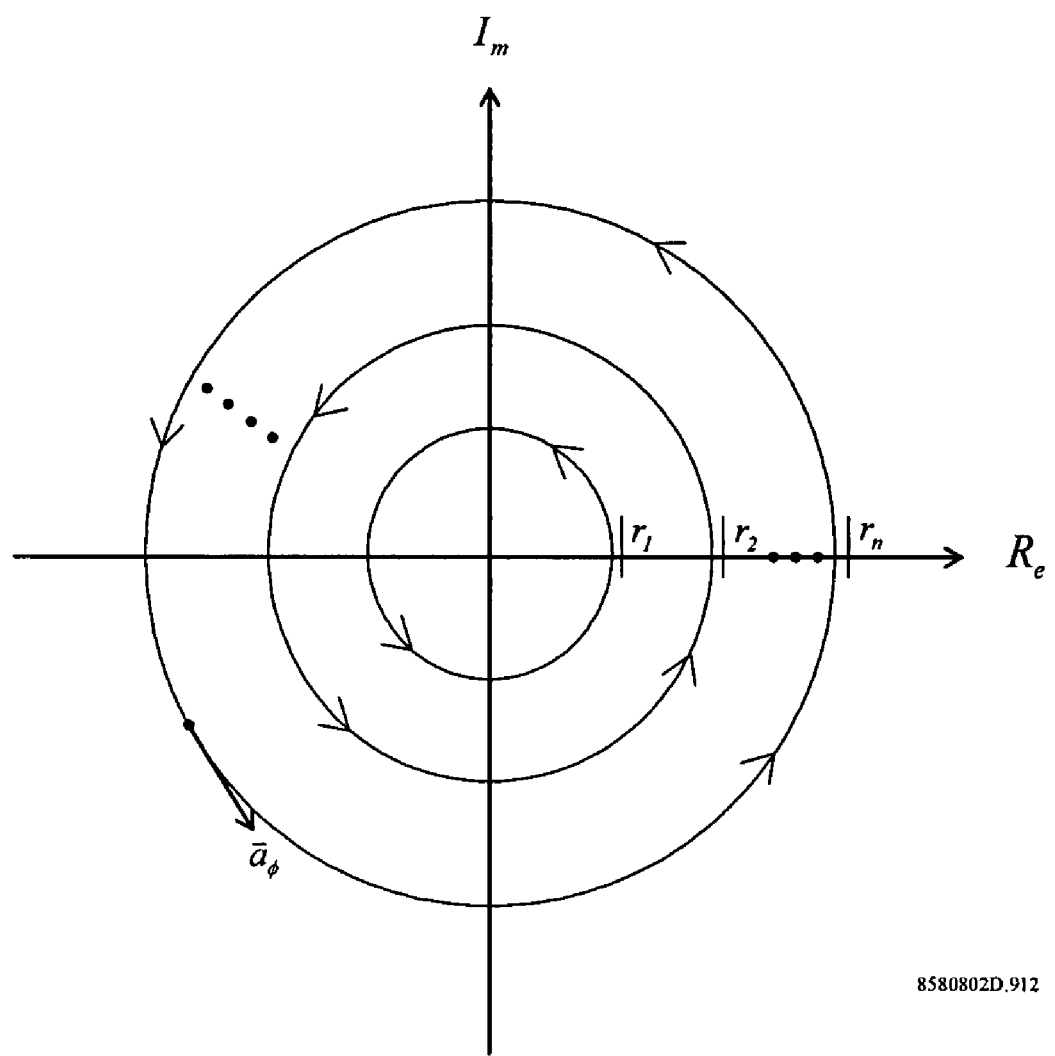
FIG. 38 illustrates example input circle constellations.

Earlier sections included significant discussion of radial sampling. This section provides some insight into circular sampling. FIG. 38 illustrates example input circle constellations.

Referring to FIG. 38, suppose that the input samples $X_i$ are arranged on circles within the complex plane and that many such circles are utilized to excite the input, successively. The entire complex plane can be characterized if the density of circles and samples located on the circles are sufficient. Furthermore, PM-PM conversion as well as PM-AM conversion can be characterized. Notice that the direction of stimulus is always orthogonal to the radial direction, according to $\vec{a}_\phi$. Hence, the PM-PM and PM-AM affects are completely decoupled from the AM-PM and AM-AM affects uncovered by radial sampling.

Let $X(t)$ represent some input function which is to be sampled, to create $X_i$, the input samples. $X(t)$ can be written as:

$$X(t)=A(t)e^{j(2\pi f t+\Theta(t))}$$

The amplitude and phase components of the complex phasor $X(t)$ are illustrated in the equation as decoupled from one another, and as such they can be modulated independently. Moreover, their vector representations within the polar plane are orthogonal. This is an important observation to resolving the non-linearity mechanisms.

Figure 39:
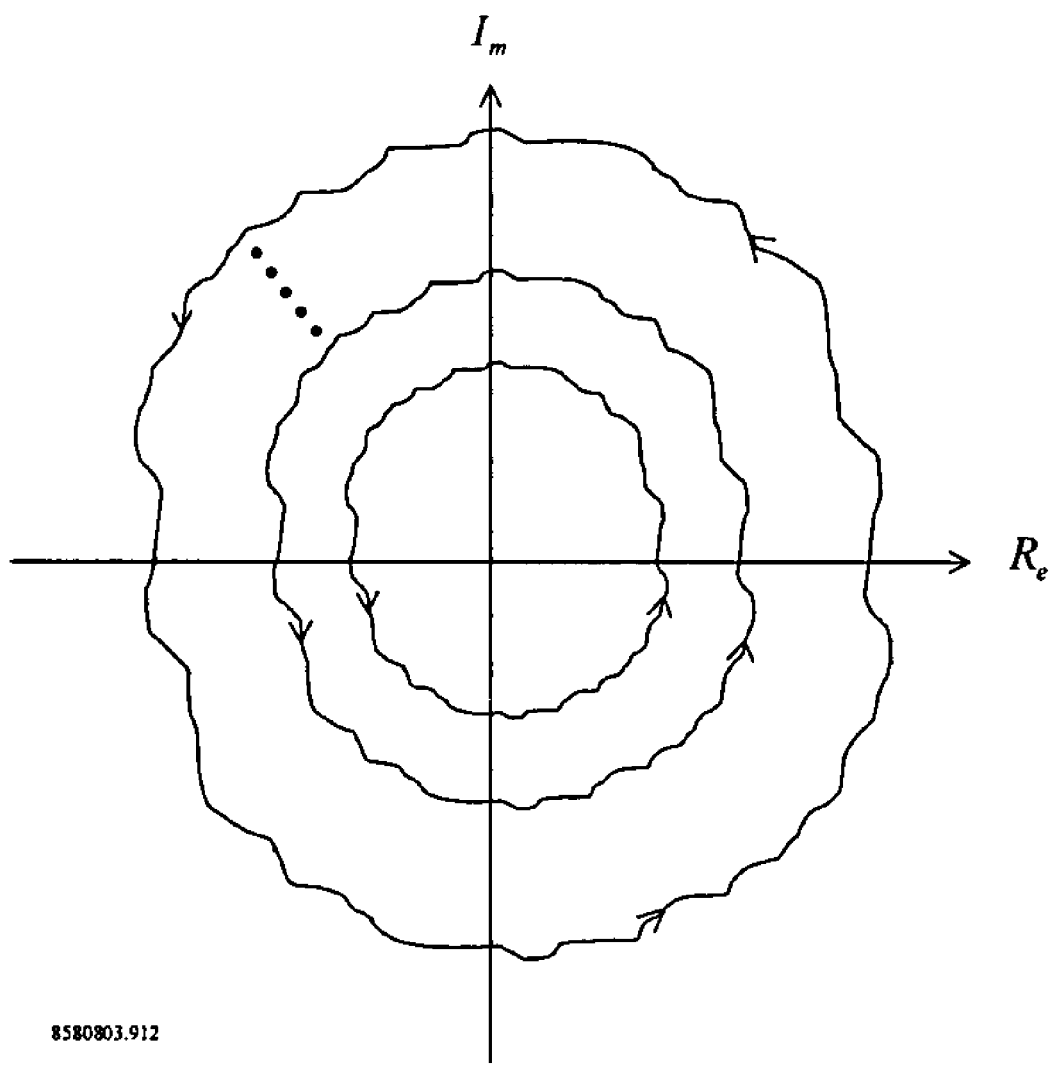
FIG. 39 illustrates example output constellations that correspond to the input constellations of FIG. 38.

FIG. 39 illustrates example output constellations that correspond to the input constellations of FIG. 38. The output constellations appear distorted because the VPA is non-linear.

Note that $D_{\epsilon_R}$ may be obtained from the $x_i$ and $y_i$ as previously discussed in other portions of this disclosure. Based on the above, the following can be said regarding sampling options discussed thus far:

1. In the most general case, both radial domain and phase domain sampling would be required because AM-AM, AM-PM must be decoupled from PM-PM and PM-AM, assuming all mechanisms are present and significant;
2. The degree of importance of these orthogonal sampling approaches is directly related to the sensitivity of $\nabla D_{\epsilon_R}$ obtained by/from exciting the input in one or the other direction, i.e., $\vec{a}_r$, $\vec{a}_\phi$; and
3. Whether or not the AM-AM, AM-PM and PM-PM, PM-AM components can be resolved by some other non orthogonal sampling trajectories on the input is related to the bandwidth dependency due to phase variation ($\Theta(t)$) and amplitude ($A(t)$) variation at the input and the sensitivity of the VPA to these variables.

The implication is that $D_{\epsilon_R}$ is a function of sweep rate and direction of sweep through the complex plane.

(g) Joint Sampling Approach

Figure 40:
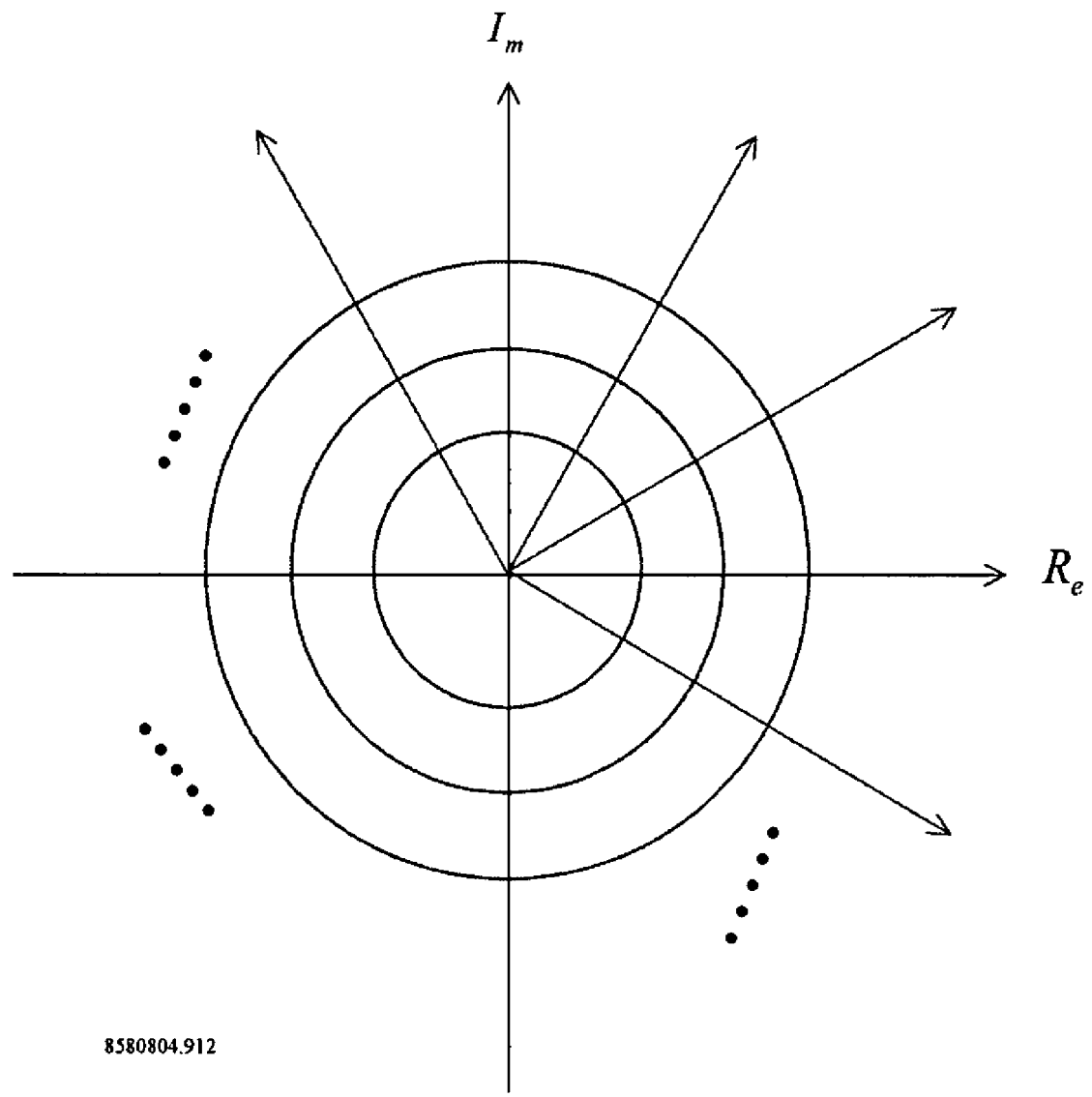
FIG. 40 illustrates an example input sampling web.

As indicated in sections (e) and (f), there are cases for which radial (amplitude domain) and phase domain sampling are warranted. In those cases a polar MESH can be obtained. This forms an input sampling web, as illustrated in FIG. 40, for example.

In a general case, the circles are generated independent of the radials, their rates are independent, and their sampling densities can also be controlled independently. If so desired, the polar coordinates could be converted to rectangular coordinates. The number of radials, the number of circles, and the sample density on circles and radials are variable parameters according to this approach.

(i) Cross Correlation

If circular sampling does not reveal any new and unique information compared to radial sampling, then it is not required. Similarly, if radial sampling does not reveal any new and unique information compared to circular sampling, then radial sampling is not required.

Suppose a fine input polar sampling mesh is generated. Then, output samples $y_i(\vec{a}_r)$ and $y_i(\vec{a}_\phi)$ are be compared (for common input sample locations) by correlating the data. The peak correlation coefficient can be represented by:

$$\rho_{\phi_i,r_i}=E\{(\hat{y}_{\phi_i})(\hat{y}_{r_i})\} \quad \text{(co-variance)}$$

$$y_{\phi_i}=y_{\phi_i}-\vec{y}_\phi$$

$$\hat{y}_{r_i}=y_{r_i}-\vec{y}_r$$

The mean values $\vec{y}_\phi$ or $\vec{y}_r$ are obtained on circle contours or radial contours (whichever is desired) at the mesh intersections (or interpolated intersections) so that the inputs whether circular or radial would be expected to give rise to the same output numbers. That is, mesh crossings on the input should give rise to mesh crossings on the output which contain information regarding the related correspondence of input and output data versus sweep method. The correlation coefficient is a measure of how much the sweep methods are similar in their results.

The hat symbol in the equations above denotes a normalization process such that the maximum cross correlation value is unity. The input mesh crossings are exactly identical for radial or circular sweeps and possess a cross correlation coefficient value of 1.

Consider exciting the input with radial sweeps. At some input radius, $r_{jx_k}$ there is a corresponding output radius value $r_{jy_k}$ on each of the $k^{th}$ radials.

Figure 41:
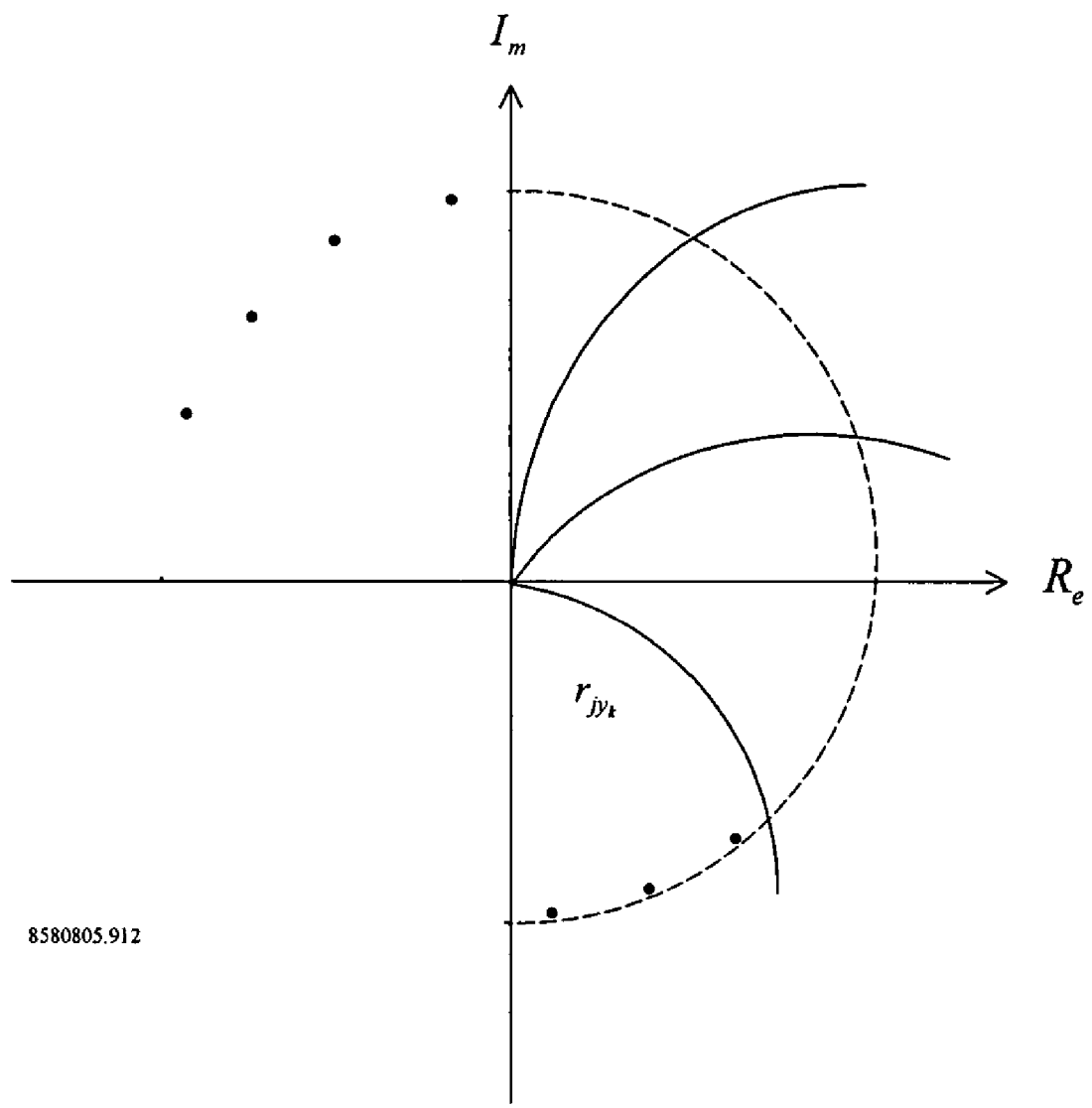
FIG. 41 illustrates an example input having radial sweeps.

As such, a set of constant $r_j$ input points would spawn a set of constant $r_j$·c output radial points if the system were linear. These k points would plot out a circle if k radials were used to cover $R^2$, as illustrated in FIG. 41. Many such circles of varying $r_j$ radii could be formed, or arranged. A set of such points can be assembled as:

$$\psi_{jk}=\{(rr_{jx},r\phi_{kx})(rr_{jy},r\phi_{ky})\}\ j=1, 2 \ldots \text{discrete radii}$$

k=1, 2 . . . radial angles

It is assumed that the means can be removed from these data sets. x's correspond to inputs and y's correspond to outputs.

Another set of data points can be collected by stimulating the input with circles, and organizing the data on circles for the input and corresponding output. This data is collected into the set (adjusted for zero mean):

$$\Lambda_{jk}=\{(\phi r_{ix},\phi\phi_{kx})(\phi r_{jy},\phi\phi_{ky})\}$$

The coordinates for $$\underset{(rr_{jx},r\phi_{kx})}{\text{radial sweep}} = \underset{(\phi r_{jx},\phi_{kx})}{\text{circular sweep}}$$

are at the input mesh intersection points. The difference is in how they are generated and organized. One set is generated along the $\vec{a}_r$ direction and the other set is generated along the $\vec{a}_\phi$ direction. Now the output data generated by $\vec{a}_r$ directional inputs are also collected into concentric rings. Then they are correlated with outputs which result when the input stimulus is along $\vec{a}_\phi$. This can be written as:

$$\rho_{\psi\Lambda}=E\frac{\{(\psi_y)(\Lambda_y)\}}{K_N}$$

Both $\Psi$ and $\Lambda$ are functions of r and $\phi$ but are obtained from sweeping the input in different experiments by radial ($\vec{a}_{s\phi}$) or orthogonal ($\vec{a}_\phi$) excitation. $K_N$ is a normalization factor. The indices j, k, can be tracked and assigned to p so that regional correlations can be assigned.

The above described process can also be accomplished by sweeping $\vec{a}_\phi$, $\vec{a}_r$ and organizing on radials, rather than circles.

If $\rho_{\psi\Lambda}=1$ at any radius then sampling in the $\vec{a}_\phi$ direction does not yield any additional data compared to input sampling in the $\vec{a}_r$ direction. If $\rho \neq 1$ then some sampling in both directions is warranted.

$\rho$ is a function of r and $\phi$ and therefore is complex. Thus $|\rho|$ and $\angle\rho$ can be obtained much in the same manner that $D_{\epsilon_R}$ is processed to form error surfaces with as the third dimension in cylindrical coordinates. The correlation surfaces are a metric for increasing or decreasing the orthogonal sampling densities. The natural tendency might be to reduce the number of orthogonal sampling contours until there is little cross correlation. This can only be accomplished provided that the remaining minimal mesh does not permit the error function and its gradient to sift through, undetected. That is, reducing sample contours and densities based on $\rho_{\psi\Lambda}$ is acceptable, with the provision that $D_{\epsilon_R}$ can still be faithfully acquired by applying principles of the sampling theorem.

(ii) Radial to Radial Correlation

If a single radial could characterize the entire complex plane, then there would be no need for multiple radials. That is, if the amplitude distortion is not a function of $\phi$ then a single radial sweep is sufficient for characterizing AM-AM and AM-PM phenomena. If these distortions vary as a function of $\phi$, however, then more than a single radial is required.

Within the set $\Psi_{jk}$ the numbers exist, parsed in a different manner, to produce additional cross correlations of interest. All j samples of the $k^{th}$ radial must be cross correlated with all j samples of the $v^{th}$ radial. Since each $k^{th}$ radial possesses a unique spawning $\phi_k$, this $\phi_k$ must be accounted for in the cross correlation process. That is $\phi_k$ is a metric associated with the input sweep and must not bias the correlation data:

$$\rho_{r(k,v)} = E\{\hat{\psi}_{rk} \cdot \hat{\psi}_{rv}\} \; k=1, 2, 3 \ldots$$

$v = 1, 2, 3 \ldots$

Whenever $k=v$, then $\rho_{r(k,v)}=1$. It is assumed that the mean values have been extracted from the data set and that the data are suitably normalized for $\max\{\rho_{v(k,v)}\}=1$. If adjacent radials possess a correlation constant $\rho \approx 1$, the radials are too closely spaced. On the other hand, the radials cannot be so sparsely positioned that $D_{\epsilon_R}$ cannot be accurately reconstructed.

(iii) Circle to Circle Correlation

Concentric circle sweeps can be correlated to one another in a manner prescribed for the radials in Section (ii). The parsing of $\Lambda_{jk}$ is required so that all k samples of the $j^{th}$ ring or circle are correlated to all k samples of the $l^{th}$ ring so that:

$$\rho_{\phi(j,l)} = E\{\hat{\Lambda}_{cj} \cdot \hat{\Lambda}_{cl}\} \; j=1, 2, \ldots$$

$l = 1, 2, \ldots$ $\rho_{\phi(j,l)} = 1$ for $j=l$ and the data sets have been adjusted for zero means and are normalized. It is noted that very high values for $\rho$ imply that circles are too closely spaced. In this case, sampling densities must be accounted for since they may vary from ring to ring. One method of accomplishing this is by interpolating the connecting rings prior to mean extraction, normalization, and correlation.

(h) Sampling Density and Sample Rate

There are several sampling constraints which must be applied to accomplish the characterization of the VPA, including:

1. Adequate sampling is required for constructing approximations to the raw sample data which are robust and which can described by convenient continuous functions;
2. Sampling must be sufficient to cover the entire $R^N$ region to efficiently reveal $D_{\epsilon_R}$ and $\nabla D_{\epsilon_R}$; and
3. Since the stimulus and the response of the VPA involve real signals as a function of time, they also possess Fourier Transforms and must be sampled according to Sampling Theorem principles subject to the frequency content revealed by the transform.

Item 3) is the concern of this section. The Fourier Transform of the input signal is given by:

$$X(f) = \int_{-\infty}^{\infty} x(t) e^{-j2\pi ft} dt$$

This form assumes knowledge of the continuous input signal function, x(t). Numerical computation usually demands the discrete transform:

$$\tilde{X}\left\{\frac{n}{N_s T_s}\right\} = \sum_{j=0}^{N_s-1} x(kT_s) e^{-j2\pi nk/N_s}$$

$n = 0, 1, 2 \ldots (N_s - 1)$

This form relates $N_s$ time samples to $N_s$ frequency samples.

Shannon's Sampling Theorem: The signal x(t) must be sampled at a rate $T_s^{-1} > 2f_{max}$ where $2f_{max}$ known as Nyquists rate is calculated from the maximum significant frequency content of the transform It follows that sample aliasing will be minimized and complete signal reconstruction is possible.

x(t) is represented as some related function within the complex plane. This representation is not sufficient without the inclusion of the time variable in terms of sampling theorem consideration. That is, x(t) is actually of the form:

$$x(t) = A(t) e^{-j(2\pi f_c t + \Theta(t))}$$

The input samples discussed previously are samples of this function acquired at discrete intervals. The general exponential form of x(t) is used above though not required. x(t) in this form permits the following:

x(t) can represent baseband and passband waveforms;
x(t) can be resolved into complex (I & Q) components;
A(t) permits amplitude domain variation;
$f_c(t)$ can permit frequency variation if desired;
$\Theta(t)$ can permit phase variation; and
Any point in $R^2$ can be swept and acquired via x(t).

Now the output transform is obtained from;

$$Y\left\{\frac{n}{N_s T_s}\right\} = \sum_{k=0}^{N_s-1} (x(kT_s) * V(kT_s)) e^{-j2\pi nk/N_s}$$

where * is a shorthand notation for convolution. $\{V\}$ is the transfer characteristic defined by Volterra (see section 2) or approximation thereof. The transfer characteristic of the VPA is non-linear and therefore gives rise to additional frequency components not found within x(t). That is, y(t) possesses unwanted harmonics and intermodulation distortion which is revealed in the transform Y above.

The error function $D_{\epsilon_R}$ requires accurate knowledge of x(t) and y(t). $D\epsilon_R$ indirectly portrays V by revealing its impact. Shannon's requirements dictate Nyquists rate for all the functions; x(t), y(t), and $D_{\epsilon_R}$ If the sampling rate is adequate for x(t) and y(t) then the difference;

$$D_{\epsilon_{Ri}} = kx_i - y_i$$

will be adequate. However, $\nabla D_{\epsilon_R}$ and higher order differential processing techniques could dictate higher sampling rates. As such, the sampling rate from a Shannon constraint will be driven from the output spectrum Y and the spectrums related to the gradient of $D\epsilon_R$ or n-th order directional derivatives of $D_{\epsilon_R}$, if such gradients are required.

One approach is to oversample the input $X_i$ sufficiently to account for all anomalies at the output. Another approach is to create greater density of samples in the areas of the output where $D_{\epsilon_R}$ is non-linear or gradients are more active. This forces non-uniform sampling intervals at the discrete input samples $X_i$, due to the affect of {V}. There are variations of these themes which permit convenient input sample definition while accommodating output bandwidth expansion using interpolation, high resolution sampling clocks combined with sparse sampling techniques, etc.

(i) Sampling Density

Based on the teachings herein, one skilled in the art would appreciate that the sampling densities are a function of the sweep rates and the information content of $D_{\epsilon_R}$ over the region of interest. As suggested above, the sample density can be required to meet the Nyquist rate at a minimum for all processed signals, given knowledge of their transforms. This rate is then translated to the distance along the output contour based on the rate of change of the sweep selected for that region.

(i) Intermediate Summary

The following statements summarize certain concepts disclosed thus far in this disclosure:

1. The VPA is a non-linear device with a transfer characteristic that is a function of power supply, gain, carrier frequency, temperature, waveform bandwidth, transitional state through the complex plane, etc.;
2. The VPA can be modeled by Volterra kernels;
3. Traditional 'real time' feed forward and feedback processing approaches can compensate for non-linearities to a degree, but suffer from a perspective of complexity, inefficiency, size and performance. A compensation technique which characterizes the VPA 'off line' and creates a manageable mathematical model may be executed in real time hardware, using a moderate amount of memory to store certain calibration factors;
4. The VPA is characterized in each state by error functions which compare a desired ideal response to actual responses. These error functions can be represented in $R^1, R^3 \ldots R^N$ where $R^N$ is an N dimensional space;
5. Correction can be applied based on the error functions, thereby compensating the VPA to obtain a nearly linear transfer characteristic for each VPA state;
6. Error functions are created from discrete measurements or samples which are applied to the VPA input and observed at the output. The systematic application of these input samples creates contours of output samples in the complex plane which can be approximated or fit by polynomials or combinations of polynomials and other mathematical descriptions. The polynomial descriptions permit significant reduction of stored data;
7. Specific input sampling trajectories are required to exercise the VPA for full characterization. Furthermore, the rate of sampling and the transitions through the complex plane help determine AM-AM, AM-PM, PM-PM, and PM-AM performance of the VPA;
8. Sampling densities along sampling trajectories and sampling densities within regions of the complex plane are proportional to the directional gradient of the error function and other weighting considerations. Also, cross correlation functions are inversely proportional to the required sampling densities.

Figure 42:
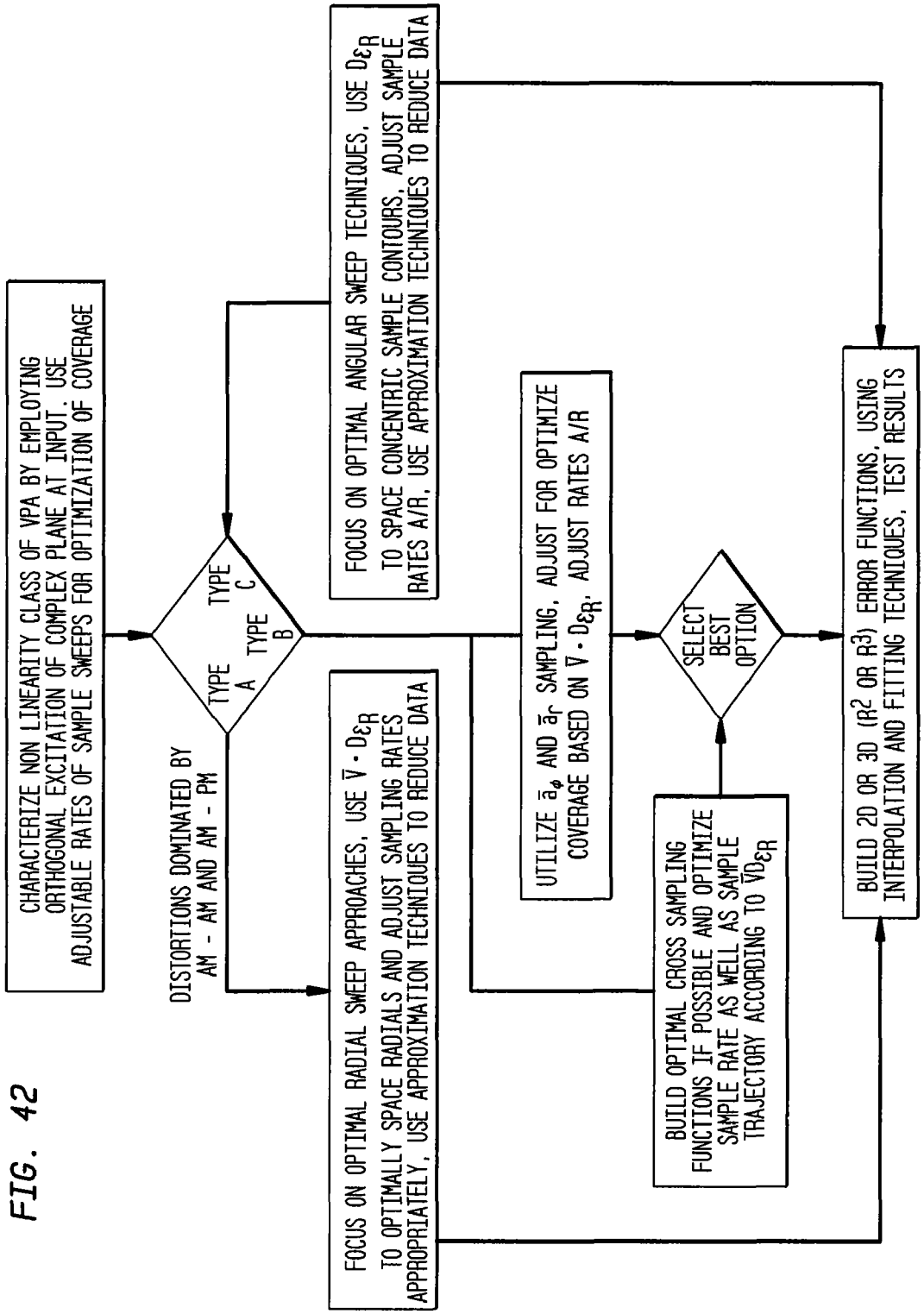
FIG. 42 is a process flowchart that illustrates a methodology for VPA error function characterization.

FIG. 42 is a process flowchart that illustrates a methodology for VPA error function characterization according to an embodiment of the present invention.

7. APPROXIMATION THEORY

Classical approximation theory involves the mathematical description of special functions by other simpler functions. The purpose of replacing one functional description for another is often related to calculation efficiency and convenience.

At first glance it may seem that approximation in its classical form has little to offer to the problem at hand since the VPA error function $D_{\epsilon_R}$ does not possess a closed form functional description. Indeed $D_{\epsilon_R}$ begins with a raw data set description and needs to be morphed to a functional description. Nevertheless, many theorems and ideas originally established by approximation theory can be applied to the problem at hand. The reason that this occurs naturally is because functions by nature are constraints on numerical domains represented by variables. Since solutions are always implemented on machines, functions need to be defined numerically and hence the forced connection.

In this section some principles and theorems are introduced, which will be used in later discussion and analysis.

The cornerstone approximation theorem proven by Wierstrass and then generalized by Stone can be stated as follows:

Given a function $f$, $\epsilon$, $R^N$, we can approximate $f$ by continuous functions which also exist within, $R^N$, and;

$$\|f - g\| = \int_{-\infty}^{\infty} |f(x) - g(x)| dx < \varepsilon$$

Where g approximates and the error $\epsilon$ is bounded according to the quality of the approximating function g.

This theorem may restrict the domain for the candidate approximating functions but does not restrict the family or form of the functions. Nor does the theorem imply accuracy, how to find such functions, etc.

A corollary of the above theorem (also from Wierstrass) is that:

"A continuous function defined on a closed and bounded interval can be approximated uniformly by means of polynomials."

The quality of the approximation to $f(x)$ given by g(x) can be measured from:

$$\|f - g\|_\gamma = \left\{ \int_a^b |f(x) - g(x)|^\gamma dx \right\}^{1/\gamma} \quad \begin{array}{c} a < x < b \\ 1 \leq \gamma \leq \infty \end{array}$$

This metric is known as the Lebesgue norm.

The $\gamma=1$ application is well known in the literature as a measurement norm. However, $\gamma=2$ is probably the most famous norm, also known as the Least Squares Metric. When $\gamma \to \infty$ the norm is known as the Chebyshev or uniform norm or also as the min-max solution. $\gamma=2$ and $\gamma=\infty$ are by far the two most important exponents for the Lebesgue integral equation. However, custom applications may work well with $\gamma=1$ or some other value.

Favard is usually credited with the so called saturation theorems or descriptions of the saturation phenomena. Each functional class can be segregated to ascertain limits for the accuracy of approximations. Both the target function and the approximating function play a role. Once a particular class of approximation is identified, a limit in performance is also predictable and cannot be improved substantially beyond an asymptotic limit. This phenomena is known as saturation. The phenomena, if it arises, can often be recognized empirically in practice, then numerically analyzed more rigorously as required.

(a) Fitting

Figure 43:
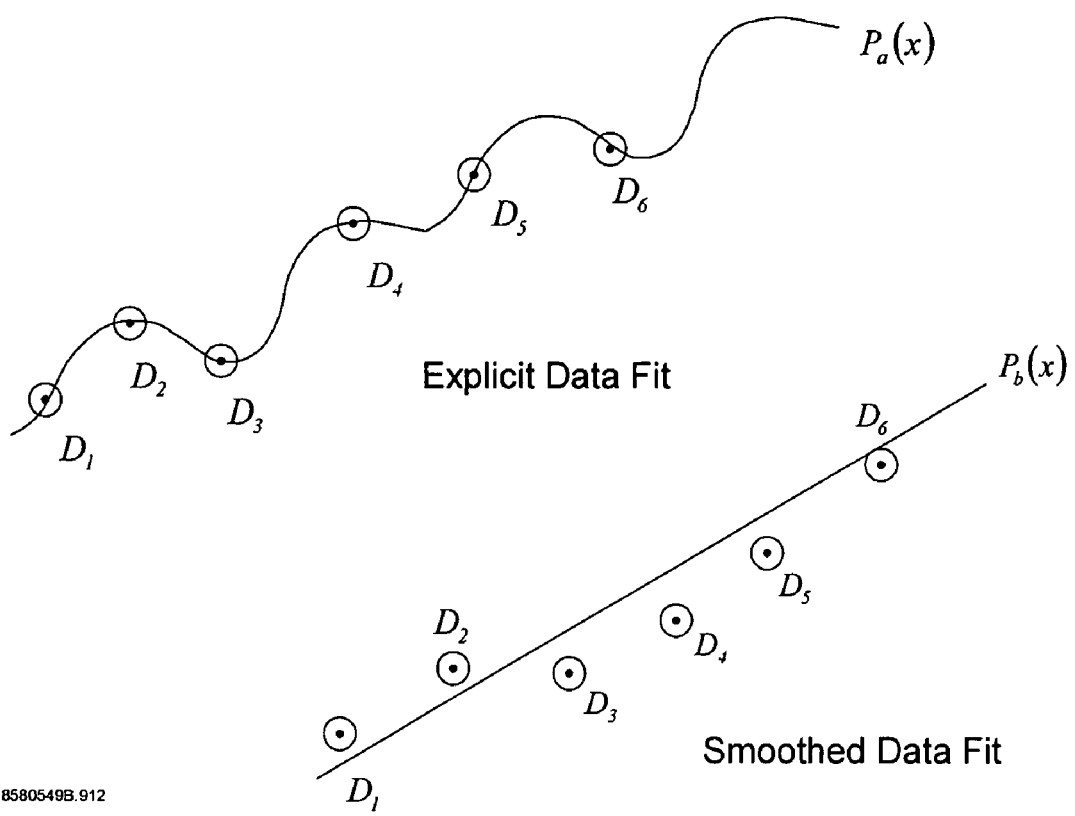
FIG. 43 is an example fitting illustration.

Fitting refers to construction of special functions which either 'pass through' data points within a particular region or provide some best estimate of a function which passes in the vicinity of the data. FIG. 43 provides an example illustration. Notice that in the top fit the polynomial $P_a(x)$ forces the condition that each datum must explicitly be defined as a specific solution. This is also sometimes referred to as an interpolating polynomial for a specific data set. The second example is such that the polynomial $P_b(x)$ appears to the eye to be of a lower order or at least 'smoothed' such that it passes to within some prescribed distance but is not constrained to possess $D_1 \ldots D_6$ as specific explicit solutions, individually. Typically, there is a constraint applied to $P_b(x)$ in terms of the average 'distance' or norm from the data set. As presented in the previous section, the Lebesgue norm is the metric often applied, and the $\gamma=2$ least squares case is the most popular for a variety of reasons. One reason that $\gamma=2$ is appealing for certain applications is that amplitude errors can be converted to energy or power errors which in turn are often more relevant to the solution of certain real world problems. In addition, $\gamma=2$ provides a metric which converges in the solution formulation for a wide class of problems and therefore is often robust.

Least squares formulation can be global or local and can be weighted, or not. This provides for significant flexibility. Note that fitting typically requires numerical input to the algorithm rather than the presumption of a specific function type, like $e^{-x}$. Nonetheless, one could make the argument that $e^{-x}$ could have been evaluated at certain points $x_0, x_1 \ldots$ etc, and that data could be used as an input to an algorithm without regard for the presumption of $e^{-x}$. In this sense, approximation and fitting share some common ground.

(i) Polynomial Fitting

Justification for polynomial fitting was provided by Wierstrass and Stone in the approximation problem which of course extends to the fitting problem as well.

Consider the general Taylor Series expansion given by:

$$f(x) = f(a) + (x-a)\frac{df(a)}{dx} + \frac{(x-a)^2}{2!}\frac{d^2 f(a)}{dx^2} + \ldots$$

If the function is smooth near a then the expansion exists and there is a remainder term given by;

$$Rem = \frac{(x-a)^{n+1}}{(n+1)!} f^{n+1}(a-\Delta), \text{ where } x < a - \Delta < a$$

Whenever $a=0$ the series is a Maclaurin series. As an example, $e^x$ can be estimated in the vicinity of zero from;

$$e^x = 1 + x + \frac{x^2}{2!} + \frac{x^3}{3!} + \frac{x^4}{4!} + \frac{x^5}{5!} \ldots \frac{x^n}{n!}$$

If $a=0.01$ then the approximation (using only 5 terms) yields 1.010050167, which agrees exactly with a calculator! On the other hand, consider the calculation for $a=0.1$ and 5 terms;

$$e^{0.1} \approx 1.105170914$$

Calculator→1.105170918

Notice that the approximation is diverging slightly. Hence, the polynomial is most accurate over a limited domain under certain conditions. This simple example illustrates polynomial representation utility for reconstructing functions. However, expansions of this form are not robust for general application over large intervals and other methods are required.

Consider the following theorem which is a restatement of the Wierstrass and Stone theorem presented in the previous section:

If $\{x_0, x_1 \ldots x_n\}$ is a set of n+1 numbers in $R^2$, then there exists a polynomial p(x) such that $p(x_i)$ yields values $y_i$. That is, the solutions of p(x) correspond precisely to $(x_i, y_i)$ at n+1 distinct points.

Thus $p_n(x)$ has a form;

$$p_n(x) = \sum_{i=0}^{n} c_i \cdot x^i.$$

This is in fact a fundamental theorem of algebra. By inspection it should be obvious that such a polynomial possesses up to n distinct roots. This fact permits the function defined by such a polynomial to change direction or slope up to n+1 times along an interval containing the roots. Coefficients within the expansion for $p_n(x)$ can also super impose movement on the average or direction of this oscillating function within the domain. This is obviously restricted to 2 dimensions for the particular theorem presented here. However, there are methods which extend variations of this theorem to consider $R^N$.

In order to determine $p_n(x)$ the $c_i$ must be calculated. The typical formulation is usually presented in matrix form as follows;

$$\begin{pmatrix} 1 + x_0 + x_0^2 + \ldots x_0^n \\ 1 + x_1 + x_1^2 + \ldots x_1^n \\ \vdots \\ 1 + x_n + x_n^2 + \ldots x_n^n \end{pmatrix} \begin{pmatrix} c_0 \\ c_1 \\ \vdots \\ c_n \end{pmatrix} = \begin{pmatrix} y_0 \\ y_1 \\ \vdots \\ y_n \end{pmatrix}$$

This can be rewritten in compact form as

[V][c]=[Y]

Solving for [c] yields;

[c]=[V]⁻¹[Y].

This is a classical problem in matrix algebra where the inverse of the Vandermode matrix, [V], is usually the issue. In some cases, the inverse matrix is ill defined and therefore considerable algorithmic investment is required to avoid singularities or computational issues.

Figure 44:
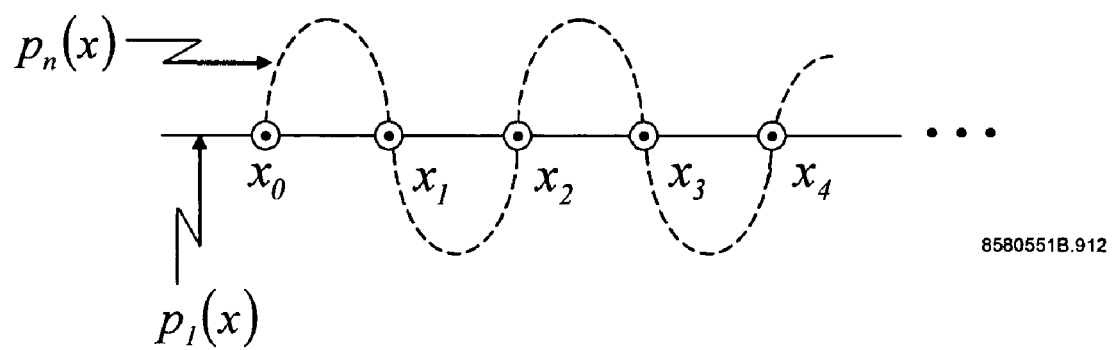
FIG. 44 is a heuristic example.

It is important to note that the solution, if it exists, yields a polynomial function which passes through the points $x_i$, $y_i$ exactly. Consider the following heuristic example, illustrated in FIG. 44.

Notice that two polynomials (one a simple line) pass through the data $x_0$, $x_1$, $x_2$ .... Without additional constraining information the choice of solution may not be considered unique.

That is, the theorems are more complete if and only if the order n is prescribed in the solution or if other constraints are prescribed. However, sometimes efficiency demands that n be minimized. In this case further considerations and constraints are warranted.

(b) Interpolation

As a specialized branch or technique of mathematics, interpolation theory developed at a slower pace, following approximation. Theoreticians have been primarily interested in convergence or representation of formulas for functions, particularly infinite series. However, interpolation is a tool for the applied mathematician or engineer or scientist to calculate specific numbers to some desired accuracy.

Interpolation in an extended sense is a method of creating new data points from pre existing data points constrained on the interval of the pre existing data points. In addition, interpolation is often referred to as fitting a specific polynomial or other function description to a specific set of data over an interval. Calculating points outside of the interval is known as extrapolation or prediction and is not contemplated within interpolation theory.

Figure 45:
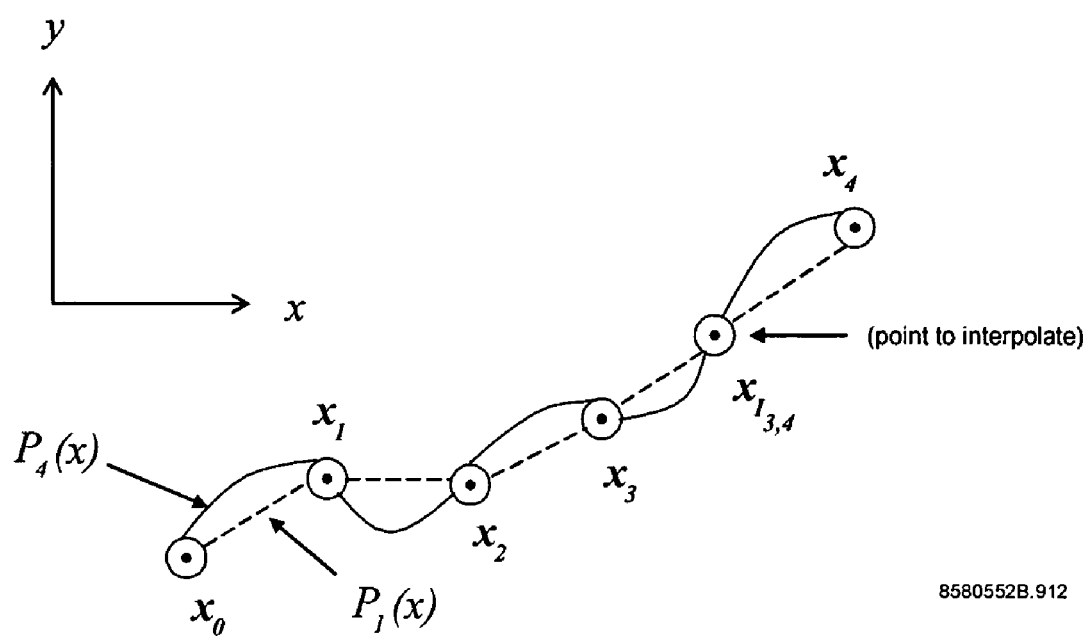
FIG. 45 is a graphical example.

Consider the graphical example illustrated in FIG. 45. If $X_0, X_1 \ldots X_4$ are data points in $R^2$, then they exist as ordered pairs, say $(x_1, y_1), (x_2, y_2) \ldots (x_4, y_4)$. Suppose that we wish to calculate a point on the interval between $X_3$ and $X_4$, named $X_{1_{3,4}}$. This can be accomplished in a number of ways. There are some facts to observe:

1. A simple data set $(x_0, y_0), (x_1, y_1) \ldots (x_k, y_k)$ does not provide enough information to solve the interpolation problem uniquely as stated;
2. A functional relationship must be assumed for the set of numbers in order to calculate other numbers not originally provided in the data set;
3. Continuity of functions and the existence of functional derivatives is a requirement along the interval of interest;
4. The interpolation technique may include consideration of all or a portion of the data set $(x_0, y_0) \ldots (x_k, y_k)$.

In the simple case of linear interpolation all of the data points of the data set may be constrained such that each datum is assumed to be connected to the next datum via a straight line and the line is everywhere differentiable along the interval bounded by the end points $x_i$ and $x_{i+1}$. Nevertheless, the derivatives of the piecewise reconstruction may or may not be well defined at the connecting nodes or knots.

Facts (1 through 4 above) provide the necessary constraints to calculate intermediate values by assigning coefficients (m, b) to the equation of a line, $$y_I = mx_{I_{3,4}} + b = \left(\frac{y_{i+1} - y_i}{x_{i+1} - x_i}\right)x_I + y_{int}.$$

where $y_{int}$ is defined as the y intercept for this example.

Given the five original data points $X_0, X_1, X_2 \ldots X_4$, a polynomial fit can be defined which included the data $(x_0, y_0)$, $(x_1, y_1) \ldots (x_4, y_4)$ as solutions and is everywhere possessing a derivative on the interval between $x_0$, $y_0$ and $x_4$, $y_4$. FIG. 45 illustrates that $p_4(x)$ is a curvaceous trace given by the dotted trajectory. Conveniently, the datum $x_{1_{3,4}}$, for this graphic example alone, is a common solution point in the linear interpolator case and $p_4(x)$ interpolator case. This is not the case in general and even for this example it is easy to recognize that if $x_{1_{3,4}}$ were decreased slightly or increased slightly that the two interpolation techniques would yield different results at that point. Hence, it is important to recognize the degrees of freedom possible with a variety of classes of interpolation problems.

In the following sections, interpolation formulas and techniques are provided.

(i) Newton's Formula

Newton's interpolation formula using the method of divided differences is simply stated without proof as:

$$f(x) = f(x_0) + (x - x_0)\overbrace{\frac{f(x_0) - f(x_I)}{(x_0 - x_I)}}^{\text{divided difference } f(x_0, x_I)} + (x - x_0)(x - x_1)$$

$$\underbrace{\left[(x - x_0)\left(\frac{f(x_0) - f(x_1)}{x_0 - x_1}\right) - (x - x_2)\left(\frac{f(x_1) - f(x_2)}{x_1 - x_2}\right)\right]}_{\text{divided difference } f(x_0, x_1, x_2)} \ldots + R$$

where R is a remainder term that also may be approximated from:

$$R = (x - x_0)(x - x_1) \ldots (x - x_k)\overbrace{f(x, x_0 \ldots x_k)}^{k\text{th divided difference}}$$

R is easiest to calculate when the form of $f(x)$ is known. However, the formulas can be applied mechanically as well without apriori knowledge of $f(x)$, provided all the data is available, as a set. R can be estimated by the additional data available from an extended functional description.

Lagrange and Jensen taught methods of calculating Newton's remainder and the formula using divided differences. Stirling also taught a similar formula, as well as Bessel. Bessel's and Stirling's formulas were originally derived by Newton. Gauss and Everett also joined these formulas with their own. The difference between these formulas involves how other numbers within the data set are permitted to influence local calculations (variations primarily in the divided difference term). In some cases, offset intervals, half distance formulas between data, and arithmetic means of differences are utilized to augment the formula variations, which all have provision for remainder terms. Newton's original formula and the numerous variations are still used today and under certain circumstances considered to be very efficient, even for computational digital electronics.

(ii) Lagrange Interpolation

Lagrange had the idea that a single interpolation could be broken up into a set of (n+1) simple problems where n is the number of data in the set. In previous sections it was stated that an $n^{th}$ order polynomial can represent the function associated with a data set consisting of n+1 points. This is in fact a fundamental theorem. Lagrange supposed that a set of polynomials could be obtained each of which known as cardinal functions. Then, a linear combination of these Lagrangian polynomials is used to construct the desired polynomial. Once the final polynomial $p_n(x)$ is constructed, then any value within this domain can be calculated.

The Lagrangian solution has the form:

$$p_n(x) = \sum_{i=0}^{n} f_k(x_i) L_i(x)$$

The Lagrangian polynomials possess the following property:

$$L_i(x_j) = \begin{cases} 1, & i = j \\ 0, & \text{elsewhere} \end{cases}$$

The above restriction implies roots ($i \neq j$) and leads to the conclusion that;

$$L_i(x) = k(x-x_0)(x-x_1)\ldots(x-x_n)$$

where k is a constant which can be calculated form the fact:

$$L_i(x_i) = 1 = k \sum_{\substack{j=0 \\ j \neq 1}}^{n} (x_i - x_j)$$

Therefore:

$$L_i(x) = \frac{(x-x_0)(x-x_{i-1})\ldots(x-x_n)}{(x_i-x_0)\ldots(x_i-x_{i-1})(x-x_{i+1})(x-x_n)}$$

$$L_i(x) = \left( \frac{\prod_{\substack{j=0 \\ j \neq 1}}^{n}(x-x_j)}{\prod_{\substack{j=0 \\ j \neq 1}}^{n}(x_i-x_j)} \right) i = 0, 1 \ldots n$$

An example may provide some insight into the application of the equations. Consider the following data points:
(0, 2) (3, 4) (4, 5) (6, 10)
Using the above equations;

$$L_0(x) = \frac{(x-3)(x-4)(x-6)}{(0-3)(0-4)(0-6)} = -\frac{1}{72}(x^3 - 13x^2 + 34x - 72)$$

$$L_1(x) = \frac{(x-0)(x-4)(x-6)}{(3-0)(3-4)(3-6)} = \frac{1}{9}(x^3 - 10x^2 + 24x)$$

$$L_2(x) = \frac{(x-0)(x-3)(x-6)}{(4-0)(4-3)(4-6)} = -\frac{1}{8}(x^3 - 9x^2 + 18x)$$

$$L_3(x) = \frac{(x-0)(x-3)(x-4)}{(6-0)(6-3)(6-4)} = \frac{1}{36}(x^3 = 7x^2 + 12x)$$

The final interpolating values are obtained by the function;

$$p_3(x) = f(x_0)L_o + f(x_1)L_1 + f(x_2)L_2 + f(x_3)L_3$$

$$= -\frac{1}{36}(x^3 - 13x^2 + 34x - 72) + \frac{4}{9}(x^3 - 10x^2 + 24x) - \frac{5}{8}(x^3 - 9x^2 + 18x) + \frac{5}{16}(x^3 - 7x^2 + 12x)$$

$p_3(x)$ then is an interpolating polynomial formed from the Lagrange interpolating cardinal functions with solutions at the given data points. With this final solution, any point ($x_k$, $y_k$) on the interval of the function can be calculated and is said to also be an interpolated value. The functions $L_0(x), \ldots L_n(x)$ are linearly independent along the interval.

(iii) Hermitian (Oscillatory) Interpolation

Hermite solved a similar interpolation problem (similar to Lagrange) but included an additional restriction, slope (derivative) at each coordinate. Thus there are n distinct points given by:

$$(x_0, y_0), (x_1, y_1) \ldots (x_n, y_n)$$

And their slopes are given by:

$$f'_0, f'_1, \ldots f'_n$$

This will spawn the natural requirement of polynomial order $p_{2n+1}(x)$. The calculations are obtained from:

$$p_{2n+1} = \sum_{i=0}^{n} \alpha_i(x) f(x_i) + \sum_{i=0}^{n} \beta_i(x) f'(x_i)$$

$$\alpha_i(x) = (1 - 2L'_j(x_i)(x - x_i)) L_i(x)^2$$

$$\beta_i(x) = (x - x_i) L_i(x)^2$$

Notice that the Lagrange interpolation functions are part of the solution.

(c) Approximation by Orthogonal Functions

Another method of function construction is based on the sum of orthogonal polynomials. Chebyshev polynomials is an important class of such polynomials and can be used for functional reconstruction. The basic form of the solution is:

$$f(x) = \sum_{i=0}^{n} c_i T_i(x)$$

$T_i(x)$ are the polynomials which are defined as:

$$T_0(x) = 1$$
$$T_1(x) = x$$
$$T_2(x) = 2xT_1(x) - T_0(x) = 2x^2 - 1$$
$$T_3(x) = 2xT_2(x) - T_1(x) = 4x^3 - 3x$$
$$\vdots$$
$$T_{n+1}(x) 2xT_n(x) - T_{n-1}(x)$$

The even order polynomials are even functions while the odd order polynomials are odd functions. An alternate representation is often used:

$$T_n(x) = \cos(n \cos^{-1}(x))$$

The coefficients can be found from;

$$c_j = \frac{2}{\pi} \int_{-1}^{1} \frac{T_j(x) f(x)}{\sqrt{1-x^2}} dx = \frac{2}{\pi} \int_0^{\pi} f(\cos(\Theta)) \cos j\Theta d\Theta$$

An important theorem associated with Chebyshev's work, known as the Equi-Oscillation Theorem, is stated as follows:

Let $f(x)$ be a continuous function defined on the interval $\lfloor a, b \rfloor$ and $p_n(x)$ be a polynomial approximation, of degree n, for $f(x)$ on $\lfloor a, b \rfloor$. Then an error function is defined as:

$$E_{n_i} = f(x_i) - p_n(x_i)$$

If there are at least n+2 points along the internal $\lfloor a, b \rfloor$ where the error function is bounded by maximum values according to $$e_n(x_i) = -1^i E_n, i=0, 1, \ldots n+1$$

Then $p_n(x)$ is known as a minimax approximation. Such an approximation is unique for $p_n(x)$ with degree $\leq$ n.

The approximating function is such that it meanders around the desired $f(x)$, back and forth, with a defined and bounded maximum error. Furthermore, it is known to be a best approximation for $p_n(x)$ whenever the degree is $\leq$n. Although this error metric is very different than the least squares, it is contemplated by the Lebesgue norm when $\gamma=\infty$. The Chebyshev polynomials often produce a result approaching the minimax solution in performance, and are considered a minimax class solution with slight modifications. Cheney in 1966 provided an excellent discussion and analysis of the minimax problem. The reader is also referred to the Remes Algorithm which is popular for various signal processing applications. The basic Chebyshev approach has been refined using modified Chebyshev polynomials and explicit minimax criteria, using the Remes algorithm for example. The results achieved are incrementally more accurate than basic Chebyshev approximation, for some applications.

Generally, the Chebyshev solution is from a class of solutions known as orthogonal function solutions. However, many such polynomials sets are candidates. Consider $\phi_n(x)$ as some orthogonal set of functions. Then, $$\phi_n(x), -1 \leq x \leq 1, n = 0, 1\ldots$$

$$\int_{-1}^{1} w(x)\phi_m(x)\phi_n(x)dx = K_n \delta_{mn}$$

That is, the functions are said to be orthogonal on the interval $-1 \leq x \leq 1$ and weighted according to $w(x)$ for generality. The approximated function $f(x)$ is found from:

$$f(x) = c_0\phi_0 + c_1\phi_1 + C_2\phi_2\ldots$$

$$f(x) = \sum_{i=0}^{k} c_i \phi_i$$

And the $c_n$ may be obtained from:

$$c_n = \frac{1}{K_n} \int_{-1}^{1} w(x)f(x)\phi_n(x)dx$$

Chebyshev, Legendre polynomials as well as Fourier series fit this solution class and are in wide use.

(d) Least Squares Revisited

Suppose that a polynomial is constructed of a specific order n such that a data set is to be fit approximately. Suppose further that the error in actual value desired versus actual value rendered by the polynomial $p_n(x)$ is bounded by the following norm:

$$E = \sum_{i=0}^{n} [p(x_i) - f_i]^2$$

This norm is recognized as a variation of the Lebesgue norm, $\gamma=2$ condition. The estimating polynomial is everywhere compared to the exact data set values point by point with the errors accumulated as indicated.

$E(p(x))$ is then minimized to some needed accuracy. Lagrange introduced this technique and called it the method of least squares.

The previous polynomial definitions are now recalled:

$$p_m(x) = c_0 + c_1 x + c_2 x^2 + c_3 x^3 + c_4 x^4 \ldots c_m x^m$$

In order to minimize $E(p)$ it is necessary to obtain the partial differential, $$0 = \frac{\partial E(p)}{\partial c_j} = \sum_{i=0}^{n} 2[p(x_i) - f_i] \frac{\partial p(x_i)}{\partial c_j}$$

The solution to this recursive equation yields a family of equations which can be arranged in a convenient form:

$$c_0 \sum_{i=0}^{n} x_i^0 + c_l \sum_{i=0}^{n} x_i + \ldots c_m \sum_{i=0}^{n} x_i^m = \sum_{i=0}^{n} f_i$$

$$c_0 \sum_{i=0}^{n} x_i + c_l \sum_{i=0}^{n} x_i^2 + \ldots c_m \sum_{i=0}^{n} x_i^{m+l} = \sum_{i=0}^{n} x_i f_i$$

$$c_0 \sum_{i=0}^{n} x_i^m + c_l \sum_{i=0}^{n} x_i^{m+l} + \ldots c_m \sum_{i=0}^{n} x_i^{2m} = \sum_{i=0}^{n} x_i^m f_i$$

Solving this set of equations for the coefficients $c_n$ yields a minimum to $E(p)$. It is important to recognize that the order m of the polynomial need not equal the number n of data points utilized as the data input set. Whenever m=n then min $E(p)=0$, and the problem is reduced to the simple polynomial interpolation problem presented earlier where the data points become exact solutions for the system of equations. Whenever m$\neq$n, a solution is still possible. Usually, it is desirable for curve fitting problems to have m<n. Then, a solution is obtained and it appears 'smoothed'. The resulting function passes in the vicinity of the data rather than directly through the data points.

This technique (of least squares) is perhaps the most ubiquitous signal processing estimator or approximator in use today.

The system of equations is most often written in matrix form as:

$$[V]^T[V][c] = [V]^T[f]$$

$[V]^T[V]$ is notorious for producing extraordinary difficult solutions. One technique is the method of Singular Value Decomposition. Another class of solutions involve Orthogonal Transforms or Orthogonal Decomposition. These methods seek to provide some alternate view, or representation of the vector space implied by the above matrix formulation, which substantially improves the individual matrix loading as well as the subsequent matrix operations.

Another variation of the least squares technique can best be illustrated by rewriting E(p) as:

$$E(p) = \sum_{i=0}^{n} w_i(x)[p_i(x) - f_i]^2$$

The $w_i$ are weighting values which weigh each of the sample points for the error calculation. Proceeding as before yields the system of equations:

$$\sum_{i=0}^{n}(w_i x_i^0)c_0 + \ldots \sum_{i=0}^{n}(w_i x_i^m)c_m = \sum_{i=0}^{n} w_i f_i$$

$$\sum_{i=0}^{n}(w_i x_i)c_0 + \ldots \sum_{i=0}^{n}(w_i x_i^{m+1})c_m = \sum_{i=0}^{n} w_i x_i f_i$$

$$\vdots \qquad \vdots \qquad \vdots$$

$$\sum_{i=0}^{n}(w_i x_i^m)c_0 + \ldots \sum_{i=0}^{n}(w_i x_i^{2m})c_m = \sum_{i=0}^{n} w_i x_i^m f_i$$

The weighting values provide an increased 'importance' or impact of certain data points with respect to the others. This solution is known as the moving least squares fit to the data.

8. PIECEWISE POLYNOMIALS AND SPLINES

This section focuses on the technique of fitting data to multiple functions, which are cascaded to extend the interpolation interval, while enhancing accuracy of the fit and stabilizing solutions. A single polynomial describing function was discussed, in a number of formats, in Section 7. Whenever the data is erratic or requires high order polynomials for the fit, the solutions are often difficult to obtain and are numerically unstable. However, breaking up a large domain or interval into a series of smaller domains, addressed by multiple functions, usually results in accurate representations with well behaved solutions, which are often numerically efficient.

Figure 46:
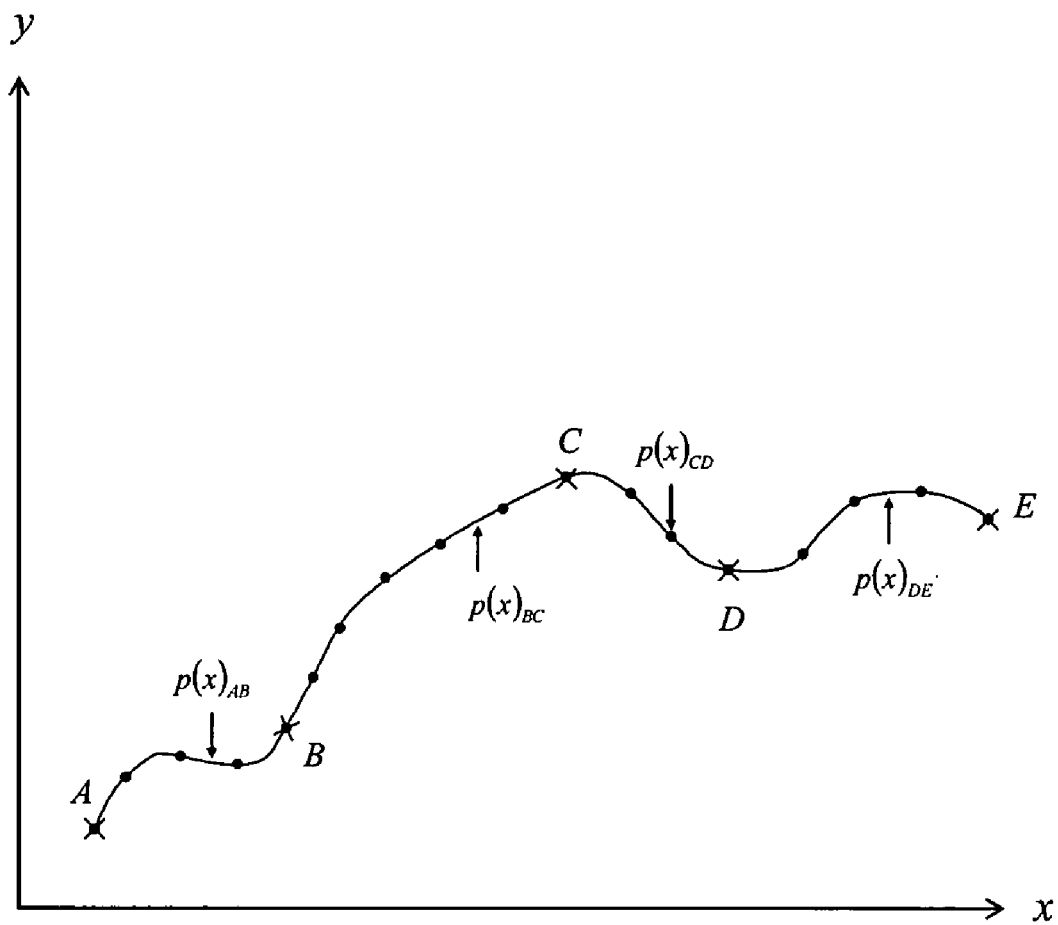
FIG. 46 is an example that illustrate piecewise fitting.

Without detailing the technique, it is assumed that polynomials of arbitrary order, and of differing order per sub-interval can be fit to a sequence of data. FIG. 46 illustrates this concept. $p(x)_{AB}$, $p(x)_{BC}$, $p(x)_{CD}$, $p(x)_{DE}$ can be unique to each of the indicated intervals. Typically, additional constraints are applied at the interval end points defining continuity. Nevertheless, over the intervals, the solution forms are very similar to those previously represented. In fact, the techniques described in Section 7 can be applied to each interval shown in FIG. 46.

Various strategies can also be applied to permit practical solutions, including a restriction of the order and form of the interpolating function on each interval. A common approach is to employ linear interpolants at each sub-interval, connecting nodes by lines, called linear splines.

Another popular interpolant is the cubic spine. It is simple to calculate and possesses excellent performance when constrained by first and second derivatives at knots, the connection nodes along the data path. This section focuses on certain aspects of the cubic spline because of its ubiquitous application history. Of course the principles presented here can be extended to quadratics, quartics, etc.

The conceptual origin of the spline probably originates from artisans and engineers who construct smooth curves from a variety of materials in applications such as ship building, car body manufacturing, etc. For instance, in ship building the smooth hull shapes are often formed by positioning strakes over bulkheads, which are fit conformally, using the bulkhead edges (knots) as a constraint and the natural tension of the strake to provide smooth continuity along the strake interval. When a strake is not long enough they are joined end to end. At the joints (knots) they must fit smoothly without disruption of continuity. When lofting the lines for boat construction, battens (physical splines) are used for drawing the hull form. The battens are bent and twisted according to their natural curvature, often using some constraining mechanism at various intervals along the span.

Physicists and applied mathematicians have analyzed the 'energy' stored in the deflected spline. This self energy (potential energy) is of course related to the curvature and is proportional to:

$$T_E \propto \int_a^b \frac{\beta_s''(x)}{(1 + (\beta_s'(x))^2)^{5/2}} dx$$

The natural cubic spline tends to approximately minimize this energy over its span according to the imposed constraints. This minimization is due to distribution of the load in an optimal manner. This property can be exploited mathematically if the constraints such as continuity, locations of joins, knot locations, etc., are defined correctly. The optimal natural spline typically is not subject to undue force or torque at the constraining knots, and tends toward asymptotic behavior at the extremums. This type of behavior gives rise to functions, which are most likely to represent the best natural fit to various classes of topologies relating to physical application.

Although the VPA application is not mechanical by nature, it is likely, along certain portions of the transfer characteristic, that functional continuity is maintained due to the physics of the semi conductor. The threshold of the semi conductor may present anomalies. However, above and below the threshold, ideas of continuity, minimal energy splines, etc., fit well with the paradigm.

(a) Cubic B Spline

The equation for a cubic spline is:

$$\beta(x) = \frac{1}{3}Ax^3 + \frac{1}{2}Bx^2 + Cx + D + \frac{1}{6}\sum_{i=1}^{N-1} a_i|x - k_i|^3$$

The knot locations $k_i$ correspond to sub interval nodes, which are data from a super set and used to constrain the spline and its functional components. N+1 (N=5) knots form the spline interval. Seven constants (A, B, C, D, $a_1$, $a_2$, $a_3$) are required to define the cubic spline in this form. Once these constants are obtained, each number on the interval may be calculated from the spline.

The spline can be derived by twice integrating:

$$\beta''(x) = Ax + B + \sum_{i=1}^{N-1} a_i|x - k_i| + \sum_{i=1}^{N-1} b_i J(x - k_i)$$

and applying constraints on continuity at interval ends $k_0$, $k_4$ as well as restricting the value outside the intervals, usually requiring null performance there. The last component of the double prime equation defines the jump functions, which are associated with knot sub intervals.

Figure 47:
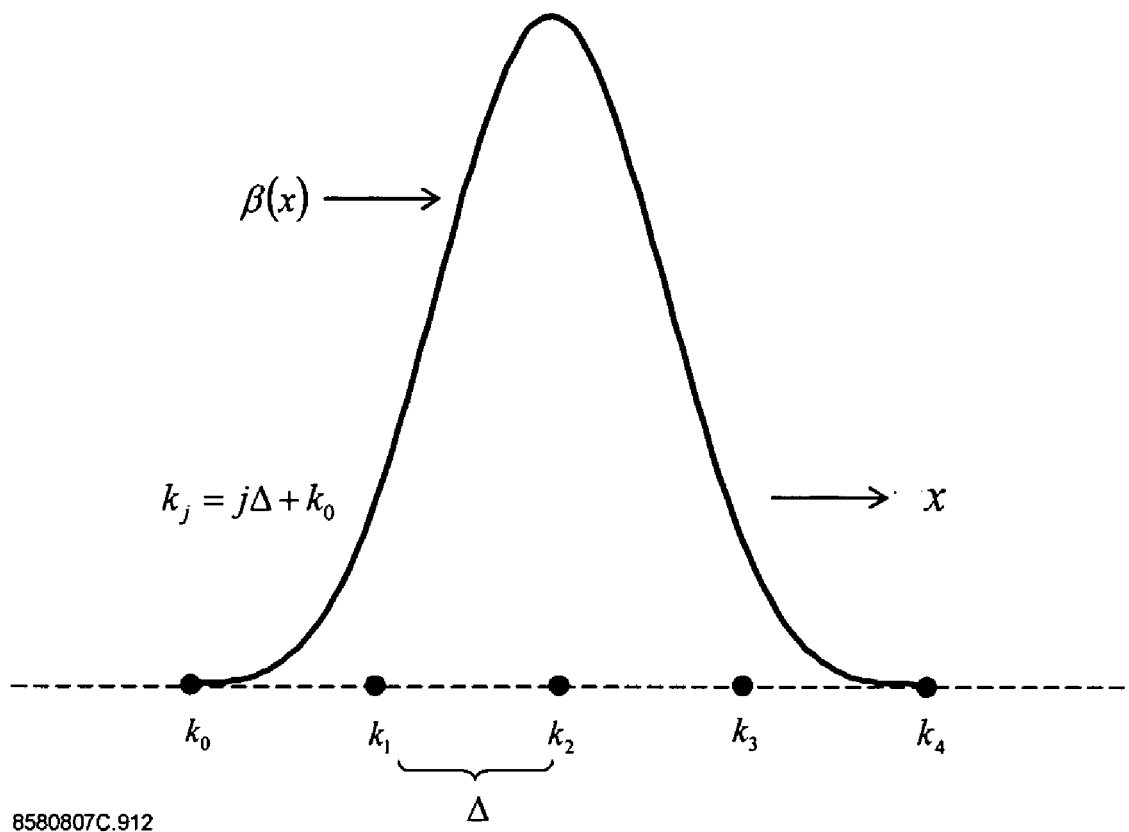
FIG. 47 illustrates an example single cubic B spline.
Figure 48:
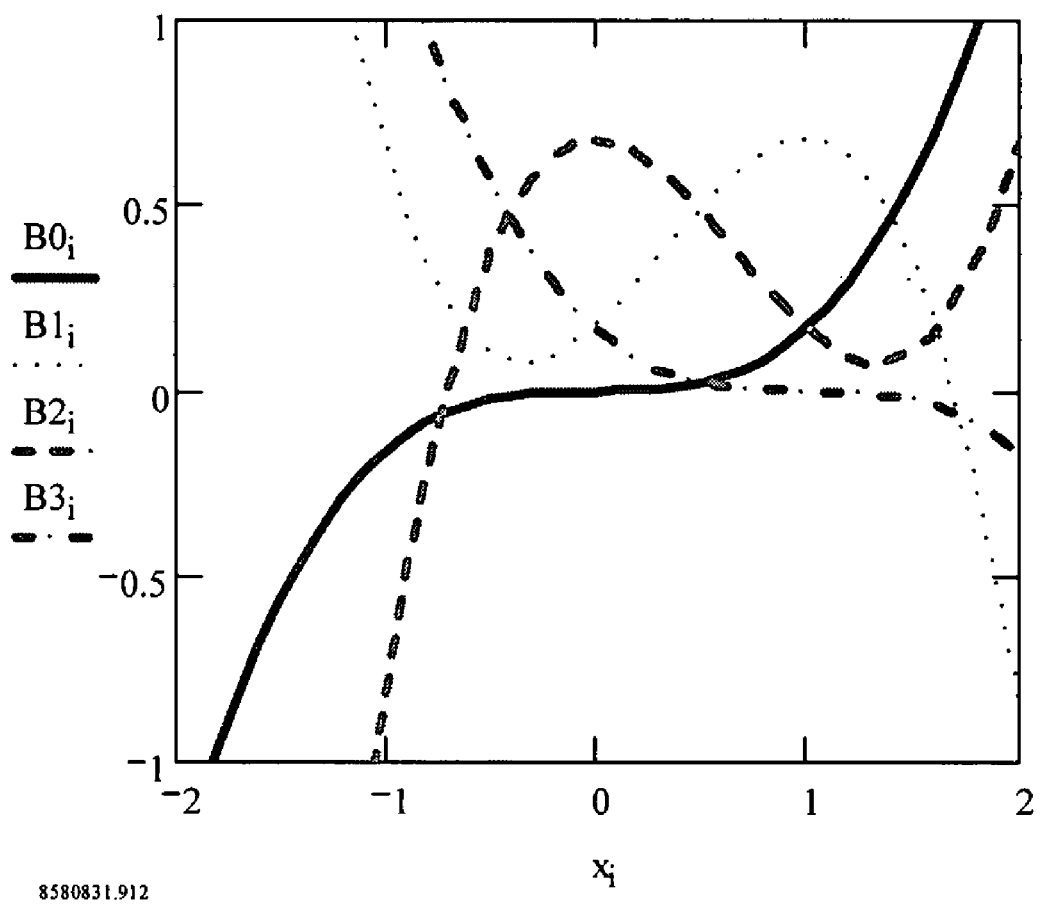
FIG. 48 illustrates an example dissected spline.

A spline of the B form, (B spline), requires the additional constraints of zero derivatives for the spline at $k_0$ and $k_4$ and is zero outside the interval. A single cubic B spline is illustrated in FIG. 47. FIG. 47 assumes equal spacing, $\Delta$, between knots. This is however not a requirement for B splines. FIG. 48 illustrates a dissected spline to reveal the component or spline basis.

The $j^{th}$ spline is given by:

$$B_j(x) = B_0(x - j\Delta) \ j = -3, -2, -1, 0, 1 \ldots N-1$$

The cubic B spline can be written as a piecewise continuous function over a limited domain in terms of its basis functions. A convenient matrix description is:

$$\beta(x) = [x][M_{B_s}][k_{B_i}]$$

Expanding the above matrix notation explicitly yields:

$$[x] = [x^3, \ x^2, \ x, \ 1]$$

$$[M_{B_s}] = 1/6 \begin{vmatrix} -1 & 3 & -3 & 0 \\ 3 & -6 & 3 & 0 \\ -3 & 0 & 3 & 0 \\ 1 & 4 & 1 & 0 \end{vmatrix}$$

$$[k_{B_i}] = \begin{vmatrix} k_{i-3} \\ k_{i-2} \\ k_{i-1} \\ k_i \end{vmatrix}$$

$$\beta(x)_{k_i} = \overbrace{\frac{(1-x)^3}{6}}^{B_3} k_{i-3} + \overbrace{\frac{3x^3 - 6x^2 + 4}{6}}^{B_2} k_{i-2} + \overbrace{\frac{(-3x^3 + 3x^2 + 3x + 1)}{6}}^{B_1} k_{i-1} + \overbrace{\frac{x^3 k_i}{6}}^{B_0}$$

$$0 \leq x \leq 1$$

Notice that the convention $B_i$ utilizes the subscript to represent a segment of the spline. In subsequent sections, $B^N$ represents the $n^{th}$ order B spline. Thus $B^3$ refers to a third order B spline and $B_0$ refers to the $0^{th}$ segment or initial segment of the spline.

Figure 49:
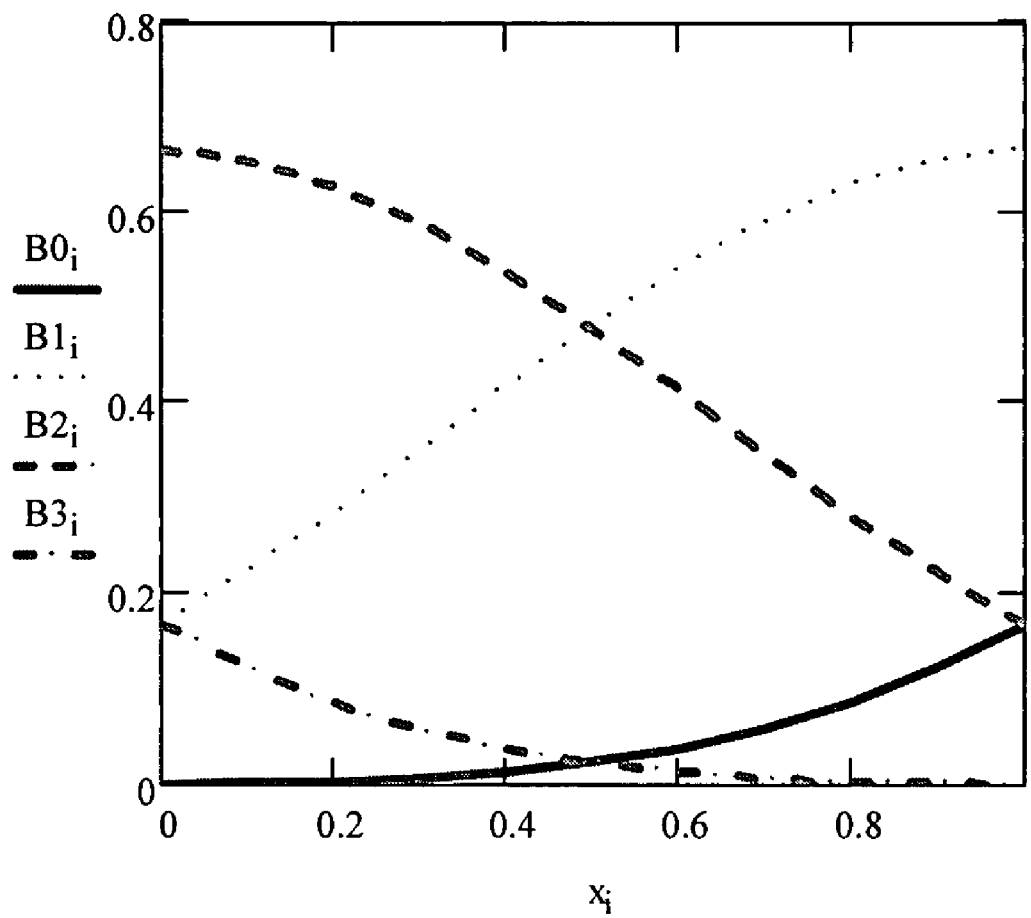
FIG. 49 illustrates various components of an example spline.

FIG. 49 illustrates the various components or basis for $\beta(x)$ over the interval $0 \leq x \leq 1$. These components of the spline are also known as blending functions.

Figure 50:
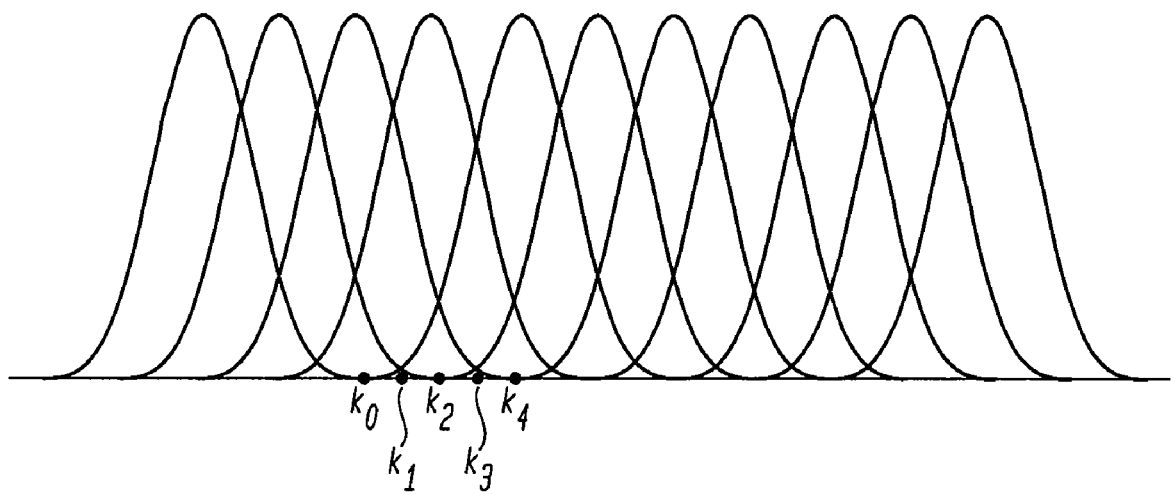
FIG. 50 illustrates overlapping splines.
Figure 51:
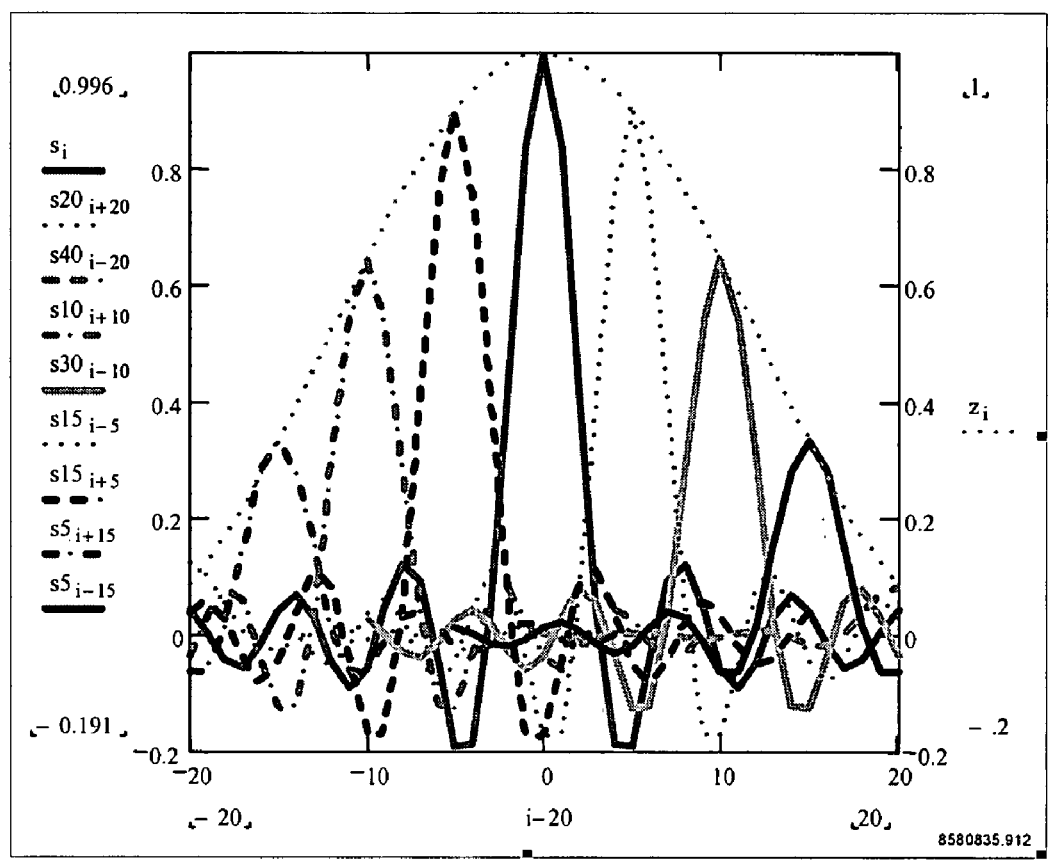
FIG. 51 illustrates overlapping splines.

Successive applications of splines overlap knot intervals as follows as illustrated in FIG. 50. These splines overlap in such a manner, given proper coefficients for each shifted B spline, that within the interval $k_0 < x < k_4$, a normalized response is obtained, requiring:

$$\sum_{i=-3}^{N} B_i(x) = 1.$$

In an application involving fitting to a curve the response over $k_0 \ldots k_N$ is tailored by:

$$S_a(x) = \sum_{i=3}^{N} a_i B_i(x)$$

where $a_i$ are additional weighting factors.

De Boor derived a recursive method for calculating the $a_i$ values. The technique requires sequential calculations beginning with splines of order n=1 and recursively progressing up to order=4 (cubic spline):

$$B(x)_{i,n} = \frac{x - k_i}{k_{i+n-1}} B(x)_{i,n-1} + \frac{k_{i+n} - x}{k_{i+n} - k_{i+1}} B(x)_{i+1,n-1}$$

$$i = -3 \ldots N - 1$$

$$n = 1, 2, 3, 4$$

(b) Smoothing

The methods presented in section 7.5 may be applied to the spline problem as well. That is, the Lebesgue norm=$2(L_2)$ constraint can be placed on a data set which possesses a greater number of knots over an interval than is strictly required. In this problem the same minimization is necessary:

$$\min(E(f)) = \sum_{i=0}^{n} w_i [\tilde{f}(x_i) - f_i]^2$$

Each of the $\tilde{f}(x_i)$ data influences the spline along with the weighting values $w_i$. $\tilde{f}$ represents the function interpolated by splines. Rather than interpolating the contour of all of the knots explicitly, a smoothed or averaged solution is obtained.

This approach can have a lot of merit for processing ensembles of data. If the ensemble possesses an optimal least squares solution then perhaps this single solution can be applied for every member experiment of the ensemble. That is, rather than requiring unique spline coefficients for each and every data set associated with a measurement, perhaps a single spline can be calculated with its corresponding single set of coefficients to apply for all separate experiments. This could reduce a significant amount of data.

Another variation can be done by averaging the $X_i$ prior to calculating the spline. Suppose that many similar experiments are run which spawn data sets each of which can be used to produce a separate experiment dependent spline, or using the $L_2$ norm derive a universally optimal spline. Rather than invoking the $L_2$ norm, it is possible under certain circumstances to approximate a solution by calculating an averaged $X_i$ and therefore obtain a single averaged $\tilde{f}_i$. This requires:

$$\overline{X}_i \Delta \frac{K_i}{n} \sum_{j=1}^{n} X_{i,j} W_j$$

$n\Delta$ Number of samples at the $i^{th}$ data location due to n similar experiments.

$K\Delta$ Normalization factor if so desired to create a unity form or other weight for the weighted average. This permits individual weighting of the j components for $X_i$ separate from weighting the $X_i$.

The individually averaged $\overline{X}_i$ can then be used to obtain a spline. If the variance across the ensemble of data sets is not too great then this technique may be very efficient and very effective. The $L_2$ norm minimization can also be applied to a single experiment, which possesses a noisy data set. In addition, a 'noisy' data set may be pre convolved with a smoothing kernel (filtered) to smooth prior to fitting.

(c) Polar Splines

Interpolation in curvilinear coordinates is in general a more difficult problem to analyze than the simple Cartesian formulation presented earlier. In addition to the natural curvature of the spline, the space itself can be warped. As presented earlier, the 'self energy' of the spline is related to the curvature of the spline which is subject to a minimization procedure. Changing coordinate systems, and projecting the spline in co-linear coordinates will change the minimization and potentially the spline formulation.

The previously written self energy minimization is once again presented:

$$S_2 \Delta \min \left\{ \int_a^b \left| \frac{d^2 \beta(x)}{dx^2} \right|^2 dx \right\}$$

$\beta(x)$ is a piecewise cubic polynomial with continuous derivatives at the joins/knots. Sometimes $S_1$ splines find application but are not presented here because of certain uniqueness properties which they lack. This can present certain computational issues unless regularization terms are included within the context of minimization.

The equivalent polar spline minimization procedure involves:

$$S_{2p} \Delta \min \left\{ \int_{\phi_a}^{\phi_b} \left( \frac{d^2 r}{d\phi^2} \right)^2 d\phi \right\}$$

where $r(\phi)$ are piecewise cubic polynomials and possess continuous derivatives at the nodes, $\phi_i$.

The minimization can take on a form involving curvature:

$$\min \left\{ \int_{\phi_a}^{\phi_b} (K)^2 f \, d \right\} = \min \int_{\phi_a}^{\phi_b} \left( \frac{r^2 + 2\left(\frac{dr}{d\phi}\right)^2 - r\frac{d^2r}{d\phi^2}}{\left(r^2 + \left(\frac{dr}{d\phi}\right)^2\right)^{3/2}} \right) d\phi$$

r an be expressed as a Hermitian function in a form:

$$r(\phi) = r_i + \frac{dr(\phi_i)}{d\phi}(\phi - \phi_i) +$$

$$\left(\frac{1}{\phi_{i+1} - \phi_i}\right)\left[\left(-\left(\frac{2dr(\phi_i)}{d\phi} + \frac{dr(\phi_{i+1})}{d\phi}\right)\right) + 3\Delta r_i\right](\phi - \phi_i)^2 +$$

$$\left(\frac{1}{\phi_{i+1} - \phi_i}\right)^2 \left(\frac{dr(\phi_i)}{d\phi} + \frac{dr(\phi_{i+1})}{d\phi} - 2\Delta r_i\right)(\phi - \phi_i)^3$$

where $$\Delta r = \left(\frac{r_{i+1} - r_i}{\phi_{i+1} - \phi_i}\right)$$

Calculating the cubic spline in polar coordinates then includes finding the derivatives $dr(\phi_i)/d\phi$ subject to the minimization constraints, at each knot or join.

(d) Relevance of the Sampling Theorem

Sampling theory has a long and famous history. Yet, until the 1990's the association of Splines and the classical sampling interpolants was overlooked. However, embodiments provided herein rely on the connection between the Cardinal series represented by a host of pioneers in mathematics, information theory, and signal processing, and the general theory of splines as applied to sampled time domain signals.

Cauchy developed some idea of the sampling theorem as far back as 1847. Borel repeated the theme with his Fourier proof in 1897. Whittaker provided a proof in 1915, which included the idea of cardinal functions associated with the samples and used as an interpolation formula. Kotelnikov in 1933 also presented a proof of the sampling theorem. In 1948 Shannon used the sampling theorem to relate the samples of information bearing analog signals to the Nyquist sampling rate. In 1962 Peterson and Middleton extended the sampling theorem to higher order spaces/dimensions. And finally, Papoulis published a generalization of the sampling theorem in 1968.

Schoenberg released a landmark paper on spline interpolants in 1946, prior to the Shannon paper. The relationship between Shannon's theorem and spline theory has been explored relatively recently even though splines have found increasing application since the 1960's. Perhaps this has been due to the lack of cross pollination between signal processing applications and the applications advancing spline theory. A common language was not developed early on and splines were considered as graphic interpolants rather than means of describing physical sampling phenomena.

The cardinal basis for sampling can be compared to the spline cardinal basis. The cardinal series originally identified with the sampling theorem is:

$$\tilde{x}(t) = \frac{1}{\pi} \sum_{n=-\infty}^{\infty} x\left(\frac{n}{2B_w}\right) \frac{\sin(\pi(2B_w t - n))}{2B_w t - n}$$

Figure 52:
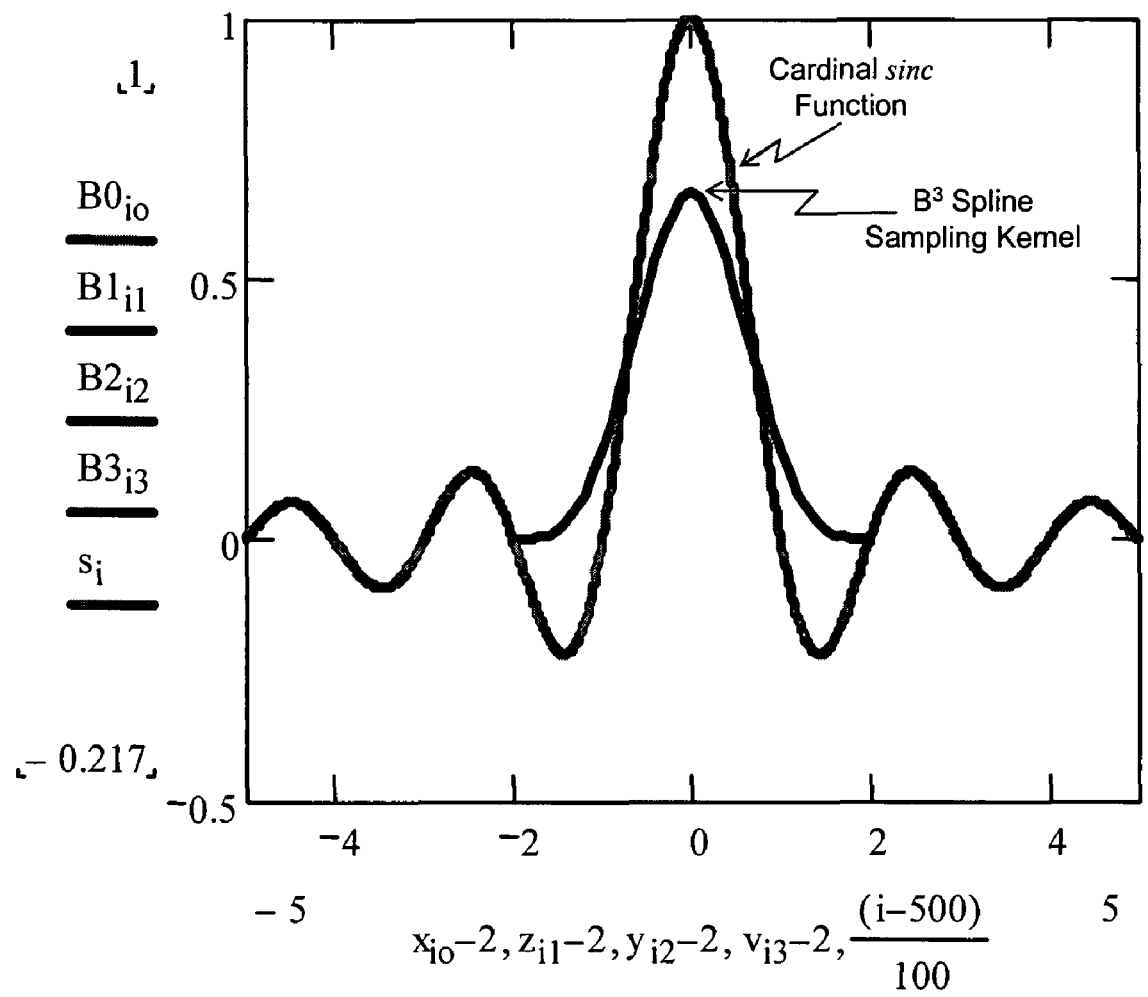
FIG. 52 illustrates an example cardinal series expansion of the function $x(t)=\cos^2(\ )$.

$x(t) \Delta$ Signal as a function of time
$B_w \Delta$ Bandwidth of the signal x(t)
$n \Delta$ Sample Index This equation illustrates that any signal can be represented from an infinite number of sample functions of the sinc form weighted by the original waveform at discrete intervals. The weighted samples are linearly combined to create the smoothed version of x(t). In fact, the time domain waveform and its discrete samples are related by means of this interpolation series. FIG. 52 illustrates this cardinal series expansion graphically for the function $x(t) = \cos^2(\ )$.

The Fourier Cardinal Series (sampling function) for a band limited sampled signal x(t) is given by:

$$X(\omega) = \sum_{n=-\infty}^{\infty} \frac{1}{2B} x\left(\frac{n}{2B}\right) \Pi\left(\frac{\omega}{2B}\right)$$

Schoenberg's form for the basic B-Spline expansion is:

$$s(x) = \overset{k}{\Sigma} c(k)(\beta^n(x - k))$$

The basic rectangular spline is represented by:

$$B^0(x) = \begin{cases} 1, & -1/2 < x < 1/2 \\ 1/2, & |x| = 1/2 \\ 0, & \text{Otherwise} \end{cases}$$

n+1 convolutions of the rectangular spline will spawn the $n^{th}$ order spline.

$$B^n(x) = \underbrace{B^0(x) * B^0(x) * \ldots B^0(x)}_{n+1}$$

The Fourier Transform can be calculated from:

$$B^n(\omega) = \int_{-\infty}^{\infty} \underbrace{\{B^0(t) * B^0(t) * \ldots\}}_{n+1 \text{ fold convolution}} e^{-j\omega t} dt$$

$$B^n(\omega) = \left(\frac{\sin(\omega/2)}{\omega/2}\right)^{n+1} = \frac{(e^{j\omega/2} - e^{-j\omega/2})^{n+1}}{(j\omega)^{n+1}}$$

Schoenberg's form can also be rewritten in terms of the time variable, t, and a reconstructed function x(t) as:

$$\tilde{x}(t) = \sum_{k=-\infty}^{\infty} c(k) B^n(t-k)$$

Notice the similarity to the form given earlier for the Whittaker-Shannon Cardinal sampling series. Shannon's form depends on the notion of the ideal low pass "brick wall" to bandwidth limit the function x(t) prior to sampling. This demands convolution with a filter which possesses a sinc ($\tau$) impulse response. If the pre-filtered waveform is subsequently sampled by an impulse sampler, then it can be reconstructed by post convolution with a reconstruction filter possessing the sinc ($\tau$) impulse response.

Schoenberg's form given above is in fact a convolution sum involving B-Splines rather than sinc ($\tau$) functions. As the B-Spline order n→∞, Schoenberg's spline reconstruction asymptotically approaches the Shannon reconstruction Cardinal series performance.

FIG. 52 illustrates the impulse response equivalent comparing the sinc interpolation and B-Spline kernels.

Figure 53:
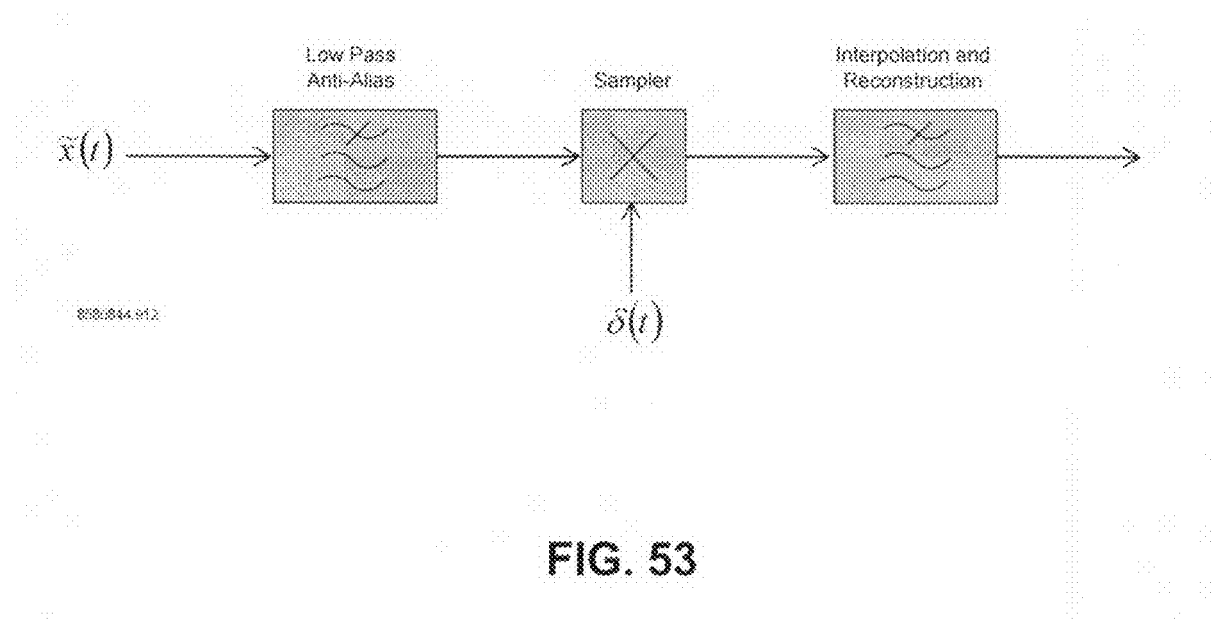
FIG. 53 illustrates an example system, including a low-pass anti-alias filter, a sampler, and an interpolation and reconstruction filter.

The sampling theorem dictates the use of anti alias filters, proper samplers, and reconstruction or interpolation filters. This is illustrated in FIG. 53, which illustrates a chain including a low-pass anti-alias filter, a sampler, and an interpolation and reconstruction filter.

The parallel has been substantiated for considering spline kernels as the interpolant. All that remains is to specify pre filtering and describe an efficient means of constructing the spline interpolation functions.

It can be shown that the ideal pre filter frequency response for the cubic spline case approaches:

$$H(f) = \frac{(\mathrm{sinc}(f))^4 \sum_{k=-\infty}^{\infty} (\mathrm{sinc}(f-k))^4}{\sum_{k=-\infty}^{\infty} (\mathrm{sinc}(f-k))^8}$$

(e) B Spline Transform

The linear sum of cubic B-Splines weighted by $$S_a(x) = \sum_{i}^{n} a_i B_i(x)$$

can be formulated for all knots over a very large interval to construct very complicated functions. Another notation which is of a discretely sampled continuous form provides a useful interpretation of the spline sampled operation:

$$S(i) = \sum_{i=-\infty}^{\infty} a(i) B_j(x-i)$$

The shifted B-Splines B(x−i) constitutes the basis for the system. The cubic B-Spline basis was previously described. The form for S(i) is a discrete sampling function similar to a convolution sum. If x were replaced by discrete samples then a convolution sum would result. This form is suggestive of a filter. In fact, this is identified as the discrete B-Spline transform:

$$a(k) = (b^3)^{-1} * s(k)$$

where $(b^3)^{-1}$ is the impulse response of the direct B-Spline filter ($3^{rd}$ order B-Spline for current discussion). A transform may be calculated for $(b^3)$ and results in:

$$B^3(\mathcal{Z}) = \sum_{k=-n/2}^{n/2} (b^3(k)) \mathcal{Z}^{-k}$$

$$= \frac{\mathcal{Z} + 4 + \mathcal{Z}^{-1}}{6}; \text{ (roots @ } \alpha_1 \simeq -.268, \alpha_2 \simeq -3.732).$$

Replacing $\mathcal{z} \to e^{j2\pi f}$ yields the Fourier Transform:

$$B^3(f) = \left(b^3(0) + \sum_{k=1}^{n/2} 2b^3(k) \cos(2\pi fk)\right) \cdot [\mathrm{sinc}(f)]^{n+1}.$$

Notice the exponent (n+1) of the sinc(f) function relating to the n fold convolution.

The transfer function of the cubic spline transform is:

$$[B^3(\mathcal{Z})]^{-1} = \frac{1}{(b^3(0)) + \sum_{k=1}^{n/2} b^3(k)[\mathcal{Z}^k + \mathcal{Z}^{-k}]}$$

This form is known as the direct B spline transform while $B^3(\mathcal{z})$ is known as the indirect form. As such:

$$s(k) = b^3 * a(k)$$

where $b^3$ is in fact the indirect B-Spline filter. The B-Spline filter can be implemented by a symmetric FIR filter. The direct B-Spline filter is naturally an IIR form, but can be converted to an FIR form.

The implications are that very fast real time algorithms can be obtained for interpolation of the spline polynomials under certain circumstances. For instance, running the signal samples through a filter, $[B^3(\mathcal{z})]^{-1}$ yields the coefficients a(k).

Figure 54:
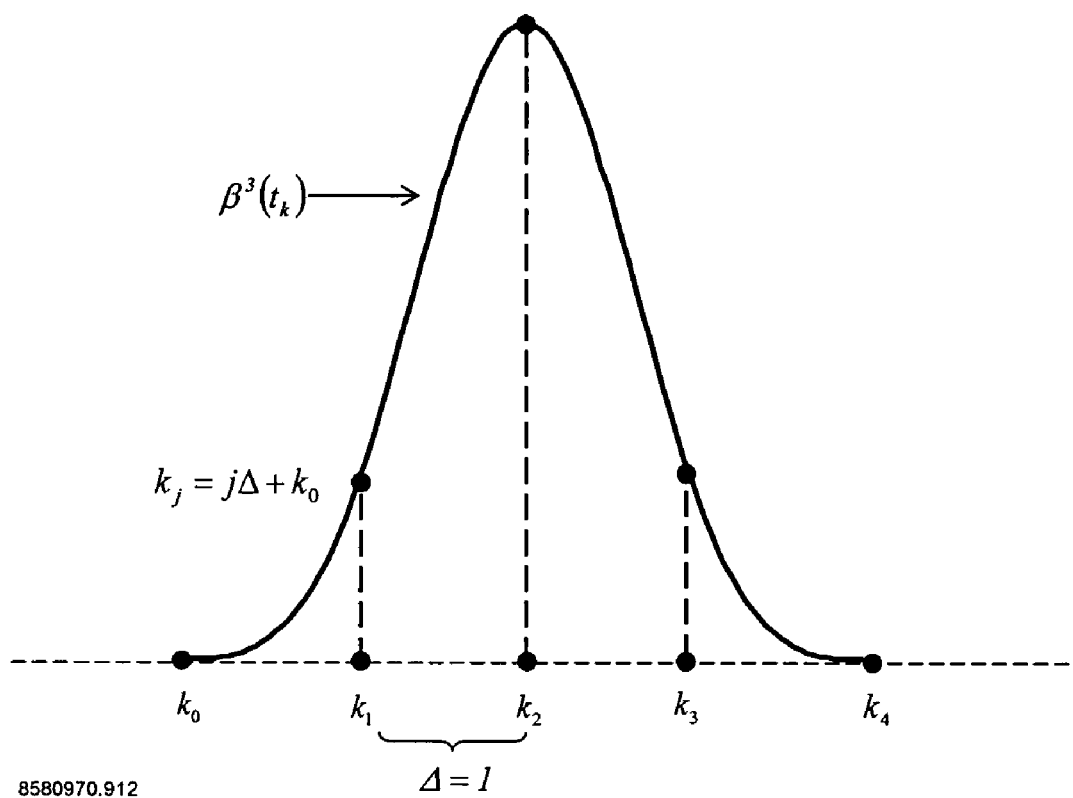
FIG. 54 illustrates an example uniformly sampled cubic B spline.

$b^3(k)$ is a discrete sampled function. The fundamental uniformly sampled cubic B-Spline is illustrated in FIG. 54.

| $k_j$ | $\beta(k_j)$ | $t_k$ |
|---|---|---|
| $k_0$ | 0 | 0 |
| $k_1$ | .16$\overline{6}$ | 1 |
| $k_2$ | .66 | 2 |
| $k_3$ | .16$\overline{6}$ | 3 |
| $k_4$ | 0 | 4 |

The discretely sampled values of $\beta^3(x)$ represent the unit pulse response of the indirect B-Spline filter whose coefficients $b^3(k)$ correspond to the tabulated values above. The direct filter is obtained as the normalized inverse, $[b^3(k)]^{-1}$.

9. SURFACE FITTING (a) Bi-Cubic Surface B-Splines

Birkhoff and de Boor (1965) are usually cited for presenting the idea of deriving surface splines for two independent directions, then interpolating the internal region of a MESH element using a form:

$$f(x, y) = \sum_{i=0}^{3} \sum_{j=0}^{3} c_{i,j} x^i y^j$$

It should be noted that the B-spline represented in 2D space requires 4 basis functions. Furthermore, 4 unique splines are required to characterize a curve within the interval $a \leq x \leq b$. A single B-spline consisting of the 4 basis functions requires 7 coefficients.

Independent basis functions in the x and y direction can be multiplied in a tensor product to obtain the bi-cubic surface B-spline form:

$$s(x, y) = \sum_{i=1}^{8} \sum_{j=1}^{8} \gamma_{i,j} B_i^3(x) B_j^3(y)$$

Thus, a total of 7×64=448 coefficients are required to described the associated single patch of the meshed surface using this approach.

A least squares solution can then be applied to calculate $\gamma_{i,j}$ for the surface. The calculation given above was based on the minimum number of knots assigned to the MESH boundaries. Usually, the problem is over determined and the minimization takes the form:

$$\min \left\{ \sum_{r=1}^{m} (s(x_r, y_r) - f_r)^2 \right\}$$

where m is the number of data points, and the number of knots is <<m.

448 coefficients is a significant calculation and memory load. However, Section 8 provides methods for implementing a B spline transform which can be applied recursively. This reduces the memory requirements. The example given above would be reduced dramatically to 64 memory locations. Furthermore, it should be understood that there is significant overhead in the example as given for a single MESH patch. Boundary conditions require additional ISI introduced by 4 adjacent splines. If an entire surface with several or many meshes is employed then the overhead for memory is distributed amongst all the MESH elements for the boundary conditions. Therefore, ignoring the additional boundary splines further reduces the memory required for a single MESH patch to a maximum of 16 coefficients. These coefficients correspond to weights related to the surface contour.

It is useful to use the parametric representation of a surface patch which is formed from the intersection of the successive spline contours $B_i^3(x)$, $B_j^3(y)$ which are arranged on an orthogonal grid. The patch is an important geometrical feature for CAGD (Computer Added Graphical Design) application and can also play an important role for the techniques disclosed herein. Section 10 provides additional clarification of the patch concept.

The following matrix representation for the tensor product of splines is given as:

$$P_{ij}^{\nu} = [X]^T [M_{B_s}]^T [\gamma_{ij}^{\nu}][M_{B_s}][Y]^T \qquad \text{(Patch Representation)}$$

This representation is built from the scalar field $\gamma_{ij}^{\nu}$ which is a tensor form whenever $\nu$ assumes one of the 3 space dimensional coordinates. That is $\gamma_{ij}^{\nu}$ is a 4×4×3 operator. The other components of the equation were described previously but are given here for convenience:

$$x = [x^3, x^2, x, 1]$$

$$y = [y^3, y^2, y, 1]$$

$$M_{B_s} = \frac{1}{6} \begin{bmatrix} -1 & 3 & -3 & 0 \\ 3 & -6 & 3 & 0 \\ -3 & 0 & 3 & 0 \\ 1 & 4 & 1 & 0 \end{bmatrix} \quad \text{Bi Cubic Spline Blending Function Matrix}$$

$$\gamma_{i,j}^{\nu} = \begin{bmatrix} \gamma_{i,j}^{\nu} & \cdots & \gamma_{i,j+3}^{\nu} \\ \vdots & & \vdots \\ \gamma_{i+3,j}^{\nu} & \cdots & \gamma_{i+3,j+3}^{\nu} \end{bmatrix}$$

This formulation is based on the bi cubic spline but can easily be modified to represent arbitrary algebraic polynomials, orthogonal polynomials, etc.

10. PATCHES AND SPLOTCHES

Another representation to describe the error surface $D_{\epsilon_R}$ within the space $R^N$ permits the sub division of the surface or manifold into local regions called patches for cases where the space is $R^2$ or $R^3$. The patches may take on any convenient shape, vary in size and be mixed within an application (different shapes and sizes). Conceptually the patch has a high level of representation within the mathematical description and its own describing functions. These higher level structures may be manipulated to morph the overall representation of $D_{\epsilon_R}$, patch by patch. If hardware accelerators are constructed which operate at this level of abstraction, speed, efficiency and utility can be blended to attain some desired performance.

In 2-D, the patches would represent regions as illustrated FIG. 55, for example. The patches are connected in networks which form the surface within the region of interest. The edges of each patch form shared boundary conditions with adjacent patches. The boundary conditions are typically described by polynomials, splines, special functions, etc. Any point within the patch boundary may then be calculated by interpolation of functions which represent the patch boundaries. In this manner, modest amounts of data, describing the boundaries, permit calculation of a continuum of coordinate values.

Figure 56:
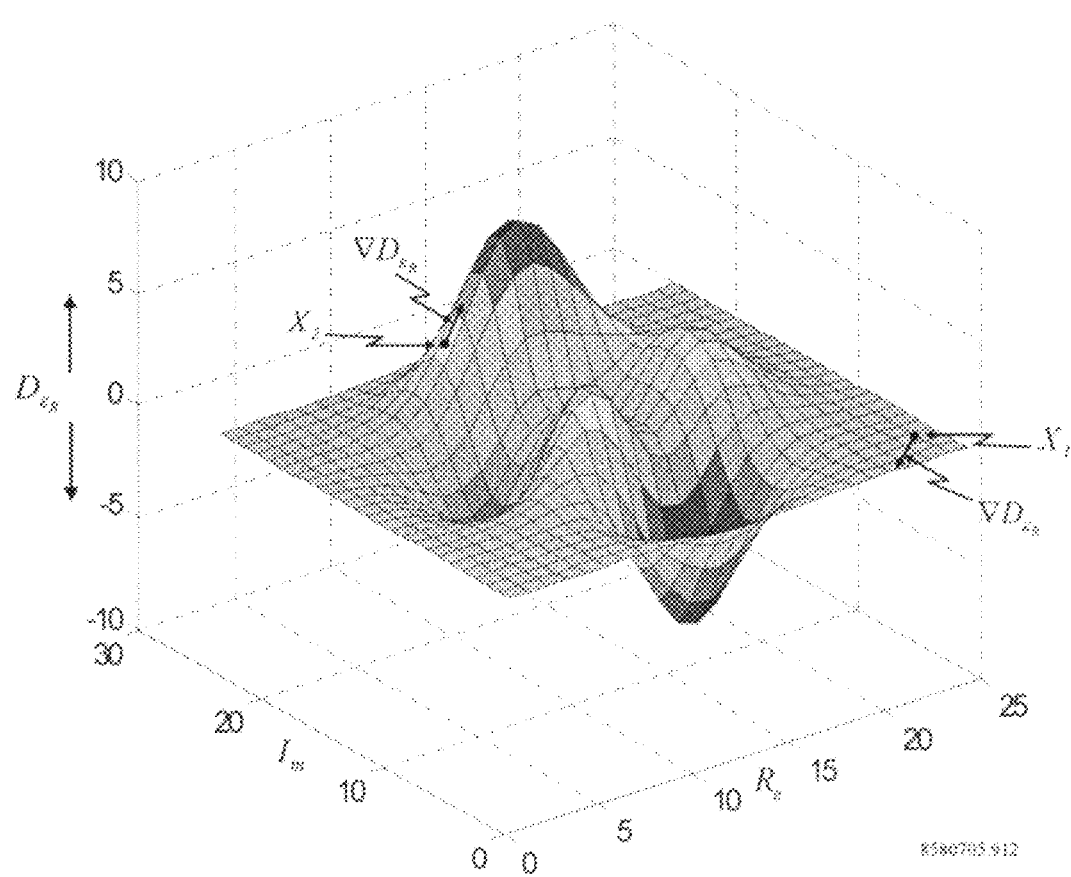
FIG. 56 illustrates how a regular rectangular grid in 2-D plane projects onto a 3-D surface.

Whenever the surface is represented in 3-D the boundaries are projected onto the surface to represent a conformal grid. FIG. 56 illustrates how a regular rectangular grid in the 2-D plane (base of figure) projects onto the 3-D surface. In 2-D, the grid is undistorted, while in 3-D the grid is distorted in proportion to the projected scalar field of values representing the surface contour.

Patch techniques are widely used in the CAGD industry and have been useful in accelerating graphically intensive processes. They have never been applied to the describing functions for calibration and compensation of RF power amplifiers.

Splotches are a new entity (newly created for this application) which can be manipulated much in the same way the patch can be manipulated. However, a splotch is a region extracted from the error surface manifold within $R^N$ whenever $N>3$.

(a) Polynomial Based Patch Interpolation

Section 9 introduced the idea of the spline product and a matrix formulation of a rectangular patch element associated with the spline based tensor product surface MESH. A more fundamental tensor product is definable in terms of polynomials which are associated with the patch boundaries. This polynomial based patch has a surface description given by:

$$P_i = c_{00} + c_{10}x + c_{01}y + c_{20}x^2 + c_{11}xy + c_{02}y^2 + c_{30}x^3 + c_{21}x^2y + c_{12}xy^2 + c_{03}y^3 + c_{31}x^3y + c_{22}x^2y^2 + c_{13}xy^3 + c_{32}x^3y^2 + c_{23}x^2y^3 + c_{33}x^3y^3 + \ldots c_{mn}x^my^n$$

$P_i$ is the amplitude or height above the x-y plane within the patch. x and y represent rectangular coordinate variables for the point and $c_{mn}$ are the coefficients of the polynomial given above.

Simultaneous equations may be solved to determine the $c_{mn}$ coefficients on a point by point basis if so desired and boundary conditions at the patch edge, corners, plus center (if known) can provide convenient constraints for calculating solutions.

Once a strategy is selected for obtaining a suitable set of coefficients which describes the patch they may be stored and recalled as required.

The matrix form is more compact:

$$P_i = [x][c_{mn}][y]^T.$$

Some common schemes of interpolation with this patch topology can be as follows:
  Level Plane Interpolation;
  Linear Plane Interpolation;
  Double Linear Interpolation;
  Bi Linear Interpolation;
  Bi Quadratic Interpolation;
  Piecewise Cubic Interpolation; and
  Bi Cubic Interpolation.

There are other popular methods in addition to the list provided above. Tradeoffs of accuracy versus calculation complexity govern the choice of method.

11. TENSOR APPLICATIONS

A tensor is a mathematical entity, which when defined within a particular coordinate system, becomes defined also within a coordinate transformation of that system. Even when the tensor's elements are fixed in a particular frame of reference, they are defined in all other legitimate frames, albeit with perhaps new quantities according to some prescribed transformation.

One particularly useful application of tensor theory is now presented because of its utility and analogous characteristic to $D_{\epsilon_R}$ manipulation. Thus far, this disclosure has presented the error surface and focused on a 'snapshot' description. However, the error surface changes as a function of many variables. This is similar to pushing, pulling stretching and deforming the error surface, juxtaposed to some baseline form.

Figure 57:
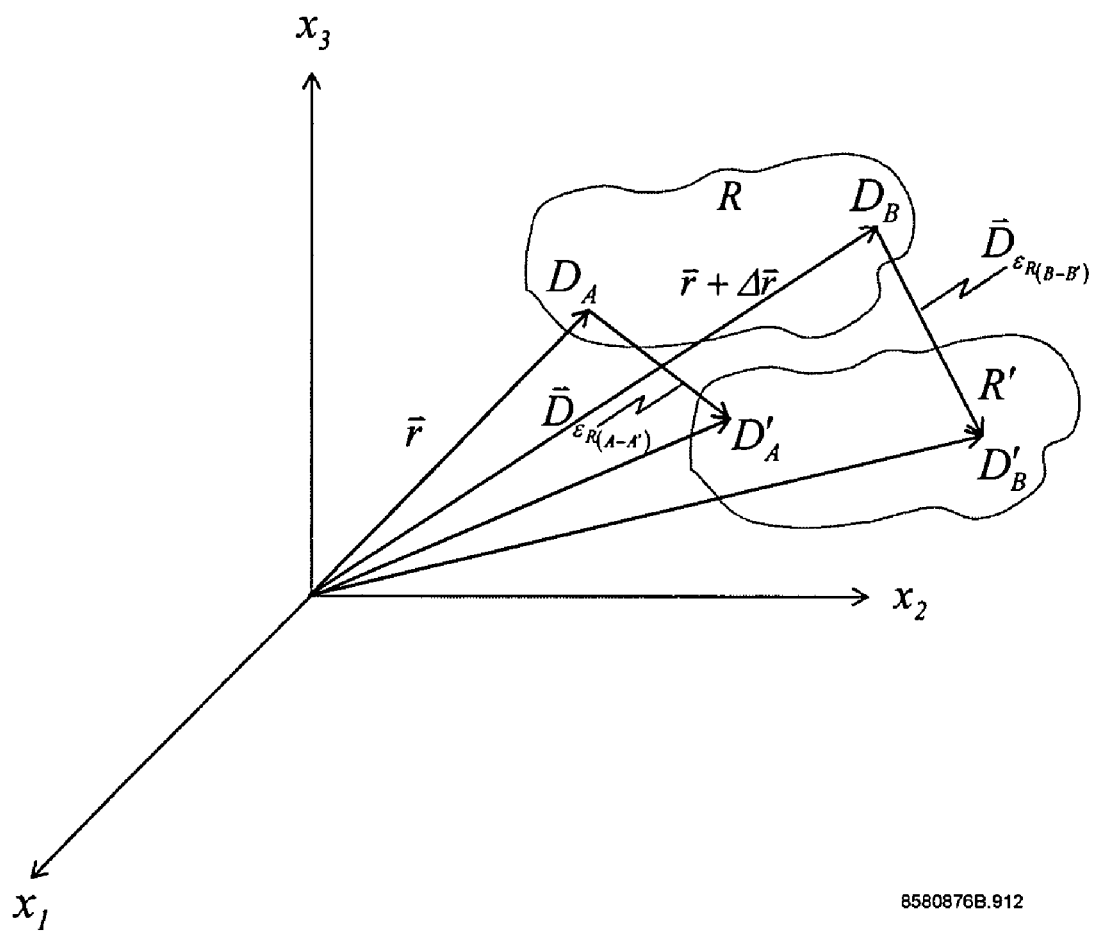
FIG. 57 illustrates an example transformation of a region in 3-D space.

FIG. 57 illustrates a case for which a change occurred in the relative position of points for a 3-D kernel space, transforming from region R to R'.

Region (R) possesses two points $D_A$ and $D_B$ which lie on a surface or are functionally related in some manner that has specific mathematical description. The radial vectors $\vec{r}$ and $\vec{r} + \Delta \vec{r}$ relate to the orientation of these points in the 3 space defined by $x_1, x_2, x_3$.

Region (R') illustrates the original two points on the original surface, translated to region R'. The new point locations are labeled $D_A'$ and $D_B'$. Notice that $$\vec{D}_{\epsilon_{R(A-A')}}$$

and $$\vec{D}_{\epsilon_{R(B-B')}}$$

have been defined as error vectors. $x_1, x_2, x_3$ define a fundamental Euclidian spatial kernel in this example.

The error vector possesses components in this 3-D space written as:

$$D_{\epsilon_{R_i}} = (\vec{D}_{\epsilon_R} \cdot \vec{x}_1, \vec{D}_{\epsilon_R} \cdot \vec{x}_2, \vec{D}_{\epsilon_R} \cdot \vec{x}_3).$$

The spatial components on the surface may be defined in shorthand notation as:

$$D_{\epsilon_{R_i}} = D_{\epsilon_{R_i}}(x_1, x_2, x_3).$$

The coordinates in R' are related to R in the following manner:

$$\Delta x_i' = \Delta x_i + D_{\epsilon_{R_i}(x_1 + \Delta x_1, x_2 + \Delta x_2, x_3 + \Delta x_3)} - D_{\epsilon_{R_i}(x_1, x_2, x_3)}$$

A differential equation is then formulated as follows:

$$\Delta x_i' = \Delta x_i + \frac{\partial D_{\epsilon_{R_i}}}{\partial x_k} \Delta x_k.$$

For very small $\Delta x_i, \Delta' x_i$, variations in the radial vectors of interest can be approximated from:

$$\Delta x_i' \Delta x_i' \cong (\Delta r')^2$$

$$\Delta x_i \Delta x_i \cong (\Delta r)^2.$$

Notice the introduction of the k index along with the i index. This degree of freedom is required to address additional spatial perturbation. The radial variations of the translated regions can be expressed by:

$$(\Delta r')^2 - (\Delta r)^2 \simeq 2 \frac{\partial D_{\varepsilon_{R_i}}}{\partial x_k} \Delta x_i \Delta x_k + \frac{\partial D_{\varepsilon_{R_i}}}{\partial x_k} \frac{\partial D_{\varepsilon_{R_i}}}{\partial x_k} \Delta x_k \Delta x_l =$$
$$\left( \frac{\partial D_{\varepsilon_{R_i}}}{\partial x_k} + \frac{\partial D_{\varepsilon_{E_k}}}{\partial x_i} + \frac{+\partial D_{\varepsilon_{R_l}}}{\partial x_k} \frac{\partial D_{\varepsilon_{R_l}}}{\partial x_k} \right) \Delta x_i \Delta x_k.$$

It should be noted that l has been introduced so that i, k, l account for all spatial perturbations in the Euclidian 3-D kernel. The second order tensor can be identified from:

$$D'_{\varepsilon_{R_{i_k}}} = \frac{1}{2} \left( \frac{\partial D'_{\varepsilon_{R_i}}}{\partial x'_k} + \frac{\partial D'_{\varepsilon_{R_k}}}{\partial x'_i} + \underbrace{\frac{\partial D'_{\varepsilon_{R_l}}}{\partial x'_i} \frac{\partial D'_{\varepsilon_{R_l}}}{\partial x'_k}}_{\text{non linear term}} \right).$$

whenever transformation from region R to R' is accomplished.

In the linear theory of elasticity, the second order tensor of interest is given by the first 2 terms as follows:

$$D_{\varepsilon_{R_{i_k}}} = \frac{1}{2} \left( \frac{\partial D_{\varepsilon_{R_i}}}{\partial x_k} + \frac{\partial D_{\varepsilon_{R_k}}}{\partial x_i} \right)$$

Figure 58:
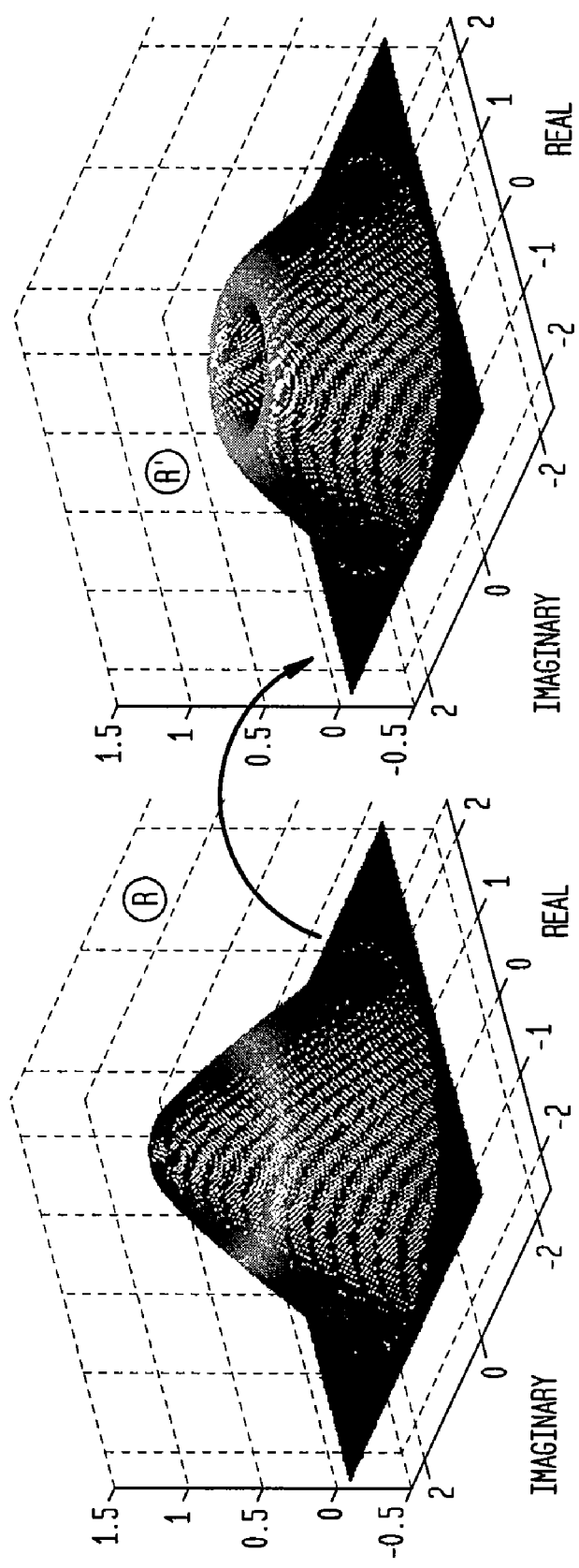
FIG. 58 illustrates two plots of example magnitude error surfaces in the fundamental 3-D spatial kernel.

FIG. 58 illustrates two plots that show two separate magnitude error surfaces $|D_{\varepsilon_{R_A}}|$ and $|D_{\varepsilon_{R_B}}|$ rendered in the fundamental 3-D spatial kernel. The plot to the right is obtained by some action on the plot to the left. This action could be temperature related, gain change, power supply change, frequency change, etc. If the tensor $D_{\varepsilon_{R_{i_k}}}$ is known, then the surfaces in FIG. 58 are entirely defined by the transformation associated with the tensor description.

Several other tensor descriptions also find relevance and are presented subsequently.

(a) Basic Tensor Operator Application

The application for tensors in the VPA characterization is realized in the $R^3$ space by operators which are of rank 2. Consider the following:

$$[y] = \tilde{\mathfrak{J}}_{D_{\varepsilon_R}} [x]$$

The tensor $\tilde{\mathfrak{J}}_D$ maps the input vector x into an output vector y. The tensor $\tilde{\mathfrak{J}}_{D_{\varepsilon_R}}$ in this case can represent an operator which carries or imparts information concerning the transformation which is inflicted by the VPA action. This tensor is also therefore directly related to the error surface, $D_{\varepsilon_R}$.

In practice, mapping is actually non-linear while the above simplistic form is revealed as linear. However, non-linear forms are readily accommodated as follows:

$$[y] = (\tilde{\mathfrak{J}}_{D_{\varepsilon_{R_a}}} [x]) + (\tilde{\mathfrak{J}}_{D_{\varepsilon_{R_b}}} [x^2]) + \tilde{\mathfrak{J}}_{D_{\varepsilon_{R_c}}} [x^3] \ldots$$

The non-linear form is similar to a polynomial and is often used to describe non-linear elastic spaces and scalar fields. $x^n$ denotes an input vector whose elements are individually raised to the power n. The second rank tensors can be constructed from 9 element matrices which relate well to the 3-D error surfaces. Multi dimensional geometries may be accommodated in this manner simply by parameterizing the space or by forming tensors of higher rank.

For instance if power supply variation, gain variation, temperature, and VSWR are taken into account along with the 3-D amplitude and phase error surfaces, a rank 6 tensor would be required to describe all interactions of the mapping in a unified treatment. Such unification can lead to significant memory reduction, with a trade-off in real time hardware to execute the tensor operations. Thus, a trade-off is required to identify the optimal rank versus hardware and memory allocation.

The previous section indicates how the input/output map can be obtained via a tensor operator, even when the system is inherently non-linear. However, each tensor operator as represented previously, as related to powers of x, can experience transformation as well. This transformation can also be viewed as a tensor operation under certain conditions. That is, the unified tensor of say rank 6 (for $R^7$) can be broken into multiple operators of lower rank if so desired. This partitioning enhances the hardware trade-off and permits significant design degree of freedom. For instance the functional calibration parameters of temperature, battery voltage, gain, load condition, and frequency can be unified or mathematically decoupled. When they are decoupled they still may be related via some transformation such as a tensor operator, for example.

12. MISCELLANEOUS RELATED TOPICS (a) Information Content

As previously indicated in Section 6(c), the gradient of the error surface defined by $D_{\varepsilon_R}$ conveys information content. Higher order gradients are possible and also convey information. Consider the 2-D spatial kernel in the complex plane:

$$D_{\varepsilon_{R2}} = f(I(t)) + jg(Q(t)).$$

In some cases, the equation can be simplified to describe I(t) as a function of Q(t), in the complex plane. In most cases, suitable domains can be defined for which continuity is adequate and derivatives exist. If it is assumed that a finite number of unique and significant derivatives exist for $D_{\varepsilon_{R2}}$, then the information content of the function is bounded. Even for the case of exponential functions a suitable truncation of terms in the series provides a practical bound on valuable (significant) information content. A pathological case may seem to exist for periodic functions. However, the claim above demands significant and unique derivatives. Hence, simple sin and cos functions do not present a particularly difficult problem when the significance of higher order derivatives is weighed. Thus, $$\frac{\partial^\nu D_{\varepsilon_R}}{\partial I^\nu} = \frac{\partial^\nu f(I)}{\partial (t)^\nu}$$

$$\frac{\partial^\zeta D_{\varepsilon_R}}{\partial Q^\zeta} = \frac{\partial^\zeta g(Q)}{\partial Q^\zeta}$$

give an indication of the information stored in the surface. For instance, suppose over some domain, there exists a function that can be described as follows:

$$D_{\varepsilon_R} = f\{I,Q\} = a_3 I^3 + a_2 I^2 + a_1 I + K_1 + b_2 Q^2 + b_1 Q + K_Q + c_{22} I^2 Q^2 + c_{21} I^2 Q + c_{12} I Q^2 + c_{11} I Q + d_{31} I^3 Q \ldots$$

This example polynomial representation provides up to 3 derivatives in I and up to 2 derivatives in Q (as written). At each derivative stage, a certain number of coefficients of the polynomial survive. Even without complete knowledge of the function above, one could obtain some idea of the information content within the 2-D plane by performing successive gradient operations and weighting the area of the plane with surviving derivative magnitudes, and/or the area under the surviving gradient surfaces over specific domains. This provides an immediate methodology of emphasizing certain regions which may possess more information via weighting functions, if so desired.

The raw information content of the error surface or manifold is directly related to the form and content of the functional description. In the case of algebraic polynomials, information is stored in the coefficients as well as the description of the polynomial domain. Orthogonal polynomial expansions also possess coefficients and domain descriptions. Therefore, the information storage requirements of such descriptions are directly related to the number of bits required for each coefficient multiplied by the number of coefficients. It follows that minimizing the information of $D_{\epsilon_R}$ is related to minimizing the number of significant coefficients and therefore the number of significant derivatives of the manifold description, as well as the required coefficient resolution.

It can be advantageous to project the error function or translate the error function to dimensions or coordinate systems for which these derivatives are naturally minimal.

In the case of VPA compensation, the 2-D fundamental spatial kernel can be expanded to a surface in a 3-D fundamental kernel description with a magnitude surface and phase surface. The magnitude surface in particular takes on the features of a cone over significant portions of operational dynamic range. The side profile of the cone possesses a nearly linear slant description over most of its domain. Section 13 indicates that this feature is advantageous to exploit in the 3-D view. This correlates well with the minimized derivative or gradient over reasonable portions of the domain as opposed to some other view such as complex 2-D, etc.

Figure 59:
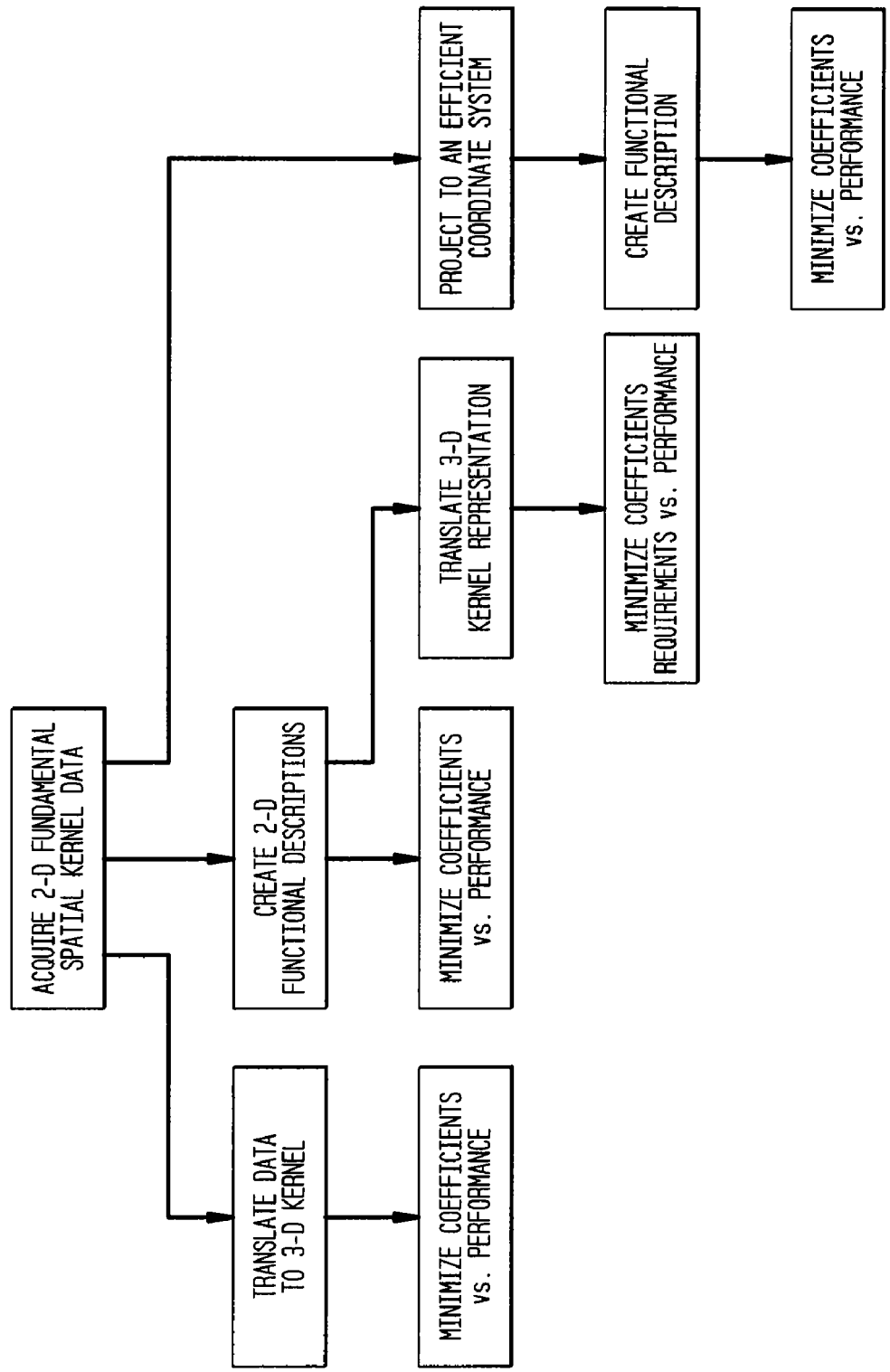
FIG. 59 illustrates a process flowchart for information minimization.
Figure 60:
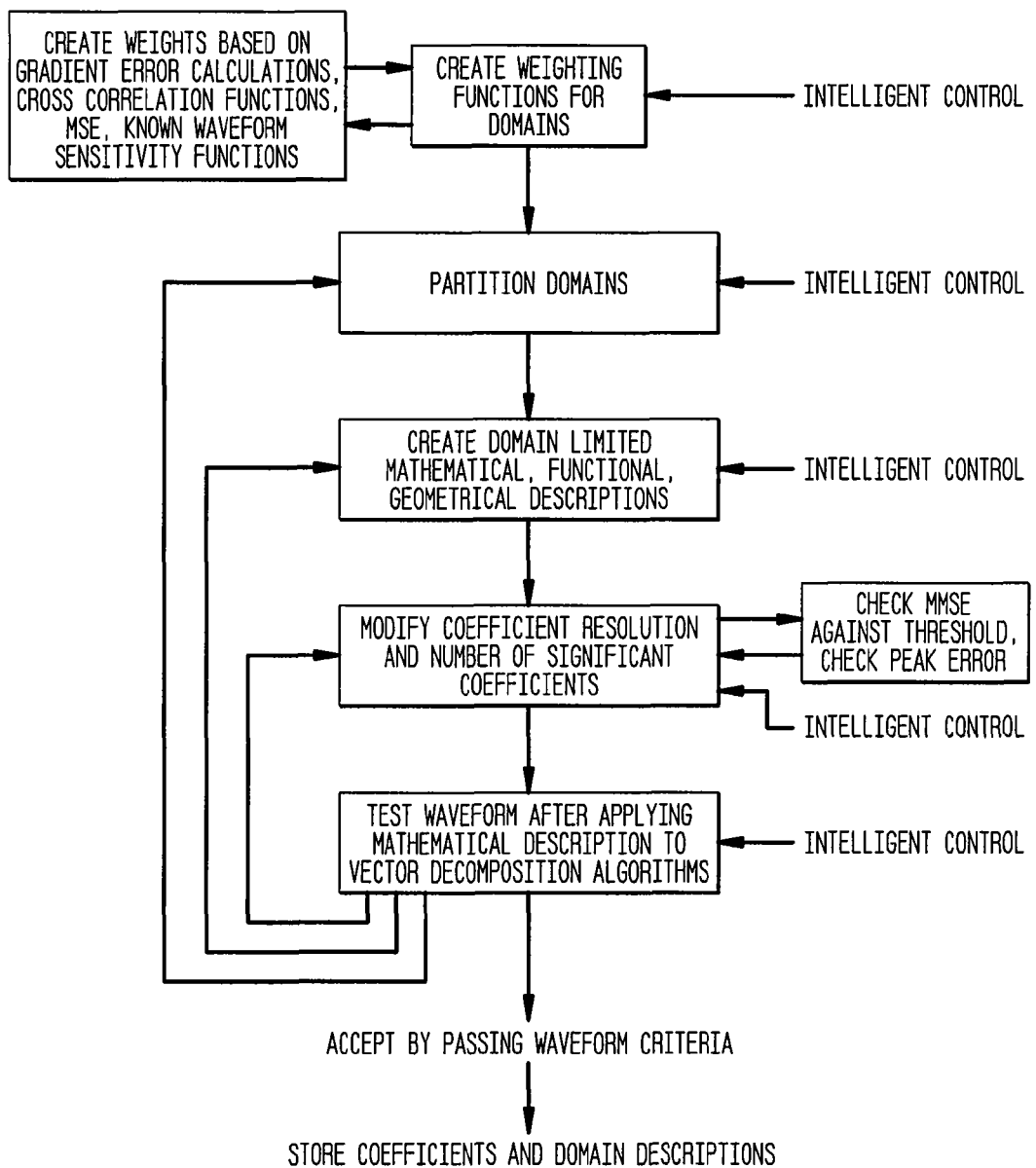
FIG. 60 illustrates a process flowchart for information minimization.

FIG. 59 illustrates a process flowchart of a methodology for approaching the information minimization requirement. The actual minimization phase of the procedure can be further expanded as illustrated in FIG. 60. Note that the minimization procedure is fairly complex and affected by the branch from which it is spawned (see FIG. 60). Choosing the right branch would typically be a matter of experience based on laboratory empirical evidence combined with some applied math. The minimization procedure does require significant intelligent control. This control can be computer driven or interactive with a human interface. In an embodiment, the human interface would be desirable until all scenarios, waveforms, degrees of freedom, etc., have been characterized. Once 'learning' was complete, suitable test thresholds could be established for each procedural step.

Since there are multiple degrees of freedom for the mathematical, functional geometric, descriptions, it is assumed that a particular methodology has been selected, i.e.:
Algebraic Polynomials;
Chebyshev and Orthogonal Expansions;
Least Squares;
Splines;
Tensors;
Beziér Curves;
Hermitian Polynomials; or
Hybrid Techniques.

Within the context of a particular genre or approach, the procedure would be applied iteratively, tweaking the domain descriptions, specifying the mathematical description, and modifying coefficients, subject to intermediate testing by MMSE criteria and ultimately final verification against waveform criteria.

Figure 61:
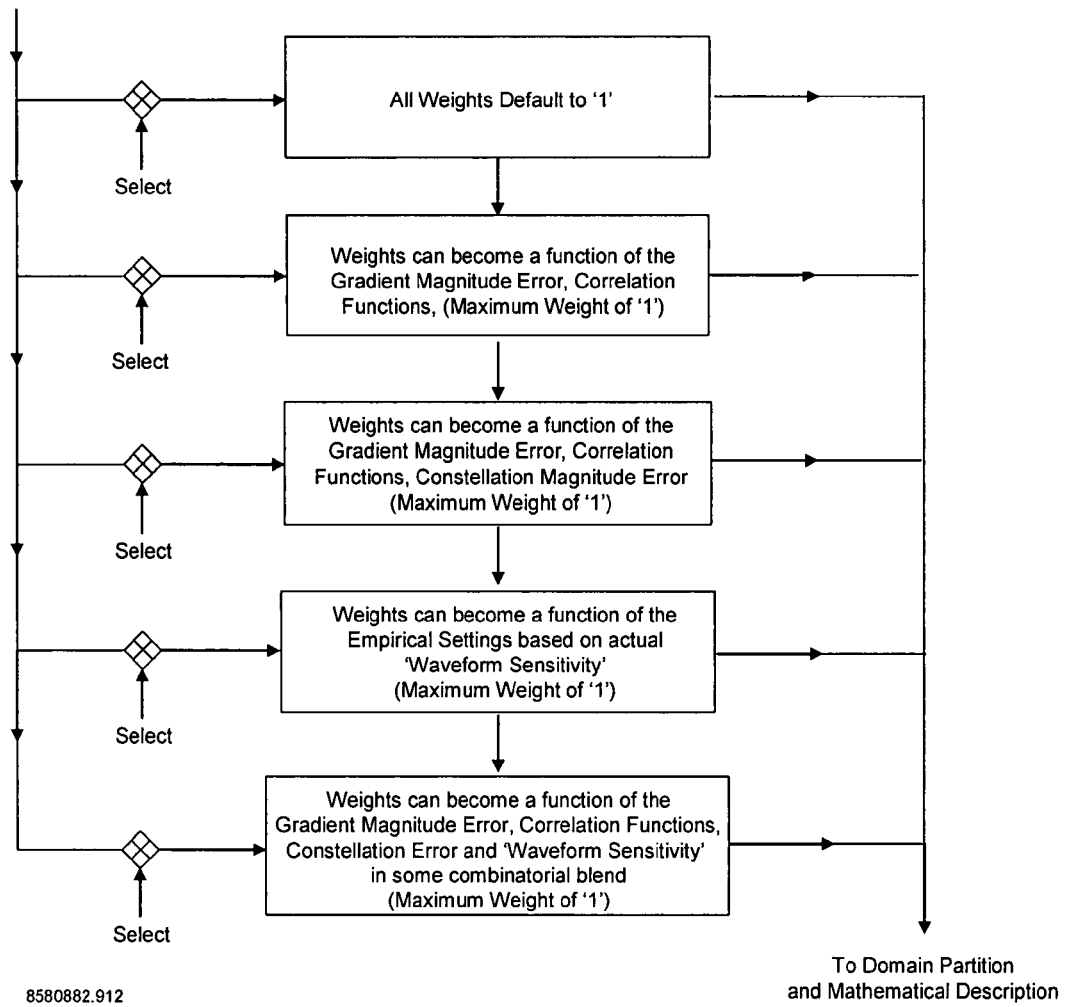
FIG. 61 illustrates an example multi-option gradient based weighting algorithm.

It is anticipated that gradient algorithms combined with mean square error considerations as well as actual waveform sensitivity functions will drive the domain weighting function procedure in the first step. The algorithm is qualitatively described as illustrated in FIG. 61, as a multi-option gradient based weighting algorithm.

Each branch of the weighting algorithm could be exclusively selected. Each data domain or functional domain could be equally weighted to a constant or each data point or collection of points could be appropriately weighted according to certain criteria relating to the impact or value of the data and its accuracy on the overall performance of the final solution. Although this could have been subjected to iterative algorithmic cycles, fed back from the output tests, it has been assumed here that apriori knowledge was gleaned from bench testing and characterizations. This simplifies the subsequent algorithm significantly.

The most comprehensive algorithmic step is based on the principle that the information content of $D_{\epsilon_R}$ is related to the functional gradient and regional cross correlation functions, as well as the gradient positions relative to the constellation origin with final tweaks applied on a per waveform basis. The constellation requirement weighs the magnitude error of the gradient versus the magnitude squared position of the gradient value within the constellation. Typically, signals on the unit circle possess greater energy and therefore greater weighting than signals near the origin. However, trajectories of signals through the complex plane and their associated derivative properties are important and cannot be totally ignored. For this reason, the waveform sensitivity weights must be added in some cases.

Also, cross correlation functions such as those described in Section 6.7.1, 6.7.2, 6.7.3, 6.7.4, etc., should be included in the mix of techniques since considerable redundancy of information exists in the $D_{\epsilon_R}$ descriptions for practical applications. Section 13 provides some examples where the cross correlation function properties are significantly exploited, thereby drastically reducing the requirements for stored data to describe certain 2-D and 3-D fundamental kernels.

13. EXAMPLES FOR CONSTRUCTION OF $D_{\epsilon_R}$

This section provides some examples of forming and processing error functions which have been reduced in some fashion by a combination of the principles presented in this disclosure. In some cases, 2D processing is favored, and in other cases 3D processing is presented. In all cases, there is an emphasis in the reduction of memory required for characterizing and processing the error $D_{\epsilon_R}$. Sections 14.7 and 14.8 provide some detailed examples for calculating the memory required (using algorithms) in the cases of WCDMA1_1 and EDGE waveforms. Section 14.9 provides a comprehensive summary. The examples illustrate the promise of the technology but do not represent the full potential.

(a) 2D Example Using Starburst

In this example, a starburst technique was employed to stimulate the VPA and measure as well as characterize the associated non-linearities. The correction files generated were used to produce compliant WCDMA waveforms covering more than 40 dB of dynamic range starting at the maximum power output. The input baseline starburst normally consists of 48 radial arms composed of uniformly distributed (in time) 128 outward bound and 128 inward bound samples per radial. This results in an input sample record size of 12228 complex points. Using principles outlined in Sections 6 and 7, the input sample record or output sample record was cut in half, because of minimal VA memory affects. In addition, output sample record lengths were reduced by correlation consideration, averaging/smoothing, and/or polynomial fitting.

Figure 62:
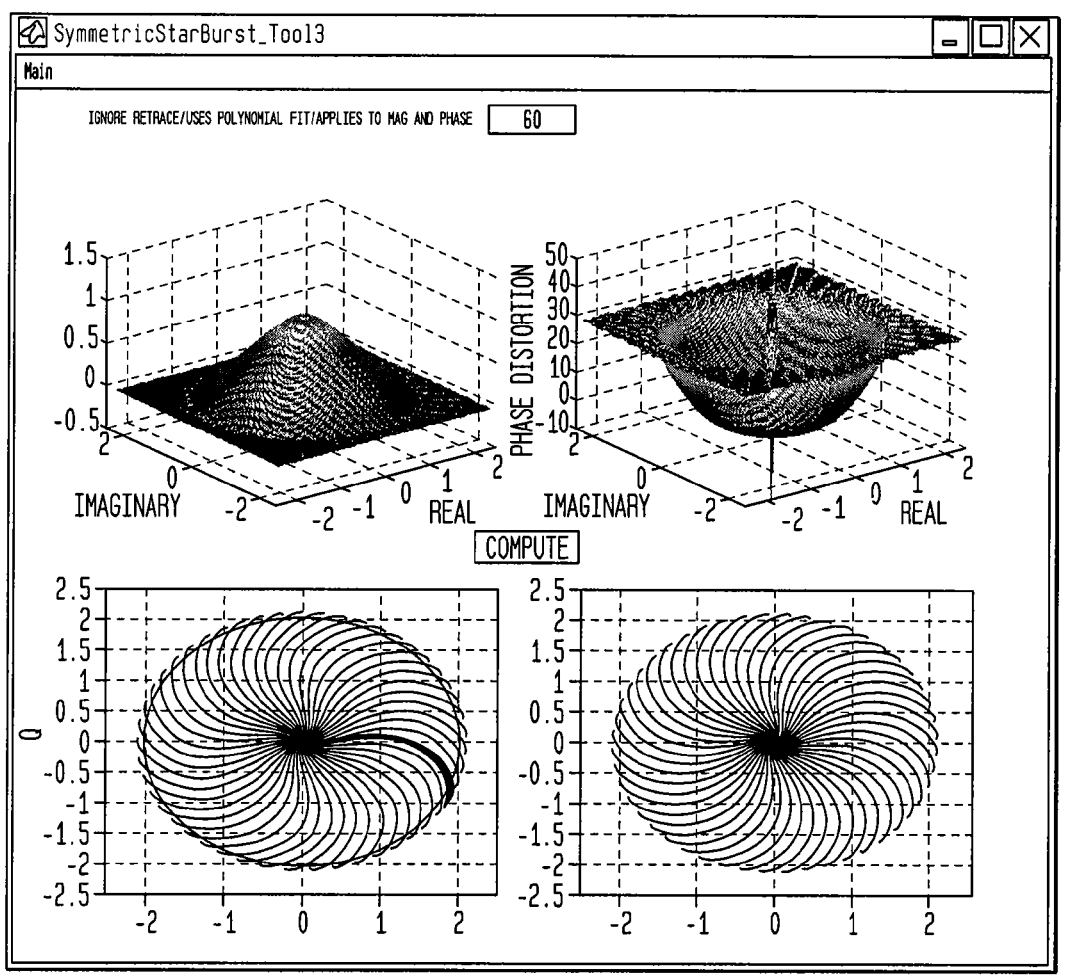
FIGS. 62-63 illustrate example output radial excitation responses in the 2D complex plane.
Figure 63:
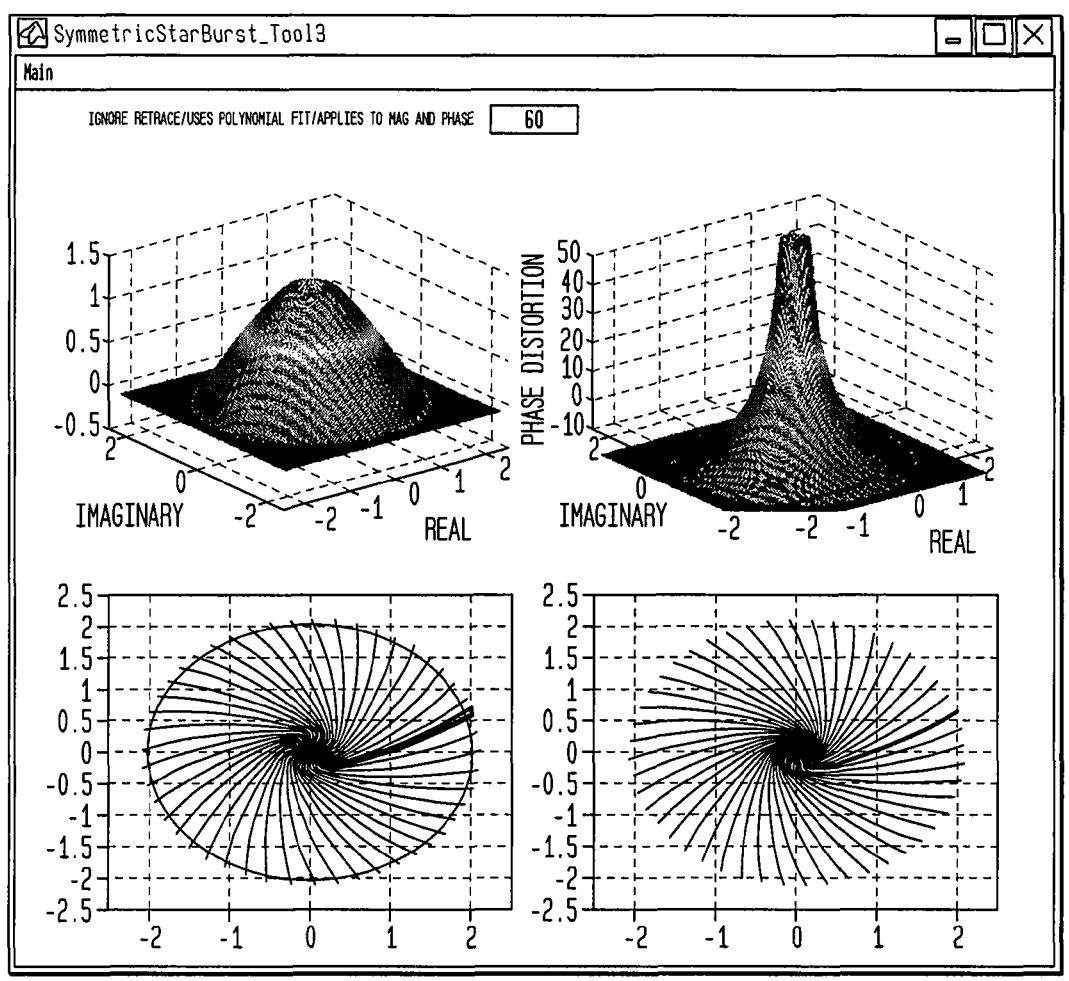

FIGS. 62 and 63 illustrate output radial excitation responses in the 2D complex plane, for full power and 22 dB attenuation conditions, respectively. Note that the ensemble of traces near φ=0° on the average are illustrated along with the 48 response radials (bottom left hand corner plot). These collapsed traces represent each original response radial collapsed to a zero offset angle. The collapsing process is accomplished by de-rotating the radial in such a manner to account for an averaged radial angle. Each radial possesses such an angle which is an average defined by:

$$\phi_{k_{av}} = \frac{1}{n} \sum_{i=1}^{n} \phi_i$$

where
k ≙ k$^{th}$ radial
i ≙ Sample number along the radial (n max=128 in nominal case)

Figure 64:
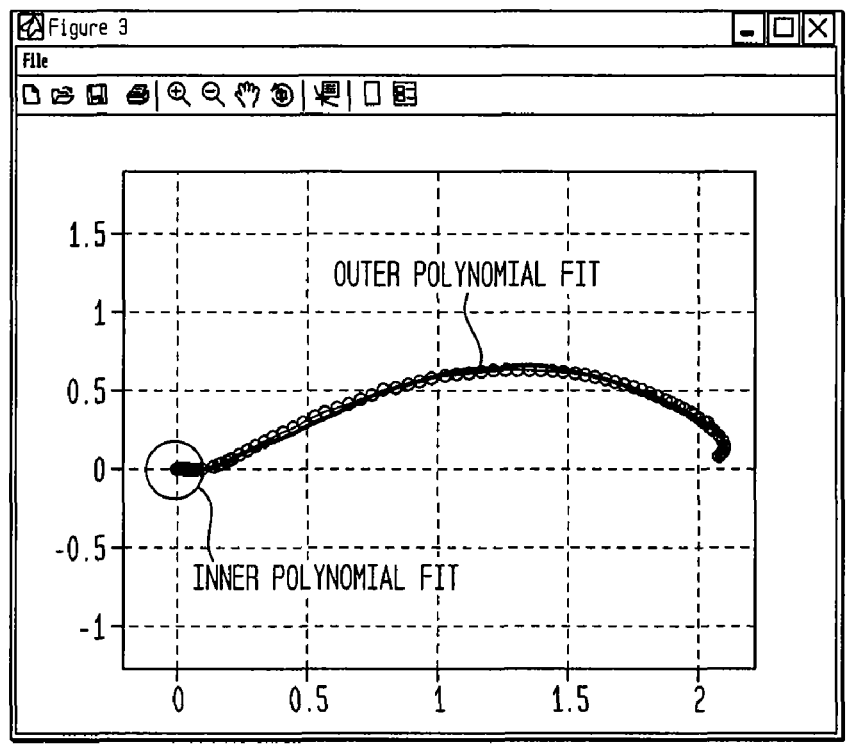
FIGS. 64-65 illustrate examples of a single averaged radial.
Figure 65:
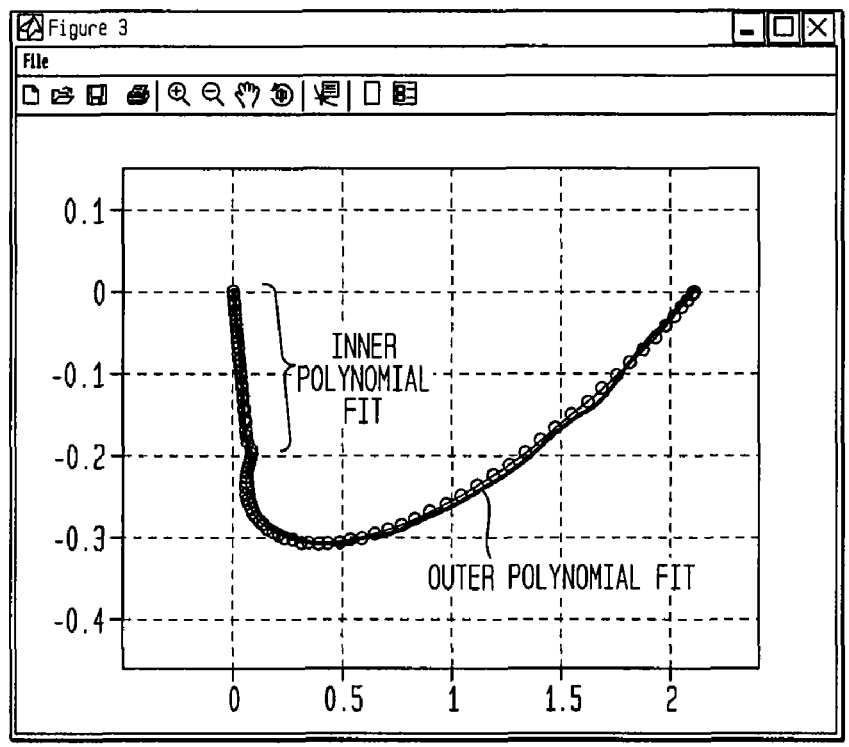

The angle $\phi_{k_{av}}$ is subtracted as the bias for each radial. This creates an ensemble of radials near the real axis on the average. The radials are then averaged to produce an averaged radial. FIGS. 64 and 65 illustrate a single averaged radial as interpolated or actually fitted in a least squares sense to an inner and outer polynomial, for full calibration and 22 dB attenuation calibration, respectively. As illustrated in FIGS. 64 and 65, two separate polynomials are utilized to break up the radial dynamic range. The inner polynomial is intended to estimate the VPA behavior at and below threshold, while the outer polynomial estimates the behavior at and above threshold. The threshold is a programmable parameter of the fitting algorithm, as well as the outer polynomial order. The inner polynomial order is restricted to be a straight line. Once the new radial formed by joining the inner and outer polynomials is generated, it is redeployed to the 48 excitation angles to render a symmetric radial complex response. (See bottom right hand plot in FIG. 62, for example). Once this 2D contour is realized, a 3D surface error for magnitude and phase can be generated. (See top left and top right plots in FIG. 62, for example)

Based on this technique, generally:
  A 70 dB plus dynamic range is accommodated by this technique, although only 40 dB of dynamic range is required.
  7 complex numbers are stored per power level. If 40 power levels are required then only 560 words must be stored (maximum).
  The approach presented also assumes that null cal coefficients can be employed for the bottom 40 dB of dynamic range. This requires no additional memory for the bottom 40 dB in the WCDMA application.

Accuracy and coefficient resolution for the polynomials improves the performance of this approach. There are several techniques for reducing the sensitivities to coefficient accuracies, including:
  Smooth derivative boundary conditions between inner and outer polynomial join.
  Higher order inner polynomials.
  Using 3 or more polynomials.
  Use spline reconstruction techniques.
  Use quadrant or sub quadrant characterization and averaging rather than modulo 360°.

(b) 3D D$\epsilon_R$ Example

In this example, polynomial fitting is applied after the error surfaces are rendered. Again, the radial sample theme is exploited with projections of these sample paths deployed along the reconstructed error surfaces. The projected radials are then averaged or smoothed after collapsing and an inner as well as outer polynomial applied to fit the smoothed result. Once the polynomial is obtained it is redeployed to form a perfectly symmetrical surface and test waveforms are run to ascertain the effectiveness of the technique.

Figure 66:
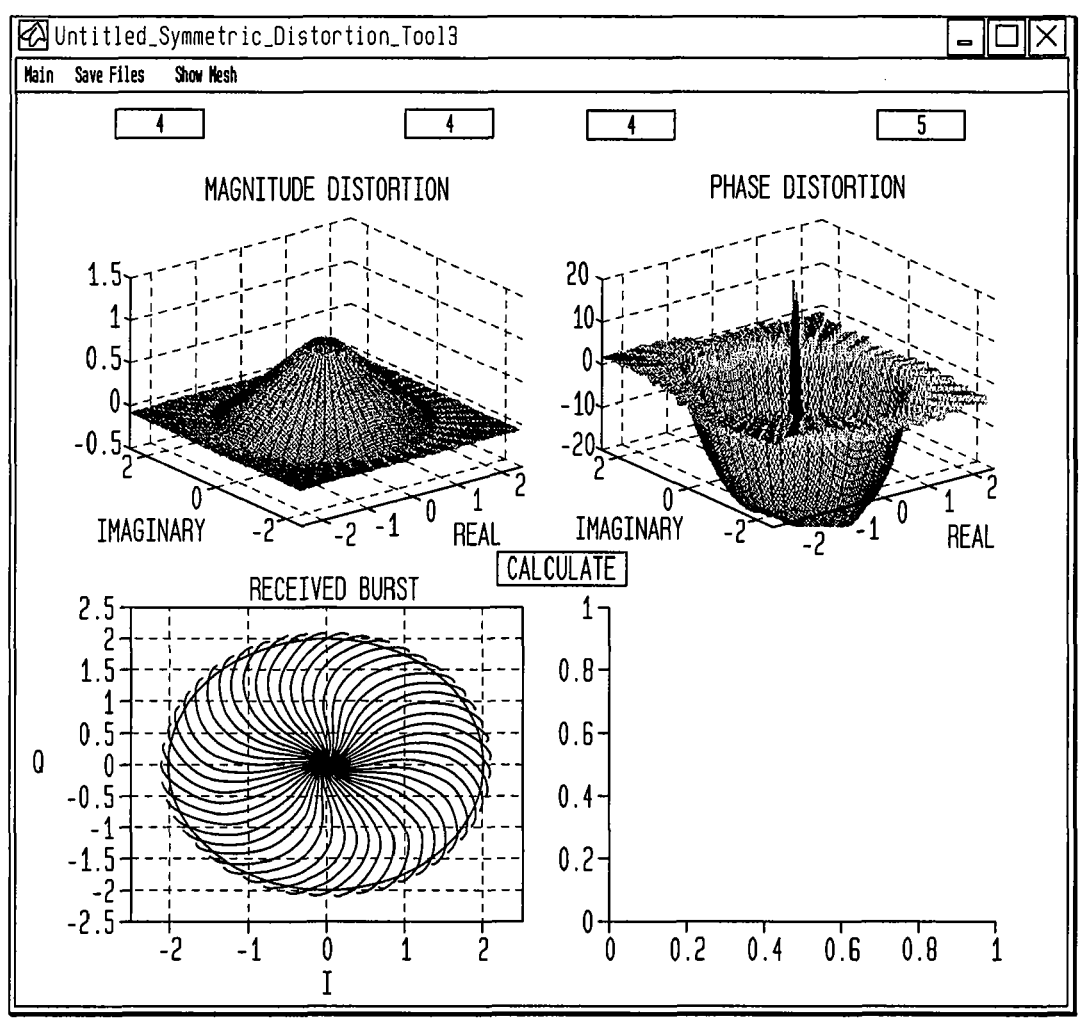
FIG. 66 illustrates a conic magnitude error surface and bucket phase error surface for a full power output VPA condition.

FIG. 66 illustrates a conic magnitude error surface and bucket phase error surface for a full power output VPA condition. Note the projected lines along the contour of the surfaces. These projected lines are images derived from the 2D complex plane radial spokes. These projected surface lines are collapsed and averaged then polynomial fitted to obtain a new surface defined by re-expanding the polynomial to each original φ prior to collapsing. The polynomial is obtained via a least squares fit to the collapsed projections at an averaged φ=0.

Figure 67:
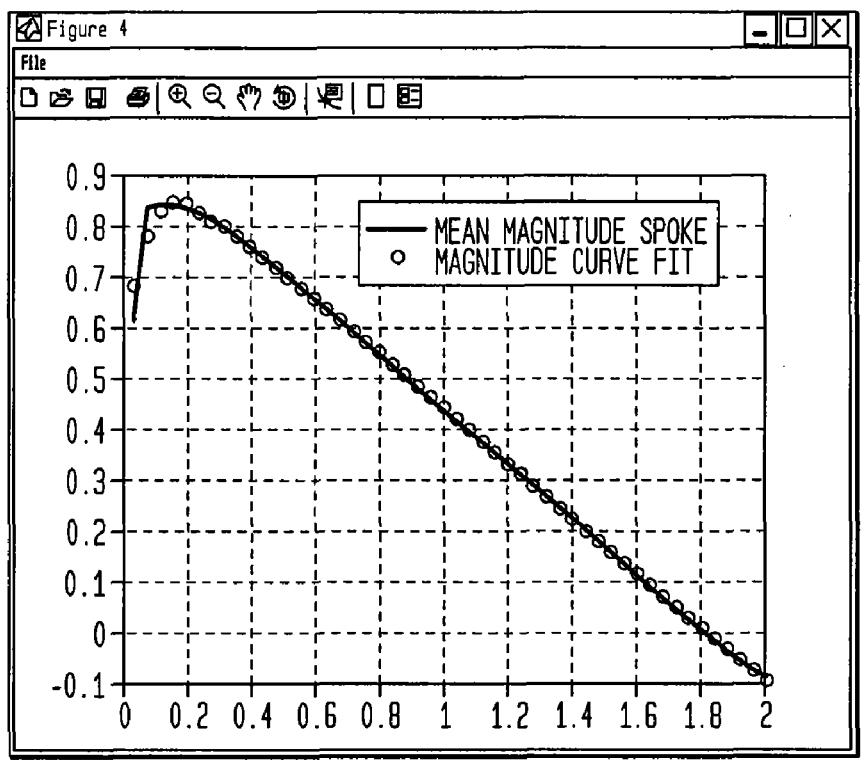
FIGS. 67-68 illustrate example magnitude and phase curve fits for an averaged collapsed surface radial using a polynomial fitting technique.
Figure 68:
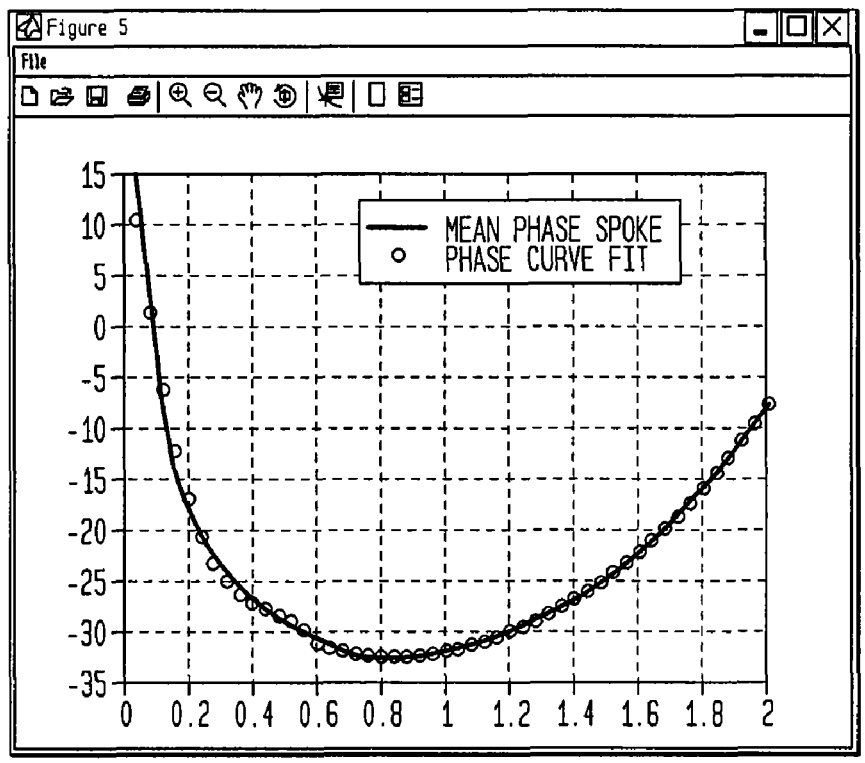

FIGS. 67 and 68 illustrate the curve fit for an averaged collapsed surface radial, which is rendered in 2-D for the curve fitting process. FIG. 67 illustrates a magnitude curve fit. FIG. 68 illustrates a phase curve fit. The solid lines indicate the averaged radial projections, also called spokes. The dots illustrate the curve fit results from the polynomial approximation. The polynomial approximation possesses an inner and outer polynomial fit as described before, but the inner fit can take on higher order, than that of the example in Section (a).

Figure 69:
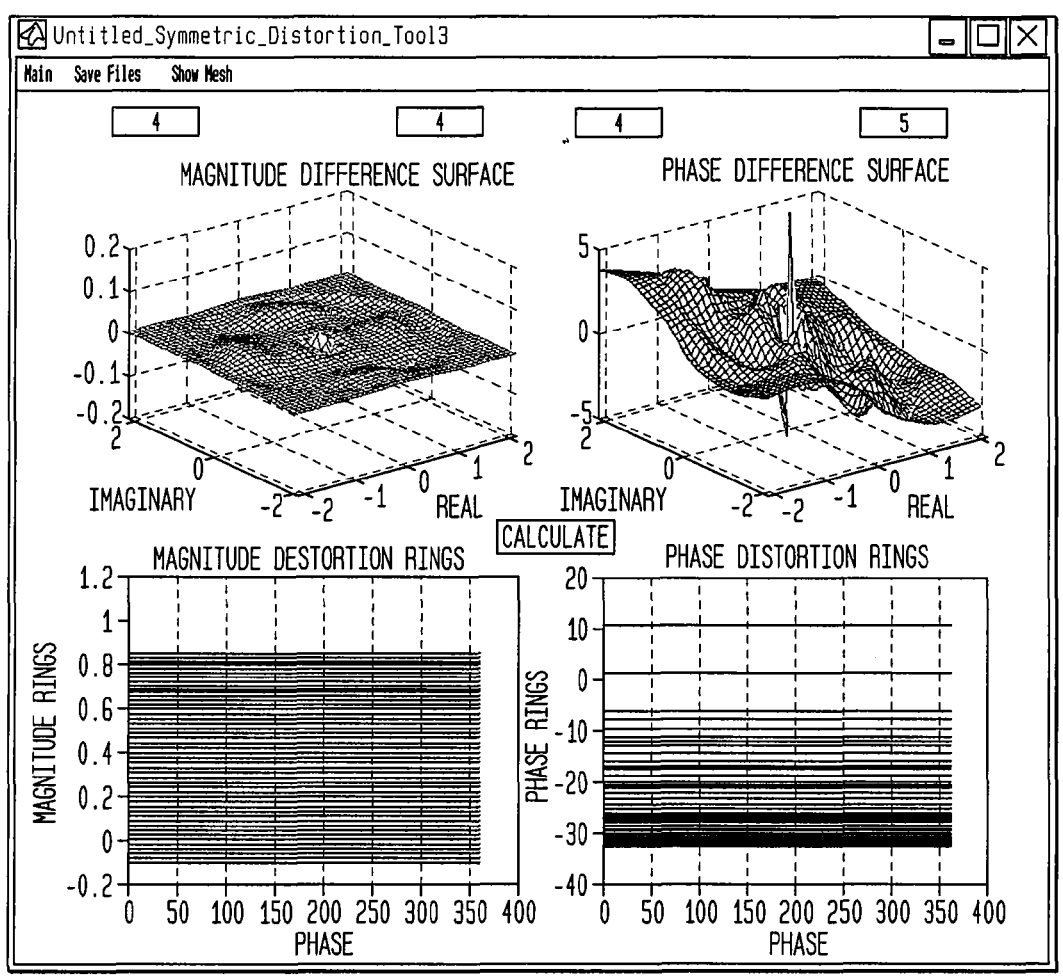
FIG. 69 illustrates an example of resulting approximate error after correction using the polynomial fitting technique.

The resulting approximate error which remains after correction is illustrated in FIG. 69.

Figure 70:
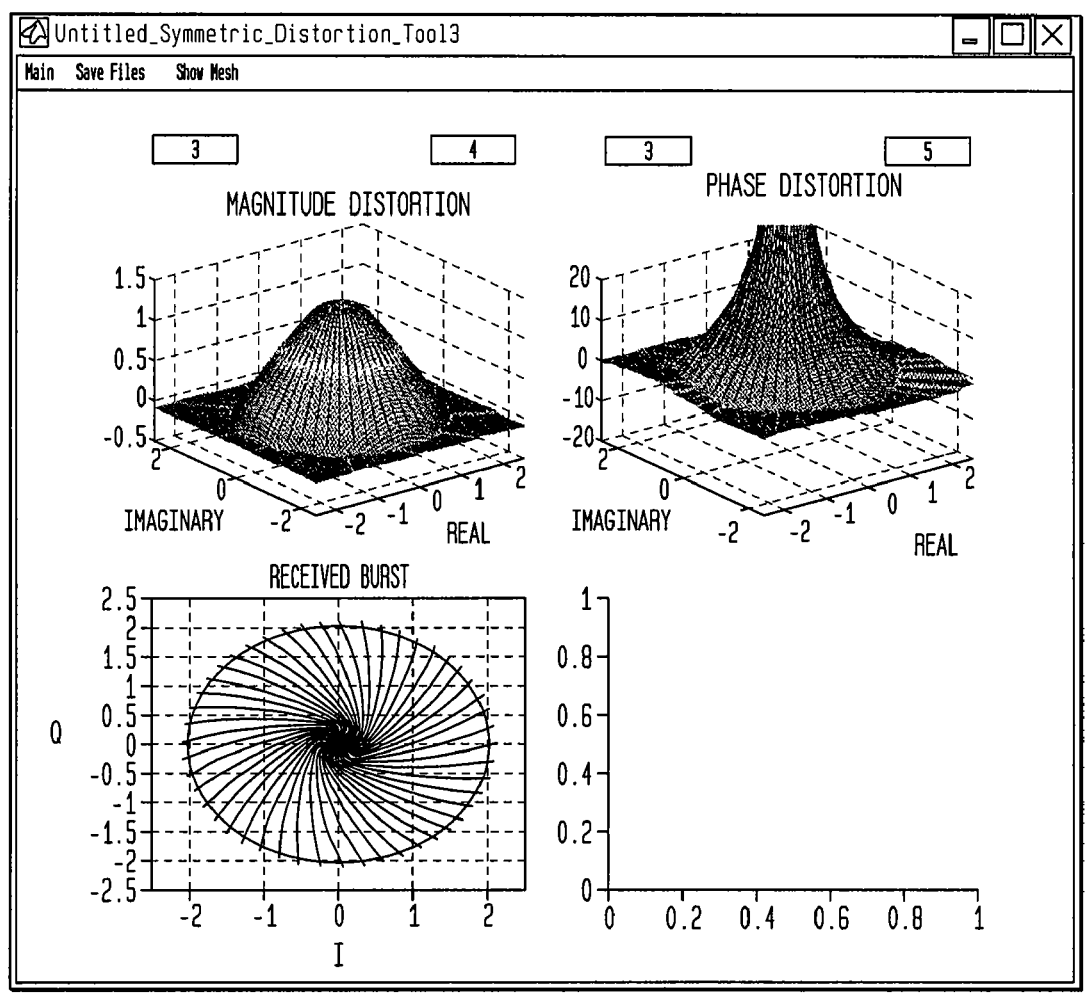
FIG. 70 illustrates example magnitude and phase error surfaces.
Figure 71:
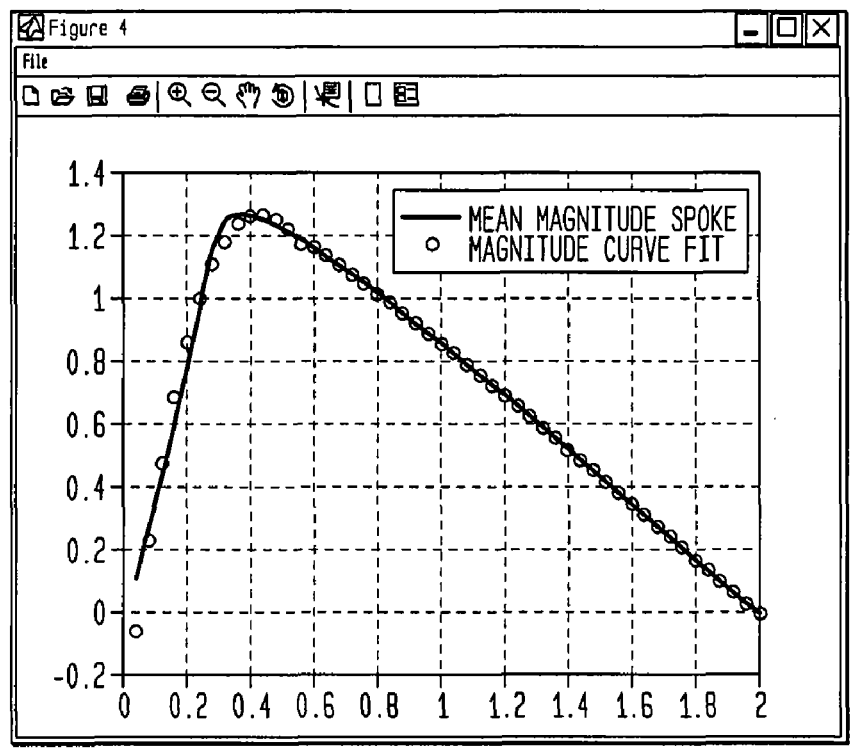
FIG. 71 illustrates an example magnitude curve fit using the polynomial fitting technique.
Figure 72:
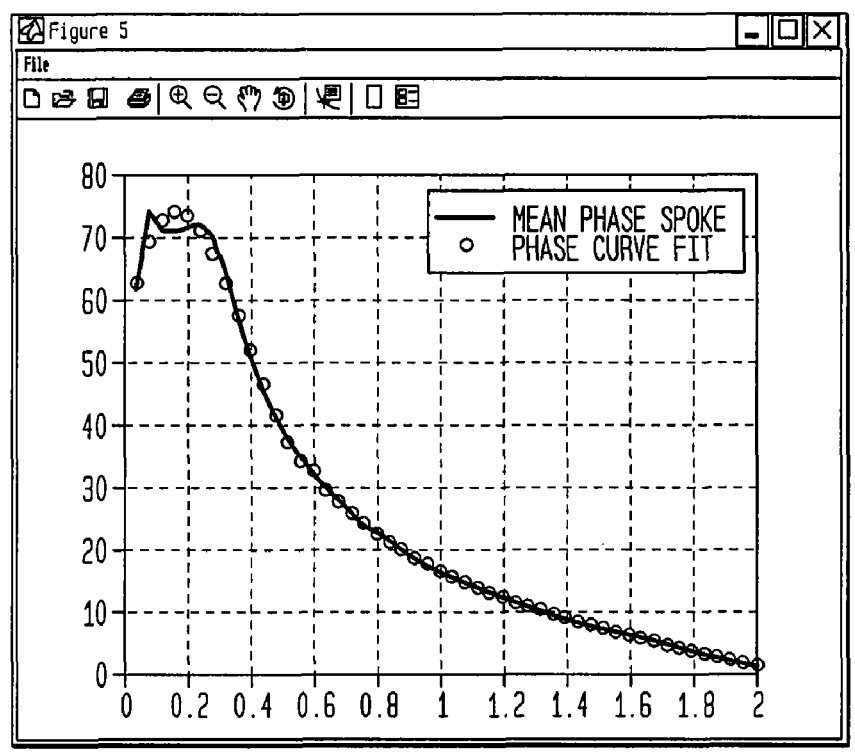
FIG. 72 illustrates an example phase curve fit using the polynomial fitting technique.
Figure 73:
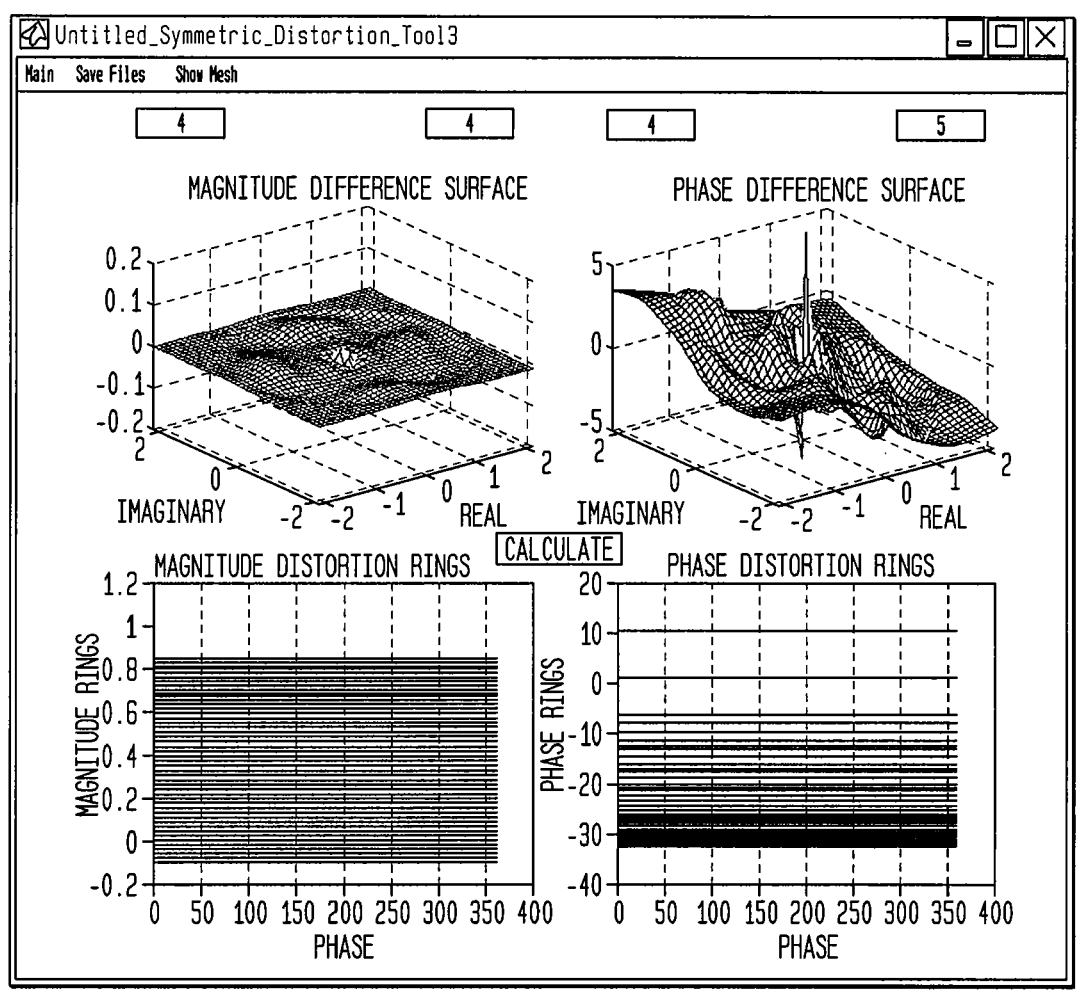
FIG. 73 illustrates an example of resulting approximate error after correction using the polynomial fitting technique.

An additional example test case for a 22 dB attenuation is provided in FIGS. 70, 71, 72, and 73. FIG. 70 illustrates magnitude and phase error surfaces. FIG. 71 illustrates a magnitude curve fit. FIG. 72 illustrates a phase curve fit. FIG. 73 illustrates the resulting approximate error after correction.

Note that an important distinction exists between this approach and that of Section 13(a). In Section 13(a), the example requires a single curve fit in 2D within the complex plane. Then, the 2D polynomial is expanded to create the 3D error surface for magnitude and phase.

In this example, |D$_{\epsilon_R}$| and ∠D$_{\epsilon_R}$ are created first and then the surface approximations are separately rendered, requiring at least 2 separate poly fit exercises (four total if inner and outer polynomials are considered separately).

The rough upper bound for coefficient memory over the 40 dB of dynamic range of interest is approximately 720 words for magnitude and phase combined, at <30 bits/word.

(c) Improvements in 3-D Polynomial Fit

The technique described in Section 13(b) can be extended to include up to 5 joined polynomials, each with programmable order. In addition, a practical constraint was added to the quantization of the polynomial coefficients. 16 bits can be partitioned to the left and right of the decimal.

The following sequence of figures (FIGS. 74-80) and Tables 1-3 below provide examples of 3 power levels, compensated by this technique. In each case compliance was obtained by as few as 12 or 14 bits quantization. Tables of floating point (high resolution) coefficients as well as fixed point (quantized coefficients) are provided for comparison in Table 1-3. The number of coefficients for each polynomial exceeds the polynomial order by 1.

The 3-D parameterized curves for magnitude and phase error are fit separately. The thresholds or joins of the piecewise polynomials are defined to restrict each polynomials domain.

The 3 documented examples illustrate significant improvement in robust behavior and reduced sensitivity to coefficient quantization by increasing the number of polynomials and decreasing their orders.

An upper band of coefficient memory to accommodate magnitude and phase over a 40 dB dynamic range is approximately 960 14-bit words.

Figure 74:
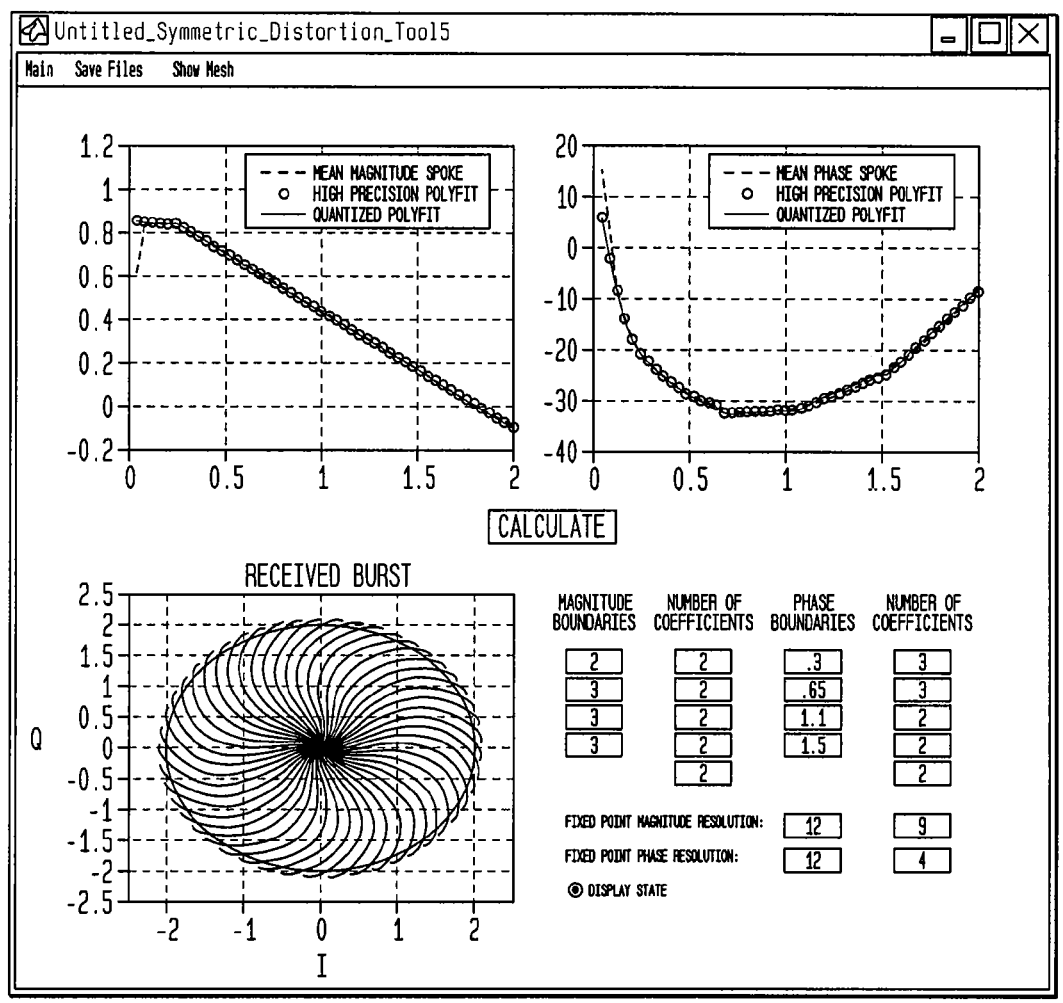
FIGS. 74-79 illustrate example error compensation results using an extended polynomial fitting technique.
Figure 75:
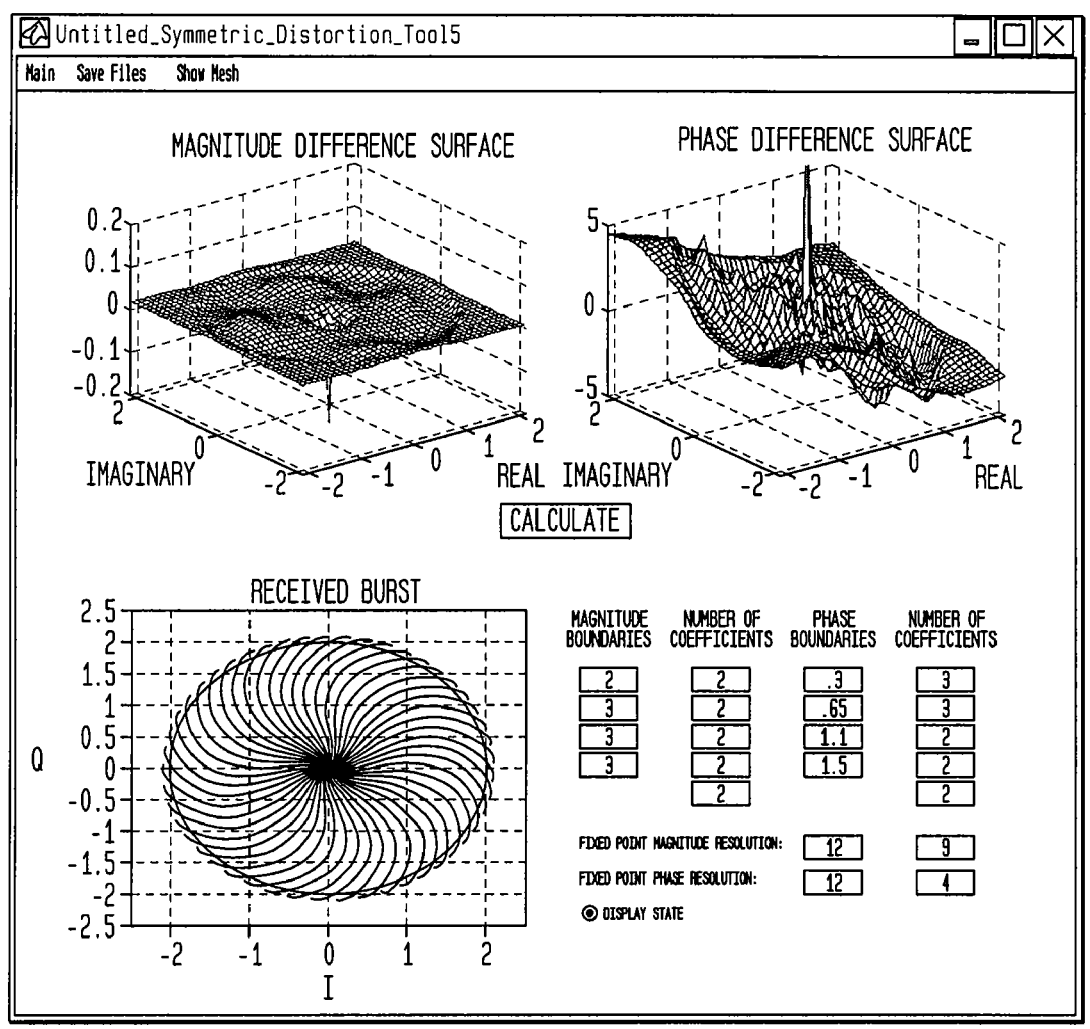

FIGS. 74 and 75 and Table 1 below illustrate example results for a 0 db attenuation example.

TABLE 1

| Magnitude Boundaries: | 0.20000 | 3.00000 | 3.00000 | 3.00000 |
|---|---|---|---|---|
| Phase Boundaries: | 0.30000 | 0.65000 | 1.10000 | 1.50000 |
| Number of Magnitude Coefficients: | 2 | 2 | 2 | 2 | 2 |
| Number of Phase Coefficients: | 3 | 3 | 2 | 2 | 2 |

| Resolution for the Magnitude Coefficients = | [12 9] |
|---|---|
| Resolution for the Phase Coefficients = | [12 4] |

| High Resolution Magnitude Coefficients |||||
|---|---|---|---|---|
| 0.85540354 | −0.00338067 | 0.00000000 | 0.00000000 | 0.00000000 |
| 0.97280137 | −0.02137875 | 0.00000000 | 0.00000000 | 0.00000000 |
| 0.00000000 | 0.00000000 | 0.00000000 | 0.00000000 | 0.00000000 |
| 0.00000000 | 0.00000000 | 0.00000000 | 0.00000000 | 0.00000000 |
| 0.00000000 | 0.00000000 | 0.00000000 | 0.00000000 | 0.00000000 |
| Quantized Magnitude Coefficients |||||
| 0.85546875 | −0.00390625 | 0.00000000 | 0.00000000 | 0.00000000 |
| 0.97265625 | −0.02148438 | 0.00000000 | 0.00000000 | 0.00000000 |
| 0.00000000 | 0.00000000 | 0.00000000 | 0.00000000 | 0.00000000 |
| 0.00000000 | 0.00000000 | 0.00000000 | 0.00000000 | 0.00000000 |
| 0.00000000 | 0.00000000 | 0.00000000 | 0.00000000 | 0.00000000 |
| High Resolution Phase Coefficients |||||
| 14.96697647 | −9.79068913 | 0.63612456 | 0.00000000 | 0.00000000 |
| −9.20465211 | −2.35328758 | 0.06139486 | 0.00000000 | 0.00000000 |
| −33.66942017 | 0.07013977 | 0.00000000 | 0.00000000 | 0.00000000 |
| −48.16052162 | 0.61092995 | 0.00000000 | 0.00000000 | 0.00000000 |
| −77.16833330 | 1.37159559 | 0.00000000 | 0.00000000 | 0.00000000 |
| Quantized Phase Coefficients |||||
| 14.93750000 | −9.81250000 | 0.62500000 | 0.00000000 | 0.00000000 |
| −9.18750000 | −2.37500000 | 0.06250000 | 0.00000000 | 0.00000000 |
| −33.68750000 | 0.06250000 | 0.00000000 | 0.00000000 | 0.00000000 |
| −48.18750000 | 0.62500000 | 0.00000000 | 0.00000000 | 0.00000000 |
| −77.18750000 | 1.37500000 | 0.00000000 | 0.00000000 | 0.00000000 |

Figure 76:
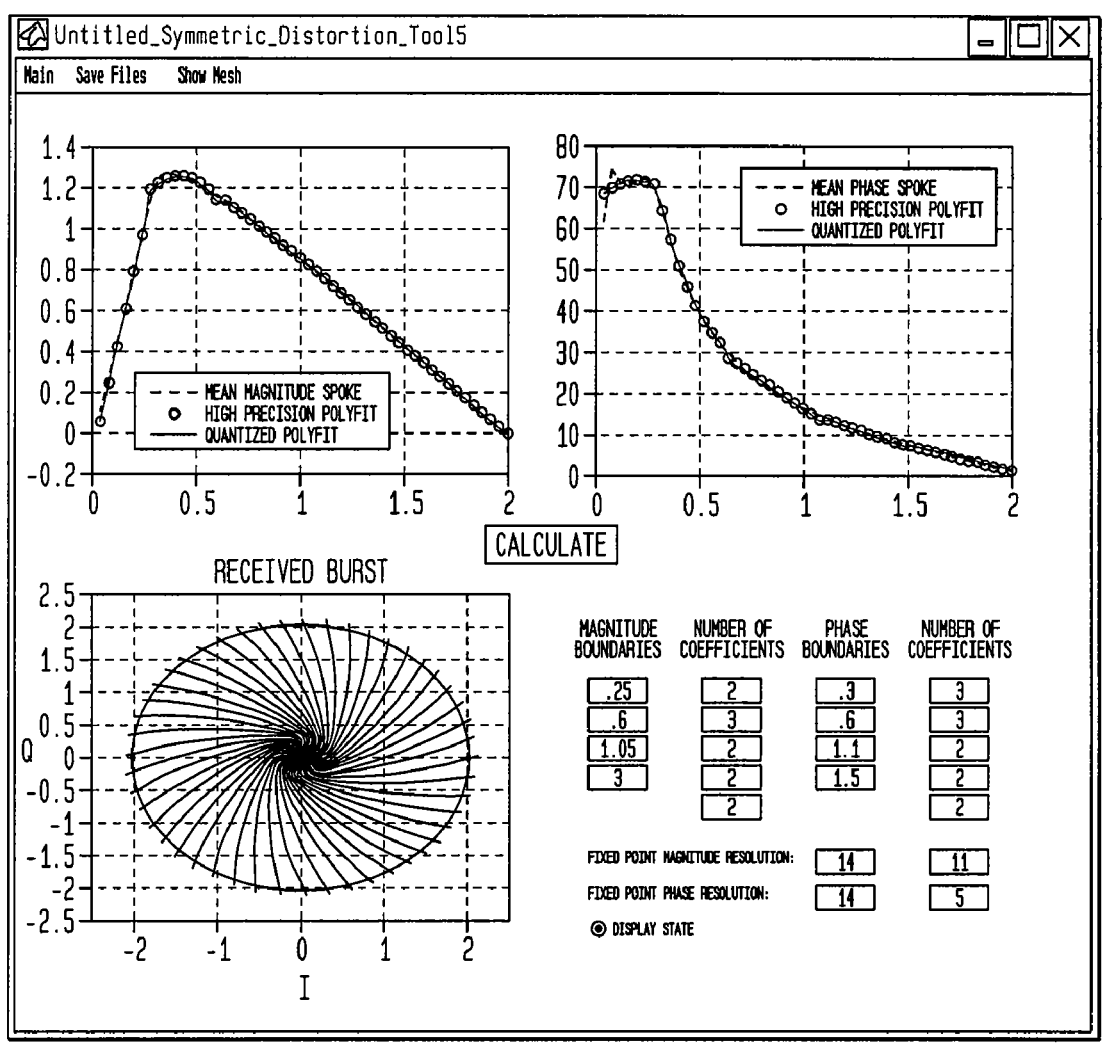
Figure 77:
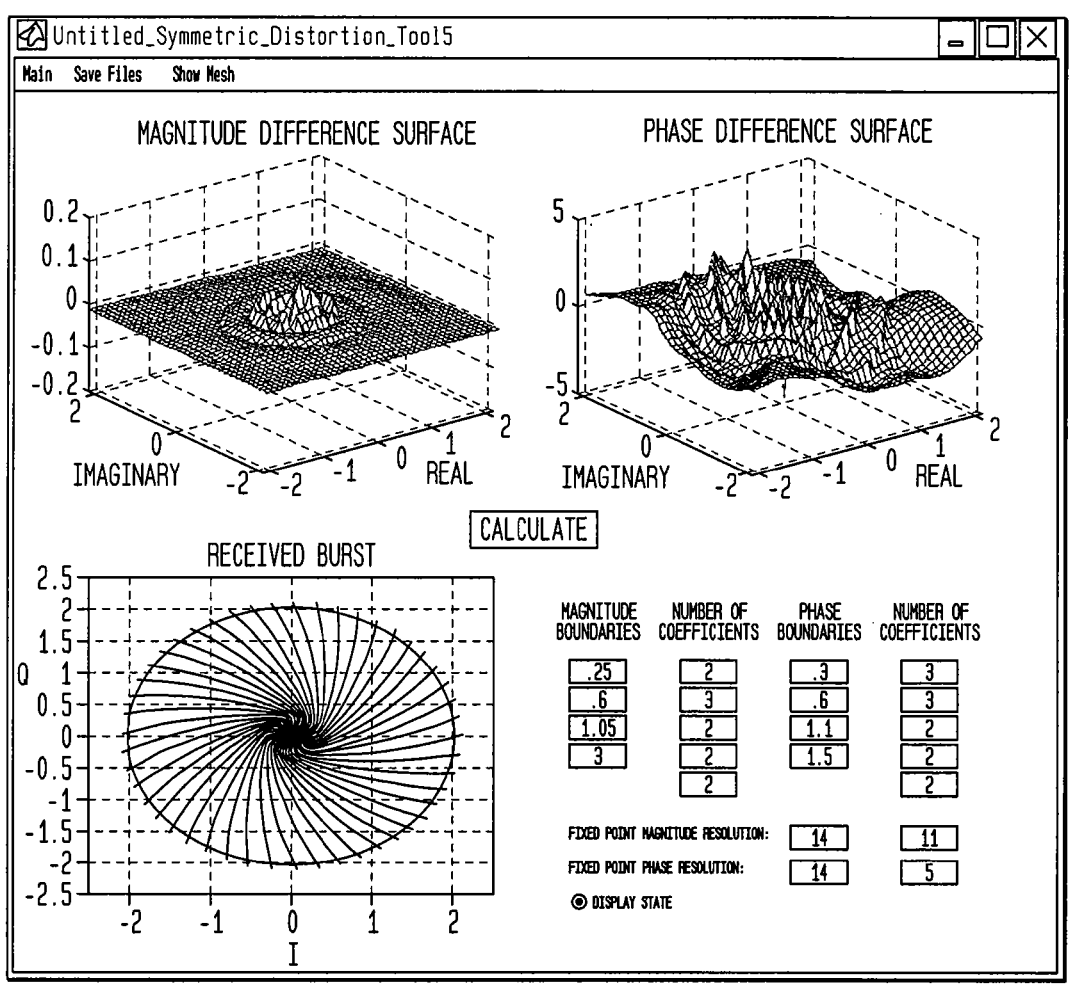

FIGS. 76, 77, and Table 2 below illustrate example results for a 22 dB attenuation example.

TABLE 2

| Magnitude Boundaries: | 0.25000 | 0.60000 | 1.05000 | 3.00000 |
|---|---|---|---|---|
| Phase Boundaries: | 0.30000 | 0.60000 | 1.10000 | 1.50000 |
| Number of Magnitude Coefficients: | 2 | 3 | 2 | 2 | 2 |
| Number of Phase Coefficients: | 3 | 3 | 2 | 2 | 2 |

| Resolution for the Magnitude Coefficients = | [14 11] |
|---|---|
| Resolution for the Phase Coefficients = | [14 5] |

| High Resolution Magnitude Coefficients |||||
|---|---|---|---|---|
| −0.12295166 | 0.18226050 | 0.00000000 | 0.00000000 | 0.00000000 |
| 0.61223504 | 0.12268472 | −0.00582460 | 0.00000000 | 0.00000000 |
| 1.63301276 | −0.03114089 | 0.00000000 | 0.00000000 | 0.00000000 |
| 1.73008103 | −0.03477335 | 0.00000000 | 0.00000000 | 0.00000000 |
| 0.00000000 | 0.00000000 | 0.00000000 | 0.00000000 | 0.00000000 |
| Quantized Magnitude Coefficients |||||
| −0.12304688 | 0.18212891 | 0.00000000 | 0.00000000 | 0.00000000 |
| 0.61230469 | 0.12255859 | −0.00585938 | 0.00000000 | 0.00000000 |
| 1.63281250 | −0.03125000 | 0.00000000 | 0.00000000 | 0.00000000 |
| 1.72998047 | −0.03466797 | 0.00000000 | 0.00000000 | 0.00000000 |
| 0.00000000 | 0.00000000 | 0.00000000 | 0.00000000 | 0.00000000 |
| High Resolution Phase Coefficients |||||
| 66.26567906 | 2.15845366 | −0.22148454 | 0.00000000 | 0.00000000 |
| 148.97252757 | −13.85828510 | 0.40500947 | 0.00000000 | 0.00000000 |
| 50.20379811 | −1.36110692 | 0.00000000 | 0.00000000 | 0.00000000 |
| 32.56491983 | −0.68370462 | 0.00000000 | 0.00000000 | 0.00000000 |
| 26.38508668 | −0.50974078 | 0.00000000 | 0.00000000 | 0.00000000 |
| Quantized Phase Coefficients |||||
| 66.28125000 | 2.15625000 | −0.21875000 | 0.00000000 | 0.00000000 |
| 148.96875000 | −13.84375000 | 0.40625000 | 0.00000000 | 0.00000000 |
| 50.21875000 | −1.37500000 | 0.00000000 | 0.00000000 | 0.00000000 |
| 32.56250000 | −0.68750000 | 0.00000000 | 0.00000000 | 0.00000000 |
| 26.37500000 | −0.50000000 | 0.00000000 | 0.00000000 | 0.00000000 |

Figure 78:
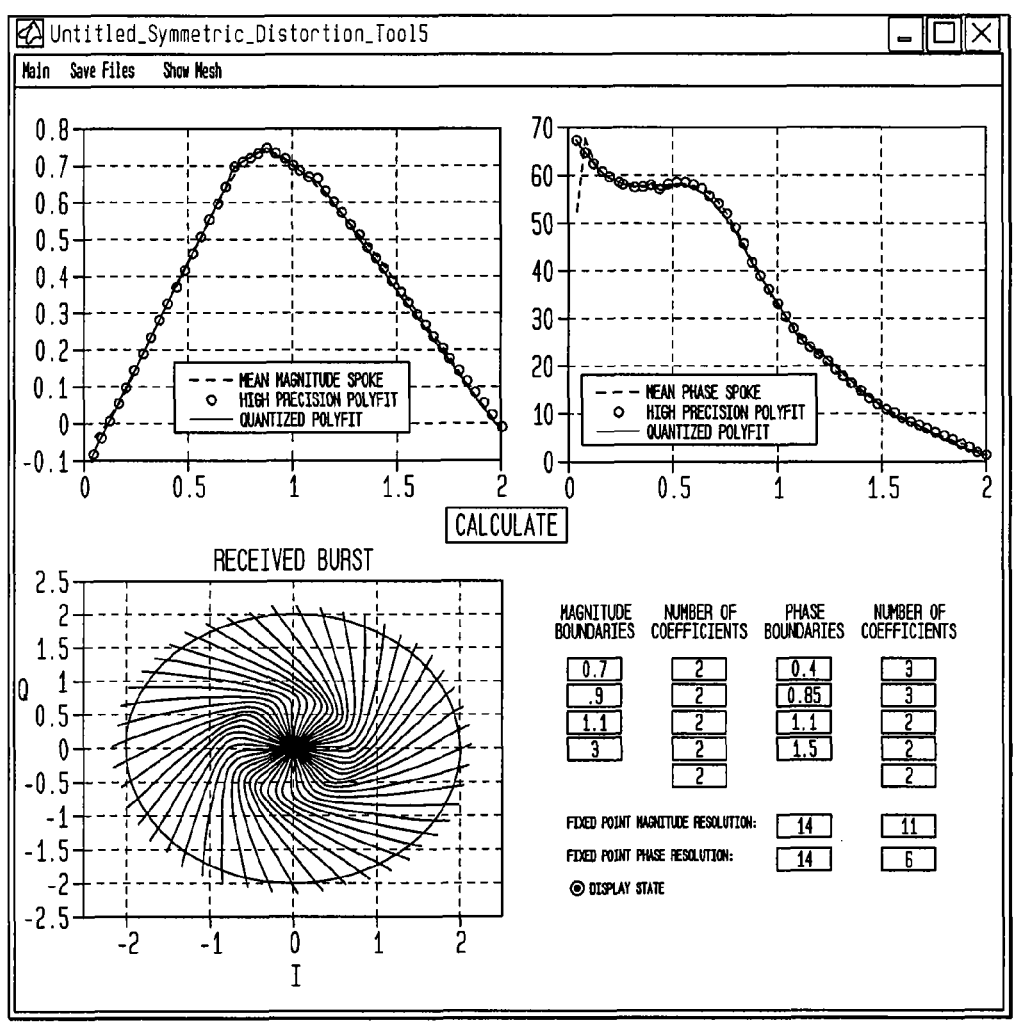
Figure 79:
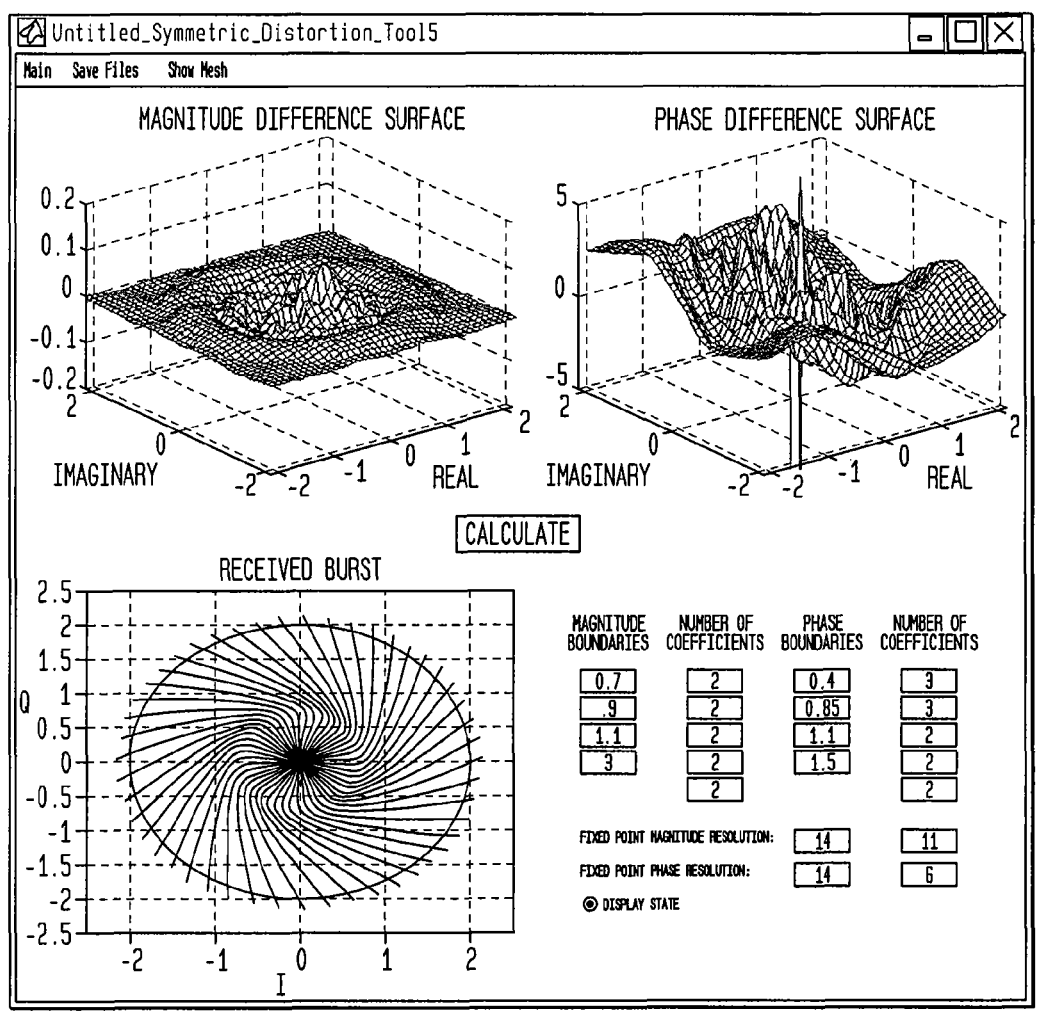

FIGS. 78, 79, and Table 3 below illustrate example results for a 31 dB attenuation example.

TABLE 3

| Magnitude Boundaries: | 0.70000 | 0.90000 | 1.10000 | 3.00000 | |
|---|---|---|---|---|---|
| Phase Boundaries: | 0.40000 | 0.85000 | 1.10000 | 1.50000 | |
| Number of Magnitude Coefficients: | 2 | 2 | 2 | 2 | 2 |
| Number of Phase Coefficients: | 3 | 3 | 2 | 2 | 2 |
| Resolution for the Magnitude Coefficients = | | | | [14 11] | |
| Resolution for the Phase Coefficients = | | | | [14 6] | |
| High Resolution Magnitude Coefficients | | | | | |
| −0.13015737 | 0.04567030 | 0.00000000 | 0.00000000 | 0.00000000 | |
| 0.46206359 | 0.01307941 | 0.00000000 | 0.00000000 | 0.00000000 | |
| 1.11527556 | −0.01650204 | 0.00000000 | 0.00000000 | 0.00000000 | |
| 1.52015026 | −0.03058306 | 0.00000000 | 0.00000000 | 0.00000000 | |
| 0.00000000 | 0.00000000 | 0.00000000 | 0.00000000 | 0.00000000 | |
| Quantized Magnitude Coefficients | | | | | |
| −0.13037109 | 0.04589844 | 0.00000000 | 0.00000000 | 0.00000000 | |
| 0.46191406 | 0.01318359 | 0.00000000 | 0.00000000 | 0.00000000 | |
| 1.11523438 | −0.01660156 | 0.00000000 | 0.00000000 | 0.00000000 | |
| 1.52001953 | −0.03076172 | 0.00000000 | 0.00000000 | 0.00000000 | |
| 0.00000000 | 0.00000000 | 0.00000000 | 0.00000000 | 0.00000000 | |
| High Resolution Phase Coefficients | | | | | |
| 70.23409410 | −3.07340941 | 0.18605940 | 0.00000000 | 0.00000000 | |
| 16.05006950 | 6.27965393 | −0.23170749 | 0.00000000 | 0.00000000 | |
| 103.06551146 | −2.79457112 | 0.00000000 | 0.00000000 | 0.00000000 | |
| 67.40027620 | −1.50747667 | 0.00000000 | 0.00000000 | 0.00000000 | |
| 40.63303212 | −0.78994105 | 0.00000000 | 0.00000000 | 0.00000000 | |
| Quantized Phase Coefficients | | | | | |
| 70.23437500 | −3.07812500 | 0.18750000 | 0.00000000 | 0.00000000 | |
| 16.04687500 | 6.28125000 | −0.23437500 | 0.00000000 | 0.00000000 | |
| 103.06250000 | −2.79687500 | 0.00000000 | 0.00000000 | 0.00000000 | |
| 67.40625000 | −1.50000000 | 0.00000000 | 0.00000000 | 0.00000000 | |
| 40.64062500 | −0.79687500 | 0.00000000 | 0.00000000 | 0.00000000 | |

(d) Expanded 2_D Tool Performance

The technique presented in Section 13(a) can be expanded to include consideration of 5 polynomials along with truncations of coefficients. This technique is of interest because the user simply fits to a single complex curve in 2-D space. This fit can then be expanded in a 3-D parametric space to reconstruct magnitude and phase error surfaces. This is equivalent to implicitly constructing I polynomials and Q polynomials. In certain embodiments, this technique requires up to 24 bit resolution for coefficients.

Figure 80:
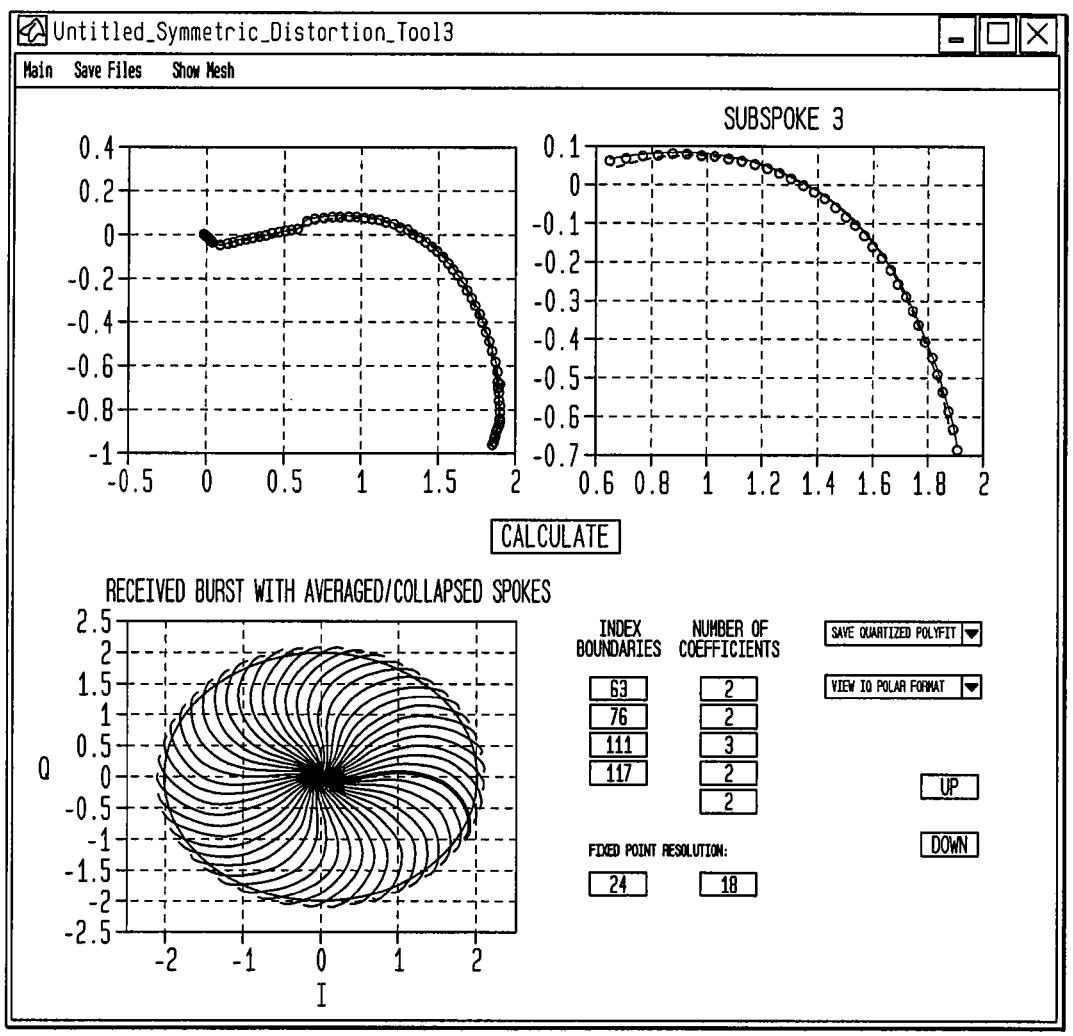
Figure 81:
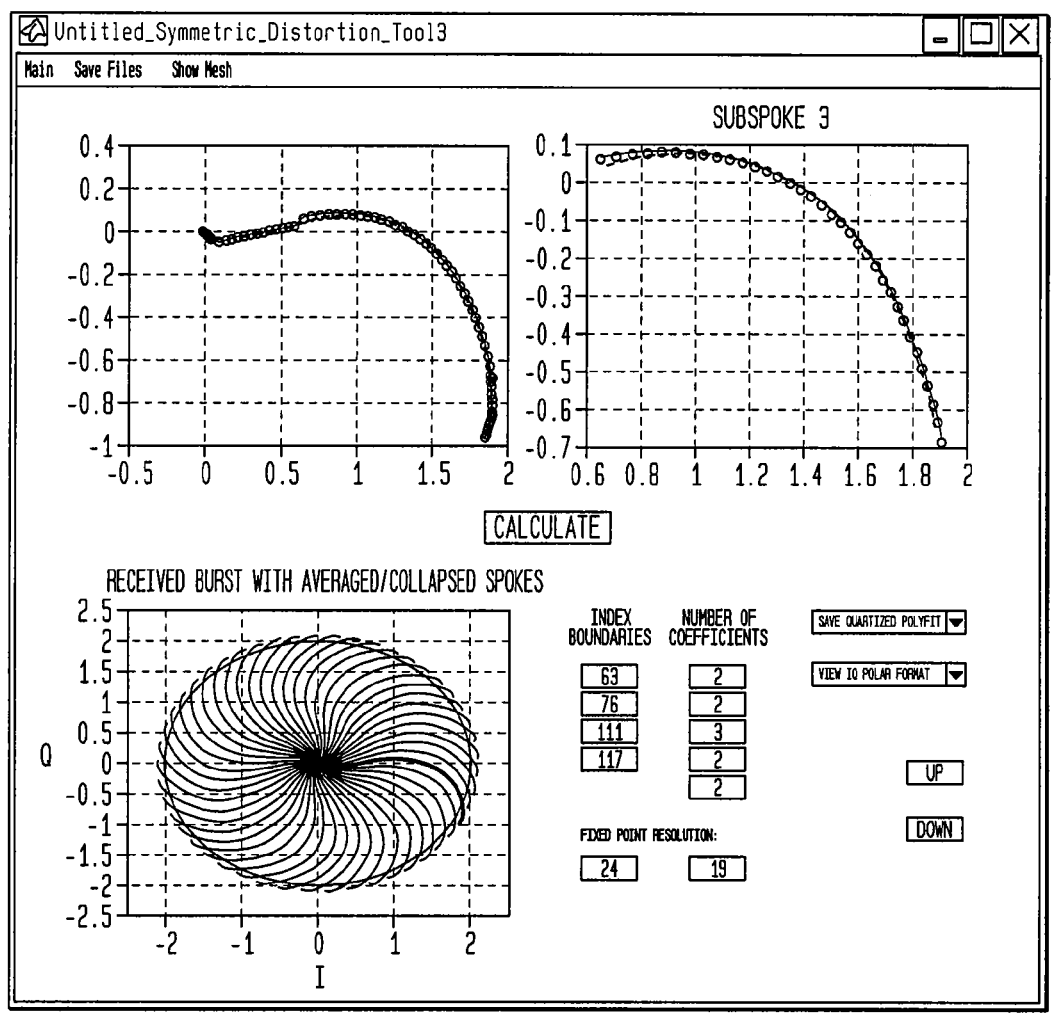
Figure 83:
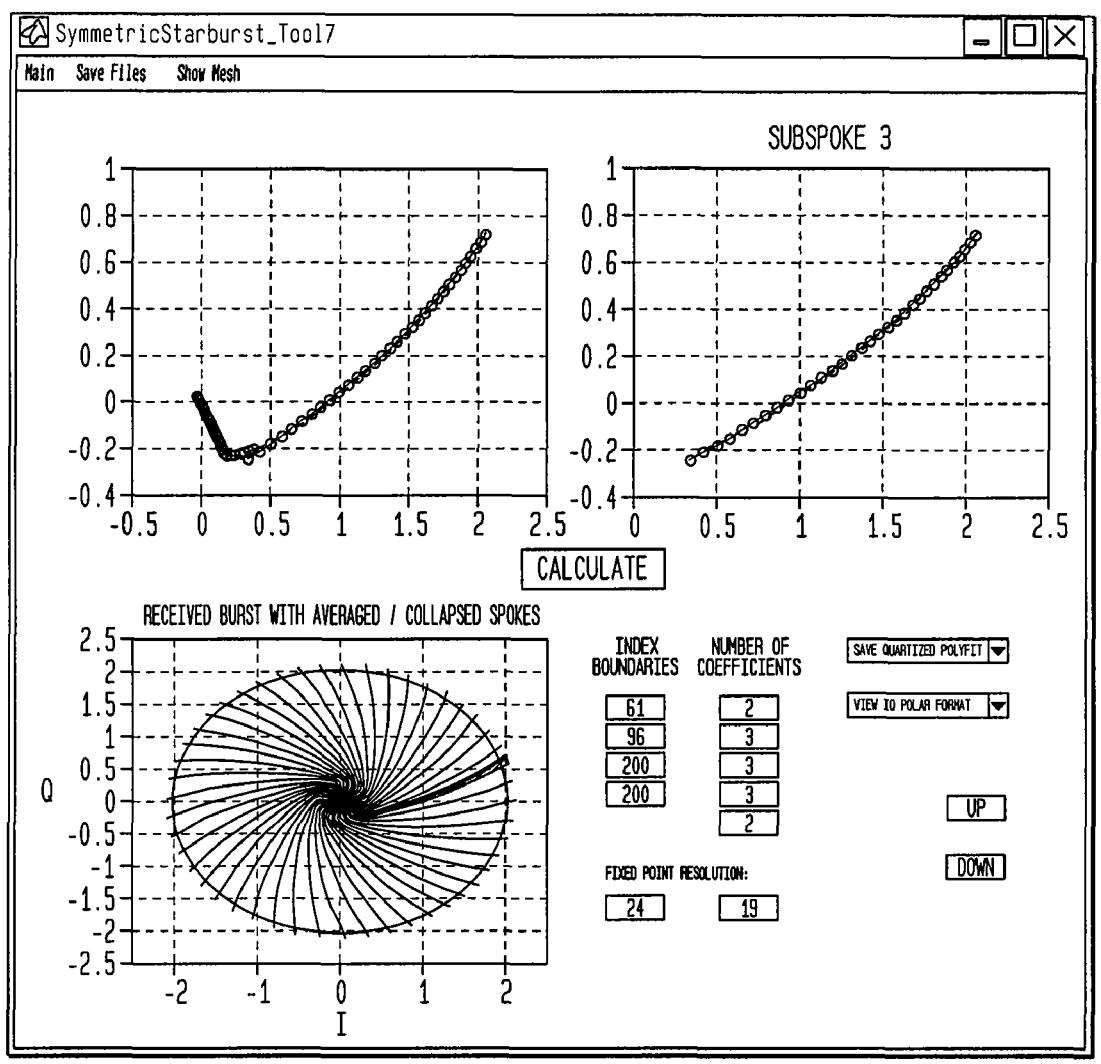

FIGS. 80-84 illustrate example results using this expanded technique. FIGS. 80 and 81 illustrate example results for a 0 db attenuation example. The fixed point resolution is slightly changed between FIG. 80 and FIG. 81. FIG. 82 illustrates floating point (high resolution) coefficients as well as fixed point (quantized) coefficients for the example of FIG. 81. FIGS. 83-84 illustrate similar example results for a 22 dB attenuation example.

(e) Extension of 2-D Technique with Explicit I, Q Component Polynomial Fit

As presented in Section (d), the complex 2-D representation implicitly fits I and Q components of the function by approximating the single complex plane focus of points using up to 5 polynomials with truncated coefficients.

In this section, the I and Q functions are fit explicitly and separately. Then, the 3-D error representation is reconstructed. Typically, up to 16 bits are required for the coefficients to achieve average performance.

Figure 85:
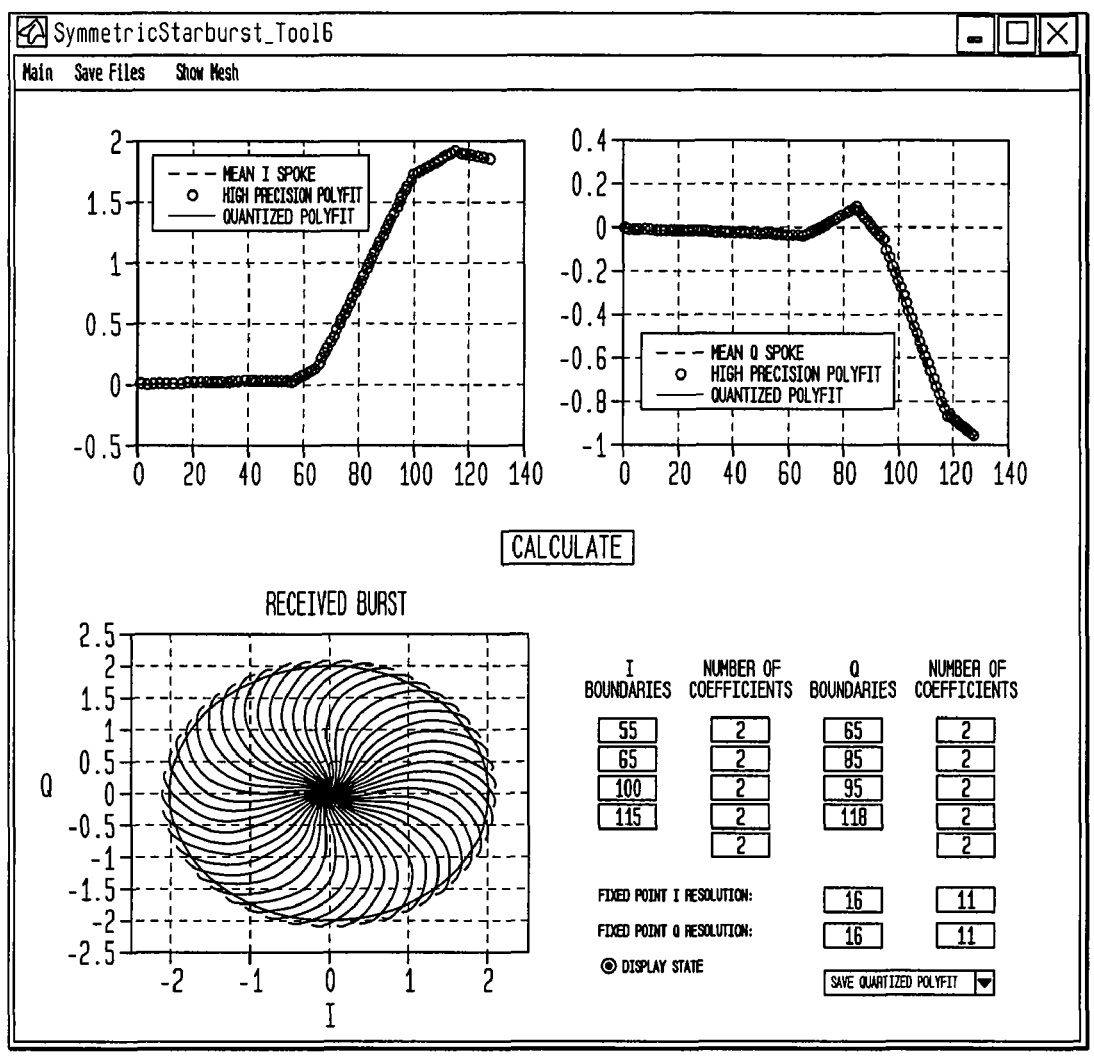
Figure 87:
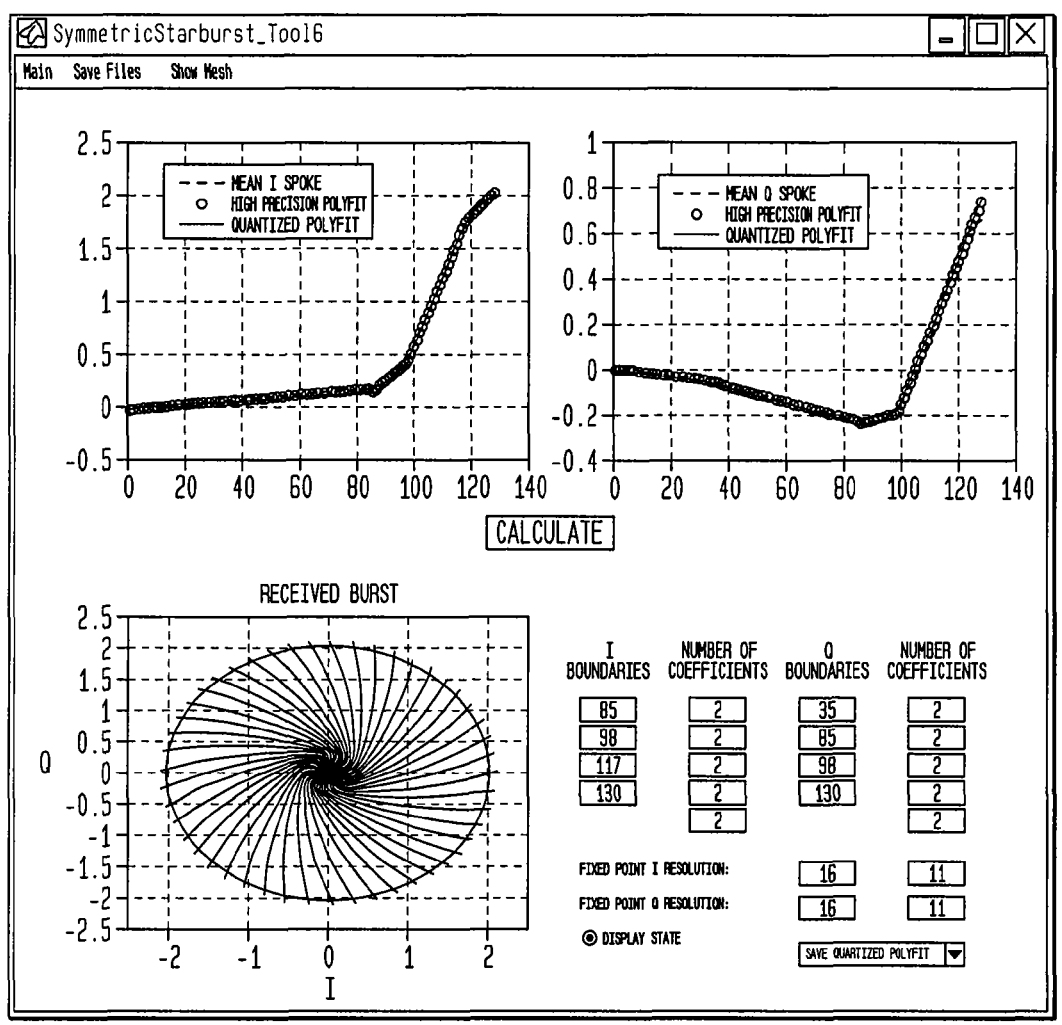
Figure 89:
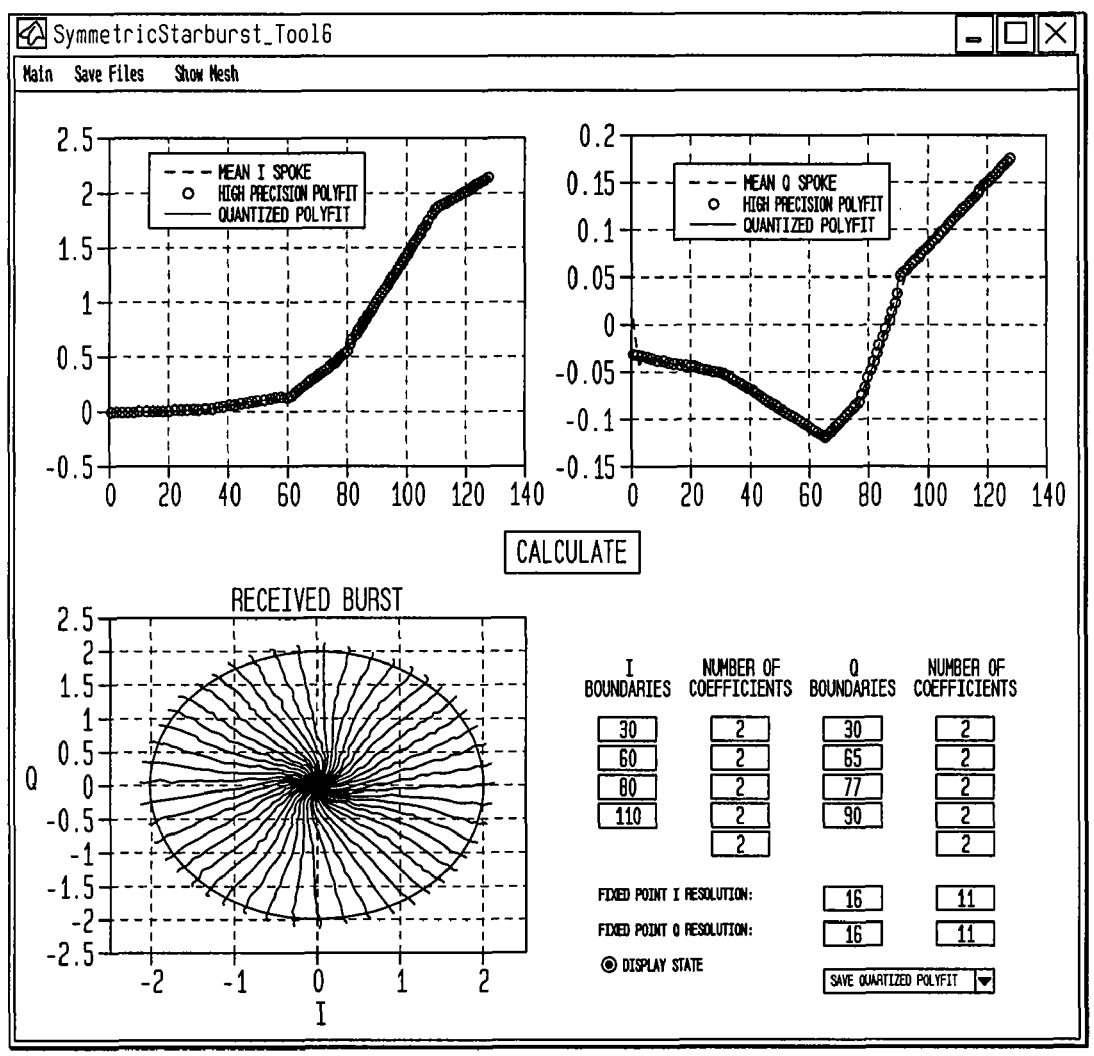

FIGS. 85-90 illustrate example results using this approach. FIGS. 85 and 86 illustrate example results for a 0 dB attenuation case. FIGS. 87 and 88 illustrate example results for a 22 db attenuation case. FIGS. 89 and 90 illustrate example results for a 40 dB attenuation case.

(f) Head to Head Comparison for Three Generation I Algorithms

In this section, three separate algorithms (Least Squares Fit, Minimax Fit, and Chebyshev Fit) are compared in terms of coefficient resolution requirements for achieving acceptable performance at three distinct power output level attenuations: 0 dBm, 22 dBm, and 40 dBm.

Figure 91:
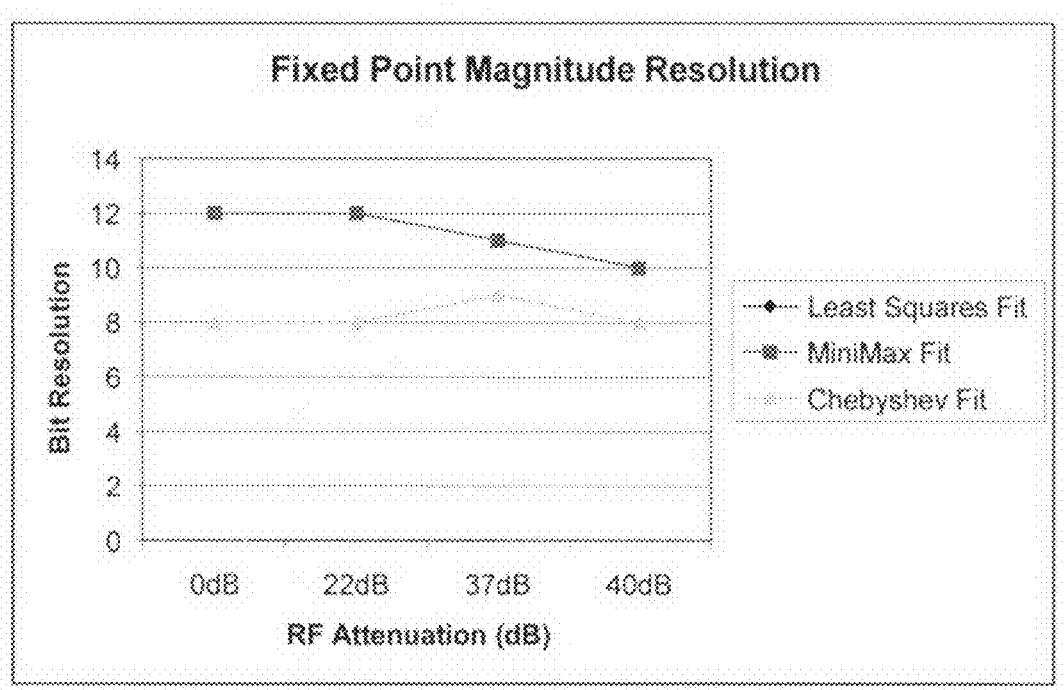
FIG. 91 illustrates a comparison of bit resolution versus RF attenuation for three example algorithms.

FIG. 91 illustrates a comparison of bit resolution versus RF attenuation for the three algorithms.

Figure 92:
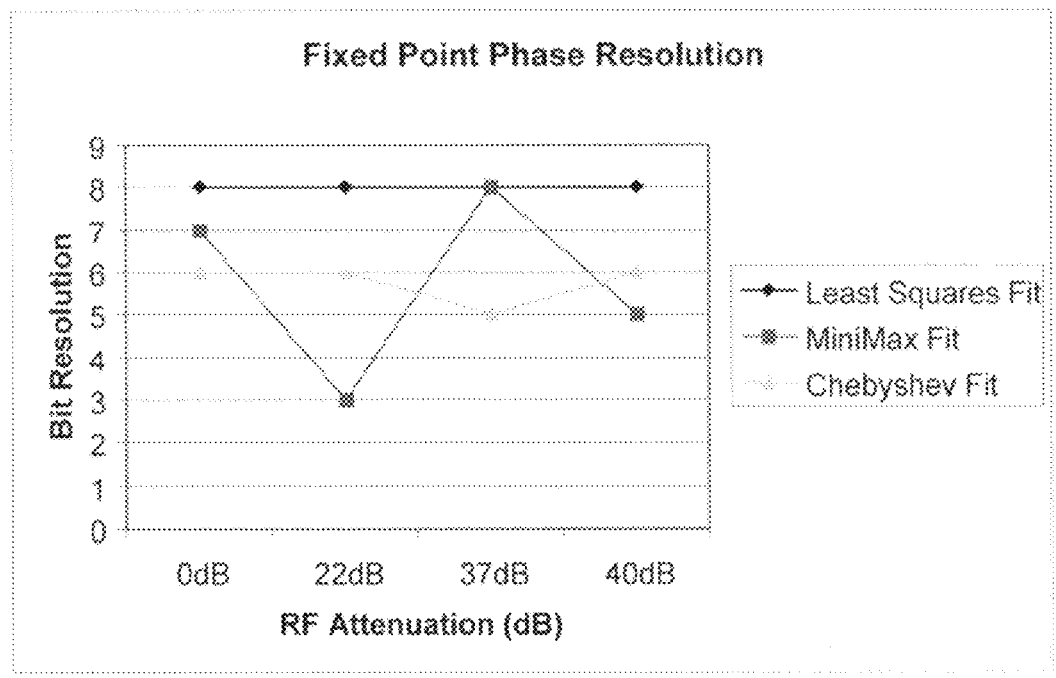
FIG. 92 illustrates a comparison of bit resolution versus RF attenuation for three example algorithms.

FIG. 92 illustrates a comparison of bit resolution versus RF attenuation for the three algorithms.

Figure 93:
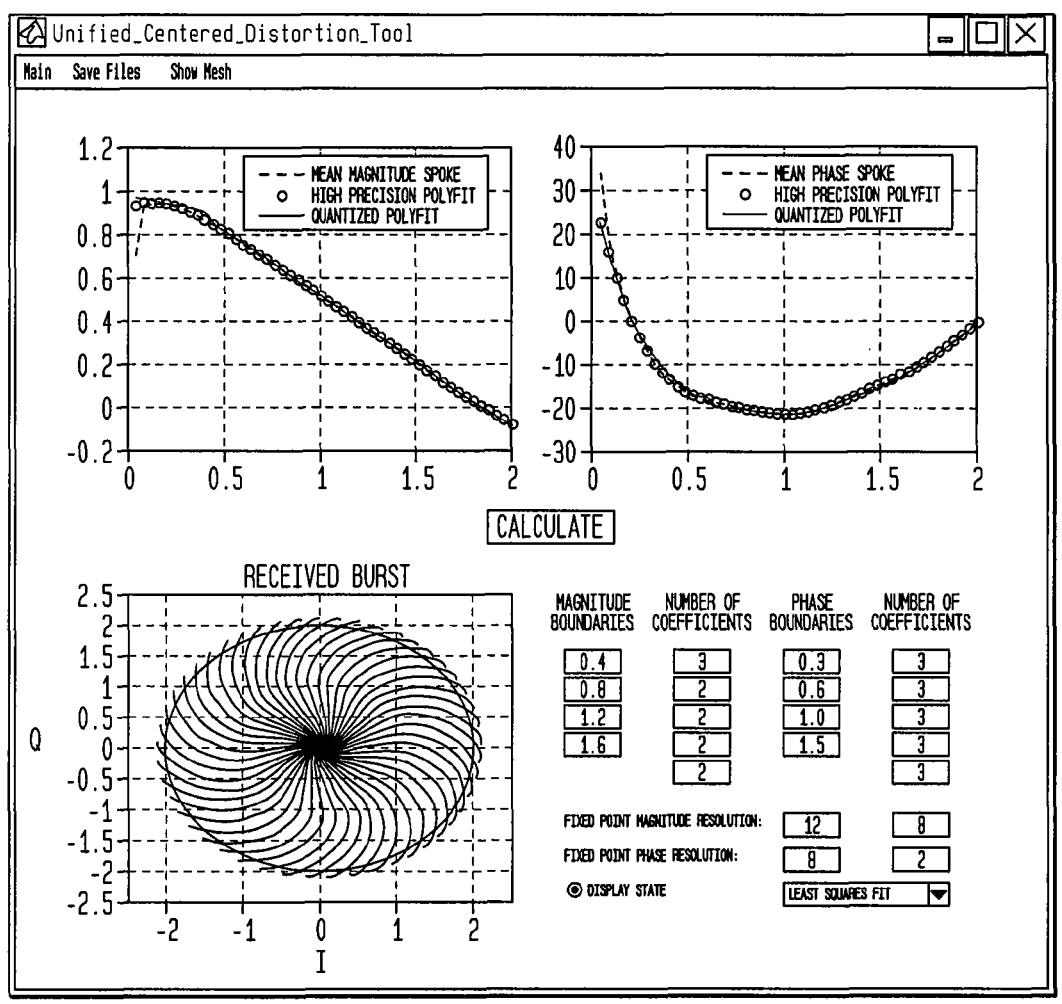

FIGS. 93-94 illustrate example results using the Least Squares Fit algorithm for a 0 db attenuation case.

Figure 95:
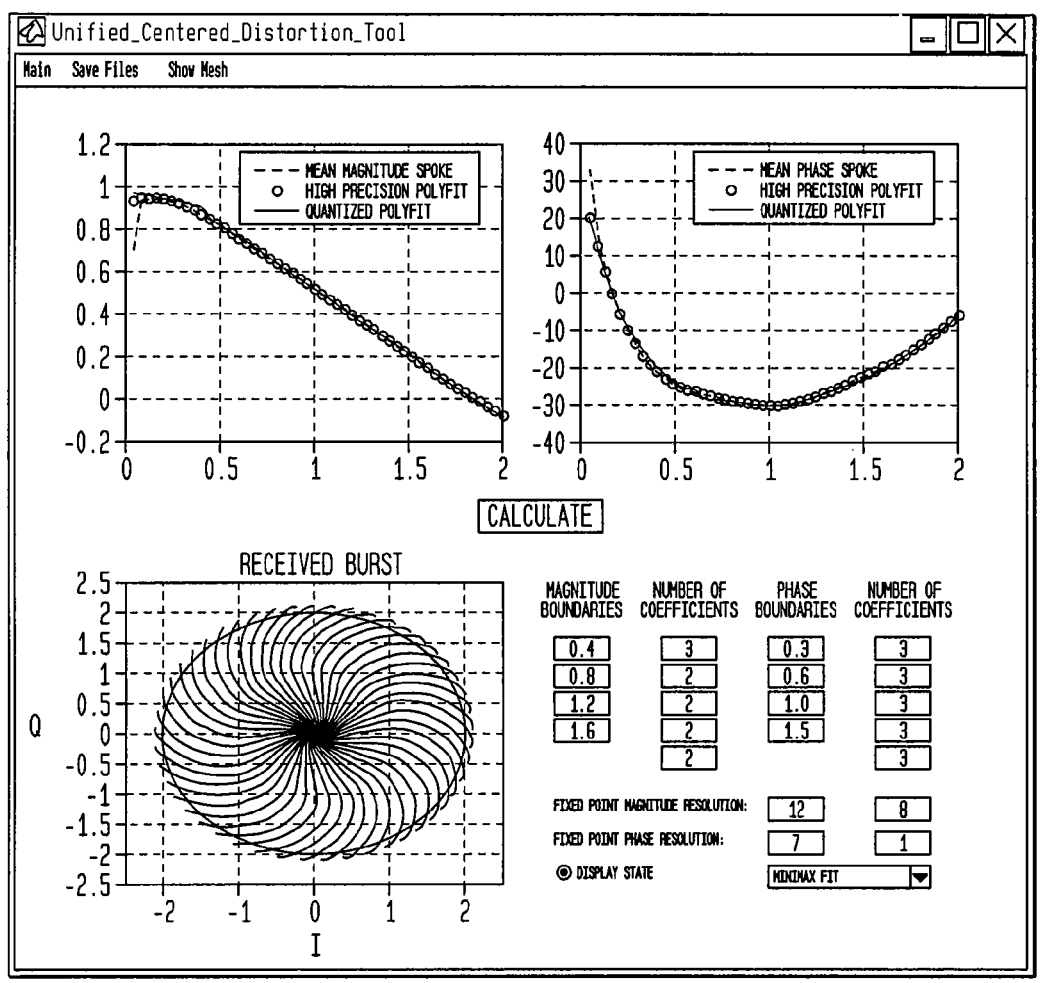

FIGS. 95-96 illustrate example results using the Minimax Fit algorithm for a 0 dB attenuation case.

Figure 97:
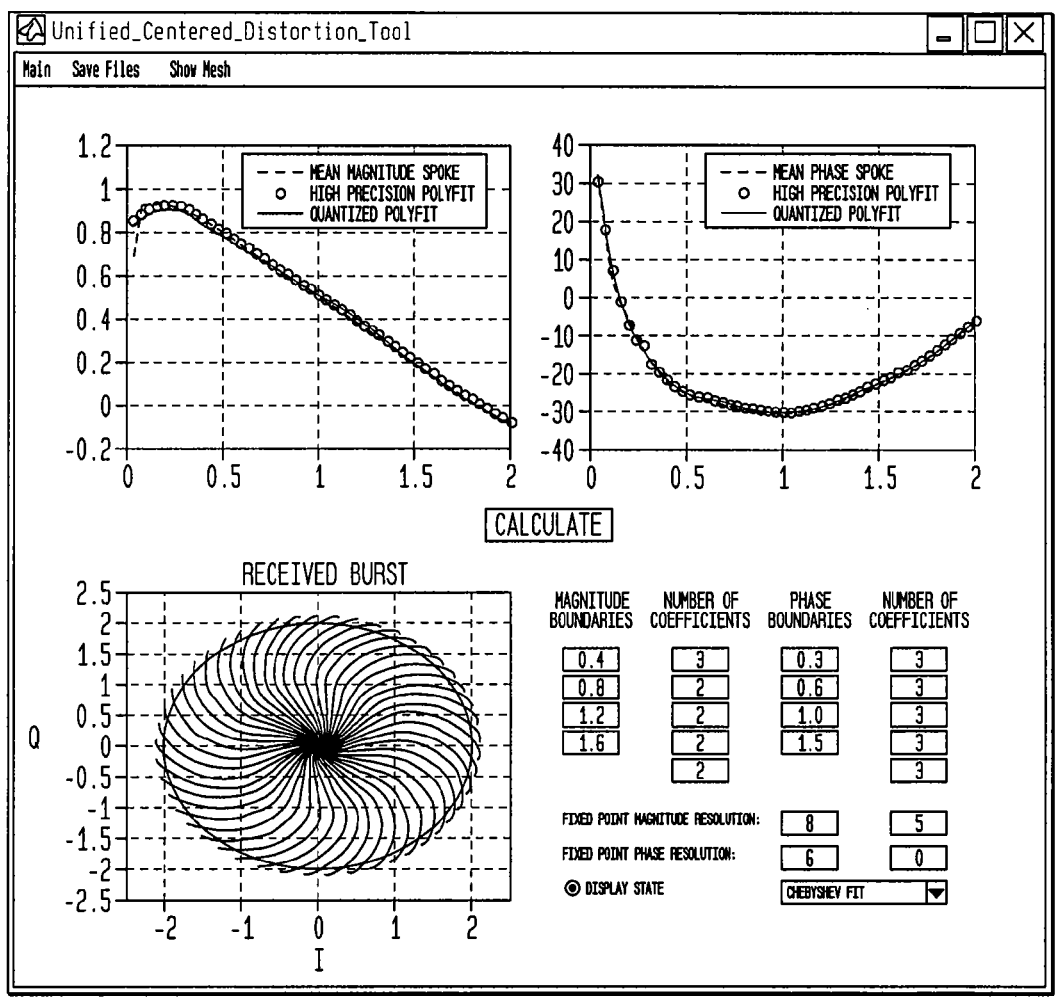

FIGS. 97-98 illustrate example results using the Chebyshev Fit algorithm for a 0 dB attenuation case.

Figure 99:
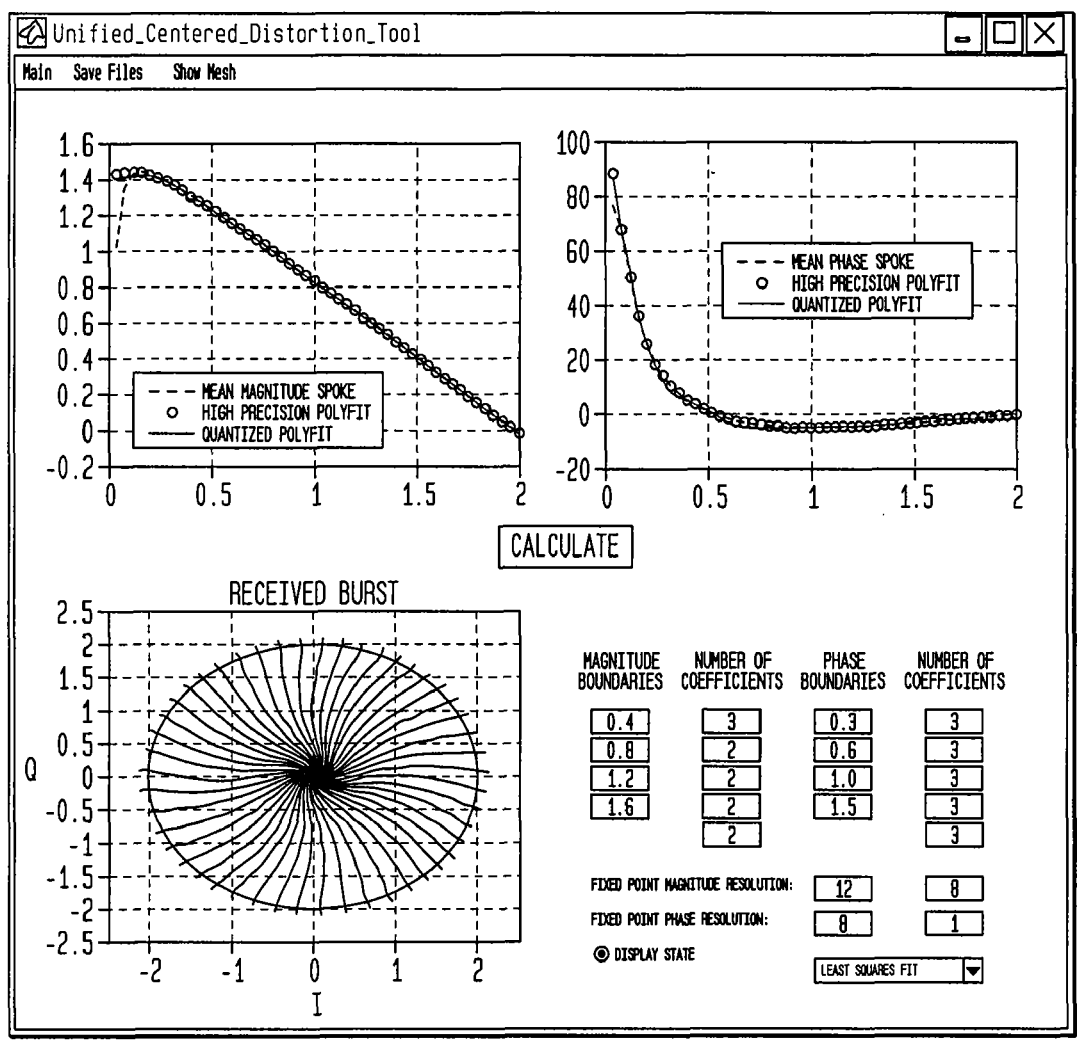

FIGS. 99-100 illustrate example results using the Least Squares Fit algorithm for a 22 dB attenuation case.

Figure 101:
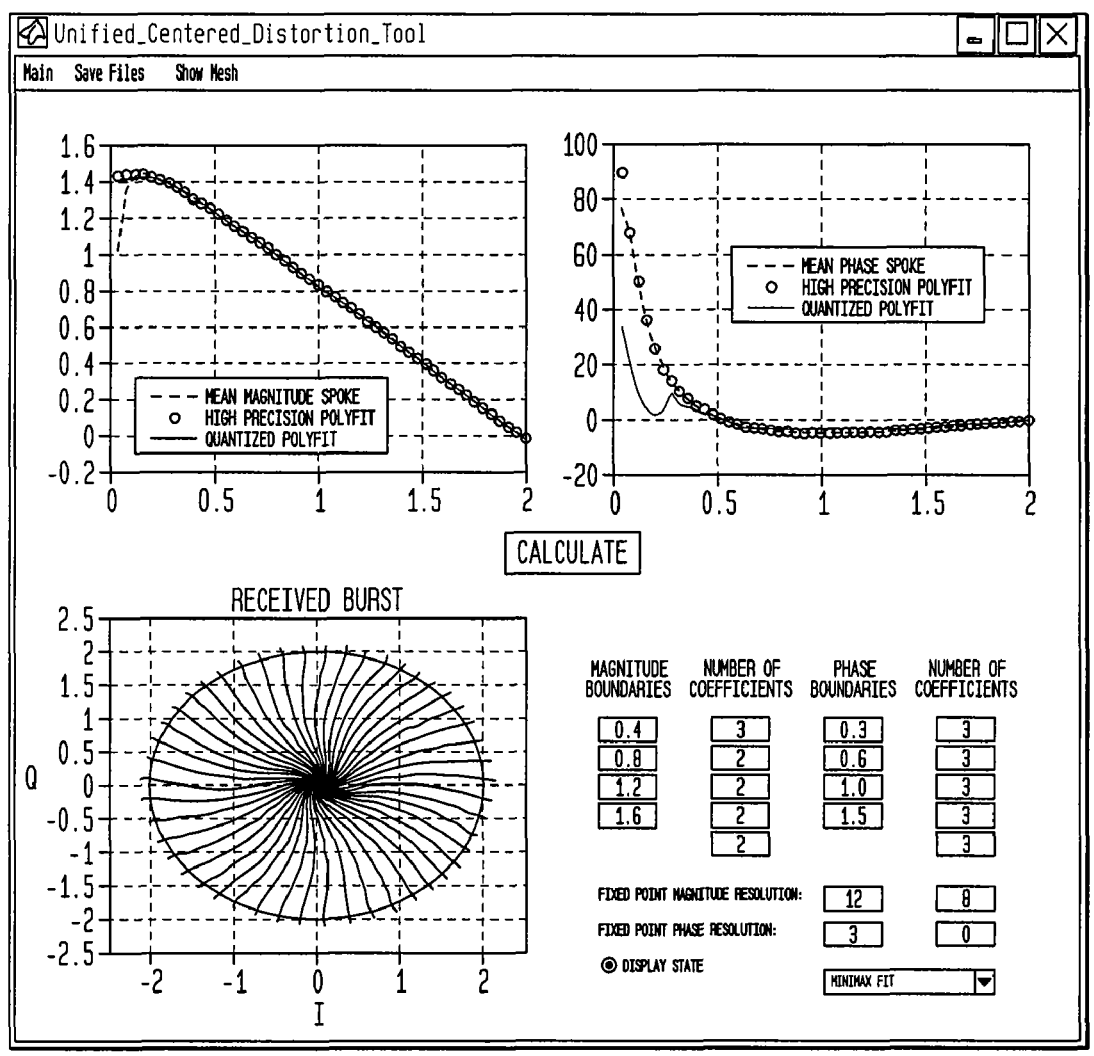

FIGS. 101-102 illustrate example results using the Minimax algorithm for a 22 dB attenuation case.

Figure 103:
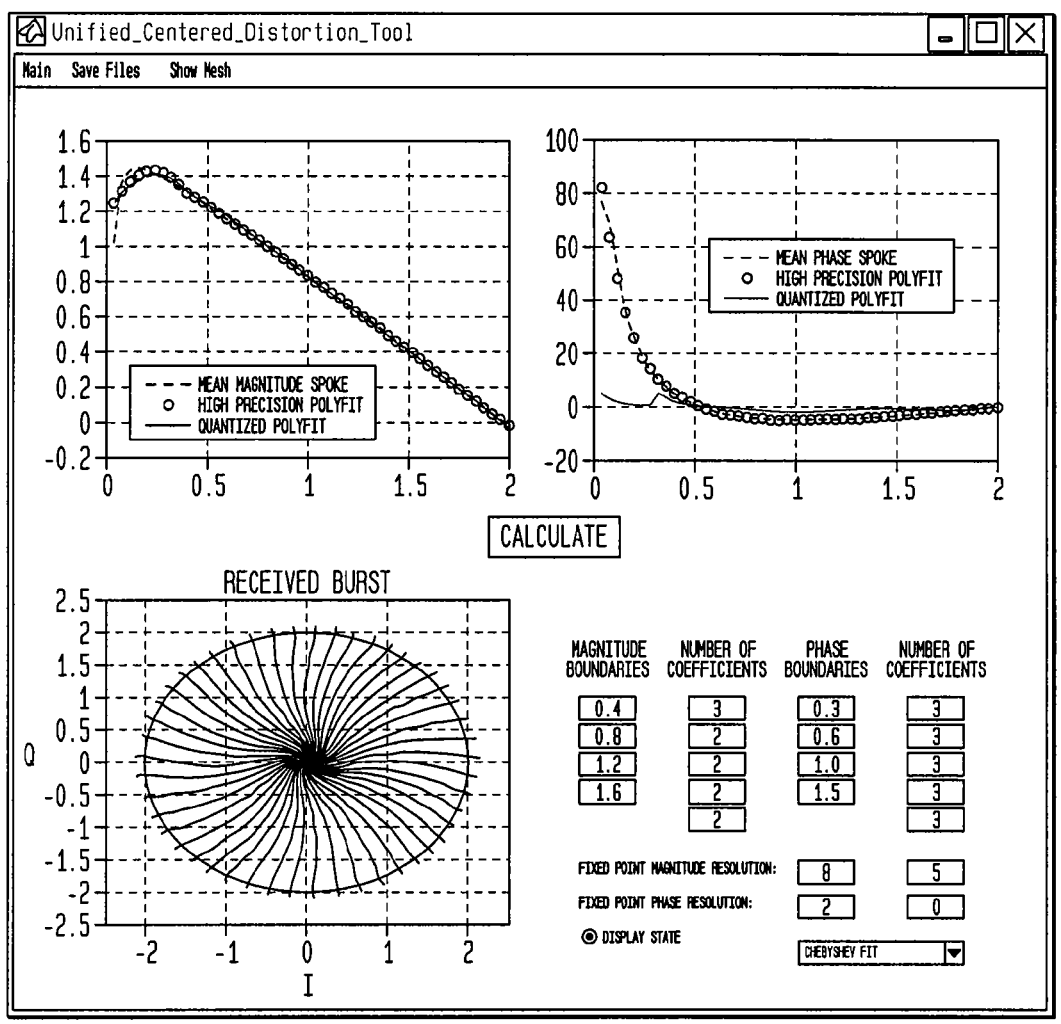

FIGS. 103-104 illustrate example results using the Chebyshev Fit algorithm for a 22 dB attenuation case.

Figure 105:
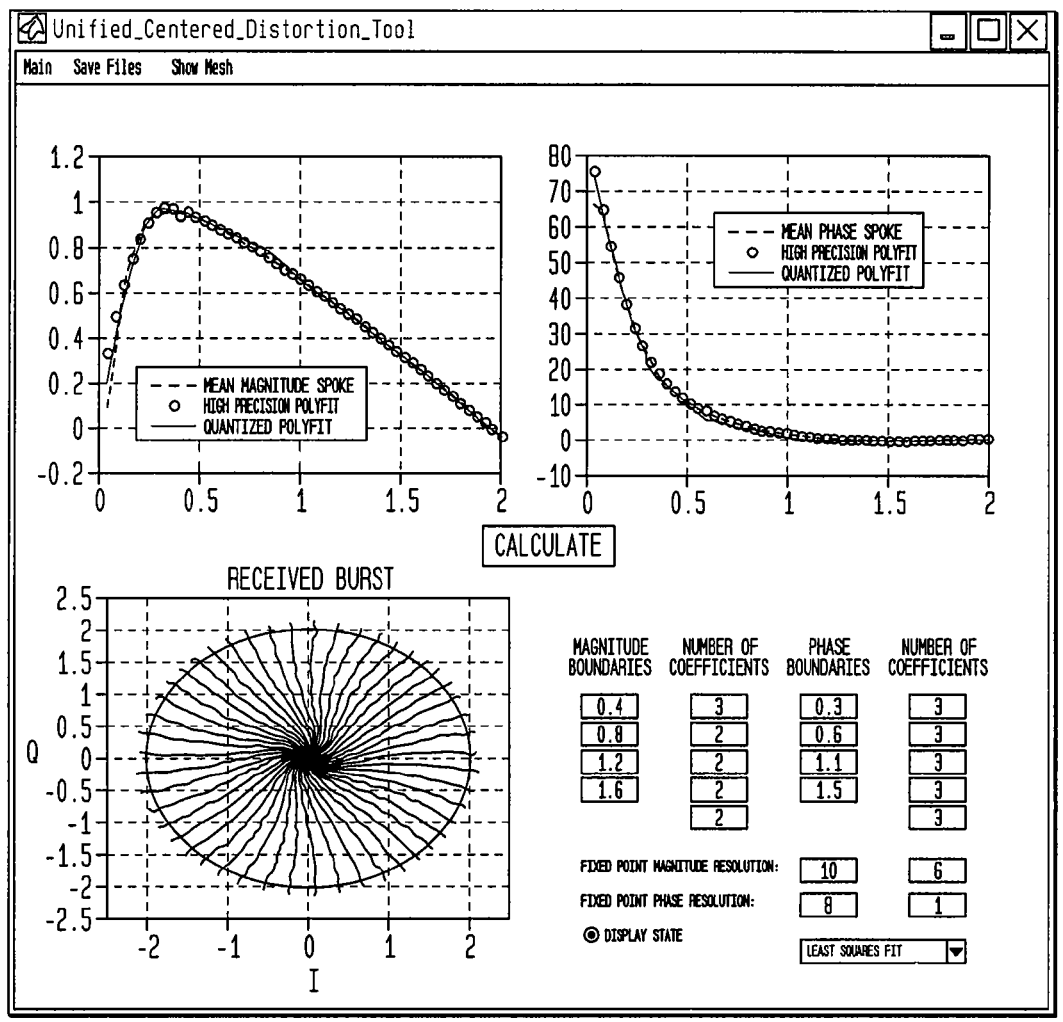

FIGS. 105-106 illustrate example results using the Least Squares Fit algorithm for a 40 dB attenuation case.

Figure 107:
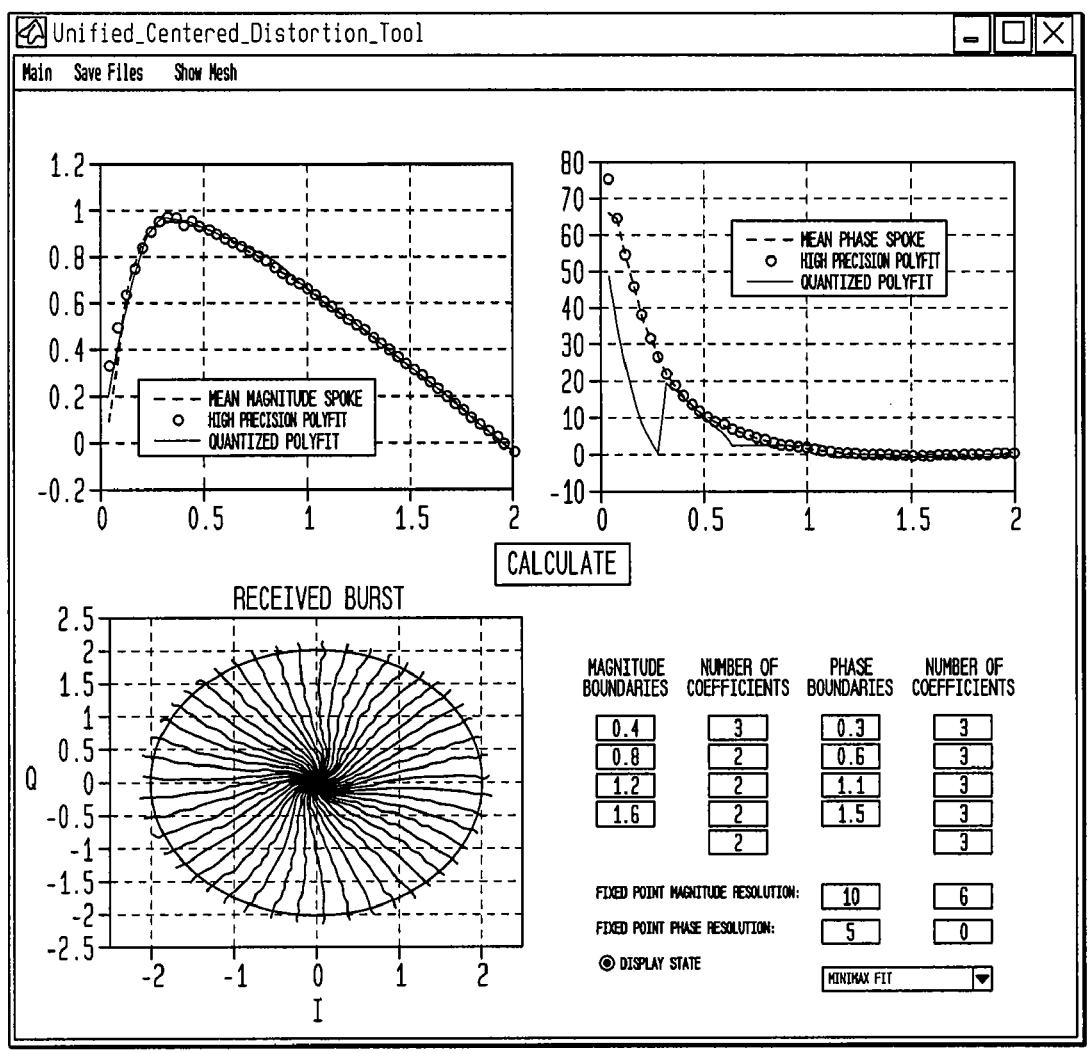

FIGS. 107-108 illustrate example results using the Minimax Fit algorithm for a 40 dB attenuation case.

Figure 109:
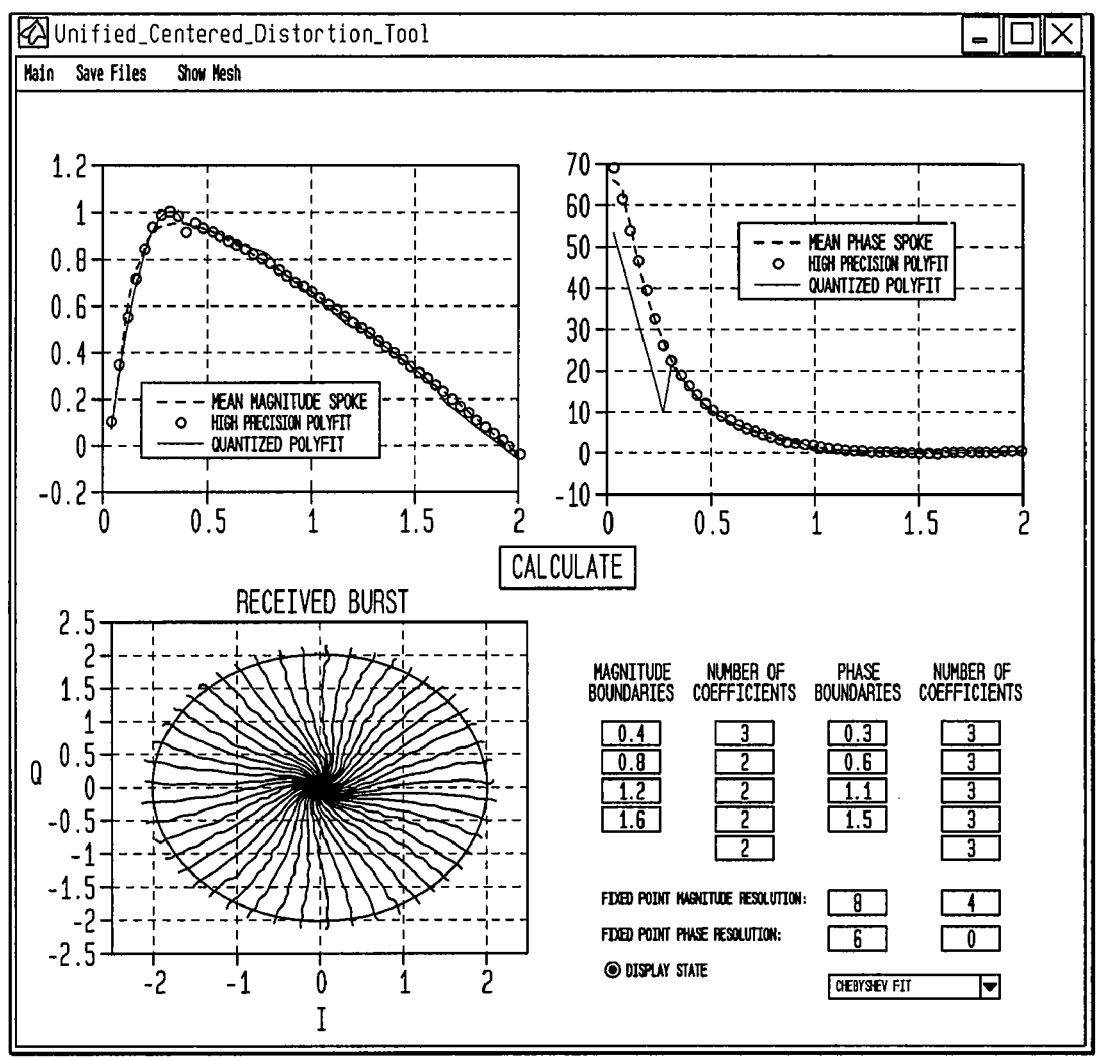
Figure 111:
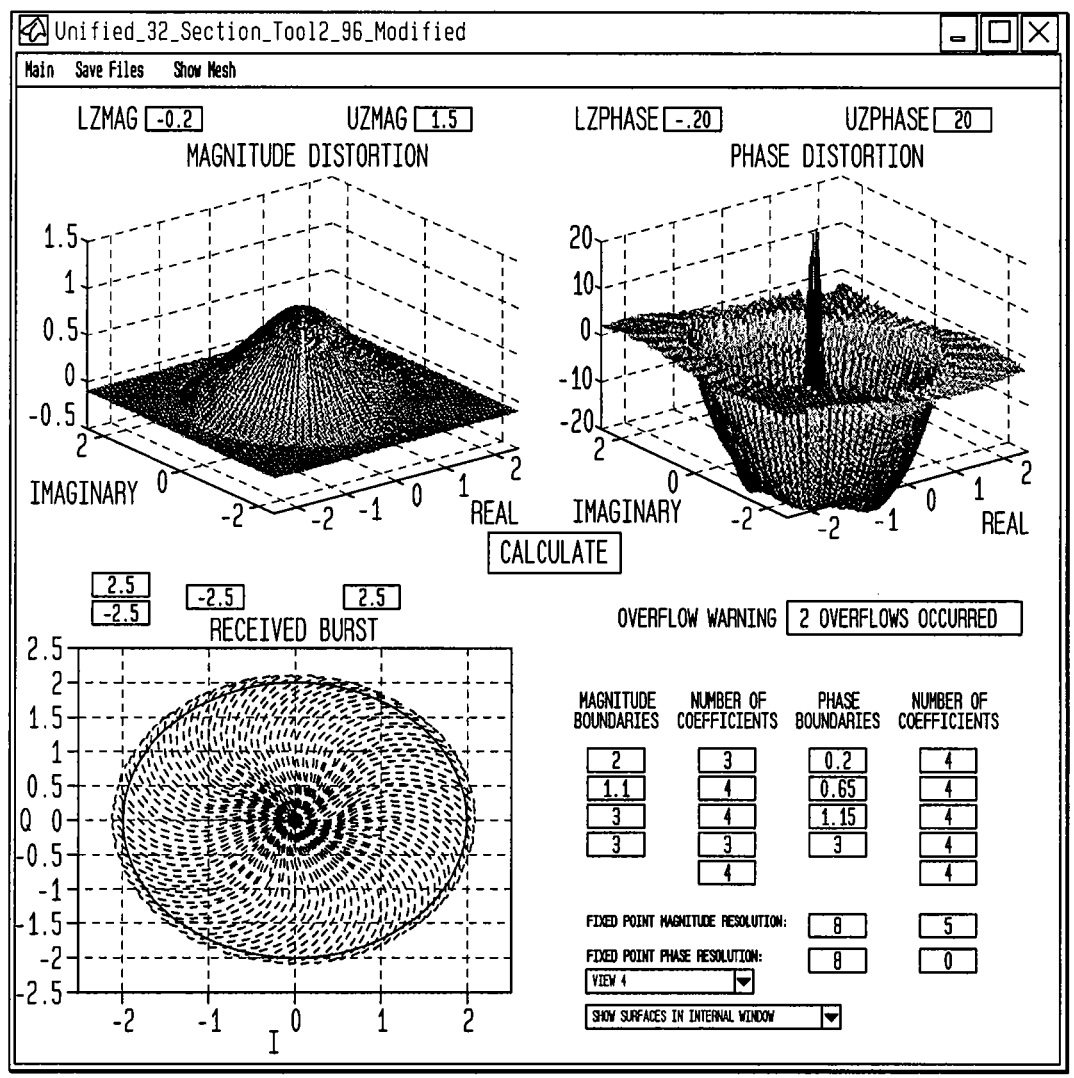
Figure 113:
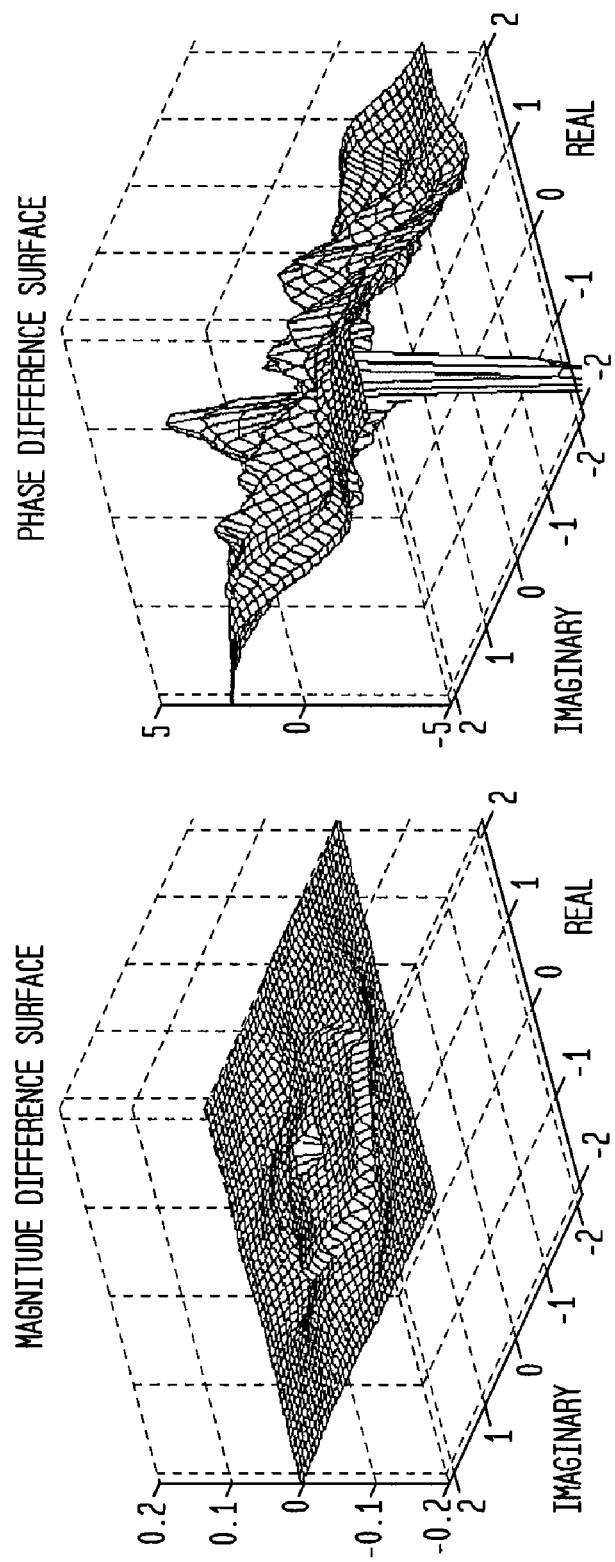
Figure 115:
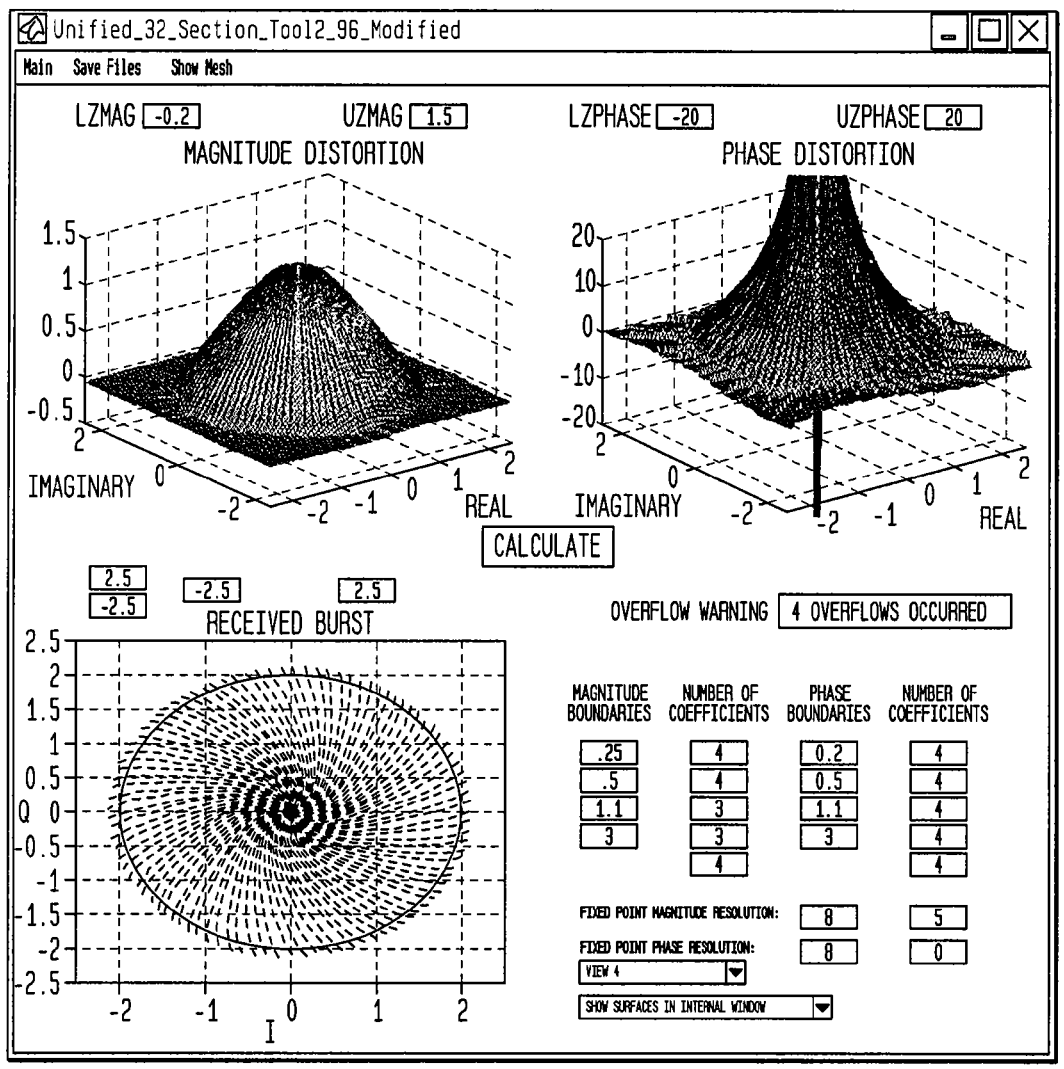
Figure 117:
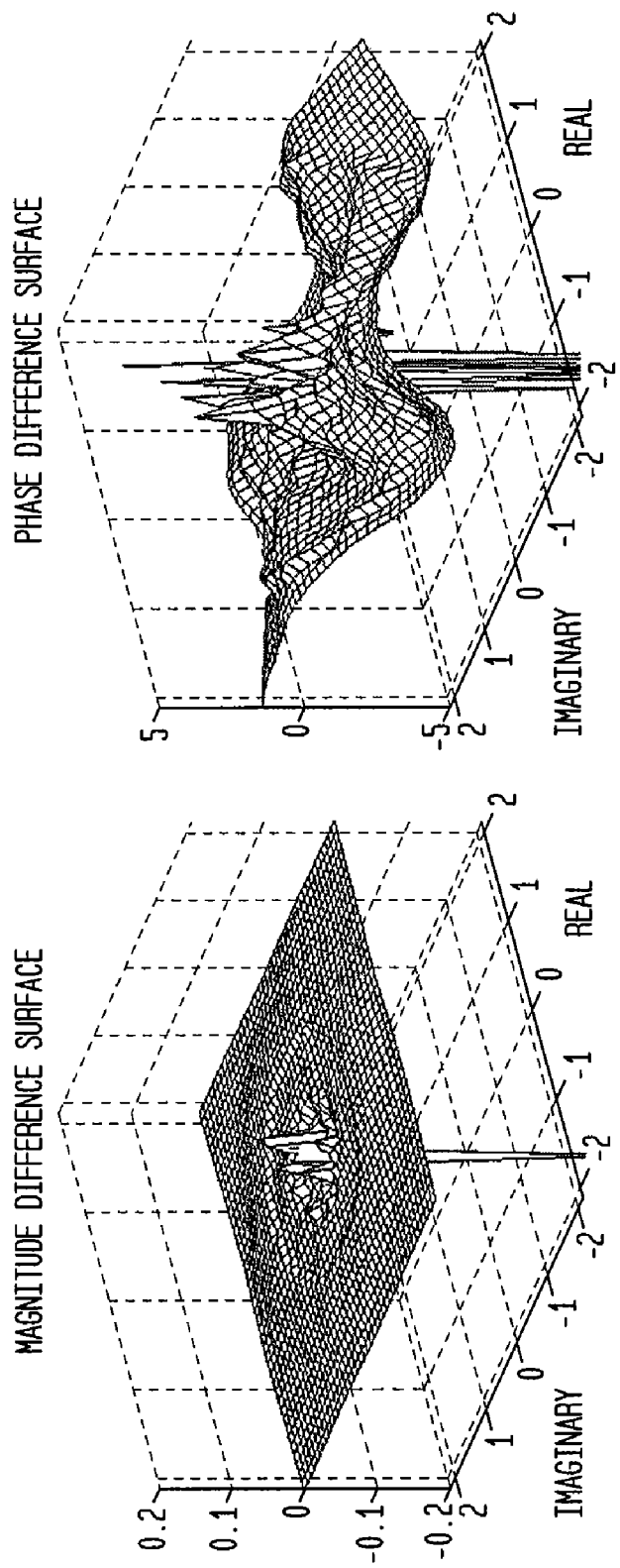
Figure 119:
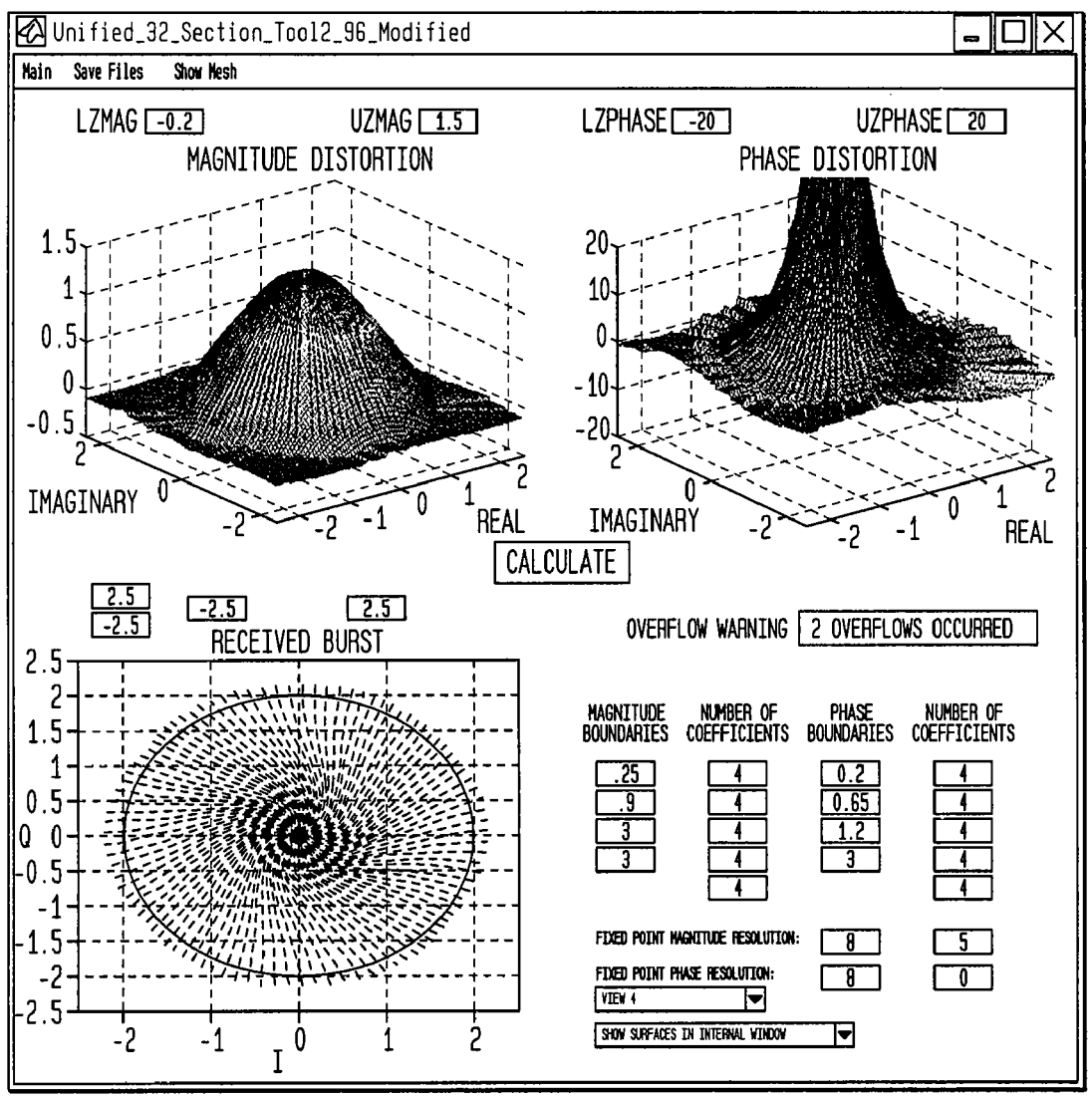
Figure 121:
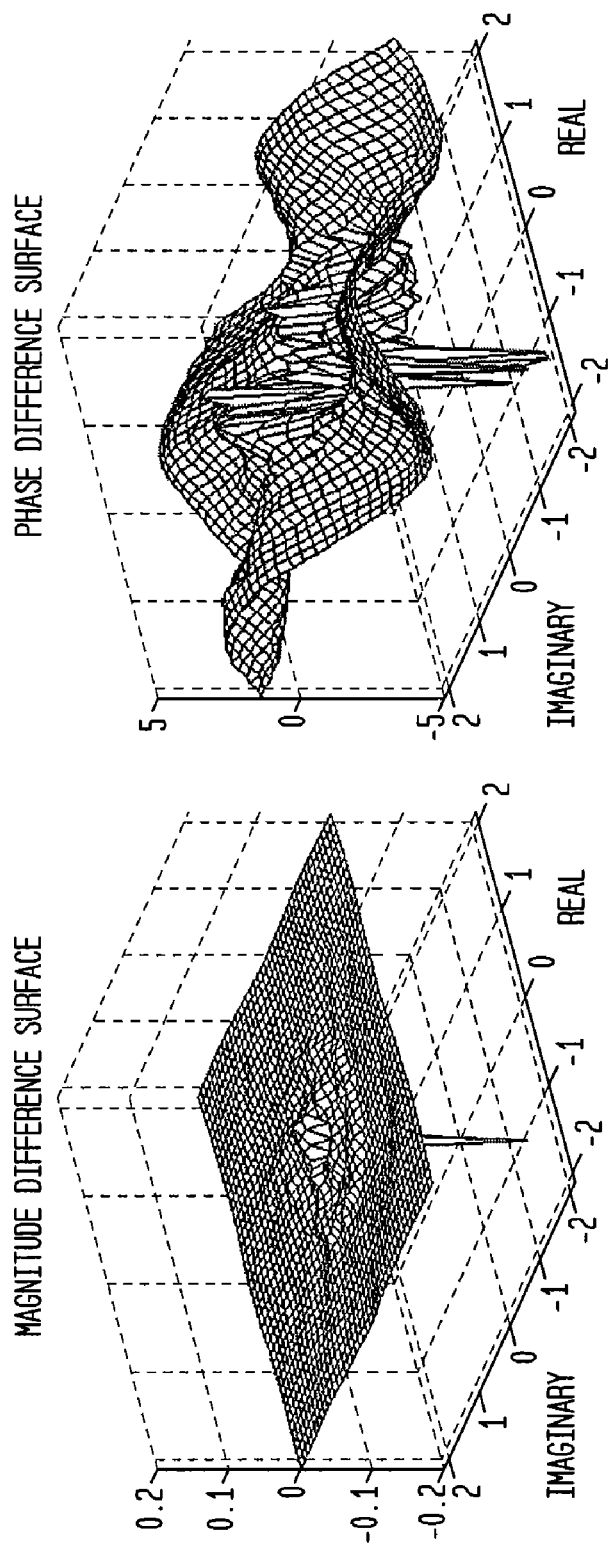
Figure 124:
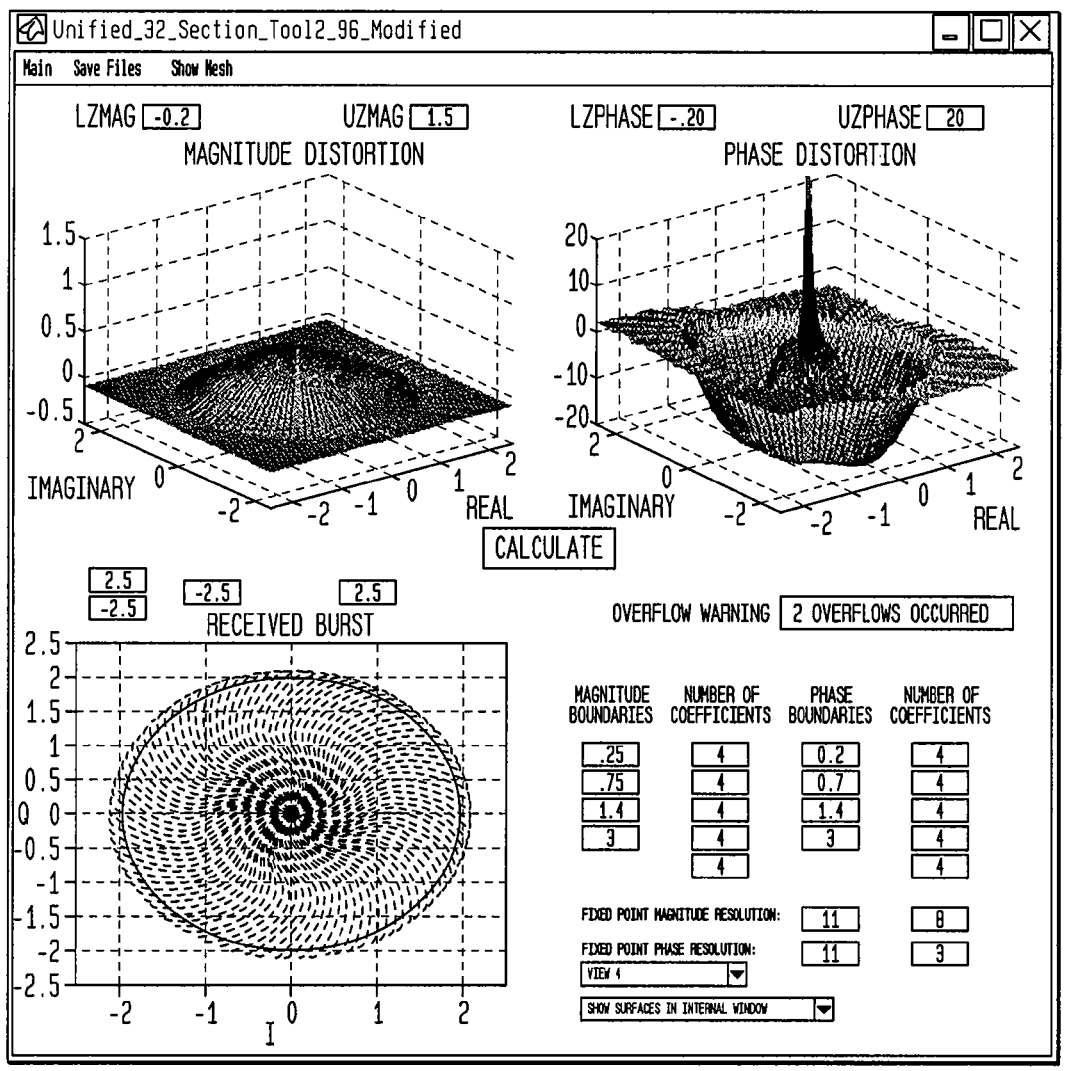
Figure 126:
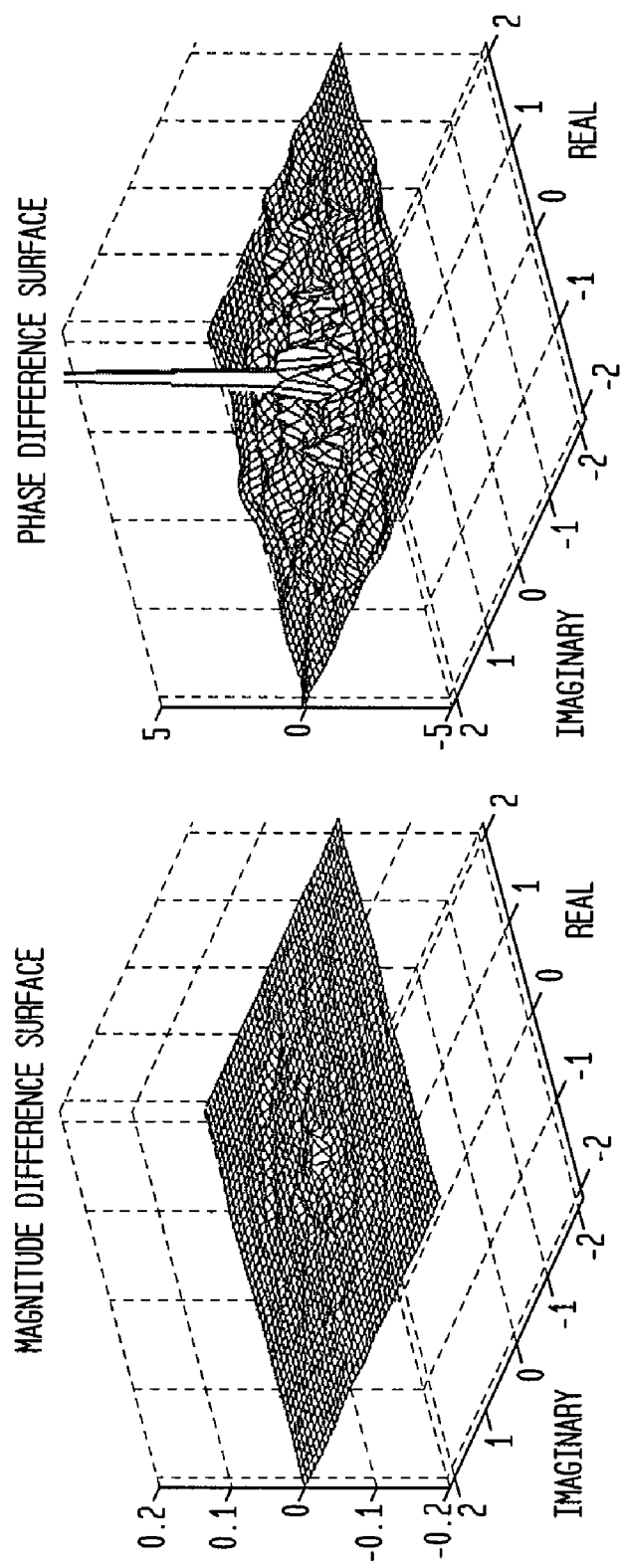
Figure 128:
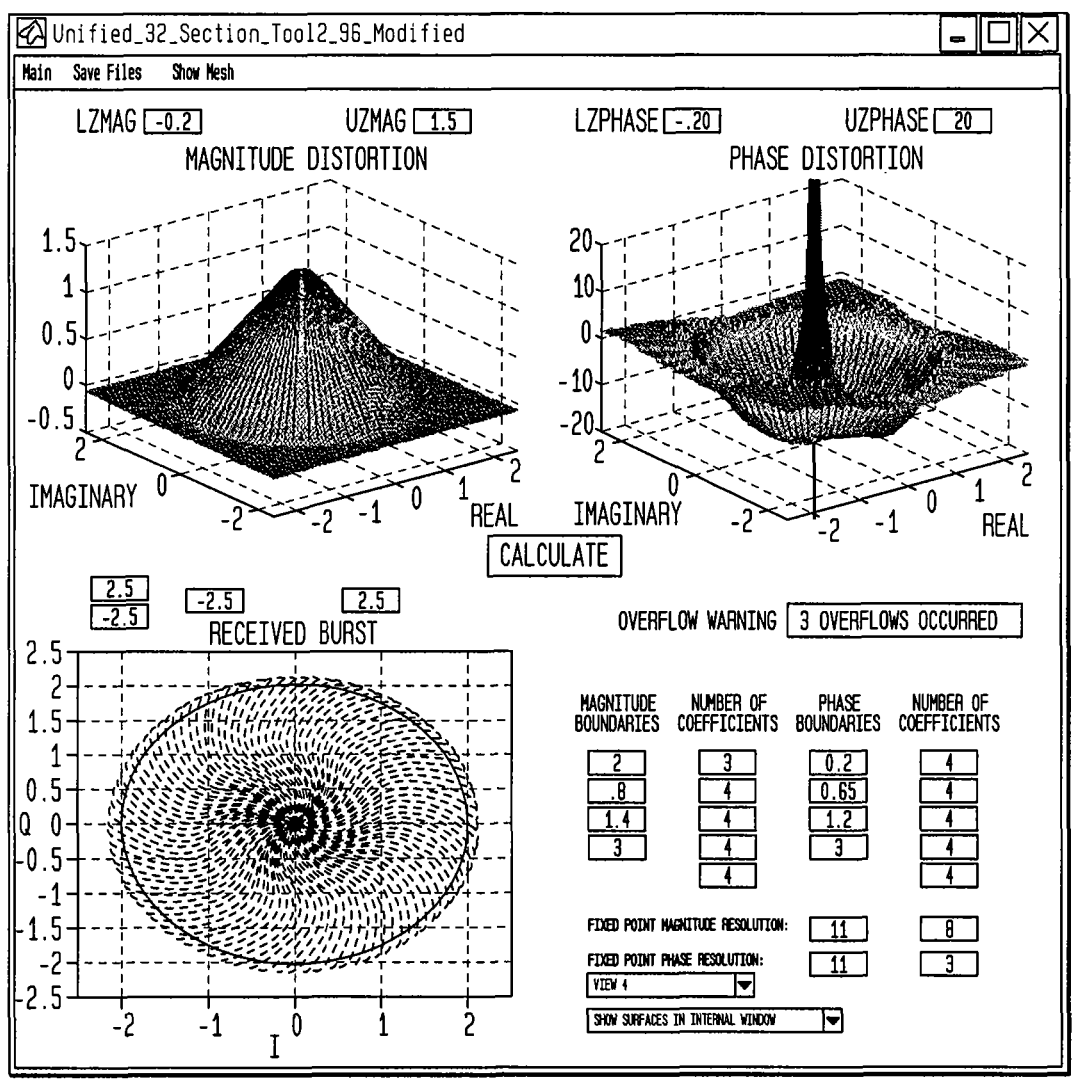
Figure 130:
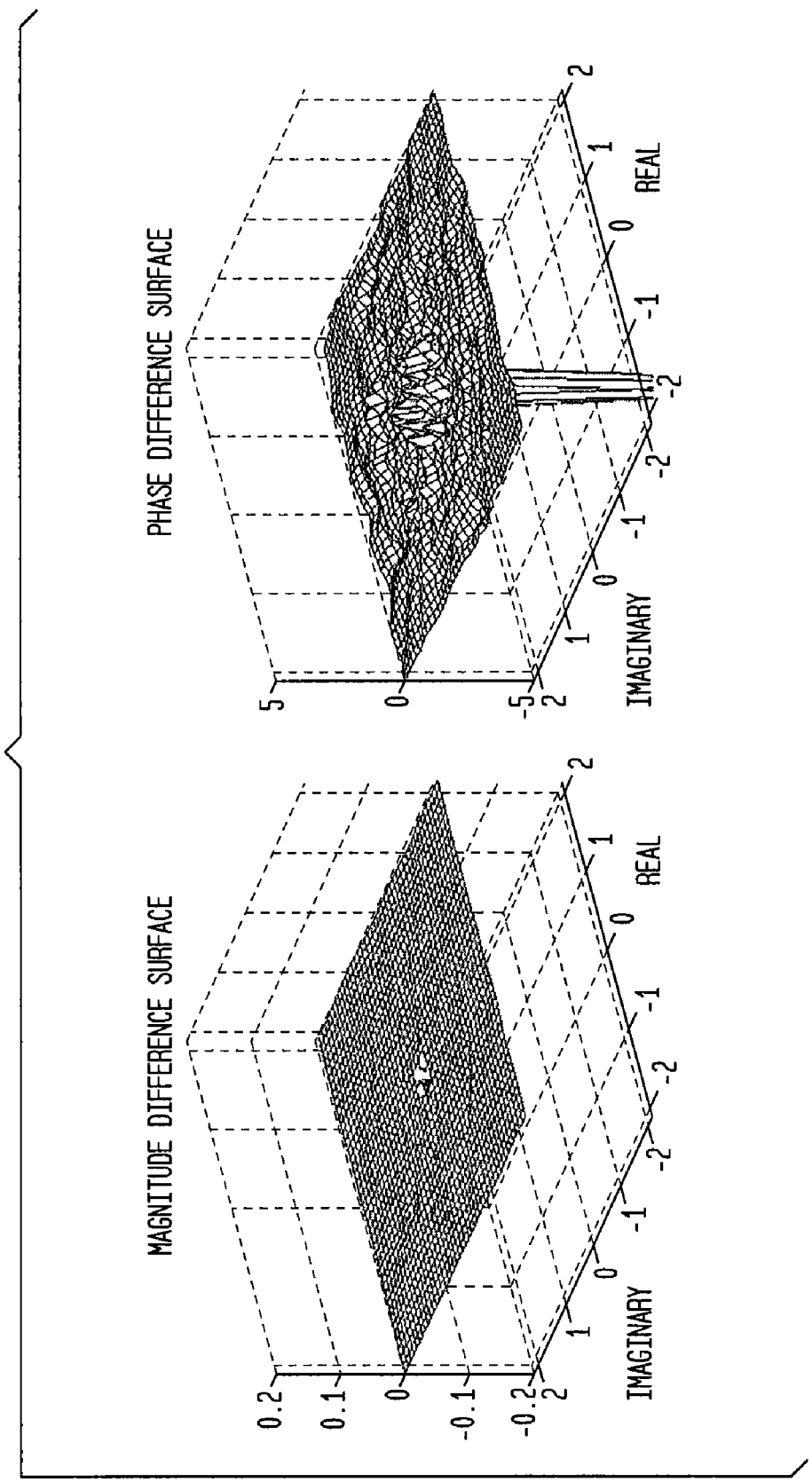
Figure 132:
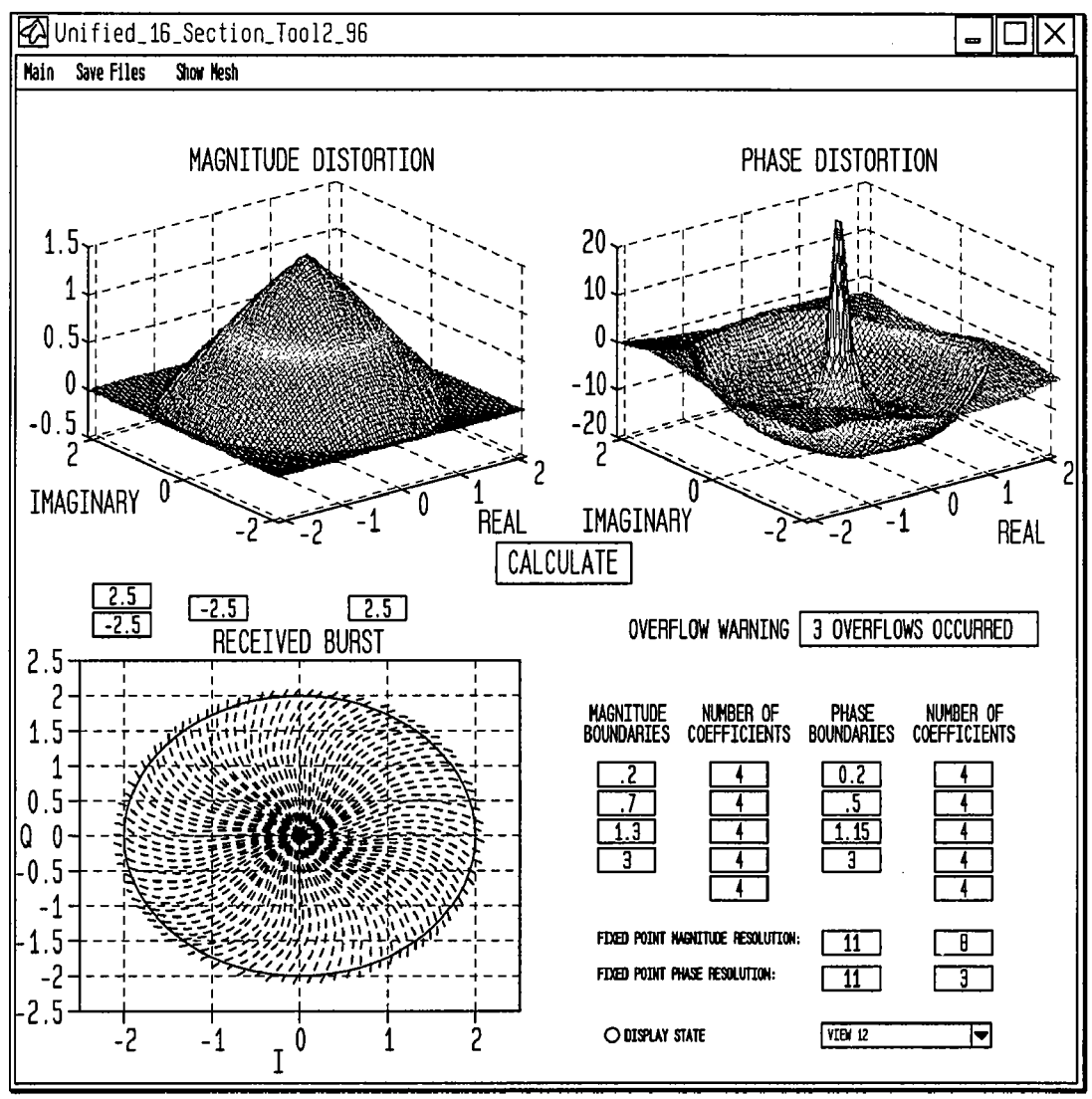
Figure 134:
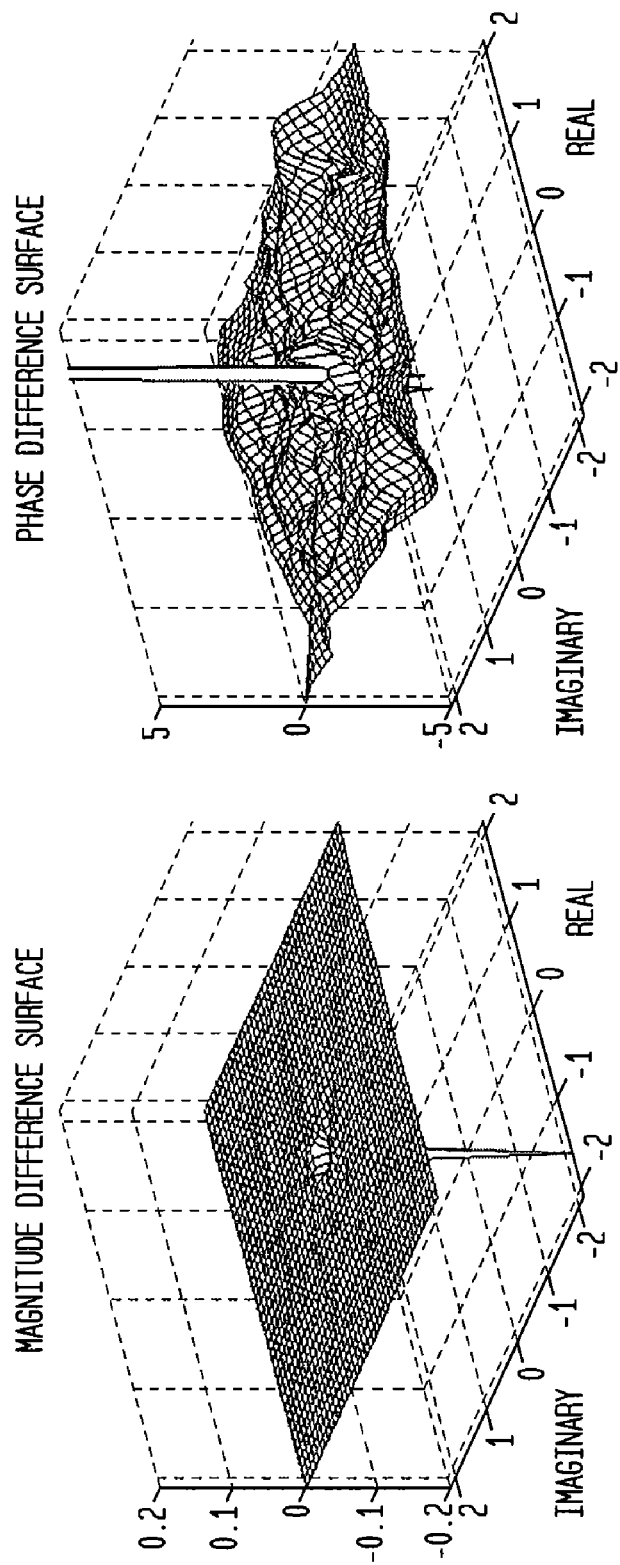
Figure 136:
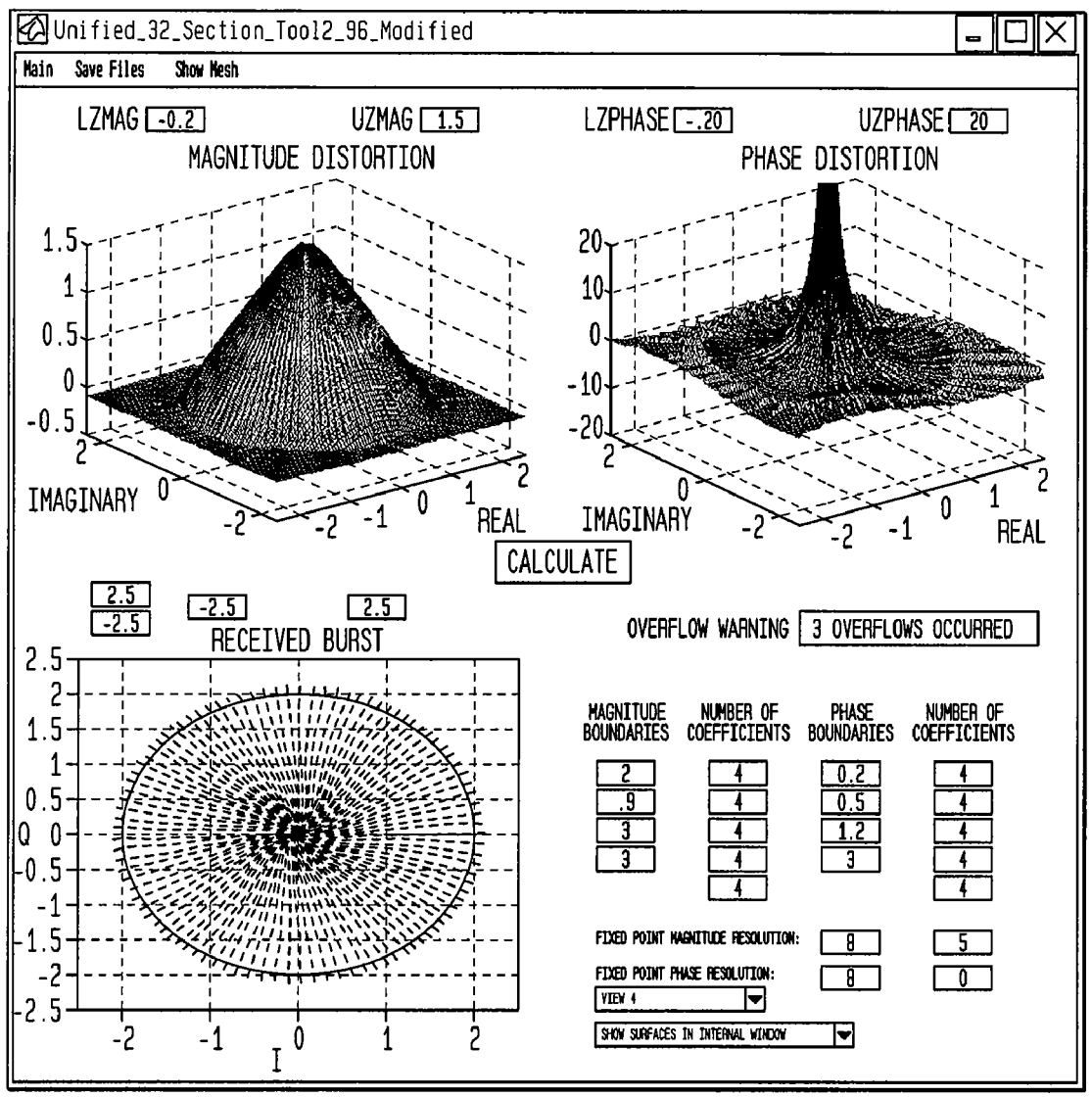
Figure 138:
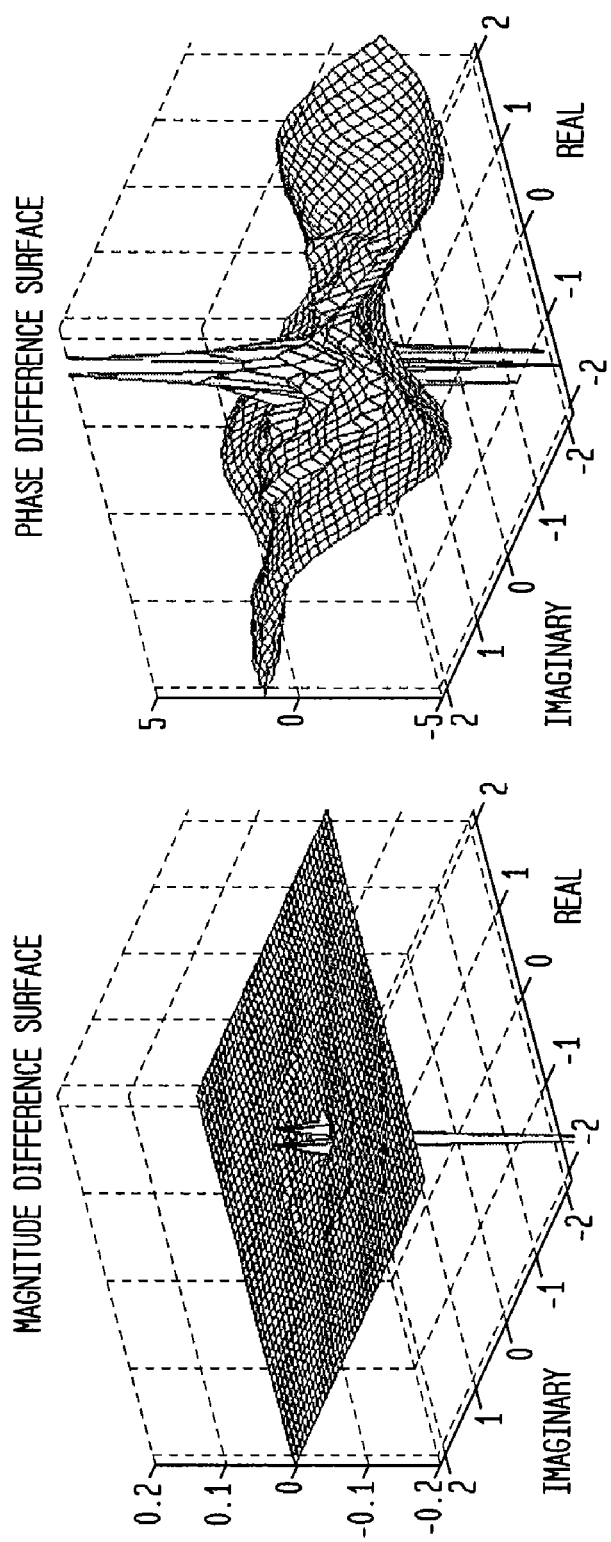

FIGS. 109-110 illustrate example results using the Chebyshev Fit algorithm for a 40 dB attenuation case.

(g) Upgraded Multi Radial Algorithms for WCDMA1_1

An upgraded experiment was run with to assess the upper band requirement for memory storage with the WCDMA1_1 waveform. The radials of the starburst calibration stimulus are averaged down to one arm for both phase and magnitude. Five (5) polynomials were utilized for phase and five (5) for magnitude. Eight (8) bit resolution was required for the coefficients describing third order polynomials and 80 bits were required to constrain the polynomial domains. This algorithm forces continuity constraints at the polynomial joins or knots. This results in 400 bits required to describe $D_{\epsilon_R}$ for each state of the system.

The following sequence figures (FIGS. 111-122) illustrate error surfaces at three different gain levels (0 dB, 22 dB, and 31 dB) as well as the required polynomial coefficients using this technique.

FIGS. 111-114 illustrate example results using the upgraded multi radial algorithm for a 0 dB attenuation case.

FIGS. 115-118 illustrate example results using the upgraded multi radial algorithm for a 22 dB attenuation case.

FIGS. 119-122 illustrate example results using the upgraded multi radial algorithm for a 31 dB attenuation case.

FIG. 123 provides a performance summary of the technique for a WCDMA1-1 waveform.

(h) EDGE Applications

Additional experiments were conducted to determine the amount of required information to support an accurate representation for $D_{\epsilon_R}$. The technique used is a 96 radial starburst with a variety of averaging options. The technique forces a continuity constraint at the polynomial joins or knots. Table 4 below illustrates example results of the number of bits required for $D_{\epsilon_R}$ representation versus gain for an EDGE waveform using this technique.

TABLE 4

| | Number of Bits for $D_{\epsilon_R}$ vs. Gain (EDGE Waveform) | | | | |
|---|---|---|---|---|---|
| Gain dB | Number of Averaged Radials | Number of Polynomials | Number of Coefficients | Resolution | Total Bits |
| 0 | 32 | 4 | 4 | 11 | 5632 |
| −2 | 16 | 4 | 4 | 11 | 2816 |
| −4 | 32 | 4 | 4 | 11 | 5632 |
| −6 | 32 | 4 | 4 | 11 | 5632 |
| −8 | 16 | 4 | 4 | 11 | 2816 |
| −10 | 16 | 4 | 4 | 11 | 2816 |
| −13 | 1 | 4 | 4 | 11 | 176 |
| −16 | 1 | 4 | 4 | 9 | 144 |
| −22 | 1 | 4 | 4 | 8 | 128 |

Accordingly, the worst case memory requirement per gain state is therefore 2×5632 bits, since each sample must be considered as complex. The average information required over all those states however is only 2×5744 bits.

The algorithm utilized above is not sophisticated and is not optimized in terms of memory usage. Hence, considerable improvement is possible, if more sophisticated methods are used.

A number of experiments have been conducted with an EDGE waveform to assess application of the compensation theories described herein. EDGE typically requires higher requirements for accurate compensation, especially at higher powers. Specifically, ACPR performance at 600 kHz offsets is typically challenging. The following sequence of figures (FIGS. 124-140) present example performance results obtained from the experiments using the technique described above.

FIGS. 124-127 illustrate example performance results for a 0 db attenuation case.

FIGS. 128-131 illustrate example performance results for a 6 db attenuation case.

FIGS. 132-135 illustrate example performance results for a 8 db attenuation case.

FIG. 136-139 illustrate example performance results for a 13 db attenuation case.

Figure 140:
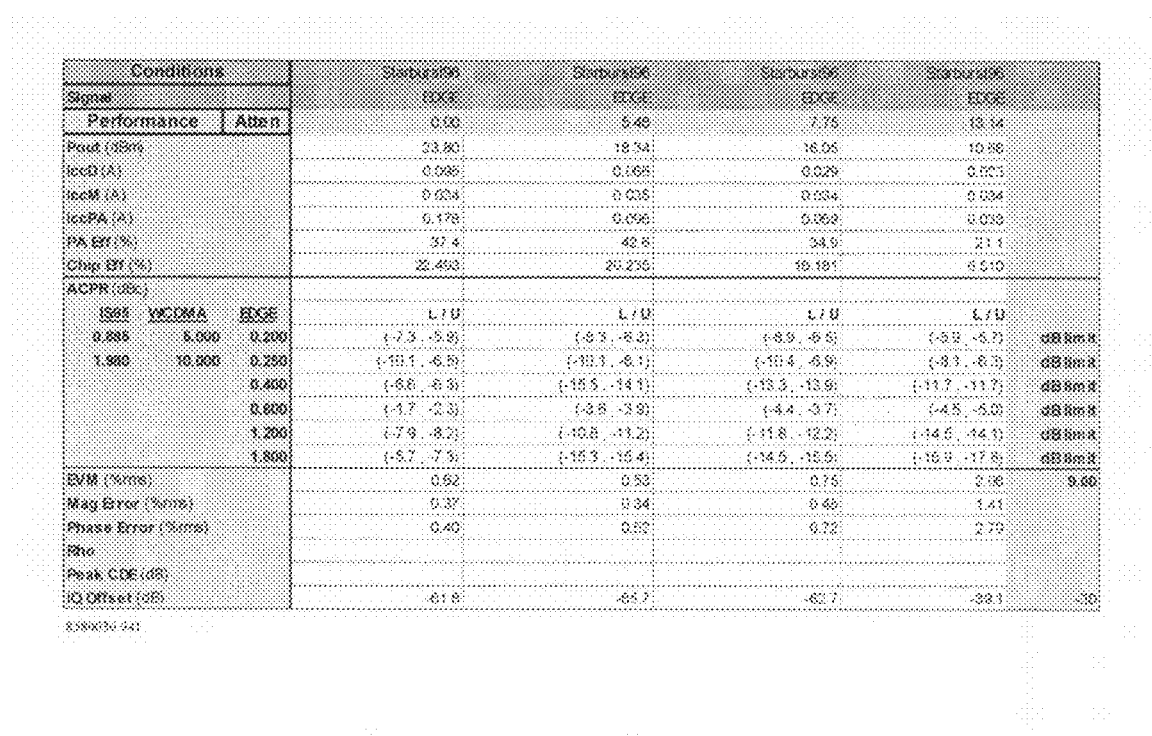

FIG. 140 provides a performance summary of the technique for an EDGE waveform.

(i) Interim Summary

Using the techniques disclosed in the previous sections, some tests were conducted to illustrate significant data reduction for applications involving the WCDMA1_1 and EDGE waveforms.

FIG. 141 illustrates the functional relationships for calibration parameters as described in Section 1(a).

An application was run with a single averaged radial (averaged out of 48 primary starburst radials) for WCDMA. The averaged radial was approximated by a 5 polynomial piecewise solution with 8 bit coefficients, for both magnitude and phase. 40 bits were required for domain definition of the segments.

Also, an EDGE application was run which required a worst case 32 out of 96 radial average from a starburst. Four (4) polynomial segments were required for each polynomial and 11 bit coefficients were required. Third order polynomials were utilized for each segment. Fifty five (55) bits were required to define the domains, for magnitude and for phase.

FIG. 142 illustrates calibration memory estimates for $D_{\epsilon_R}$ for WCDMA and EDGE according to an embodiment of the present invention.

FIG. 143 illustrates memory requirements for the operational calibration parameters according to an embodiment of the present invention.

FIG. 144 illustrates memory requirements for the modulation calibration parameters according to an embodiment of the present invention.

FIG. 145 illustrates total memory requirements for WCDMA and EDGE according to an embodiment of the present invention.

According to an embodiment, 1000 states are reserved to account for Functional Calibration Parameters, or total dimensionality of the space. Less than 1000 states are required because of the techniques applied based on principles disclosed herein. As a point of reference, prior implementations required more than 2 G-Bytes per waveform to achieve similar quality. This represents a reduction factor of greater than 1000:1.

14. HARDWARE FOR 'REAL TIME OPERATION'

This section provides example implementations to combine a correction algorithm with the VPA architecture to enable an application using 'real time' hardware.

Figure 146:
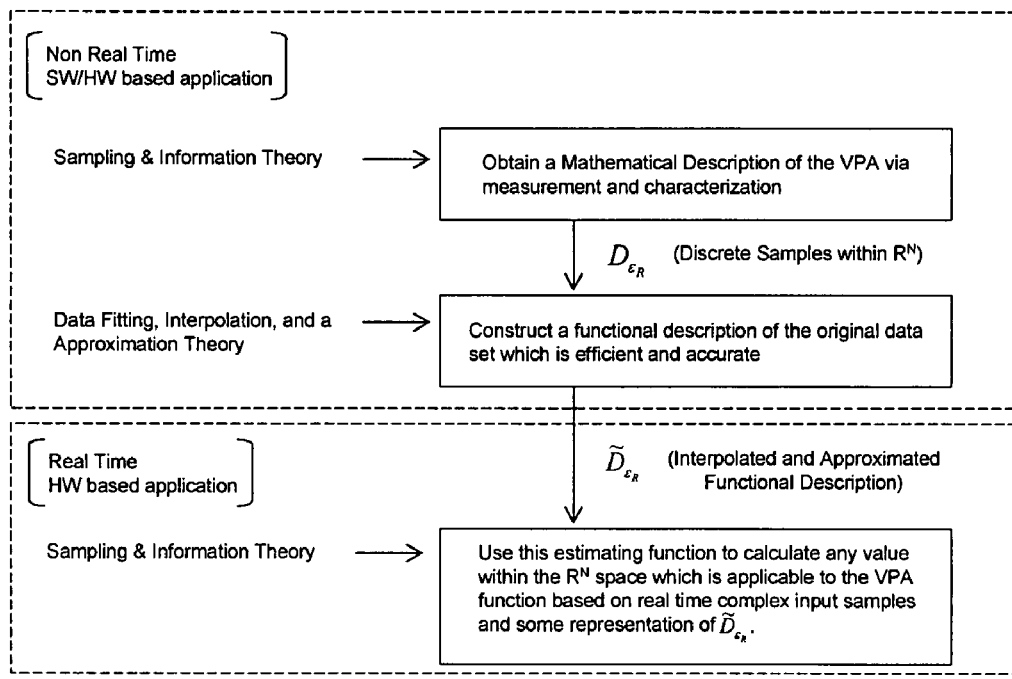
FIG. 146 illustrates an example partitioning of functions of a correction algorithm into non-real time and real-time portions.

FIG. 146 illustrates an example partitioning of functions of the correction algorithm into 'non real time' and 'real time' portions.

Figure 147:
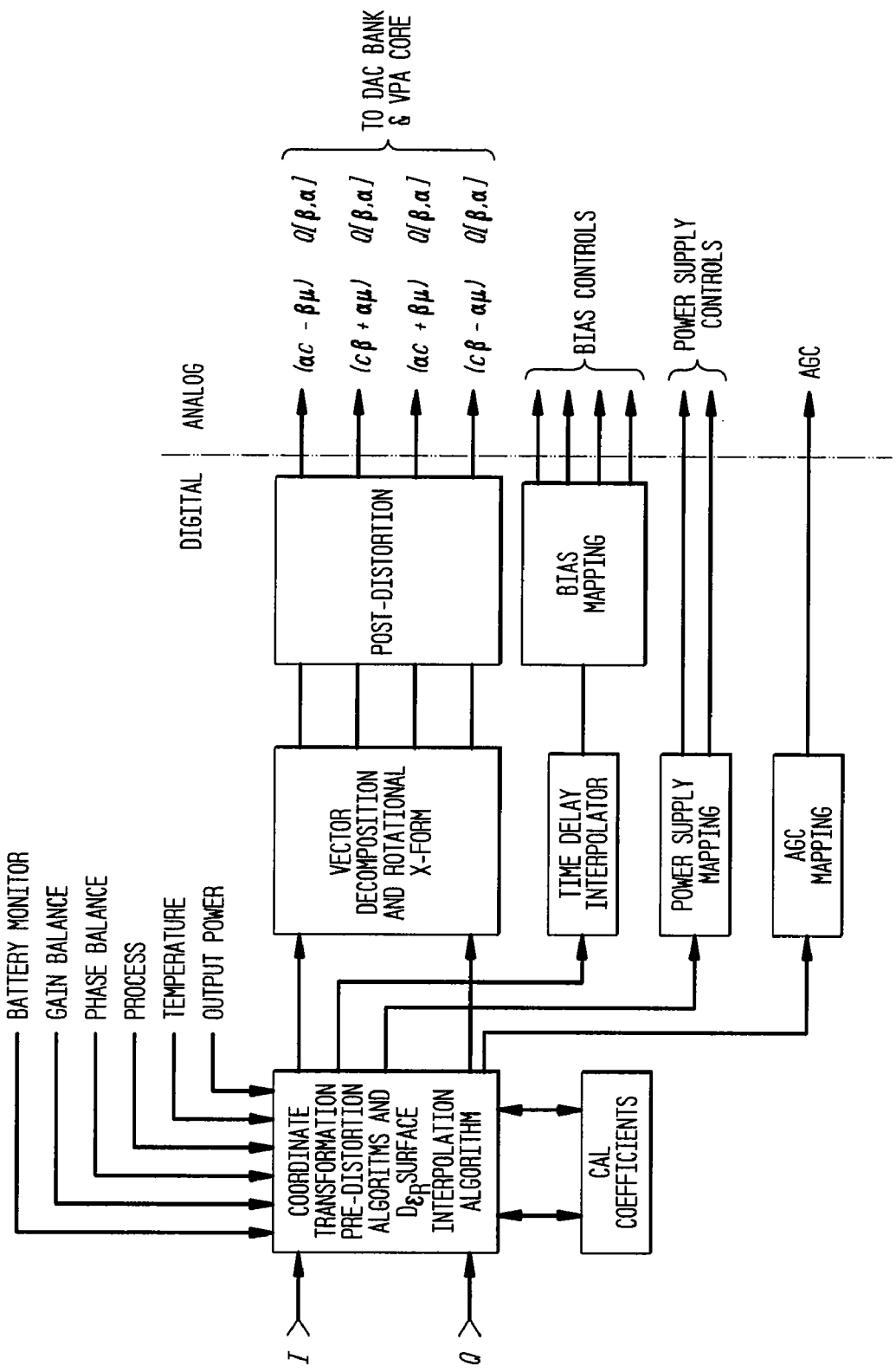
FIG. 147 illustrates an example approach to combine real time portions of a correction algorithm within a VPA.

The real time portions of the correction algorithm can be combined into the VPA algorithm as illustrated in FIG. 147. The $D_{\epsilon_R}$ surface interpolation algorithms interact with the vector decomposition core to provide a corrected transfer characteristic. The error surface interpolation algorithms may be further described in terms of hardware implementation using the following high level block descriptions:

Polynomial Interpolators
Orthogonal Polynomial Interpolators
Spline Interpolators
Tensor Product Interpolators
Patch Operators These structures can be utilized independently or collectively to realize an efficient solution. The following sections describe block diagrams associated with these functions which provide a basis for hardware development to execute the algorithms in 'real time'.

(a) Polynomial Interpolator

Once the mathematical description of the error function $D_{\epsilon_R}$ has been reduced to a set of coefficients stored in a memory, the coefficients can be utilized in a real time application to reconstruct and compensate for error.

Figure 148:
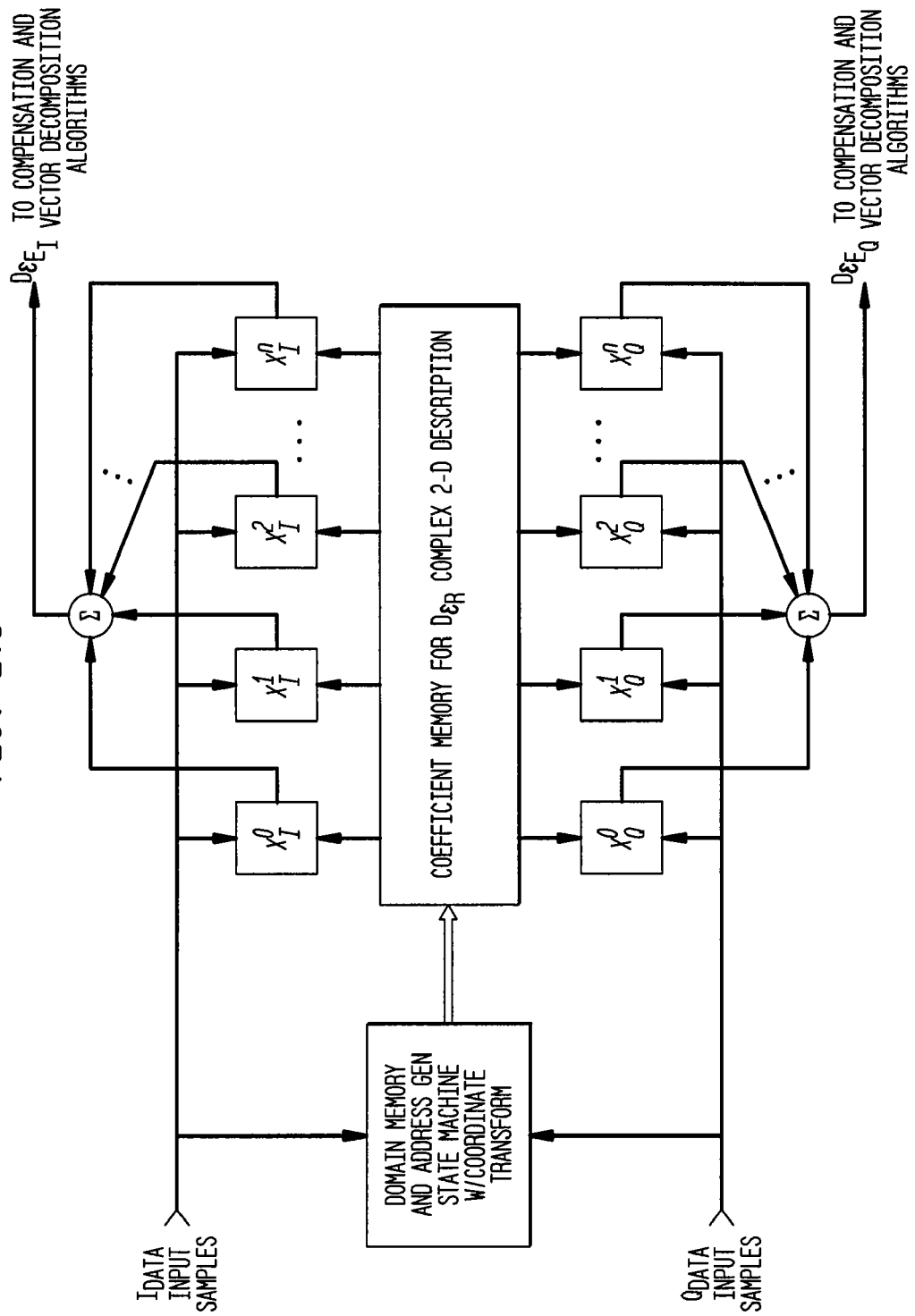
FIG. 148 illustrates an example Type I interpolator.

One method, which is suitable when the functional error description is algebraic polynomial based, is to reconstruct the complex data representation of $D_{\epsilon_R}$ based on the incoming complex data sample stream. FIG. 148 is a block diagram that illustrates an interpolator capable of implementing this approach, according to an embodiment of the present invention.

FIG. 148 illustrates the application of interpolation prior to vector decomposition, which renders a dual thread complex stream for $D_{\epsilon_R}$. The numbers are rectangular in format but can also be polar without restriction. It is also possible to construct the error function after vector decomposition. However, this requires a quad thread signal flow and is not illustrated in FIG. 148.

The interpolator illustrated in FIG. 148 uses the incoming data stream as a metric for indexing the position within the 2-D complex plane for which $D_{\epsilon_R}$ must be obtained 'on the fly'. The I and Q data is accessed by a state machine which calculates partitions for the algebraic polynomial descriptions. The domain descriptions are coordinate boundaries which apply to the polynomials. A bank of non-linear power operators are required for the real and imaginary portions of the complex numbers to implement each coefficient weighted term of the power series defining the polynomial.

The summed outputs from the $c_i x^n$ operations reconstitutes the polynomial description of the surface on a sample by sample basis. Each sample represents a single point on the error surface $D_{\epsilon_R}$, which in turn corresponds to a particular complex data sample. In some embodiments, the polynomial may represent a literal surface function. In other embodiments, a rotational transform can be applied to redistribute an averaged contour or single thread error locus over the error surface at various angles, as is the case for an averaged radial error function, for example. In such cases, the pre-averaged contour is redeployed via some specific transformation, such as a radial or rotational transform. This methodology significantly reduces the memory overhead for reconstructing $D_{\epsilon_R}$ and the interpolator hardware. This trade off comes at an expense of running real time hardware.

The Type I interpolator illustrated in FIG. 148 is suitable for applications where error surfaces to be interpolated are symmetric, for example. As would be understood by a person skilled in the art based on the teachings herein, a more general form interpolator may be required when the error surfaces are more complicated with asymmetric curvatures.

Figure 149:
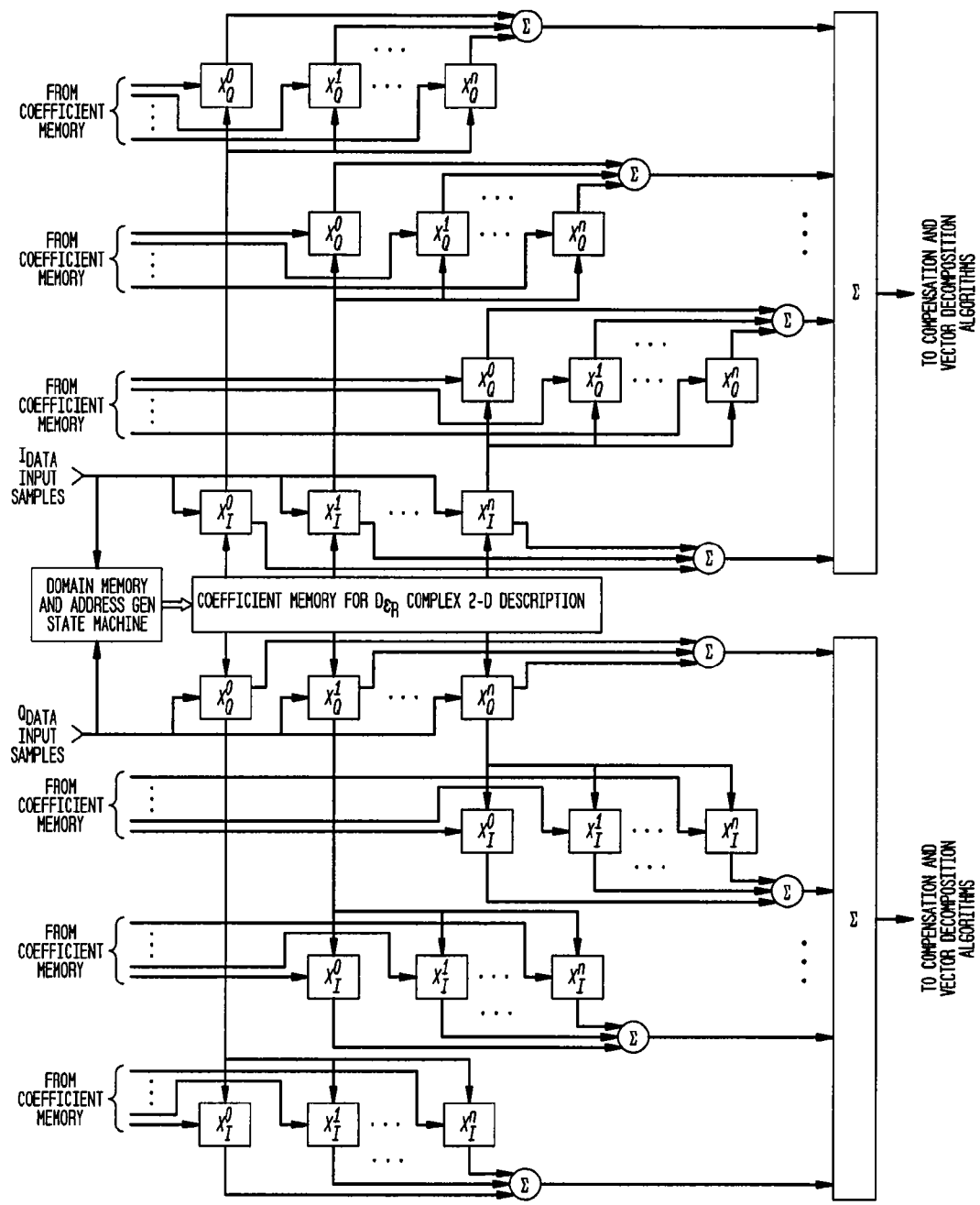
FIG. 149 illustrates an example Type II interpolator.

FIG. 149 is a block diagram of a Type II interpolator according to an embodiment of the present invention. The interpolator of FIG. 149 enables dyadic calculations 'on the fly' and accommodates hybrid algebraic tensor operations. It can be constructed as an extension of the Type I architecture illustrated in FIG. 148.

Note that the most general $I^r \cdot Q^m$ combinations and permutations can be explicitly formed on the fly with this structure. Rarely would every coefficient and every tensor product be required. Coefficients can be 'zeroed' to reduce the architecture to a Type I interpolator. Coefficients can also be weighted to obtain virtually any non-linear surface description for $D_{\epsilon_R}$, subject to the constraint, n.

(b) Spline Interpolator

Spline Error Surface reconstruction was addressed in Sections 8 and 9. As described above, once suitable coefficients are obtained, they are stored in a memory and re-called as required in the reconstruction process. Two categories of approaches according to the present invention are illustrated in this section, polynomial reconstruction (Types I and II) and filter based reconstruction.

Types I and II approaches build or generate the spline in a piecewise manner and re-assemble the splines according to a weighting function (see Section 8) relating to $D_{\epsilon_R}$. Filter based approaches are typically more efficient and rely on the principles of the spline transforms presented in Section 8.

Figure 150:
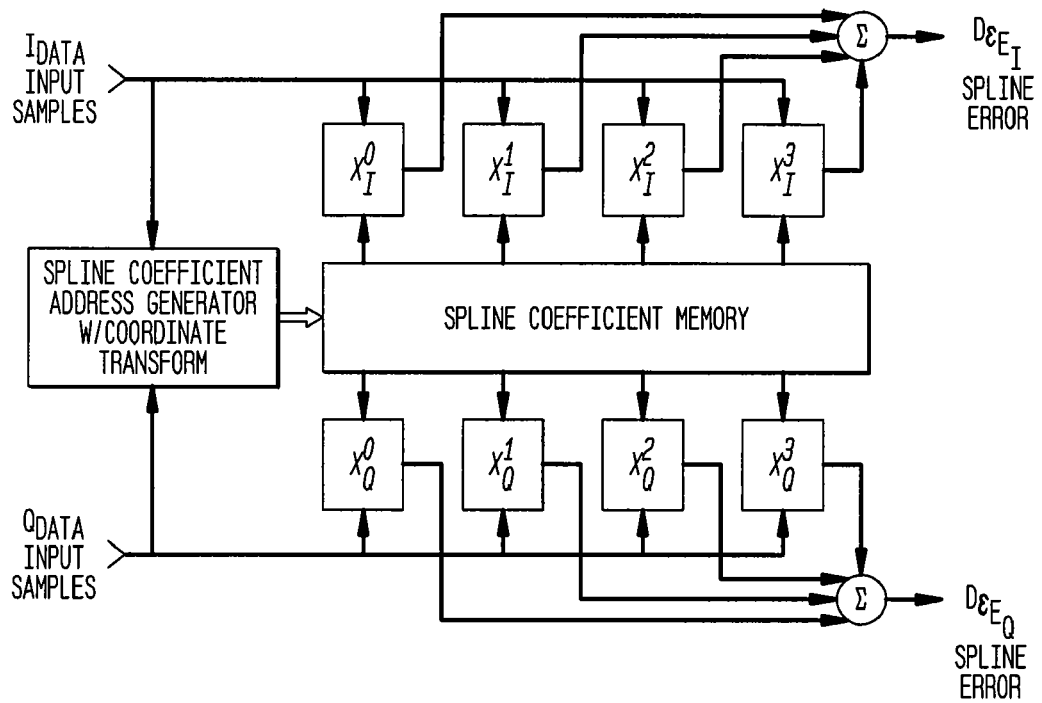
FIG. 150 illustrates a Type I spline generator core.
Figure 151:
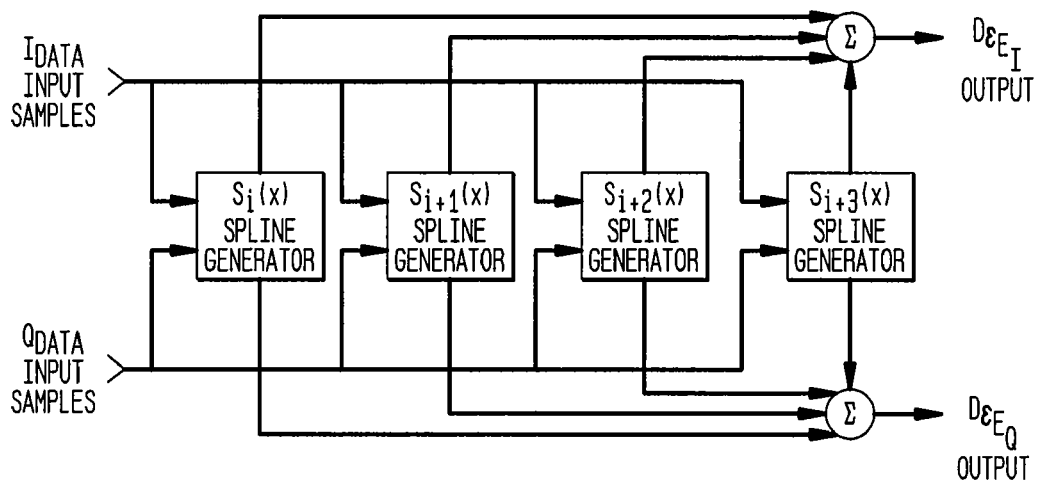
FIG. 151 illustrates an example Type I spline interpolator.

The basic third order spline consisting of 4 segments is constructed in much the same manner as any third order polynomial. The normal spline coefficients are stored in a form prescaled according to the error function, $D_{\epsilon_R}$. Since the spline sampler consists of multiple segments, a single structure running sequentially will suffice for the fundamental spline generation. FIG. 150 is a block diagram that illustrates Type I spline generator core. The spline interpolator uses four spline generator cores to create a complex sample for the reconstructed error surface, as illustrated in FIG. 151. Four cores are required due to the deliberate ISI (Inter-Symbol Interference) introduced with the spline technique. A polar format of the spline interpolator shown in FIG. 151 is also possible. As in the case of algebraic polynomial reconstruction, the memory address/state machine function also implements coordinate transformations which exploit certain error surface redundancies, and therefore reduces memory requirements under certain circumstances.

Figure 152:
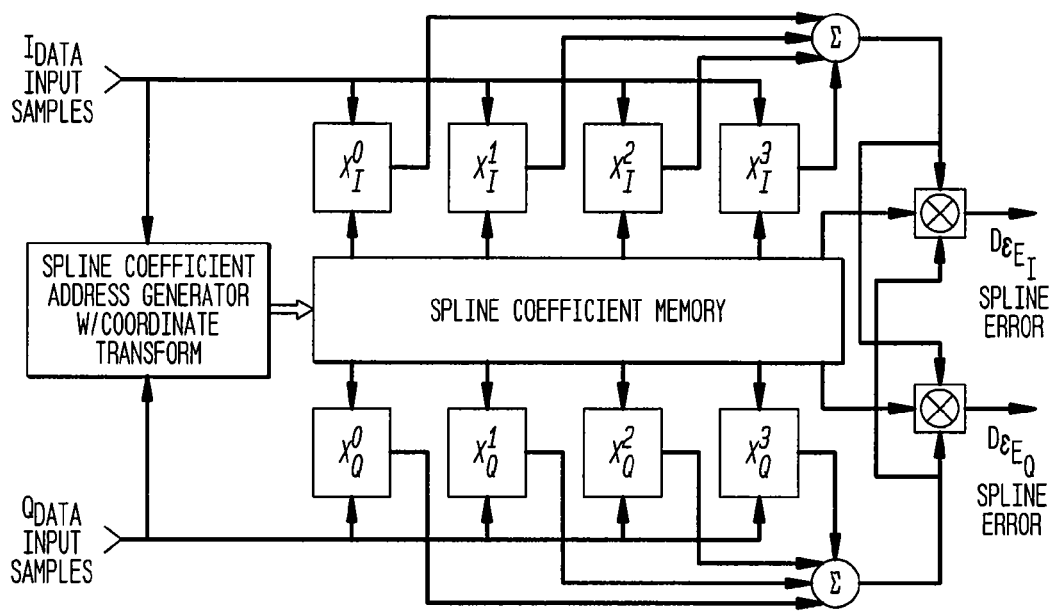
FIG. 152 illustrates an example Type II spline generator core.
Figure 153:
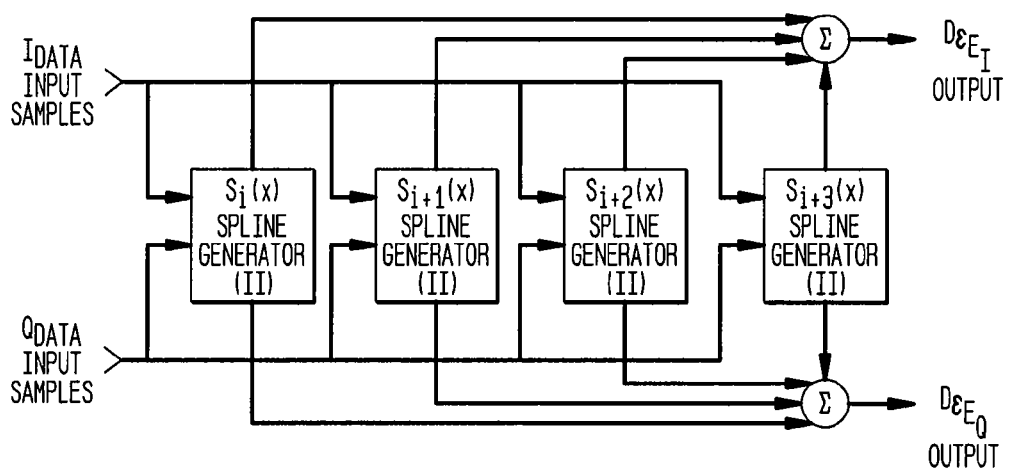
FIG. 153 illustrates a Type II spline interpolator.

If the error surface consists of significant asymmetric distortions, then a more general B-Spline interpolator function is required consisting of all combinations and permutations of dyadic tensor operations. This structure is illustrated as a Type II spline interpolator in FIG. 153. FIG. 152 is a block diagram that illustrates a Type II spline generator core. The spline generator core includes a dyadic tensor multiplication between the orthogonal spline reconstructions.

(i) Filter Based Spline Interpolator

When coefficients a(k) are calculated according to the convolution and filter techniques presented in Section 8, they can be stored and used to reconstruct waveforms efficiently. Error surface coefficients are recalled from memory and run through the filter with the transfer function $B^3()$. This filter reconstructs the error surface using third order spline interpolation.

The error function reconstruction synchronizes with incoming I, Q data for compensation to be applied. This synchronization is accomplished by a memory management state machine providing for the appropriate domain of coefficient acquisition.

Figure 154:
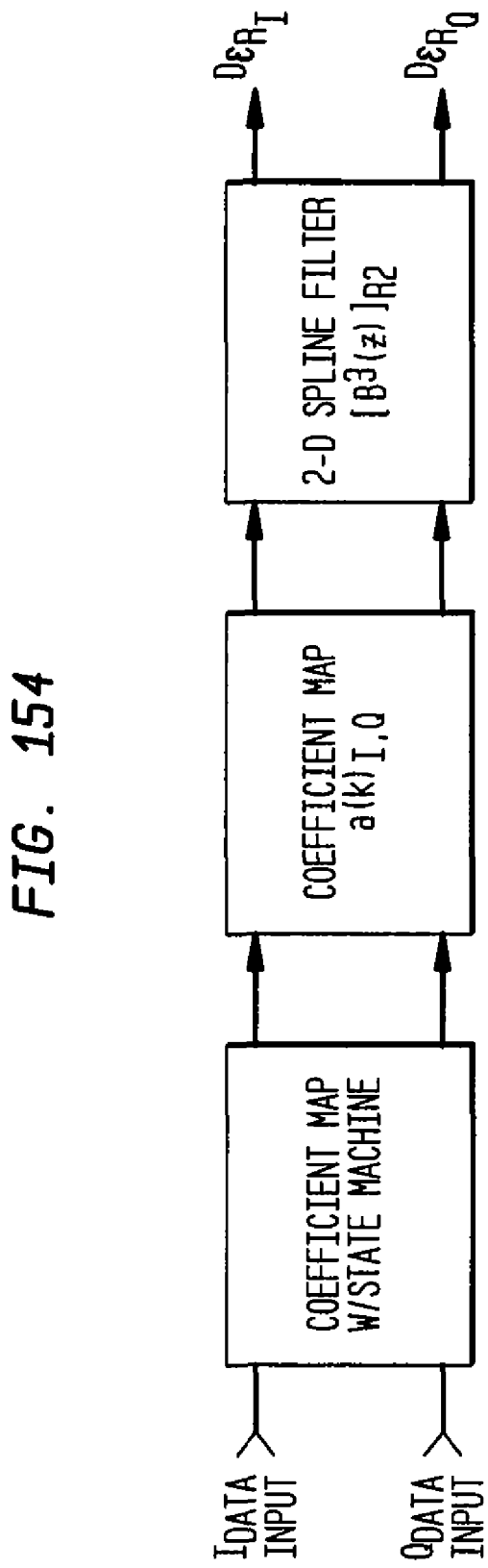
FIG. 154 illustrates a filter based spline interpolator.

FIG. 154 is a block diagram that illustrates this approach. The I and Q paths may be treated independently or as a complex number. A single real sample consists of three additions and three multiply operations within the filter. Four complex coefficients are required for the filter at each sample. Under certain conditions, the computational complexity may be reduced to two complex additions and two complex multiplications per complex sample, with an additional scaling procedure.

15. SUMMARY

Novel techniques for error compensation are provided herein. These techniques can be applied to a myriad of applications for which an input to output transfer characteristic must be corrected or linearized. This disclosure has shown that in particular, systems that process signals or inputs which can be described by complex math in 2 dimensions, can also possess a corresponding complex output signal description that may be compared to some ideal desired output signal. The difference between the measured and ideal is associated with an error function or error data, $D_{\epsilon_R}$, and can be exploited to compensate the system.

$D_{\epsilon_R}$ begins as a raw data set from the above described comparison and morphs into a compact mathematical description which eliminates the requirement to store all compared data points of the original difference measurements. This compact mathematical description may further be optimized in 2, 3, or higher order dimensions to minimize the amount of data stored using a variety of techniques and principles associated with approximation theory, data fitting, interpolation theory, information theory, tensor analysis, spline theory, as well as a plethora of disciplines related to geometric modeling.

This approach permits a convenient partition of resources in the VPA application. Some extensive data processing can be accomplished off line in 'non real time', which characterizes the compact mathematical descriptions. Once the 'off line' number calculation is complete, the compact formulation is stored in the form of coefficients in a memory. The memory possesses a description of $D_{\epsilon_R}$ that hardware can utilize to provide corrective compensation in a 'real time' application very efficiently.

VPA based designs utilizing these techniques maintain excellent performance metrics while maintaining high power efficiency for many types of waveform standards in a unified design, with only a modest amount of memory and associated correction hardware. This blend of attributes is exceedingly desirable and can be flexibly tailored using the principles provided herein.

According to embodiments of the present invention, error can be described $D_{\epsilon_R}$, processed, and geometrically interpreted. Raw error data is assigned to coordinates of a 2, 3, or higher order dimensional space. Then contours, surfaces, and manifolds can be constructed within the space to fit the raw data in an optimal sense subject to some important criteria. These contours, surfaces, and manifolds can be described in terms of convenient functions with a minimum amount of memory over specified domains, and may be used to reconstruct interpolated data over a continuum of points, reconstructing new data sets many orders of magnitude larger than the original memory used to describe the various original geometrical structures and their domains. Furthermore, the memory based algorithm can execute in 'real time' hardware very efficiently, thereby rendering practical designs.

All manners of compensation requirements are contemplated by the techniques provided herein. Temperature effects, power supply drift, power gain variations, process variation and many other imperfections can be addressed as parameters of the compensation space or dimensions of the compensation space. In this manner, a high order geometrical interpretation of $D_{\epsilon_R}$ can characterize system errors for virtually all imperfections, including the non-linearities of the input/output transfer characteristic. This does not preclude the simultaneous use of slow feedback adjustments to assist the open loop algorithm to enhance yield or increase performance.

Embodiments of the present invention provided herein advocate the compact formulation of correction and calibration functions which reduces memory requirements as well as computational time and associated math operations related to VPA operation. Embodiments are addressed to VPA applications. However, they can be applied to any linear or non-linear system which can be represented in an N order geometrical description.

Embodiments of the present invention introduce methods for characterizing a distorted space by mathematical functions or describing non-linearities of trajectories through the space by functions, apply these descriptions to some definition of an error function $D_{\epsilon_R}$, then use $D_{\epsilon_R}$ to either linearize the space or correct non-linearities within the functional trajectories. The proposed techniques are specifically applied to D2P VPA compensation and correction. Typically, RF power amplifiers are compensated with real time feed forward or feed back loops which seek to reduce intermod products by 'on the fly analog circuits' or DSP algorithms. Such approaches do not reconstruct general mathematical functional descriptions of errors prior to execution. Rather, errors are manipulated point by point in virtual real time on the fly with algorithmic convergence determined by control loops. In contrast, the algorithms provided herein fully describe an N-dimensional space by mathmatical functions such that the distortion of the space is completely known apriori without storing raw data from the space. Only the data required to describe spatial distortion is stored. This provides a significant advantage in data storage requirements to achieve a specified performance for the VPA.

According to embodiments of the present invention, error information is related to a geometric shape, or contour of the space, and significantly related to the 'tension' or 'latent energy' of the space, not directly to point wise errors encountered in time as the application runs. This approach permits much more efficient calculations which transform scalars, vectors, tensors, and indeed the space itself, and can be accommodated by linear algebra.

16. APPENDIX A

Bibliography

The following references are incorporated herein by reference in their entireties.

| | |
|---|---|
| ATKINSON, Kendall E | On the Order of Convergence of Natural Cubic Spline Interpolation. SIAM Journal on Numerical Analysis, Volume 5, No. 1, Pg. 89-101, March 1968 |
| BAJAJ, Chandrajit L, GUOLIANG, Xu | Error Bounded Regular Algebraic Spline Curves (Extended Abstract) |
| BORISENKO, A. I., and TARAPOV, I. E | Vector and Tensor Analysis with Applications. Dover Publications, Inc., New York, 1979 |
| BOURKE, Paul.,: | Bicubic Interpolation For Image Scaling. May 2001 |
| BUHMANN, Martin D | Radial Basis Functions. Cambridge Monographs on Applied and Computational Mathematics, 2003 |
| BUSE, A., and LIM, L.,: | Cubic Splines as a Special Case of Restricted Least Squares. Journal of the American Statistical Association, Volume 72, No. 357, March 1977 |
| COX, M. G., and HAYES, J. G | Curve Fitting: a Guide and Suite of Algorithms For the Non-Specialist User. National Physical Laboratory NPL/NAC, December 1973 |
| CUTHBERT, Daniel, and WOOD, Fred S | Fitting Equations to Data Computer Analysis of Multifactor Data. Second Edition, Wiley Classics Library Edition, 1999 |
| de BOOR, Carl | A Practical Guide to Splines. Applied Mathematical Sciences, Volume 27, |

-continued

| | |
|---|---|
| de BOOR, Carl | On Calculating with B-Splines. JIMA, Journal of Approximation Theory, Volume 6, Pg. 50-62, 1972 |
| de BOOR, Carl, and RICE, John R., | Least Squares Cubic Spline Approximation II - Variable Knots. *This work was initiated at the General Motors Research Labs. The final stages were partially supported by NSF Grant GP-7163. |
| FORD, Walter B | A Brief Course In Analytic Geometry and The Elements of Curve-Fitting. Henry Holt and Company, New York, 1924 |
| GREVILLE, T. N. E | Data fitting by spline functions. M.R.C. Technical Summary Report No. 893, 1968. Mathematics Research Center, U.S. Army, University of Wisconsin, Madison, Wisconsin |
| HAYES, D. G | A method of storing the orthogonal polynomials used for curve and surface fitting. Computer Journal, Volume 12, Pg.148-250, 1969 |
| HAYES, J. G | Numerical Approximation to Functions and Data. Based on a conference organized by the Institute of Mathematics and Its Applications, Canterbury, England, 1967. Published for The Institute of Mathematics and Its Applications by University of London, The Athlone Press, 1970 |
| HAYES, J. G., and HALLIDAY, J | The Least-Squares Fitting of Cubic Spline Surfaces to General Data Sets. (J. Inst. Maths Applics (1974) 89-103 |
| HAYES, J. G.,: | Numerical Approximation to Functions and Data. The Institute of Mathematics and Its Applications by University of London, The Athlone Press 1970 |
| KIDNER, David, DOREY, Mark, and SMITH, Derek | What's the point? Interpolation and extrapolation with a regular grid DEM. GeoComputation 99 |
| KNOWLES, James K | Linear Vector Spaces and Cartesian Tensors. California Institute of Technology, Published by Oxford University Press, New York, NY, 1998 |
| LAWSON, Charles L., and HANSON, Richard J | Solving Least Squares Problems. SIAM Classics In Applied Mathematics, 1995 |
| LEBEDEV, Leonid P., and CLOUD, Michael J | Tensor Analysis. World Scientific Publishing Company, 2003 |
| LORENTZ, G. G | Approximation of Functions. Chelsea Publishing Company, New York, New York, 1966 |
| MALCEVIC, Ivan | 2D Contour Smoothing. Geometric Modeling 98 - Project Report |
| MEINARDUS, G | Approximation of Functions: Theory and Numerical Methods. Springer Tracts in Natural Philosophy Volume 13, Springer-Berlag New York Inc. 1967 |
| MILNE, William Edmund | Numerical Calculus Approximations, Interpolation, Finite Differences, Numerical Integration, and Curve Fitting. Princeton University Press, Princeton, New Jersey, 1949 |
| NATANSON, I. P. | Constructive Function Theory. Volume I Uniform Approximation, Frederick Ungar Publishing Co., New York 1964 |
| RICE, John R | The Approximation of Functions. Volume 2 Non-linear and Multivariate Theory. Addison-Wesley Publishing Company, 1969 |
| RIVLIN, Theodore, J. | An Introduction to the Approximation of Functions. Dover Publications, Inc., New York, 1969 |
| SIMMONDS, James G. | A Brief on Tensor Analysis. Second Edition, Springer-Verlag New York, Inc. Publisher, 1982, 1994 |
| SRECKOVIC, Milan | Adaptive Hierarchical Fitting of Curves and Surfaces. A thesis presented to the University of Waterloo, Waterloo, Ontario, Canada 1992 |
| TORAICHI, Kazuo, YANG, Sai, MASARU, Kamada, and RYOICHI, Mori | Two-Dimensional Spline Interpolation For Image Reconstruction. Pattern Recognition, Volume 21, No. 3, 1988 |
| UNSER, Michael and ALDROUBI, Akram | A General Sampling Theory for Nonideal Acquisition Devices. IEEE Transactions on Signal Processing, Volume 42, No. 11, Pg. 2915-2925, November 1994 |
| UNSER, Michael, ALDROUBI, Akram, and MURRAY, Eden | B-Spline Signal Processing: Part I - Theory. IEEE Transactions on Signal Processing, Volume 41, No. 2, Pg. 821-833, February 1993 |
| UNSER, Michael, ALDROUBI, Akram, and MURRAY, Eden | B-Spline Signal Processing: Part II - Efficient Design and Applications. IEEE Transactions on Signal Processing, Volume 41, No. 2, Pg. 834-848, February 1993 |
| WALSH, J. L | Interpolation and Approximation by Rational Functions in the Complex Domain. American Mathematical Society Colloquium Publications Volume XX, Providence, Rhode Island, 1965 |
| WANG, Wenping, POTTMANN, Helmut, and LIU, Yang | Fitting B-Spline Curves to Point Clouds by Squared Distance Minimization. |

| | |
|---|---|
| WIENER, Norbert | Extrapolation, Interpolation, and Smoothing of Stationary Time Series. The Technology Press of The Massachusetts Institute of Technology and John Wiley & Sons, Inc., New York, New York, 1950 |
| YEE, Paul V., and HAYKIN, Simon | Regularized Radial Basis Function Networks Theory and Applications. John Wiley & Sons, 2001 |

17. APPENDIX B

This appendix forms part of the disclosure of the current patent application.

(a) Equation of a Radial Line in Rectangular and Polar Coordinates

The equation of a line in $R_c^2$ is a well known form;

$$y = mX + b$$

m $\triangleq$ Slope
b $\triangleq$ y Intercept

In the case of a radial line, b=0 and therefore a family of lines beginning at the origin can be obtained from:

$$y = mX \quad \infty < m < \infty$$

Figure 155:
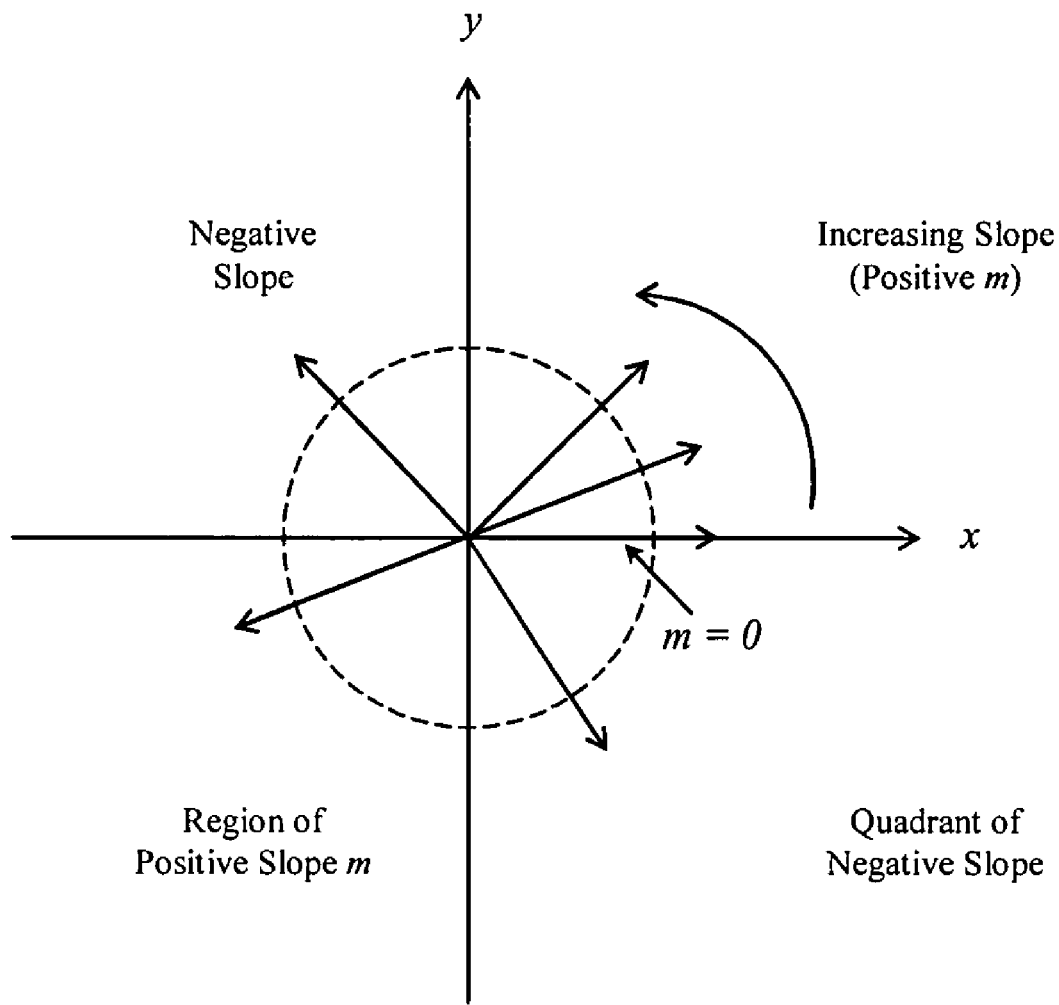
FIG. 155 illustrates a family of radials that can be obtained from a line equation.

FIG. 155 illustrates a family of radials that can be obtained from y=mX.

Any coordinate on a radial line is specified completely from $f(x,y)$ and m. The lines may be defined over limited intervals or truncated by:

$$y = mx[u(x) - u(x-x^0)], \quad x_0 \triangleq \sqrt{r_0^2 - y_0^2},$$

where $u(x-x_0)$ is a unit step function and $r_0$ is the radial magnitude.

Transforming to polar form yields the following:

$$r = \sqrt{x^2 + y^2}$$

$$x = r \cos \Theta$$

$$y = r \sin \Theta$$

Figure 156:
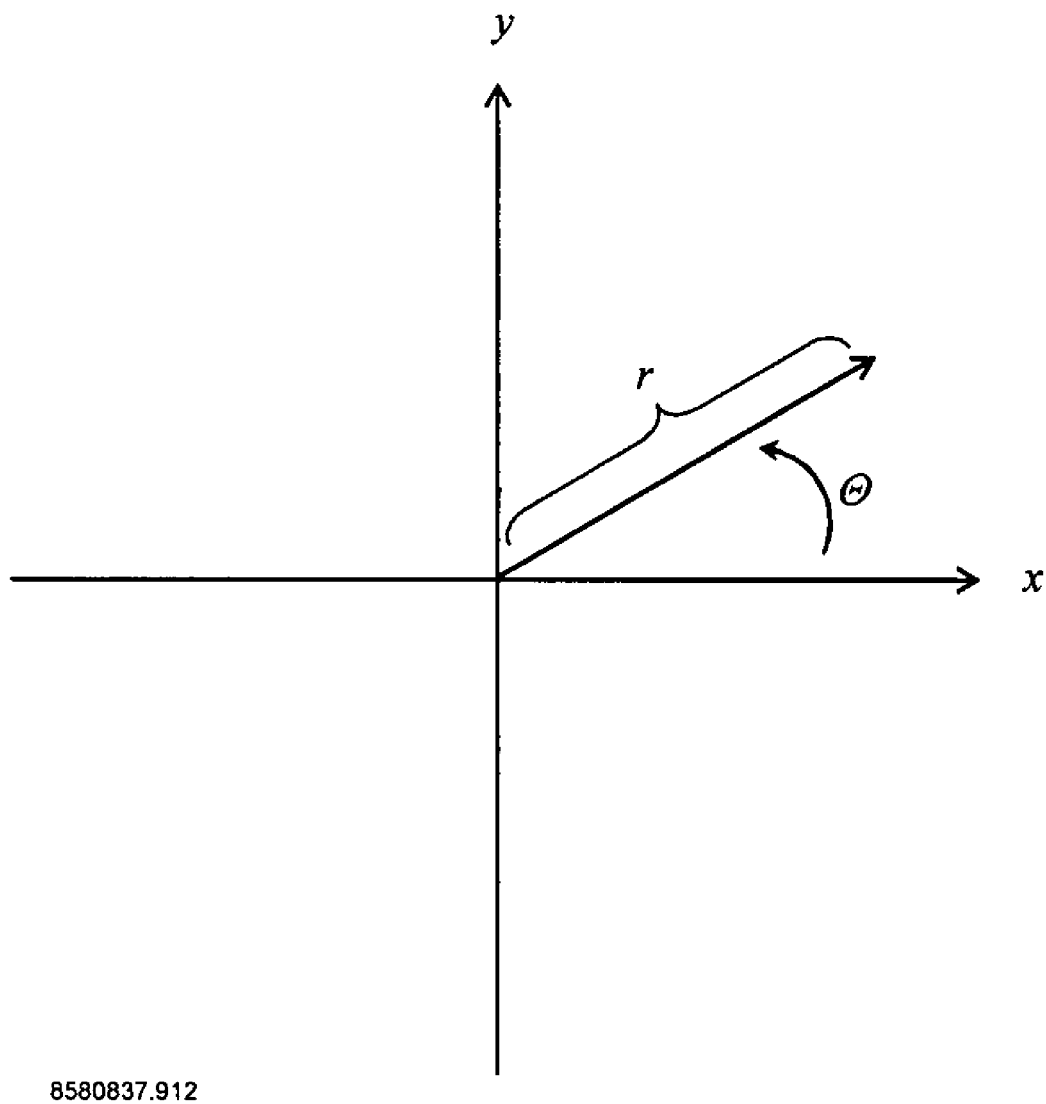
FIG. 156 illustrates polar transformation.

Polar transformation is illustrated in FIG. 156. In Polar form, the radial line takes the form:

$$r \sin\Theta = m(r \cos\Theta)$$

$$m = \frac{\sin\Theta}{\cos\Theta} \quad -\infty < m < \infty$$

Any coordinate on a radial line is completely specified by $f(r,\Theta)$, $f(r,\Theta) = \{r,\Theta_0\}$ in polar form. $\Theta$ is held constant for a particular radial line. This fact is very convenient for many operations within the complex signaling plane. In complex phasor notation, the radial is defined by $f(r,\Theta) = re^{-j(\omega t + \Theta_0)}$.

As previously noted the radial may be truncated as follows:

$$f(r,\Theta) = \{r,\Theta_0\}(u(r) - u(r-r_0)) \quad \text{Truncated Radial Line}$$

$$f(r,\Theta) = re^{-j(\omega t + \Theta_0)}(u(r)u(r-r_0)) \quad \text{Complex Phasor Notation}$$

(b) Equation of Circle in Cartesian and Polar Coordinates

The equation for a concentric circle in the Cartesian plane is:

$$x^2 + y^2 = r_0^2 \quad (r \text{ is held constant})$$

$$r_0 \triangleq \quad \text{The Circle Radius}$$

In polar form, this becomes:

$$r^2(\cos^2\Theta + \sin^2\Theta) = r^2 \quad (r \text{ is held constant})$$

Thus any coordinate on the circle can be found from the constant $r = r_0$ and the variable $\Theta$.

(c) Cubic B Spline in Polar Coordinates

The basic Cartesian cubic spline is:

$$S(x) = \alpha x^3 + \beta x^2 + \gamma x + \delta + \sum_{i=1}^{3} a_i |(x - k_i)|^3$$

In polar form, it can be written as:

$$S(r,\Theta) = \alpha(r\cos\Theta)^3 + \beta(r\cos\Theta)^2 + \gamma(r\cos\Theta) + \delta + \sum_{i=1}^{3} a_i |r\cos\Theta - k_i|^3$$

The knots $k_i$ are given in terms of their $(r_i, \Theta_i)$ coordinates. This form should not be confused with the polar spline derived in Section 8(c). The form provided here is simply a convenient reference for a transformed version of a Cartesian Cubic B Spline.

(d) Gradients in Cartesian and Cylindrical Coordinates $$\nabla f = \frac{\partial f}{\partial x} \vec{a}_x + \frac{\partial f}{\partial y} \vec{a}_y + \frac{\partial f}{\partial z} \vec{a}_z \quad \text{Cartesian Form}$$

$$\nabla f = \frac{\partial f}{\partial r} \vec{a}_r + \frac{1}{r} \frac{\partial f}{\partial \phi} \vec{a}_\phi + \frac{\partial f}{\partial z} \vec{a}_z \quad \text{Cylindrical Form}$$

18. APPENDIX C

This appendix forms part of the disclosure of the current patent application.

(a) Methods

Figure 157:
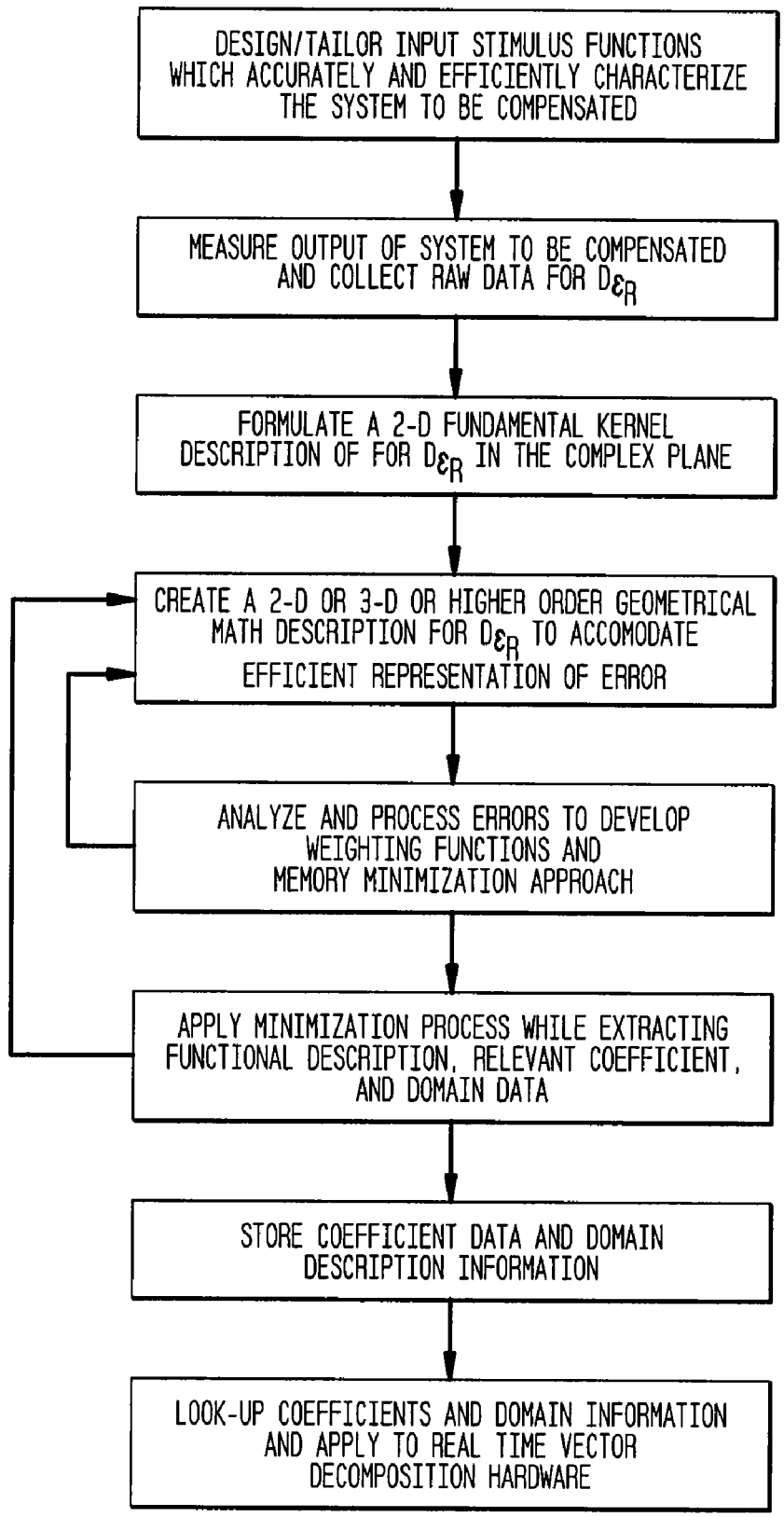
FIG. 157 is a process flowchart that provides a high-level description of methods according to the present invention.

This appendix provides an overview of methods according to the present invention, which have been presented above. At a high level, these methods can be described using the process flowchart illustrated in FIG. 157.

(i) Input Signals

Section 5 of the main text provides a detailed presentation regarding the application of the input stimulus waveforms according to the present invention. As previously presented, according to embodiments of the present invention:

Input Stimulus are designed to provide full coverage of the complex signaling plane to enable universal modulator features.

Sampling rates are adequately designed to reflect requirements of Shannon's Theorem and the associated Nyquist conditions.

The stimulus signal can be optimized to characterize AM-PM, AM-AM, PM-AM, PM-PM tendencies of the system.

Stimulus signals can be efficiently designed to minimize the number of samples required for specific information obtained in $D_{\epsilon_R}$ descriptions.

The stimulus signals can be designed to characterize memory within the device.

The stimulus signals can be designed to permit efficient formulation of the error function $D_{\epsilon_R}$.

According to embodiments of the present invention, higher order N-dimensional descriptions may be created from the 2-D and 3-D descriptions by permitting the geometry of the space to account for temperature effects, power supply variation, process variation, gain variation, etc. Further, a variety of mathematical techniques may be used to describe the information of all of these states and spaces. As disclosed herein, tensor analysis provides a particularly powerful technique for analyzing the transitions between various states of the system. At the completion of this step in the process $D_{\epsilon_R}$ possesses a compact representation in functional form.

(ii) Analysis and Weighting Functions

According to embodiments of the present invention, the basis descriptions can be made more efficient by providing further consideration to emphasize portions of the descriptive domain for $D_{\epsilon_R}$ where information may be more important or necessary and de-emphasize domains that do not necessarily impact performance as much.

According to embodiments of the present invention, gradients of the error function, cross correlation properties of $D_{\epsilon_R}$ and energy content of the error function $D_{\epsilon_R}$, as well as its derivatives, can be used to provide valuable insight into the process for weighting the error domains.

(iii) Minimize

Embodiments of the present invention further include applying weighting considerations to functional descriptions, while optimizing domains of functional descriptions and minimizing resolutions required for coefficients.

(iv) Output Measurement

According to embodiments of the present invention, output measurements possess a one-to-one correspondence to input stimulus signals. The input/output signals are sampled and therefore may be processed by automatic test equipment and computational devices.

(v) Formulated 2-D $D\epsilon_R$ Description

According to embodiments of the present invention, output measurements are compared to the anticipated ideal desired output in a complex number format in Cartesian or Polar form. The comparison may include performing a mathematical operation such as subtraction, for example. The difference between output measurements and the ideal desired out is $D_{\epsilon_R}$. Raw $D_{\epsilon_R}$ data are collected to form a compact functional description of the raw data set, to reduce memory. A step is to obtain these fundamental descriptions in 2 dimensions, i.e., the complex plane.

(vi) Create Efficient Multi-Dimensional Descriptions of $D\epsilon_R$

According to embodiments of the present invention, the fundamental 2-D kernel $D_{\epsilon_R}$ can be manipulated into a form involving polynomials and domains, using spline descriptions, tensor descriptions, and a variety of other functions. See Sections 6, 7, 8, 10, 11, 12. The underlying theories involve concepts of Approximation Theory, Interpolation Theory, Curve and Surface Fitting, Tensor Analysis, N-Dimensional Geometry, Information Theory, etc. Fundamental 3-D kernels may be formed by manipulation of the fundamental 2-D kernel.

(vii) Store Coefficients and Domains

According to embodiments of the present invention, since the descriptions for $D_{\epsilon_R}$ can be in polynomial form or other convenient mathematical or geometrical form, only certain coefficients are required to describe the forms along with a description of the domains over which the specific representations apply.

(viii) Real Time Application

According to embodiments of the present invention, the stored description of $D_{\epsilon_R}$ can be accessed from memory and applied to real time digital and analog hardware to correct for all errors in the transfer characteristic of the system being error corrected. The coefficients drive very fast hardware based algorithms, which execute corrections to vector decomposition math within the VPA core based on $D_{\epsilon_R}$. The resolution of the coefficients on $D_{\epsilon_R}$. The resolution of the coefficients and complexity of the description for $D_{\epsilon_R}$ as well as the number of domains used to partition $D_{\epsilon_R}$ all control the quality of the final result. Any waveform may be compensated in a single unified amplifier or power modulator device by application of algorithms according to the present invention.

(ix) Features and Advantages of the Invention

The following is a list of features and advantages of embodiments of the present invention.

(1) Stimulus Claim Categories

The following stimulus functions and/or signals and applications thereof are within the scope of the embodiments of the present invention.

1. A 'star burst' or radial stimulus function that can be used to excite the VPA input and provide full characterization of the transfer characteristic of the VPA by measurements performed at the VPA output, comparing to an ideal desired response.
2. A circle burst stimulus function that can be used to excite the VPA input and provide full characterization of the transfer characteristic of the VPA by measurements performed at the VPA output, comparing to an ideal desired response.
3. A spiral burst stimulus function that can be used to excite the VPA input and provide full characterization of the transfer characteristic of the VPA by measurements performed at the VPA output, comparing to an ideal desired response.
4. Stimulus signals which possess continuity and smooth first derivatives everywhere in the complex plane and that can be used to excite the VPA input and provide full characterization of the transfer characteristic of the VPA by measurements performed at the VPA output, comparing to an ideal desired response.
5. Stimulus signals which possess continuity and smooth first and second derivatives everywhere in the complex plane and that can be used to excite the VPA input and provide full characterization of the transfer characteristic of the VPA by measurements performed at the VPA output, comparing to an ideal desired response.
6. Stimulus signals which possess continuity and smooth first, second, and higher order derivatives everywhere in the complex plane and that can be used to excite the VPA input and provide full characterization of the transfer characteristic of the VPA by measurements performed at the VPA output, comparing to an ideal desired response.
7. Stimulus signals with characteristics as described in 1) and that are tailored to maximize the detection of complex plane response non-linearities by gradient method.
8. Stimulus signals with characteristics as described in 2) and that are tailored to maximize the detection of complex plane response non-linearities by gradient method.
9. Stimulus signals with characteristics as described 3) and that are tailored to maximize the detection of complex plane response non-linearities by gradient method.

10. Stimulus signals with characteristics as described in 4) and are tailored to maximize the detection of complex plane response non-linearities by gradient method.
11. Stimulus signals with characteristics as described in 5) and are tailored to maximize the detection of complex plane response non-linearities by gradient method.
12. Stimulus signals with characteristics as described in 6) and are tailored to maximize the detection of complex plane response non-linearities by gradient method.
13. Hybrid stimulus signals having any combination of the above, including the following combinations:
    (a) 1), 2)
    (b) 1), 2) 3)
    (c) 2), 3)
    (d) 1), 2), 4)
    (e) 1), 2), 5)
    (f) 1), 2), 6)
    (g) b), 4) (i.e., 13(b) and (4))
    (h) b), 5)
    (i) b), 6)
    (j) c), 4)
    (k) c), 5)
    (l) c), 6)
    (m) 7), a): 7), b): 7), c): 7), d): 7), e): 7), f)
    (n) 8), a): 8), b): 8), c): 8), d): 8), e): 8), f)
    (o) 9), a): 9), b): 9), c): 9), d): 9), e): 9), f)
    (p) 10), a): 10), b): 10), c): 10), d): 10), e): 10), f)
    (q) 11), a): 11), b): 11), c): 11), d): 11), e): 11), f)
    (r) 12), a): 12), b): 12), c): 12), d): 12), e): 12), f)
14. Application of any of items 1) thru 13) with any system to be compensated.
15. Application of any of items 1) thru 13) with VPA based applications.
16. Designing sweep rates of any pattern to optimally stimulate the bandwidth of the system to accommodate specific applications.
17. Organizing density of sweep locus, contours, trajectories, and samples to minimize samples required according to $D_{\epsilon_R}$ gradients.
18. Organizing density of sweep locus, contours, trajectories, and samples to minimize samples required according to $D_{\epsilon_R}$ cross correlation functions.
19. Sweep at an N-dimensional space where some parameters of the space can be temperature, gain, process variation, power variation, etc.
20. Sweeping to isolate AM-AM.
21. Sweeping to isolate AM-PM.
22. Sweeping to isolate PM-PM.
23. Sweeping to isolate PM-AM.
24. Sweeping to reveal system memory.
25. Sweeping to minimize sweep time vs. coverage vs. performance.
26. Statistically based and deterministically based stimulus design to account for semiconductor heating affects in concert with previous claims or as autonomous technique.

(x) Measurement Claims

The following is within the scope of measurement functions according to embodiments of the present invention.

Associating complex measurement at output with input by assigning a corresponding index. The index corresponds to a coordinate within the complex plane.

(xi) 2-D Fundamental Kernel Claims

The following is within the scope of metric functions and data formats enabled within the metric functions, according to embodiments of the present invention.

1. Generating a metric based on the difference of the measured output vs. the 'ideal' expected output (extrapolated from the input stimulus).
2. Generating a metric based on the ratio of the measured output vs. the 'ideal' expected output (extrapolated from the input stimulus).
3. Enabling rectangular or polar formats for 1), and 2).

(xii) Create 2-D and 3-D Description Claims

The following is within the scope of 2-D and 3-D error characterization according to embodiments of the present invention.

1. Developing complex functions to describe the 2-D surface (use interpolation, approximation, fitting, etc.), (Data→Functions) using one or more of:
   Polynomials (Algebraic and Orthogonal)
   Splines
   Curves
   Tensors and Tensor Products
   Patches
   Radial Basis Functions
   Matrices
   Vectors
   Any combination of d), g), h)
   Other combinations of a) through i)
2. Developing 3-D kernel from 2-D kernel by isolating magnitude error and phase error functions. Generating description of the error surface within the 3-D space using one or more of:
   Polynomials (Algebraic and Orthogonal)
   Splines
   Curves
   Tensors and Tensor Products
   Patches
   Radial Basis Functions
   Matrices
   Vectors
   Any combination of d), g), h)
   Other combinations of a) through i)
3. Minimizing mathematical descriptions by reducing the number of required functions and associated coefficients necessary to convey surface information, using one or more of:
   Gradient Information
   Correlation Functions
   Rotational Transforms
   Radial Transforms
   Domain Partitions
   Patches
4. Higher order application of number 3) above.
5. Storing coefficients by:
   Minimizing of spline coefficient using symmetry transform
6. Recalling coefficients by:
   Minimizing of spline coefficient using symmetry transform (xiii) N-Dimensional Processing Claims The following is within the scope of processing functions according to embodiments of the present invention.

Developing complex functions to describe the N-D surface or manifold (use interpolation, approximation, fitting, etc.) (Data→Functions) using one or more of:
   Polynomials (Algebraic and Orthogonal)
   Splines
   Curves
   Tensors and Tensor Products
   Splotches
   Radial Basis Functions
   Matrices
   Vectors
   Any combination of the above.

Minimizing mathematical descriptions by reducing the number of required functions and associated coefficients necessary to convey surface information, using one or more of:
- Gradient Information
- Correlation Functions
- Rotational Transforms
- Radial Transforms
- Domain Partitions
- Splotches Building N-dimensional descriptions of $D_{\epsilon_R}$ and associated calibration functions from unified rank (N−1) tensors.

Building N-dimensional description of $D_{\epsilon_R}$ and associated calibration functions from transformation operators and tensors which are partitioned as lower rank mathematical entities. These entities operate successively and/or coincidentally to form an equivalent (N−1) rank operator, or to form separate multiple (N−l) rank operators, for $0 < l \leq N$.

(b) Pre Distortion Case Comparison

Some systems attempt to correct amplifier non-linearities by using a pre distortion block prior to amplification. This can be accomplished by using raw error data or some descriptive correction function. Techniques according to the present invention do not use 'raw data' from measurements but rather functions of the raw data created in 'non real time' applications. Further distinctions between pre-distortion techniques and techniques according to the present invention can be described as follows:

a. Pre-distortion functions do not take a form that address unique error content from region to region in the complex plane. That is, they are not continuously variable 2-D function.

b. Pre-distortion functions do not use all the information from the complex plane in their respective descriptions, whether smoothed, averaged, or otherwise.

c. Pre-distortion functions do not integrate 2 dimensional complex plane error data, gain variation, temperature variation, process variation, power supply variation, etc. as parameters and/or variables in their respective unified descriptions.

d. Pre-distortion functions usually minimize some ancillary target goal such as intermodulation distortion.

e. Pre-distortion is applied exclusively to the data not to the coordinate system of interest for the signaling application.

(c) Summary

Embodiments of the present invention can be used to define a function of any point in the complex plane which is unique at every point within that plane and can be described in polar or Cartesian form over multiple regional domains if so desired. Hence, gradients within the 2 dimensional plane can be uniquely characterized everywhere without storing original input/output measurement data samples or their difference or their ratio.

Embodiments of the present invention can be used to minimize or tailor the uniqueness of the description of error from region to region in the complex plane by examination of regional cross correlations. Furthermore, averaged data and smoothed data from adjacent regions can be used to create the description of error which compensates the system, thereby utilizing all complex plane information to form a compact error description.

Embodiments of the present invention can be used to describe error functions within the framework of a N-dimensional space to account for complex plane non-linearities, temperature effects, process variances, gain variance, power supply variations, etc.

Goal function are LSE, MMSE driven, or Lebesgue norm driven with $1 \leq \gamma \leq \infty$ using golden stimulus function within the complex plane, which for comparison correlate to EVM metrics, CDE metrics, amplitude domain error, phase error, as well as ACPR rather than IMD performance.

Correction function according to embodiments of the present invention can be applied to create a new coordinate system if so desired rather than correct the input data. The new coordinate system is created such that signal projections and transformations onto the new coordinates system produce a desired output result.

What is claimed is:

1. A method for calibrating an electronic system, the method comprising:

applying one or more input stimulus signals to the electronic system for a state of operation;

measuring an actual output of the electronic system for the state of operation;

generating a multi-dimensional error function, wherein the multi-dimensional error function comprises at least three dimensions and a plurality of calibration coefficients associated with a plurality of parameters that characterizes one or more actual input/output transfer characteristics of the electronic system; and applying, with a processing unit, the plurality of calibration coefficients to the electronic system, wherein the plurality of calibration coefficients adjusts the actual input/output transfer characteristics based on the measured actual output of the electronic system to reduce a difference between the one or more actual input/output transfer characteristics of the electronic system and one or more desired input/output transfer characteristics of the electronic system.

2. The method of claim 1, wherein generating the multi-dimensional error function comprises generating the plurality of calibration coefficients corresponding to a polynomial approximation of the multi-dimensional error function.

3. The method of claim 1, wherein generating the multi-dimensional error function comprises characterizing one or more differences between the one or more actual input/output transfer characteristics of the electronic system and the one or more desired input/output characteristics of the electronic system for each of a plurality of states of operation of the electronic system.

4. The method of claim 1, wherein generating the multi-dimensional error function comprises determining a plurality of parameters that affect performance of the electronic system.

5. The method of claim 1, wherein the actual input/output transfer characteristics of the electronic system depends on the state of operation of the electronic system.

6. The method of claim 1, wherein the electronic system is calibrated at a point of calibration within the electronic system.

7. The method of claim 6, wherein the point of calibration is located at an output of any of one or more components of the electronic system.

8. The method of claim 6, wherein the multi-dimensional error function characterizes one or more differences between the one or more actual input/output transfer characteristics of the electronic system and the one or more desired input/output characteristic of the electronic system at the point of calibration.

9. The method of claim 6, wherein the electronic system comprises a vector power amplifier (VPA), and wherein the point of calibration is located at an output of the VPA.

10. The method of claim 6, wherein the electronic system comprises a vector power amplifier (VPA), wherein the VPA comprises a Multiple Input Single Output (MISO) amplifier, and wherein the point of calibration is located at an output of the MISO amplifier.

11. The method of claim 1, wherein the electronic system comprises a vector power amplifier (VPA), and wherein determining the state of operation of the electronic system includes determining or estimating one or more of:

VPA power supply;
VPA power gain;
VPA carrier frequency;
temperature variations;
process variations;
VPA output waveform bandwidth; and
VPA Adjacent Channel Power Ratio (ACPR).

12. The method of claim 1, wherein the electronic system includes a vector power amplifier (VPA), and wherein calculating one or more calibration multipliers comprises calculating one or more calibration coefficients related to at least one of a gain of the VPA, phase of the VPA, or both.

13. The method of claim 1, wherein the processing unit comprises circuitry.

* * * * *